United States Patent
Pak et al.

(10) Patent No.: US 11,800,793 B2
(45) Date of Patent: Oct. 24, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Hankyu Pak, Suwon-si (KR); Mun-ki Sim, Seoul (KR); Seokhwan Hwang, Suwon-si (KR); Junha Park, Gwacheon-si (KR); Jang Yeol Baek, Yongin-si (KR); Keigo Hoshi, Fukuoka (JP); Yuuki Miyazaki, Fukuoka (JP); Hyoyoung Lee, Suwon-si (KR); Minjung Jung, Hongcheon-gun (KR); Sun Young Pak, Suwon-si (KR); Chanseok Oh, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 515 days.

(21) Appl. No.: 17/091,619

(22) Filed: Nov. 6, 2020

(65) Prior Publication Data

US 2021/0273175 A1    Sep. 2, 2021

(30) Foreign Application Priority Data

Feb. 19, 2020   (KR) .................. 10-2020-0020252

(51) Int. Cl.
*C07F 5/02* (2006.01)
*H10K 85/60* (2023.01)
(Continued)

(52) U.S. Cl.
CPC .......... *H10K 85/631* (2023.02); *C07F 5/027* (2013.01); *C09K 11/06* (2013.01); *H10K 85/636* (2023.02);
(Continued)

(58) Field of Classification Search
None
See application file for complete search history.

(56) References Cited

U.S. PATENT DOCUMENTS

| 5,645,948 A | 7/1997 | Shi et al. |
| 2004/0053069 A1 | 3/2004 | Sotoyama et al. |

(Continued)

FOREIGN PATENT DOCUMENTS

| JP | 4060669 B2 | 3/2008 |
| JP | 2018-43984 A | 3/2018 |

(Continued)

OTHER PUBLICATIONS

Kondo, Yasuhiro, et al. "Narrowband deep-blue organic light-emitting diode featuring an organoboron-based emitter." Nature Photonics 13.10 (2019): 678-682. (Year: 2019).*

(Continued)

*Primary Examiner* — Robert S Loewe
(74) *Attorney, Agent, or Firm* — Lewis Roca Rothgerber Christie LLP

(57) ABSTRACT

An organic electroluminescence device includes a first electrode, an organic layer disposed on the first electrode, and a second electrode disposed on the organic layer, wherein the organic layer includes a polycyclic compound represented (Continued)

by Formula 1. The organic electroluminescence device may have high emission efficiency.

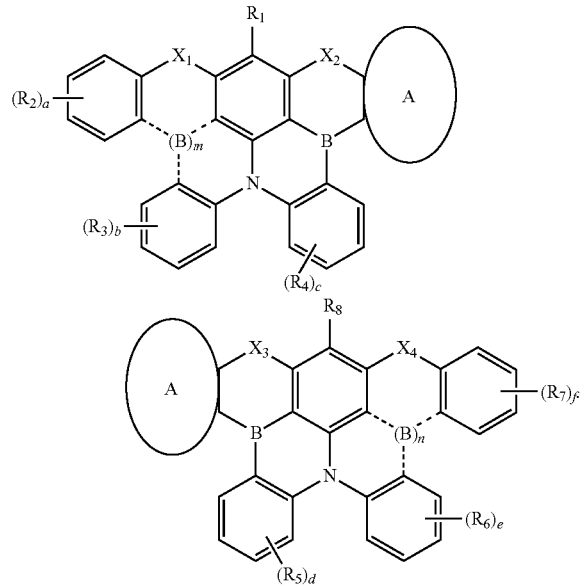

21 Claims, 3 Drawing Sheets

(51) Int. Cl.
C09K 11/06 (2006.01)
H10K 50/11 (2023.01)
H10K 50/16 (2023.01)
H10K 50/17 (2023.01)
H10K 101/10 (2023.01)

(52) U.S. Cl.
CPC ............. C09K 2211/1007 (2013.01); C09K 2211/1018 (2013.01); H10K 50/11 (2023.02); H10K 50/16 (2023.02); H10K 50/171 (2023.02); H10K 85/6572 (2023.02); H10K 85/6574 (2023.02); H10K 2101/10 (2023.02)

(56) References Cited

U.S. PATENT DOCUMENTS

| | | |
|---|---|---|
| 2010/0155714 A1 | 6/2010 | Seo et al. |
| 2018/0069182 A1 | 3/2018 | Hatakeyama et al. |
| 2018/0094000 A1 | 4/2018 | Hatakeyama et al. |
| 2018/0366653 A1 | 12/2018 | He et al. |
| 2019/0256538 A1 | 8/2019 | Hatakeyama et al. |
| 2020/0144515 A1 | 5/2020 | Hatakeyama et al. |
| 2020/0203651 A1* | 6/2020 | Duan ................... H10K 50/121 |
| 2020/0203652 A1* | 6/2020 | Duan ................ H10K 85/6572 |
| 2021/0159411 A1* | 5/2021 | Sim ..................... H10K 85/657 |

FOREIGN PATENT DOCUMENTS

| | | | |
|---|---|---|---|
| KR | 10-0525408 B1 | 11/2005 | |
| KR | 10-2016-0119683 A | 10/2016 | |
| KR | 10-2017-0130435 A | 11/2017 | |
| KR | 10-1876763 B1 | 7/2018 | |
| KR | 10-1886773 B1 | 8/2018 | |
| KR | 10-1955647 B1 | 3/2019 | |
| KR | 10-2019-0051003 A | 5/2019 | |
| WO | WO 2018/212169 A1 | 11/2018 | |
| WO | WO-2019151204 A1 * | 8/2019 | |
| WO | WO-2019198698 A1 * | 10/2019 | ............ C07F 5/027 |
| WO | WO-2020040298 A1 * | 2/2020 | ............ C09K 11/06 |
| WO | WO-2020101001 A1 * | 5/2020 | ............ G09F 9/30 |
| WO | WO-2021230133 A1 * | 11/2021 | |

OTHER PUBLICATIONS

Adachi, Chihaya et al., "Confinement of charge carriers and molecular excitons within 5-nm-thick emitter layer in organic electroluminescent devices with a double heterostructure", Applied Physics Letters, 1990, pp. 531-533, vol. 57, No. 6, American Institute of Physics, U.S.

Pershin, Anton et al., "Highly emissive excitons with reduced exchange energy in thermally activated delayed fluorescent molecules", Nature Communications, 2019, pp. 1-5, vol. 10, No. 597, Springer Nature Limited.

Sakamoto, Youichi et al., "Synthesis, Characterization, and Electron-Transport Property of Perfluorinated Phenylene Dendrimers", J. Am. Chem. Soc., 2000, pp. 1832-1833, vol. 122, No. 8, American Chemical Society, U.S.

Tang, C.W. et al., "Organic electroluminescent diodes", Applied Physics Letters, 1987, pp. 913-915, vol. 51, No. 12, American Institute of Physics, U.S.

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0020252, filed on Feb. 19, 2020, the entire content of which is hereby incorporated by reference.

BACKGROUND

1. Field

The present disclosure herein relates to an organic electroluminescence device and a polycyclic compound for an organic electroluminescence device.

2. Description of Related Art

Recently, the development of an organic electroluminescence display device as an image display device is being actively conducted. Different from a liquid crystal display device, the organic electroluminescence display device is a so-called self-luminescent display device in which holes and electrons injected from a first electrode and a second electrode recombine in an emission layer, and a light-emitting material including an organic compound in the emission layer emits light to attain display of images.

In the application of an organic electroluminescence device to a display device, the decrease of a driving voltage, and the increase of the emission efficiency and the lifespan of the organic electroluminescence device are desired (e.g., required), and development on materials for an organic electroluminescence device capable of stably attaining these characteristics is being continuously pursued.

Particularly, recently, in order to accomplish an organic electroluminescence device with high efficiency, techniques on phosphorescence emission (which utilizes energy in a triplet state) or delayed fluorescence emission (which utilizes the generating phenomenon of singlet excitons by the collision of triplet excitons (triplet-triplet annihilation, TTA)) are being developed, and development on a material for thermally activated delayed fluorescence (TADF) utilizing delayed fluorescence phenomenon is being conducted.

SUMMARY

One or more aspects of embodiments of the present disclosure are directed toward an organic electroluminescence device showing long lifespan and high efficiency, and a polycyclic compound utilized therein.

One or more aspects of embodiments of the present disclosure are also directed toward an organic electroluminescence device including a thermally activated delayed fluorescence material, and a polycyclic compound utilized as a thermally activated delayed fluorescence material.

According to an embodiment of the present disclosure, an organic electroluminescence device includes a first electrode; an organic layer on the first electrode; and a second electrode on the organic layer, wherein the organic layer includes a polycyclic compound represented by the following Formula 1:

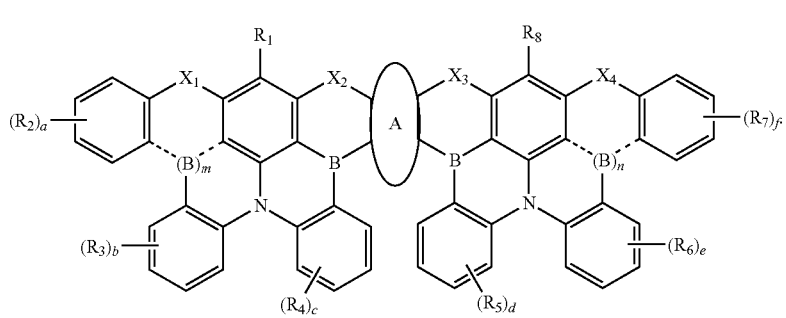

Formula 1

In Formula 1, $X_1$ to $X_4$ may each independently be $NR_9$, O or S; $R_1$ to $R_8$ may each independently be a hydrogen atom, a deuterium atom, a halogen atom, a cyano group, a substituted or unsubstituted boron group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring; $R_9$ may be a hydrogen atom, a deuterium atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring; "a" to "f" may each independently be an integer of 0 to 4; "m" and "n" may each independently be 0 or 1; a dotted line may represent a bond or a non-bond (e.g., there is no bond between groups on each side of the dotted line);

and ring A may be represented by any one selected from the following Formula 2-1 to Formula 2-3:

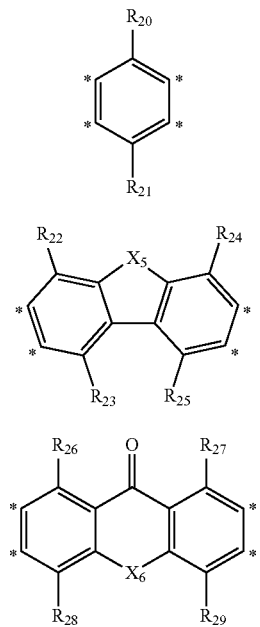

Formula 2-1

Formula 2-2

Formula 2-3

In Formula 2-1 to Formula 2-3, "*" may represent a position for condensation (e.g., a bonding site with a neighboring atom); $X_5$ and $X_6$ may each independently be $CR_{30}R_{31}$, $NR_{32}$, O or S; $R_{30}$ to $R_{32}$ may each independently be a hydrogen atom, a deuterium atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring; and $R_{20}$ to $R_{29}$ may each independently be a hydrogen atom, a deuterium atom, a halogen atom, a cyano group, a substituted or unsubstituted boron group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, wherein when ring A is represented by Formula 2-1 or 2-2, at least one selected from "m" and "n" may be 1.

In an embodiment, the organic layer may include a hole transport region on the first electrode; an emission layer on the hole transport region; and an electron transport region on the emission layer.

In an embodiment, the emission layer may include the polycyclic compound and may emit delayed fluorescence.

In an embodiment, the emission layer may be a delayed fluorescence emission layer including a host and a dopant, and the dopant may be the polycyclic compound.

In an embodiment, the emission layer may be a thermally activated delayed fluorescence emission layer emitting blue light.

In an embodiment, the electron transport region may include an electron transport layer on the emission layer; and an electron injection layer on the electron transport layer, and the electron transport layer or the electron injection layer may include the polycyclic compound.

In an embodiment, Formula 2-2 may be represented by any one selected from the following Formula 3-1 to Formula 3-4:

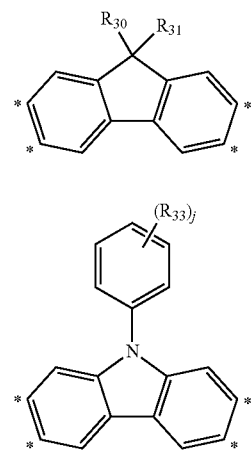

Formula 3-1

Formula 3-2

Formula 3-3

Formula 3-4

In Formula 3-1 to Formula 3-4, "*" may represent a position for condensation (e.g., a bonding site with a neighboring atom); $R_{30}$, $R_{31}$, and $R_{33}$ may each independently be a hydrogen atom, a deuterium atom, or a substituted or unsubstituted alkyl group of 1 to 20 carbon atoms; and "j" may be an integer of 0 to 5.

In an embodiment, Formula 2-3 may be represented by any one selected from the following Formula 4-1 to Formula 4-3:

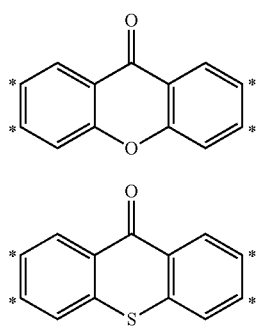

Formula 4-1

Formula 4-2

-continued

Formula 4-3]

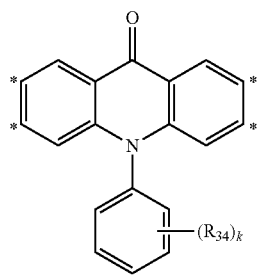

In Formula 4-1 to Formula 4-3, "*" may represent a position for condensation (e.g., a bonding site with a neighboring atom); $R_{34}$ may be a hydrogen atom, a deuterium atom, or a substituted or unsubstituted alkyl group of 1 to 20 carbon atoms; and "k" may be an integer of 0 to 5.

In an embodiment, the polycyclic compound represented by Formula 1 may be represented by the following Formula 5-1 or Formula 5-2:

Formula 5-1

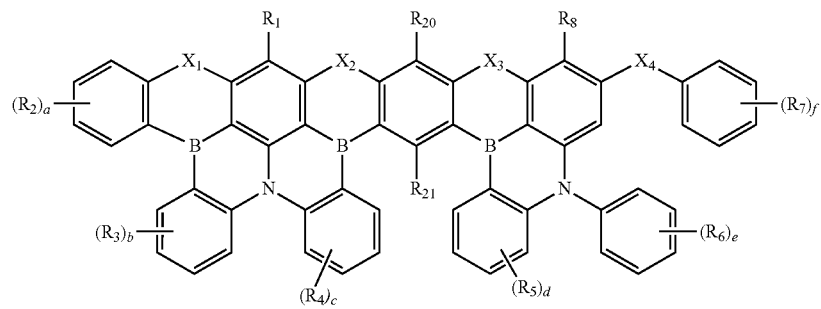

Formula 5-2

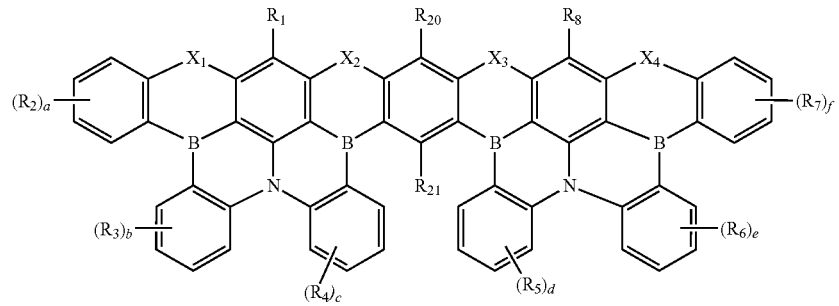

In Formula 5-1 and Formula 5-2, $X_1$ to $X_4$, $R_1$ to $R_8$, $R_{20}$, $R_{21}$, and "a" to "f" are the same as respectively defined in Formula 1 and Formula 2-1.

In an embodiment, the polycyclic compound represented by Formula 1 may be represented by the following Formula 6-1 or Formula 6-2:

Formula 6-1

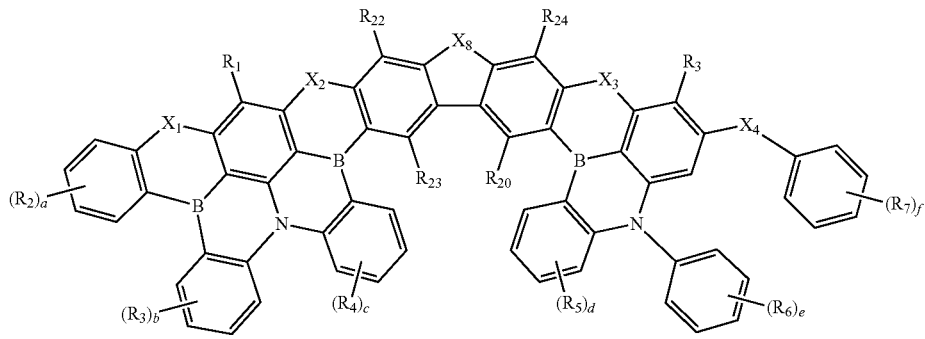

-continued
Formula 6-2
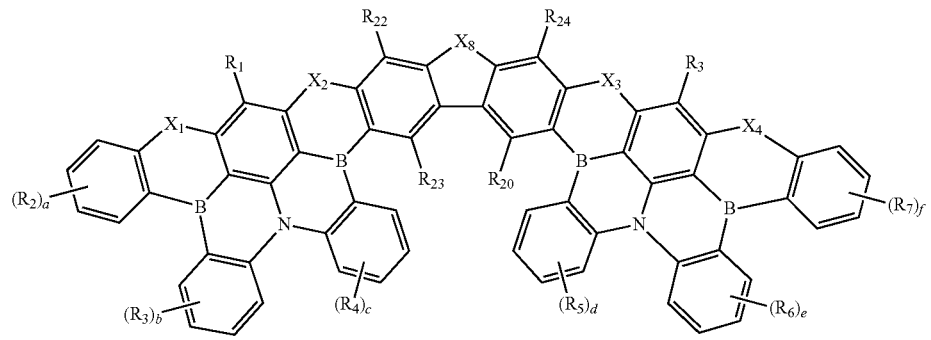
In Formula 6-1 and Formula 6-2, $X_1$ to $X_5$, $R_1$ to $R_8$, $R_{22}$ to $R_{25}$, and "a" to "f" are the same as respectively defined in Formula 1 and Formula 2-2.
In an embodiment, the polycyclic compound represented by Formula 1 may be represented by any one selected from the following Formula 7-1 to Formula 7-3:
Formula 7-1
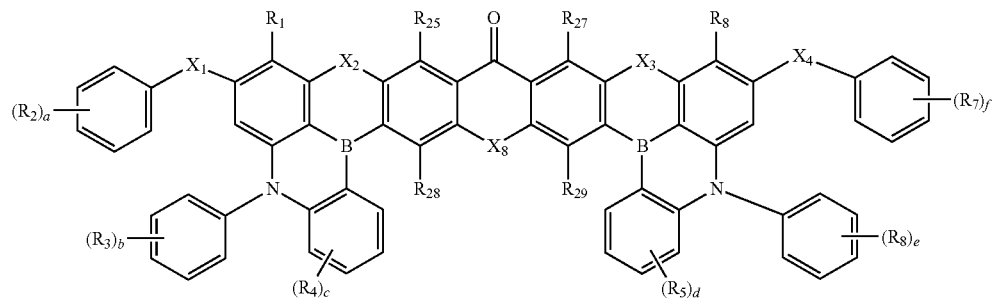
Formula 7-2
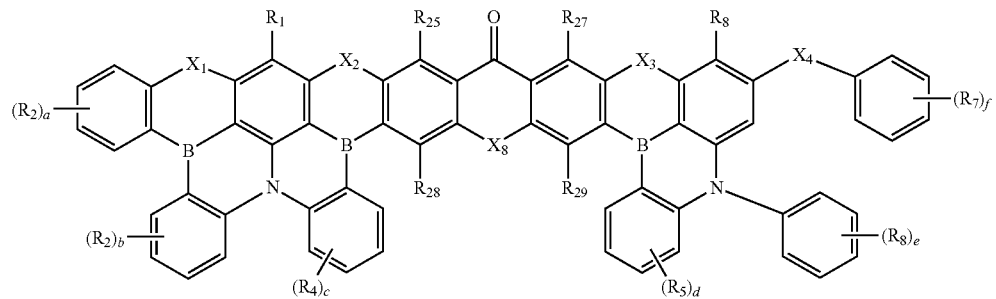
Formula 7-3
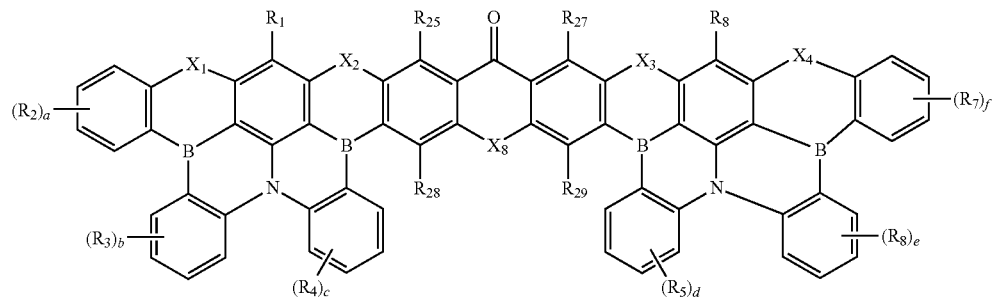

In Formula 7-1 to Formula 7-3, $X_1$ to $X_4$, $X_6$, $R_1$ to $R_8$, $R_{26}$ to $R_{29}$, and "a" to "f" are the same as respectively defined in Formula 1 and Formula 2-3.

In an embodiment, $X_1$ to $X_4$ may be each independently $NR_{11}$, or O, and $R_{11}$ may be a substituted or unsubstituted aryl group of 6 to 30 carbon atoms for forming a ring.

In an embodiment, $X_1$ and $X_4$ may be the same, and $X_2$ and $X_3$ may be the same.

In an embodiment, the polycyclic compound represented by Formula 1 may be any one selected from compounds represented in Compound Group 1 to Compound Group 3 (to be described in more detail below).

In another embodiment of the present disclosure, there is provided a polycyclic compound represented by Formula 1.

BRIEF DESCRIPTION OF THE FIGURES

The accompanying drawings are included to provide a further understanding of the present disclosure and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
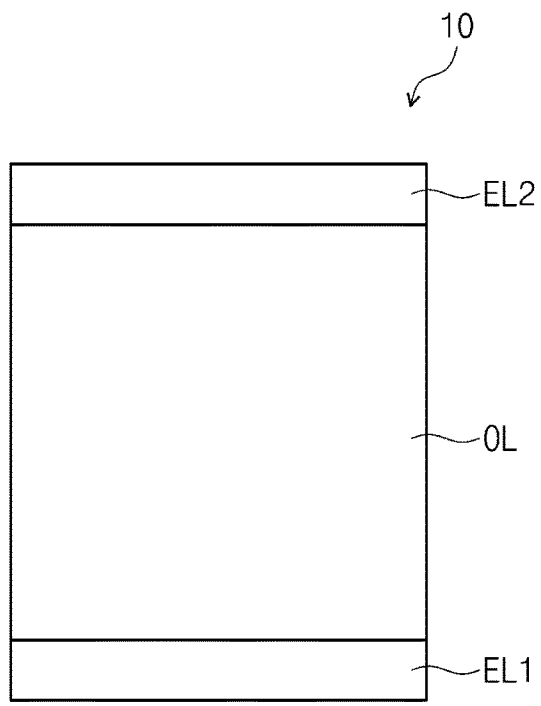
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element (or region, layer, part, etc.) is referred to as being "on", "connected to" or "coupled to" another element, it can be directly on, connected or coupled to the other element or a third intervening elements may be present.

Like reference numerals refer to like elements throughout. In addition, in the drawings, the thickness, the ratio, and the dimensions of constituent elements are exaggerated for effective explanation of technical contents.

The term "and/or" includes one or more combinations which may be defined by relevant elements.

It will be understood that, although the terms first, second, etc., may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In addition, the terms "below", "beneath", "on" and "above" are used for explaining the relation of elements shown in the drawings. The terms are relative concept and are explained based on the direction shown in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment of the present disclosure will be explained with reference to the attached drawings.

FIG. 1 to FIG. 5 are each cross-sectional views schematically showing organic electroluminescence devices according to exemplary embodiments of the present disclosure. Referring to FIG. 1 to FIG. 5, in an organic electroluminescence device 10 of an embodiment, a first electrode EL1 and a second electrode EL2 are oppositely disposed, and between the first electrode EL1 and the second electrode EL2, an organic layer OL may be disposed.

Meanwhile, referring to FIG. 2 to FIG. 5, the organic layer OL of an embodiment may include a plurality of functional layers. The plurality of functional layers may include a hole transport region HTR, an emission layer EML and an electron transport region ETR. That is, the organic electroluminescence device 10 of an embodiment may include a first electrode EL1, a hole transport region HTR, an emission layer EML, an electron transport region ETR, and a second electrode EL2, stacked in the stated order. In addition, the organic electroluminescence device 10 of an embodiment may include a capping layer CPL disposed on the second electrode EL2 (see FIG. 5).

The organic electroluminescence device 10 of an embodiment may include a polycyclic compound of an embodiment, which will be explained later, in the organic layer OL disposed between the first electrode EL1 and the second electrode EL2. When the organic layer OL includes an emission layer EML, the emission layer EML may include the polycyclic compound of an embodiment. However, embodiments of the present disclosure are not limited thereto, but the organic electroluminescence device 10 of an embodiment may include the polycyclic compound of an embodiment, which will be explained later, in a hole transport region HTR or an electron transport region ETR, which are a plurality of functional layers disposed between the first electrode EL1 and the second electrode EL2 in addition to the emission layer EML, or the polycyclic compound of an embodiment, which will be explained later, may be included in a capping layer CPL disposed on the second electrode EL2.

Figure 2:
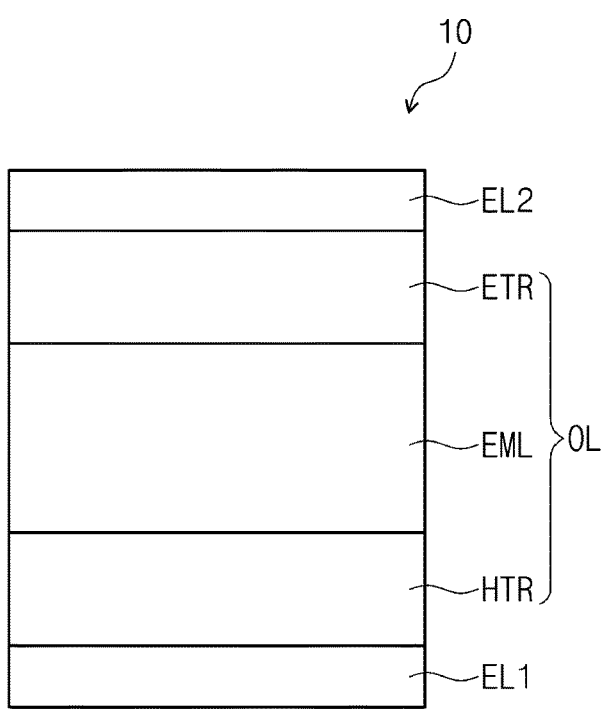
FIG. 2 is a cross-sectional view schematically illustrating an organic electroluminescence device according to an embodiment of the present disclosure.
Figure 3:
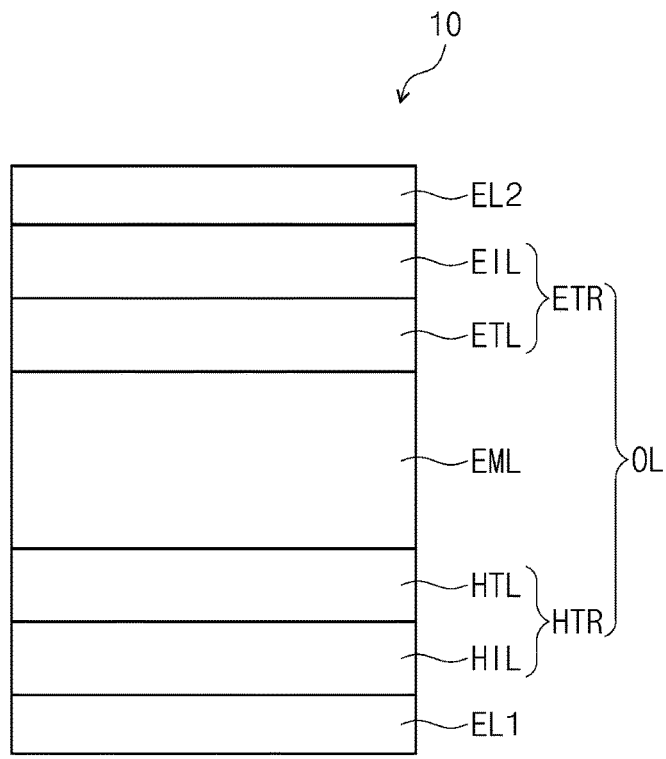
FIG. 3 is a cross-sectional view schematically illustrating an organic electroluminescence device according to an embodiment of the present disclosure.
Figure 4:
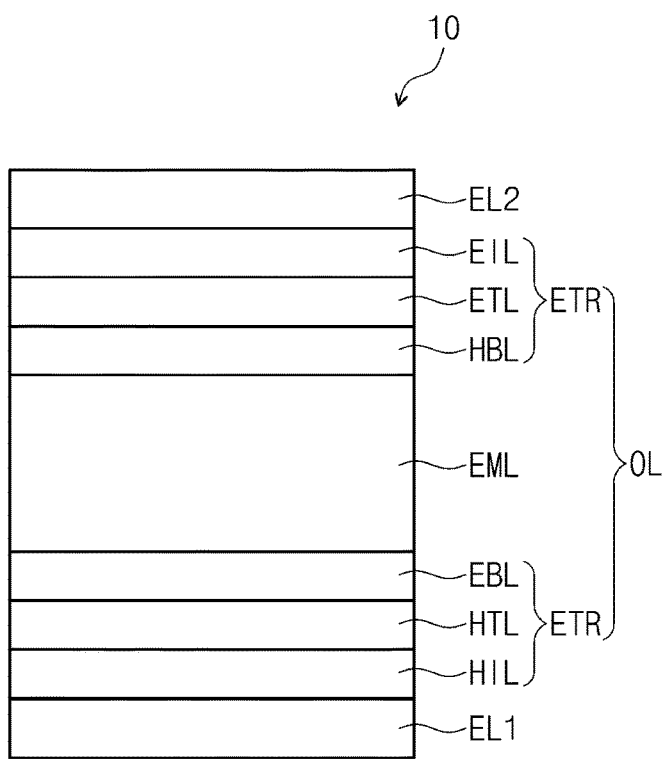
FIG. 4 is a cross-sectional view schematically illustrating an organic electroluminescence device according to an embodiment of the present disclosure.
Figure 5:
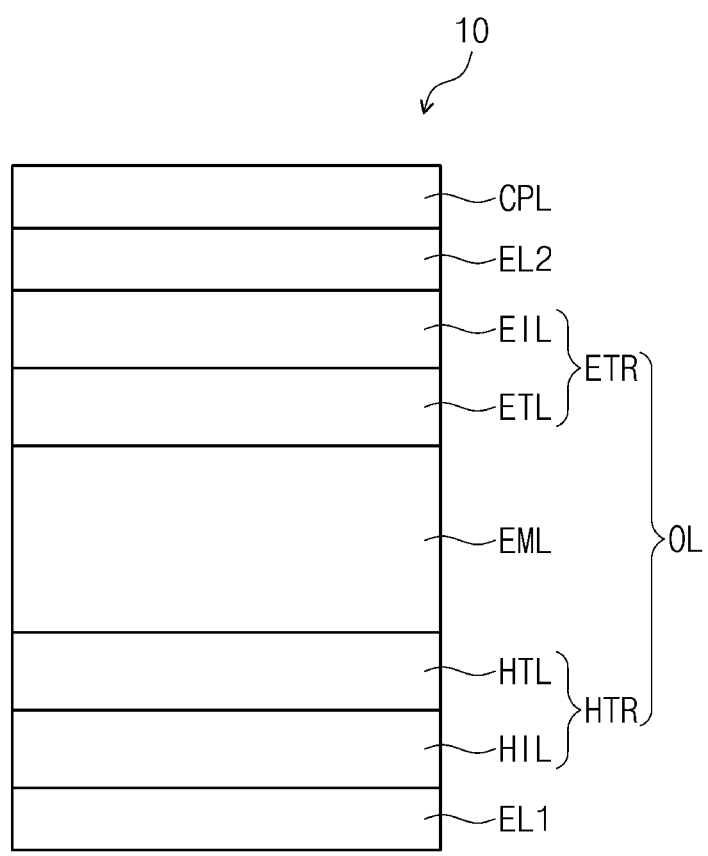
FIG. 5 is a cross-sectional view schematically illustrating an organic electroluminescence device according to an embodiment of the present disclosure.

When compared with FIG. 2, FIG. 3 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 2, FIG. 4 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 3, FIG. 5 shows the cross-sectional view of an organic electroluminescence device 10 of an embodiment, including a capping layer CPL disposed on a second electrode EL2.

The first electrode EL1 has conductivity. The first electrode EL1 may be formed utilizing a metal alloy or a conductive compound. The first electrode EL1 may be a pixel electrode or an anode. The first electrode EL1 may be a transmissive electrode, a transflective electrode, or a reflective electrode. When the first electrode EL1 is the transmissive electrode, the first electrode EL1 may be formed utilizing a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In one embodiment, the first electrode EL1 may have a structure including a plurality of layers including a reflective layer or a transflective layer formed utilizing the above materials, and a transmissive conductive layer formed utilizing ITO, IZO, ZnO, and/or ITZO. For example, the first electrode EL1 may include a three-layer structure of ITO/Ag/ITO. However, embodiments of the present disclosure are not limited thereto. The thickness of the first electrode EL1 may be from about 1,000 Å to about 10,000 Å, for example, from about 1,000 Å to about 3,000 Å.

The organic layer OL is disposed on the first electrode EL1. The organic layer OL may have a single layer formed utilizing a single material, a single layer formed utilizing a plurality of different materials, or a multilayer structure including a plurality of layers formed utilizing a plurality of different materials. For example, the organic layer OL may have a single layer structure of an emission layer EML, or a multilayer structure including (e.g., composed of) a hole transport region HTR, an emission layer EML and an electron transport region ETR.

The organic layer OL of the organic electroluminescence device 10 of an embodiment includes the polycyclic compound of an embodiment of the present disclosure. If the organic layer OL has a multilayer structure having a plurality of layers, any one layer selected from the plurality of layers may include the polycyclic compound according to an embodiment. For example, the organic layer OL may include a hole transport region HTR disposed on a first electrode EL1, an emission layer EML disposed on the hole transport region HTR and an electron transport region ETR disposed on the emission layer EML, and the emission layer EML or the electron transport region ETR may include the polycyclic compound according to an embodiment of the present disclosure.

In the description, the term "substituted or unsubstituted" refers to (e.g., a moiety) substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the description, the term "forming a ring via the combination with an adjacent group" may refer to forming a substituted or unsubstituted hydrocarbon ring, or a substituted or unsubstituted heterocycle (e.g., heterocyclic ring) via the combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In addition, the ring formed via the combination with an adjacent group may be combined with another ring to form a spiro structure.

In the description, the term "adjacent group" may refer to a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, the two methyl groups may be interpreted as "adjacent groups" to each other, and in 1,1-diethylcyclopentane, the two ethyl groups may be interpreted as "adjacent groups" to each other.

In the description, the halogen atom may be a fluorine atom, a chlorine atom, a bromine atom or an iodine atom.

In the description, the boron group includes an alkyl boron group and an aryl boron group. The boron group may refer to the above-defined alkyl group or aryl group combined with a boron atom. Non-limiting examples of the boron group includes a trimethylboron group, a triethyl boron group, a t-butyldimethylboron group, a triphenylboron group, a diphenylboron group, a phenylboron group, etc.

In the description, the alkyl (e.g., alkyl group) may be a linear, branched or cyclic alkyl group. The carbon number of the alkyl may be 1 to 50, 1 to 30, 1 to 20, 1 to 10, or 1 to 6. Non-limiting examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the alkenyl group refers to a hydrocarbon group including one or more carbon double bonds in the middle of or at the terminal of an alkyl group of 2 or more carbon atoms. The alkenyl group may be a linear chain or a branched chain. The carbon number is not specifically limited, but may be 2 to 30, 2 to 20 or 2 to 10. Non-limiting examples of the alkenyl group include a vinyl group, a 1-butenyl group, a 1-pentenyl group, a 1,3-butadienyl aryl group, a styrenyl group, a styrylvinyl group, etc.

In the description, the alkynyl group refers to a hydrocarbon group including one or more carbon triple bonds in the middle of or at the terminal of an alkyl group of 2 or more carbon atoms. The alkynyl group may be a linear chain or a branched chain. The carbon number is not specifically limited, but may be 2 to 30, 2 to 20 or 2 to 10. Non-limiting examples of the alkynyl group include an ethynyl group, a propynyl group, etc.

In the description, the hydrocarbon ring group may be an optional functional group or substituent, which is derived from an aliphatic hydrocarbon ring, or an optional functional group or substituent derived from an aromatic hydrocarbon ring. The carbon number of the hydrocarbon ring group for forming a ring may be 5 to 60, 5 to 30, or 5 to 20.

In the description, the aryl group refers to a functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Non-limiting examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc.

In the description, the fluorenyl group may be substituted, and two substituents may be combined with each other to form a spiro structure. Non-limiting examples of a substituted fluorenyl group are as follows (e.g., shown below). However, embodiments of the present disclosure are not limited thereto.

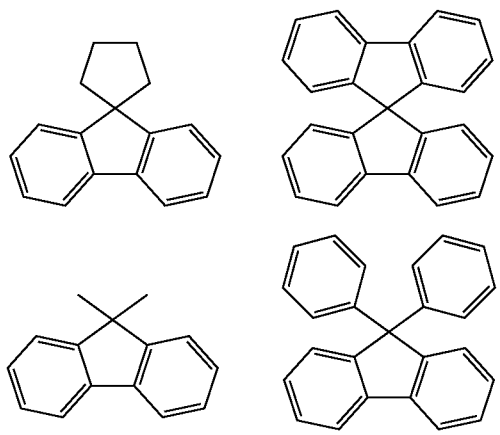

In the description, the heterocyclic group refers to an optional functional group or substituent derived from a ring including one or more selected from B, O, N, P, Si and S as heteroatoms (e.g., as ring forming hetero atoms in addition to carbon atoms). The heterocyclic group includes an aliphatic heterocyclic group and an aromatic heterocyclic group. The aromatic heterocyclic group may be a heteroaryl group. The aliphatic heterocycle and aromatic heterocycle may be a monocycle or a polycycle.

In the description, the heterocyclic group may include one or more selected from B, O, N, P, Si and S as heteroatoms (e.g., as ring forming hetero atoms in addition to carbon atoms). When the heterocyclic group includes two or more heteroatoms, the two or more heteroatoms may be the same or different. The heterocyclic group may be a monocyclic heterocyclic group or a polycyclic heterocyclic group and may include a heteroaryl group. The carbon number for forming a ring of the heterocyclic group may be 2 to 30, 2 to 20, or 2 to 10.

In the description, the aliphatic heterocyclic group may include one or more selected from B, O, N, P, Si and S as heteroatoms (e.g., as ring forming hetero atoms in addition to carbon atoms). The carbon number for forming a ring of the aliphatic heterocyclic group may be 2 to 30, 2 to 20, or 2 to 10. Non-limiting examples of the aliphatic heterocyclic group may be an oxirane group, a thiirane group, a pyrrolidine group, a piperidine group, a tetrahydrofuran group, a tetrahydrothiophene group, a thiane group, a tetrahydropyrane group, a 1,4-dioxane group, etc.

In the description, the heteroaryl group may be one including one or more selected from B, O, N, P, Si and S as heteroatoms (e.g., as ring forming hetero atoms in addition to carbon atoms). When the heteroaryl group includes two or more heteroatoms, the two or more heteroatoms may be the same or different. The heteroaryl group may be a monocyclic heteroaryl group or a polycyclic heteroaryl group. The carbon number for forming a ring of the heteroaryl group may be 2 to 30, 2 to 20, or 2 to 10. Non-limiting examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, dibenzothiofuran, etc.

In the description, the carbon number of the amine group is not specifically limited, but may be 1 to 30. The amine group may include an alkyl amine group, an aryl amine group or a heteroaryl amine group. Non-limiting examples of the amine group include a methylamine group, a dimethylamine group, a phenylamine group, a diphenylamine group, a naphthylamine group, a 9-methyl-anthracenylamine group, a triphenylamine group, etc.

In the description, the thiol group may include an alkyl thio group and an aryl thio group.

In the description, the alkoxy group may have a linear chain, a branched chain or a cyclic chain. The carbon number of the alkoxy group is not specifically limited, but may be, for example, 1 to 20 or 1 to 10. Non-limiting examples of the alkoxy group include methoxy, ethoxy, n-propoxy, isopropoxy, butoxy, pentyloxy, hexyloxy, octyloxy, nonyloxy, decyloxy, benzyloxy, etc.

The polycyclic compound according to an embodiment of the present disclosure is represented by the following Formula 1:

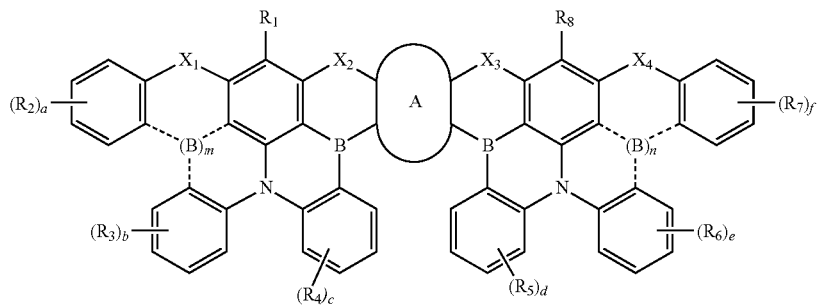

Formula 1

In Formula 1, $X_1$ to $X_4$ are each independently NRs, O or S.

In Formula 1, $R_1$ to $R_8$ are each independently a hydrogen atom, a deuterium atom, a halogen atom, a cyano group, a substituted or unsubstituted boron group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

In Formula 1, $R_9$ is a hydrogen atom, a deuterium atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring.

In Formula 1, "a" is an integer of 0 to 4. Meanwhile, when "a" is 2 or more, a plurality of $R_2$ groups are the same or different.

In Formula 1, "b" is an integer of 0 to 4. Meanwhile, when "b" is 2 or more, a plurality of $R_3$ groups are the same or different.

In Formula 1, "c" is an integer of 0 to 4. Meanwhile, when "c" is 2 or more, a plurality of $R_4$ groups are the same or different.

In Formula 1, "d" is an integer of 0 to 4. Meanwhile, when "d" is 2 or more, a plurality of $R_5$ groups are the same or different.

In Formula 1, "e" is an integer of 0 to 4. Meanwhile, when "e" is 2 or more, a plurality of $R_6$ groups are the same or different.

In Formula 1, "f" is an integer of 0 to 4. Meanwhile, when "f" is 2 or more, a plurality of $R_7$ groups are the same or different.

In Formula 1, "m" and "n" are each independently 0 or 1, and a dotted line represents a bond or a non-bond (e.g., there is no bond between groups on each side of the dotted line). For example, when "m" is 0, the dotted lines around $(B)_m$ represent non-bonds (no bonds), and when "m" is 1, the dotted lines around $(B)_m$ represent bonds. When "n" is 0, the dotted lines around $(B)_n$ represent non-bonds, and when "n" is 1, the dotted lines around $(B)_n$ represent bonds. The term "bond" as used herein refers to a state where a single bond is formed between a carbon atom and the boron (B) atom, connected (e.g., through a dotted line) as in the following Formula 1-1, and the term "non-bond" as used herein refers to a state where carbon and hydrogen form a single bond without B as in the following 1-2:

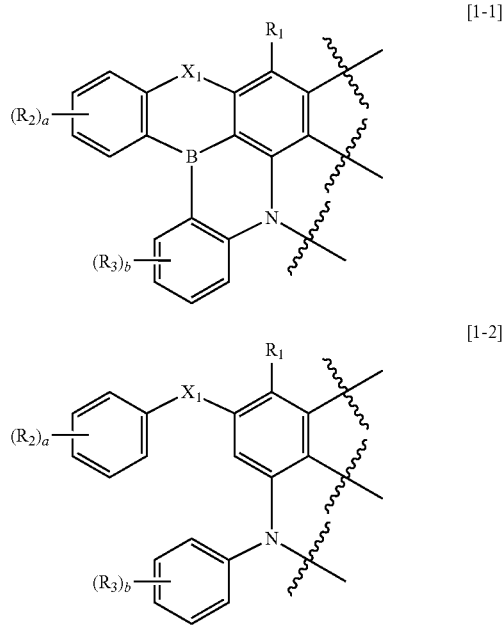

[1-1]

[1-2]

In Formula 1, ring A is an aryl group or a heteroaryl group having (e.g., satisfying) aromaticity. In one embodiment, in Formula 1, ring A is represented by any one selected from the following Formula 2-1 to Formula 2-3:

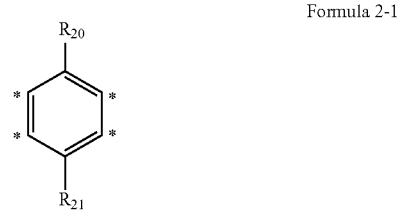

Formula 2-1

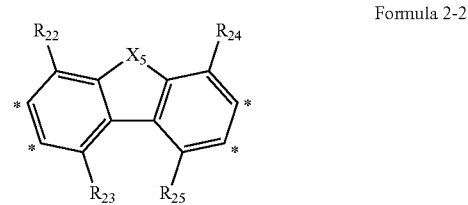

Formula 2-2

Formula 2-3

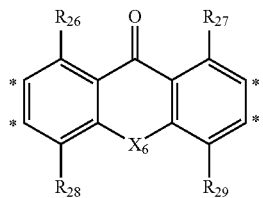

In Formula 2-1 to Formula 2-3, "*" represents a position for condensation (e.g., a bonding site with a neighboring atom) in Formula 1.

In Formula 2-1 to Formula 2-3, $X_5$ and $X_6$ are each independently $CR_{30}R_{31}$, $NR_{32}$, O or S.

In Formula 2-1 to Formula 2-3, $R_{30}$ to $R_{32}$ are each independently a hydrogen atom, a deuterium atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

In Formula 2-1 to Formula 2-3, $R_{20}$ to $R_{29}$ are each independently a hydrogen atom, a deuterium atom, a halogen atom, a cyano group, a substituted or unsubstituted boron group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

When ring A is represented by Formula 2-1 or 2-2, at least one selected from "m" and "n" is 1. In an embodiment, when ring A is represented by Formula 2-1 or 2-2, "m" in Formula 1 may be 1, and "n" may be 0, or "m" in Formula 1 may be 0, and "n" may be 1.

In an embodiment, when ring A of Formula 1 is represented by Formula 2-1 or 2-2, "m" and "n" in Formula 1 may each be 1, respectively.

In an embodiment, when ring A is represented by Formula 2-3, "m" and "n" may each be 0, respectively, or at least one selected from "m" and "n" may be 1. In an embodiment, when ring A is represented by Formula 2-3, "m" and "n" in Formula 1 may each be 1, respectively.

In an embodiment, $X_1$ to $X_4$ in Formula 1 may be each independently $NR_{11}$, or O, and $R_{11}$ may be a substituted or unsubstituted aryl group of 6 to 30 carbon atoms for forming a ring.

In an embodiment, $X_1$ and $X_4$ in Formula 1 may be the same, and $X_2$ and $X_3$ in Formula 1 may be the same.

In an embodiment, Formula 2-2 may be represented by any one selected from the following Formula 3-1 to Formula 3-4:

Formula 3-1

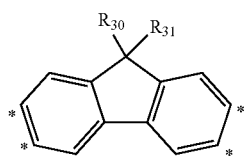

Formula 3-2

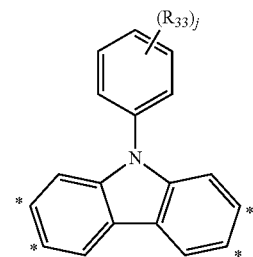

Formula 3-3

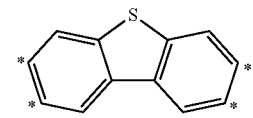

Formula 3-4

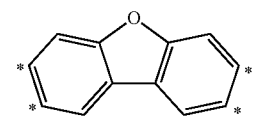

In Formula 3-1 to Formula 3-4, "*" represents a position for condensation (e.g., a bonding site with a neighboring atom).

In Formula 3-1, $R_{30}$ and $R_{31}$ may be each independently a hydrogen atom, a deuterium atom, or a substituted or unsubstituted alkyl group of 1 to 20 carbon atoms.

In Formula 3-2, $R_{33}$ may be a hydrogen atom, a deuterium atom, or a substituted or unsubstituted alkyl group of 1 to 20 carbon atoms, and "j" may be an integer of 0 to 5. Meanwhile, when "j" is 2 or more, a plurality of $R_{33}$ groups are the same or different.

In an embodiment, Formula 2-3 may be represented by any one selected from the following Formula 4-1 to Formula 4-3:

Formula 4-1

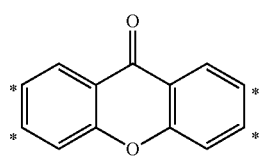

Formula 4-2

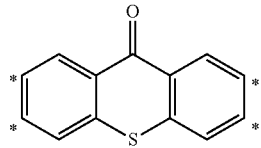

Formula 4-3

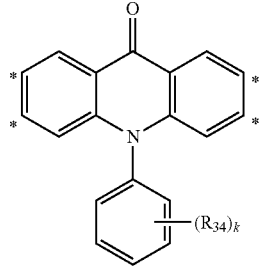

In Formula 4-1 to Formula 4-3, "*" represents a position for condensation (e.g., a bonding site with a neighboring atom).

In Formula 4-3, $R_{34}$ is a hydrogen atom, a deuterium atom, or a substituted or unsubstituted alkyl group of 1 to 20 carbon atoms.

In Formula 4-3, "k" is an integer of 0 to 5. Meanwhile, when "k" is 2 or more, a plurality of $R_{34}$ groups are the same or different.

In an embodiment, ring A of Formula 1 may be represented by Formula 2-1. In this case, the polycyclic compound represented by Formula 1 may be represented by the following Formula 5-1 or Formula 5-2:

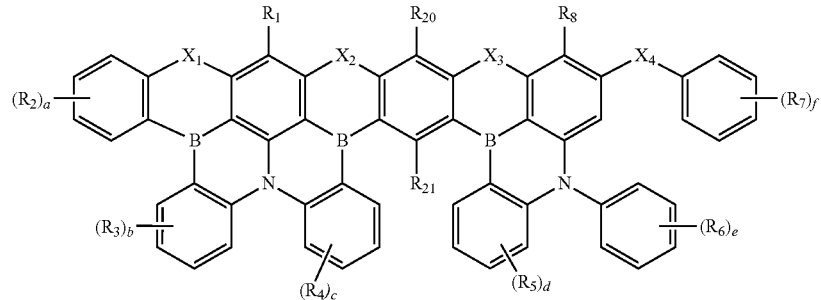

Formula 5-1

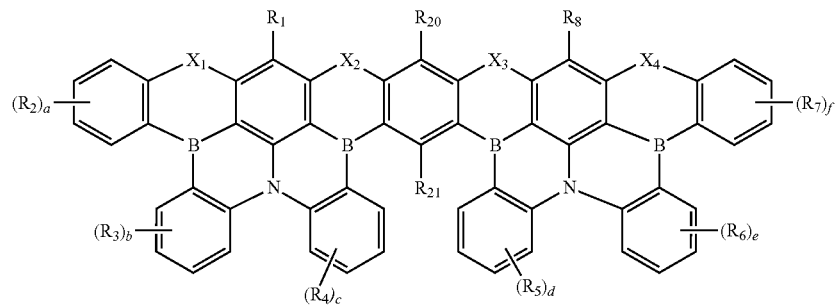

Formula 5-2

In Formula 5-1 and Formula 5-2, $X_1$ to $X_4$, $R_1$ to $R_8$, $R_{20}$, $R_{21}$, and "a" to "f" are the same as respectively defined in connection with Formula 1 and Formula 2-1.

In an embodiment, ring A of Formula 1 may be represented by Formula 2-2. In this case, the polycyclic compound represented by Formula 1 may be represented by the following Formula 6-1 or Formula 6-2:

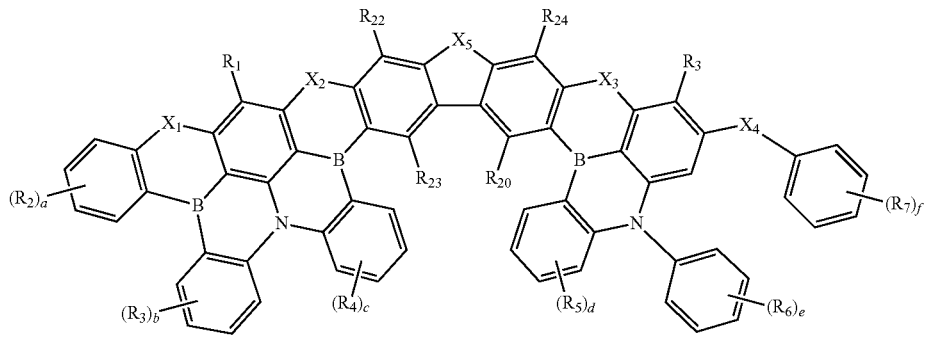

Formula 6-1

Formula 6-2

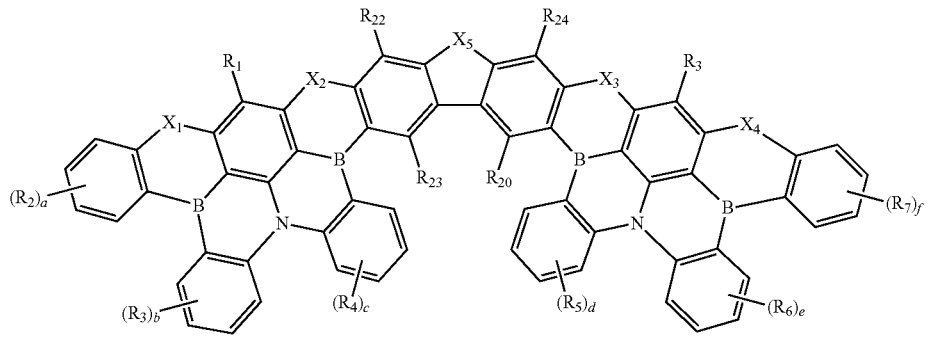

In Formula 6-1 and Formula 6-2, $X_1$ to $X_5$, $R_1$ to $R_8$, $R_{22}$ to $R_{25}$, and "a" to "f" are the same as respectively defined in connection with Formula 1 and Formula 2-2.

In an embodiment, ring A of Formula 1 may be represented by Formula 2-3. In this case, the polycyclic compound represented by Formula 1 may be represented by any one selected from the following Formula 7-1 to Formula 7-3:

In Formula 7-1 to Formula 7-3, $X_1$ to $X_4$, $X_6$, $R_1$ to $R_8$, $R_{26}$ to $R_{29}$, and "a" to "f" are the same as respectively defined in connection with Formula 1 and Formula 2-3.

In an embodiment, the polycyclic compound represented by Formula 1 may be any one selected from the compounds represented in the following Compound Group 1, but embodiments of the present disclosure are not limited thereto:

Formula 7-1

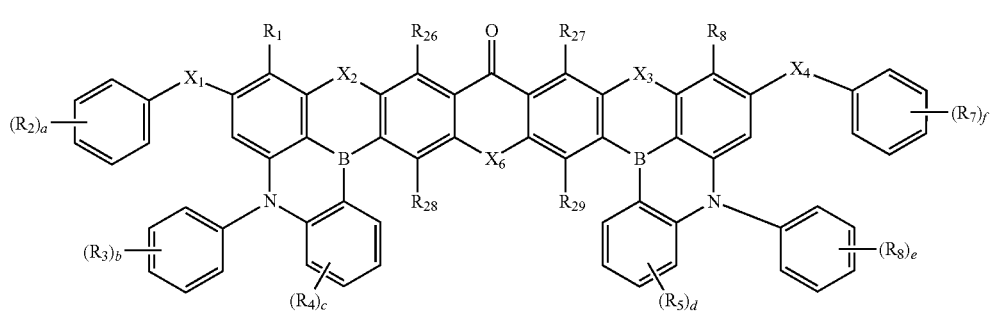

Formula 7-2

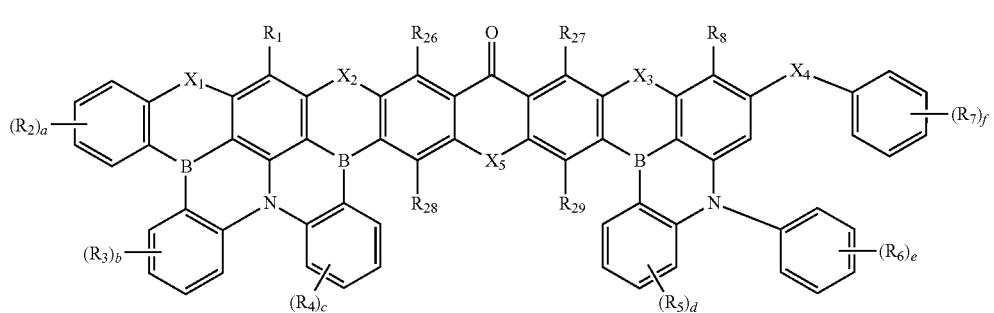

Formula 7-3

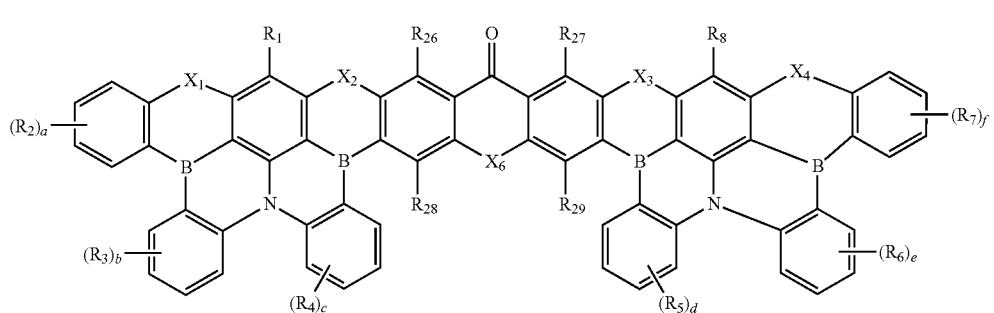

Compound Group 1
1-1
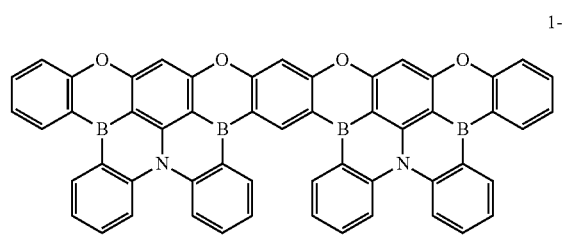
1-2
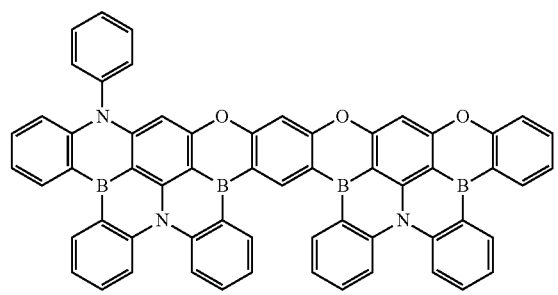
1-3
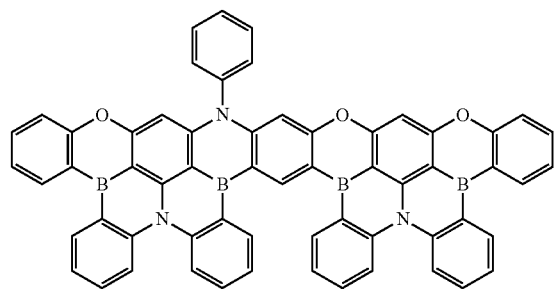
1-4
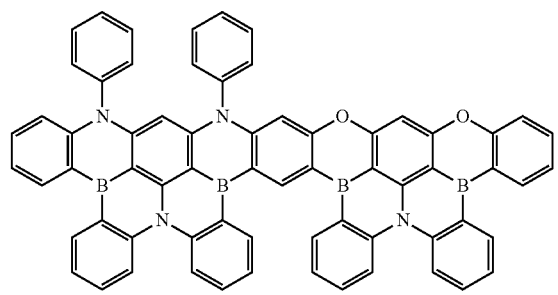
1-5
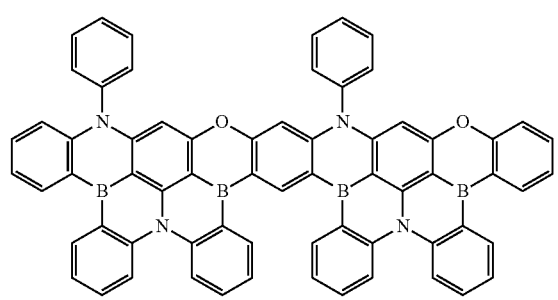
1-6
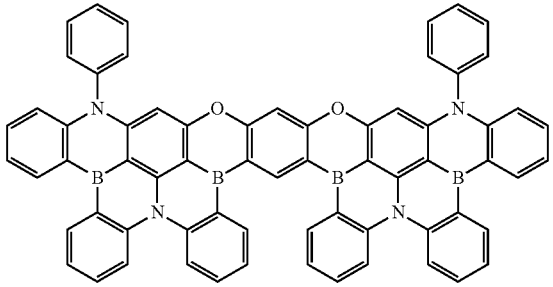
1-7
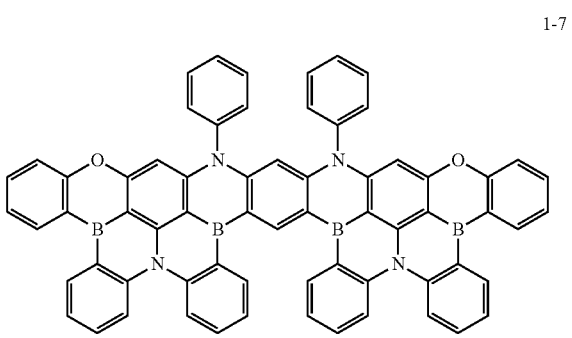
1-8
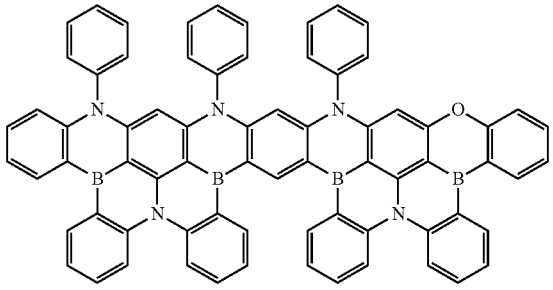
1-9
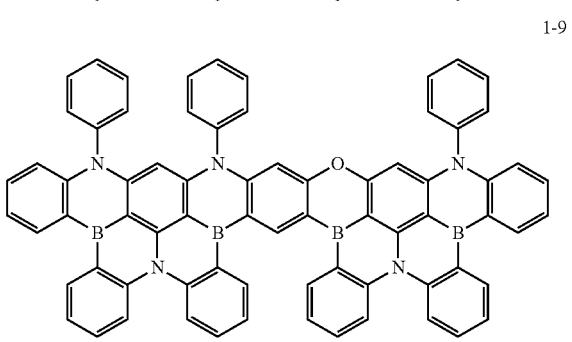
1-10
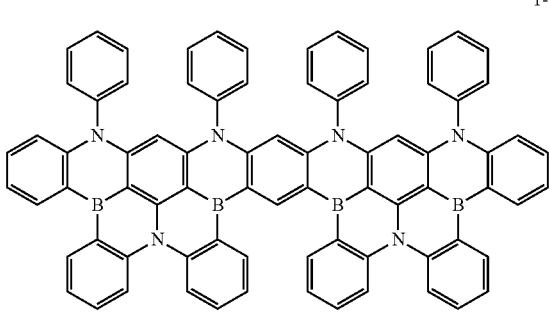

1-11
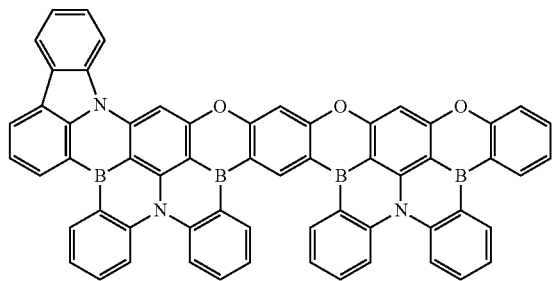
1-12
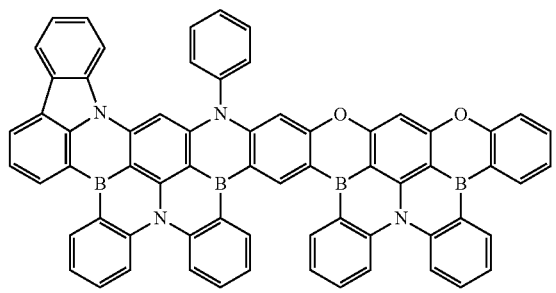
1-13
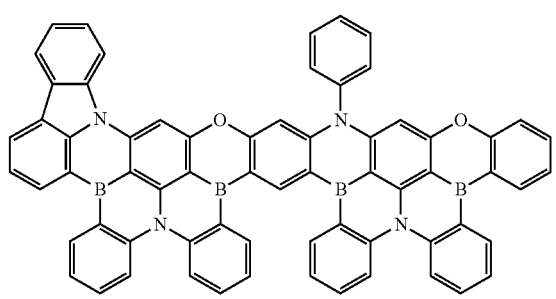
1-14
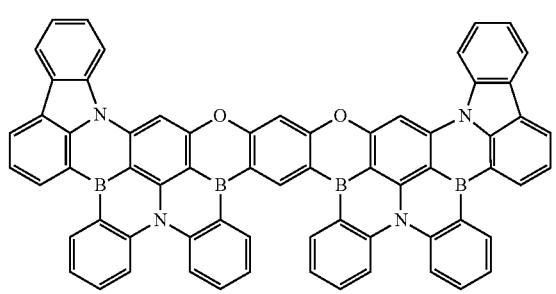
1-15
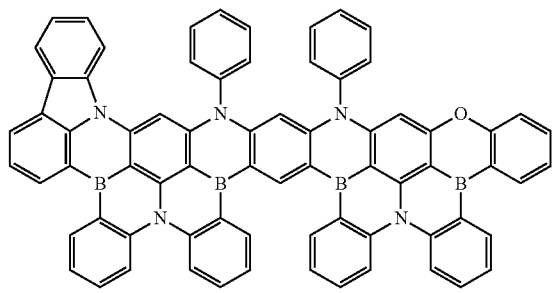
1-16
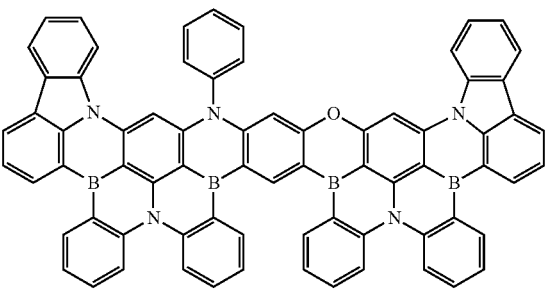
1-17
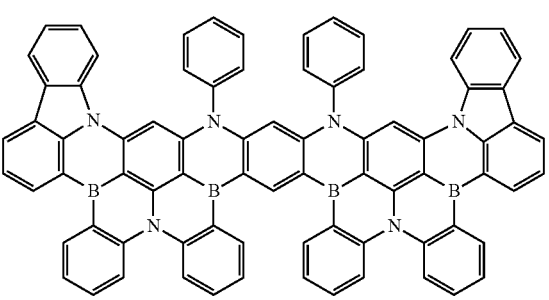
1-18
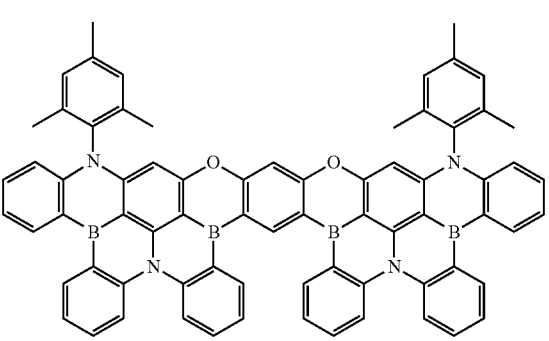
1-19
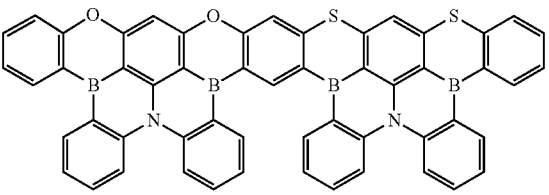
1-20
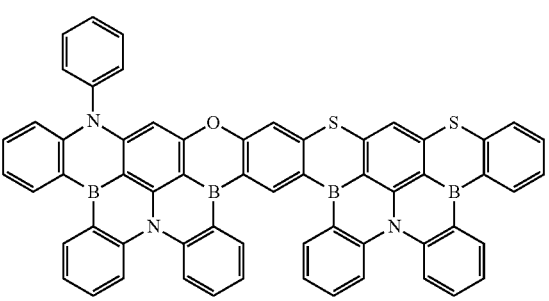

1-21
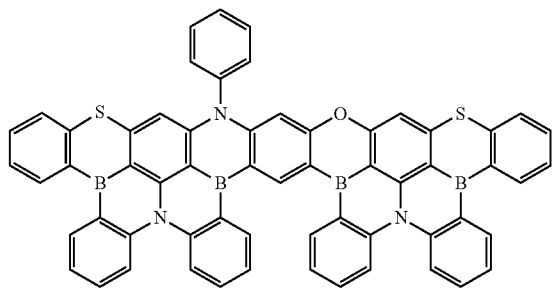
1-22
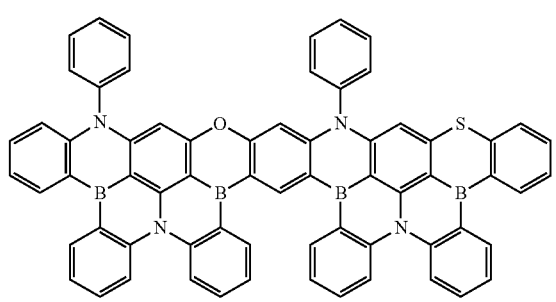
1-23
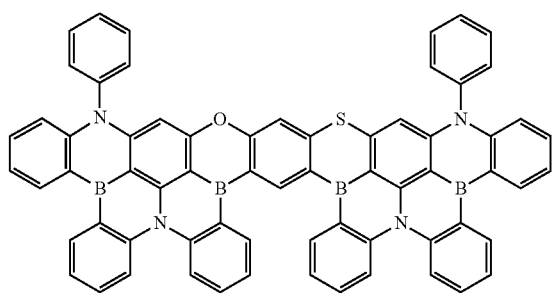
1-24
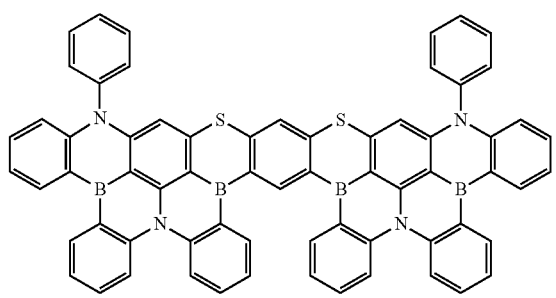
1-25
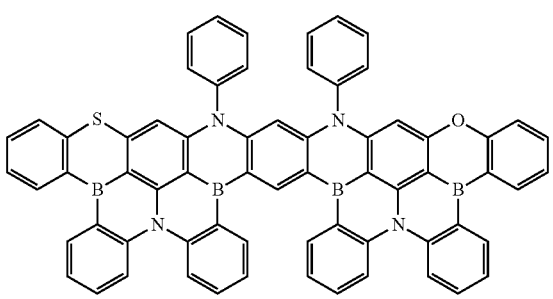
1-26
1-27
1-28
In an embodiment, the polycyclic compound represented by Formula 1 may be any one selected from the compounds represented in the following Compound Group 2, but embodiments of the present disclosure are not limited thereto:

Compound Group 2
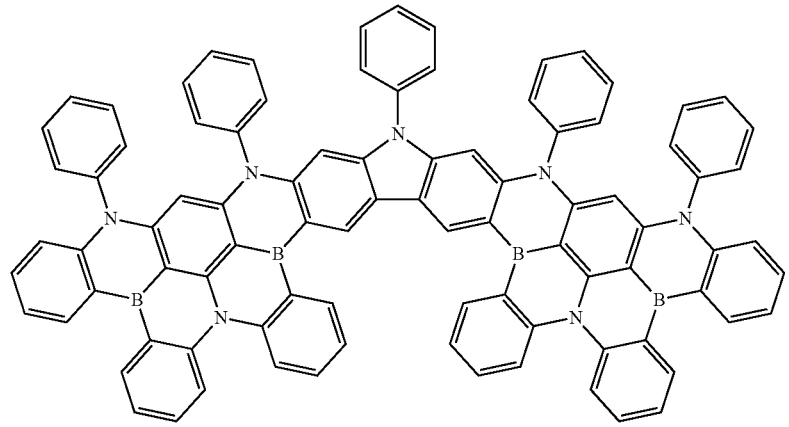
2-1
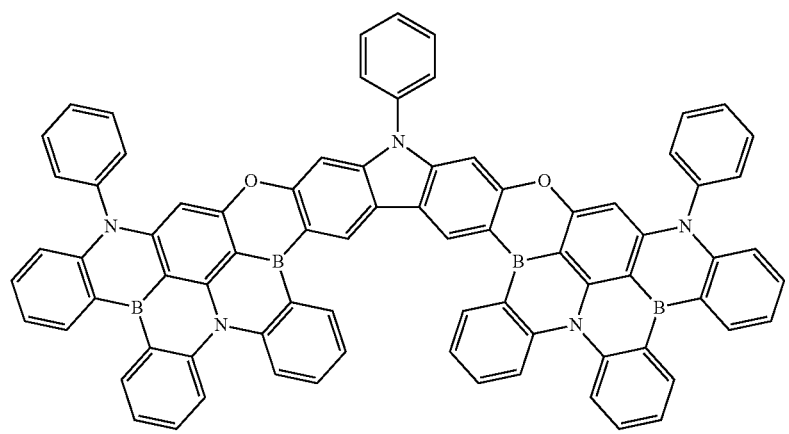
2-2
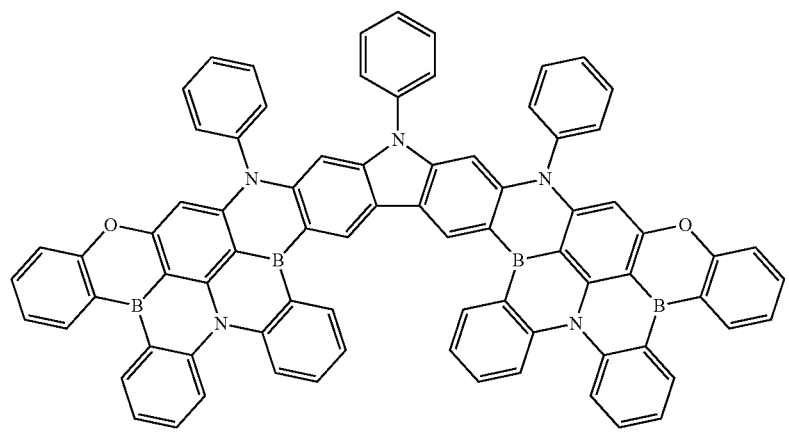
2-3

2-4
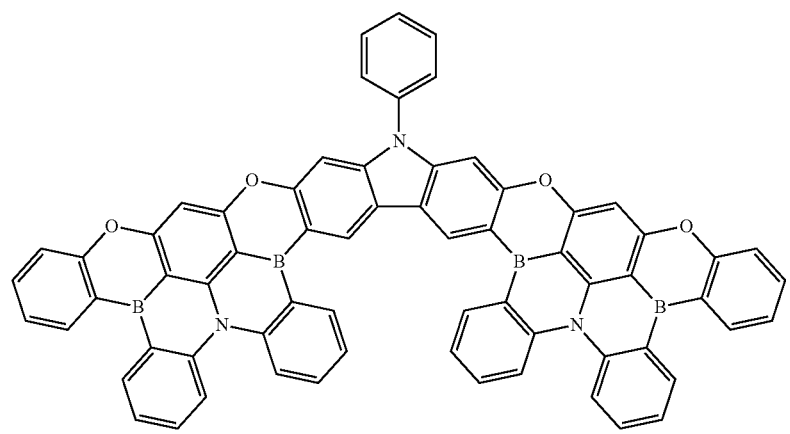
2-5
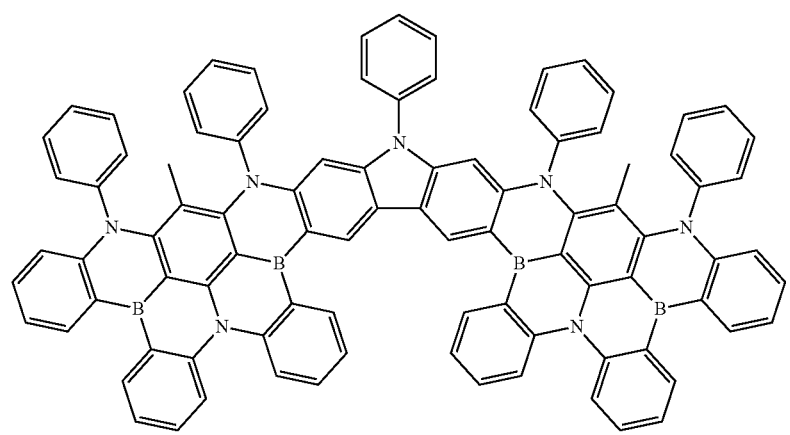
2-6
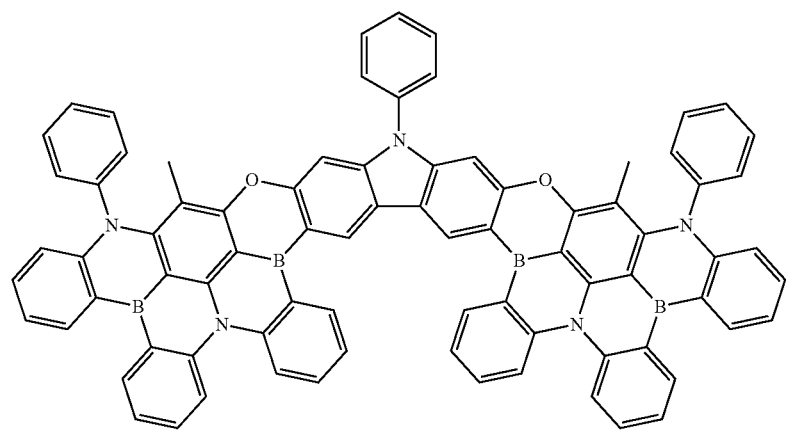

2-7
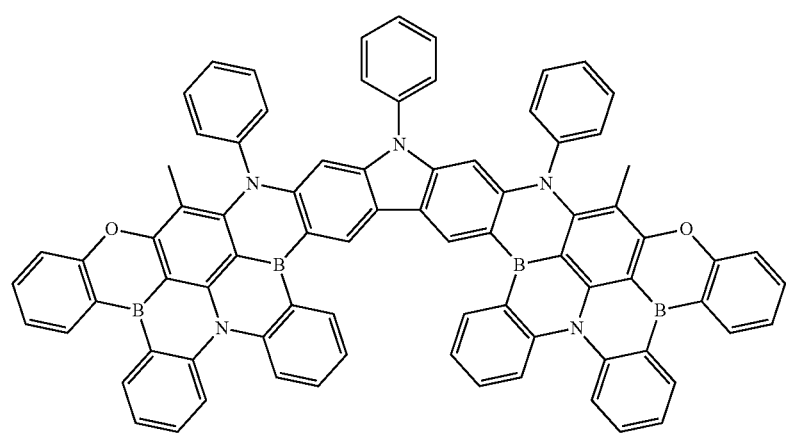
2-8
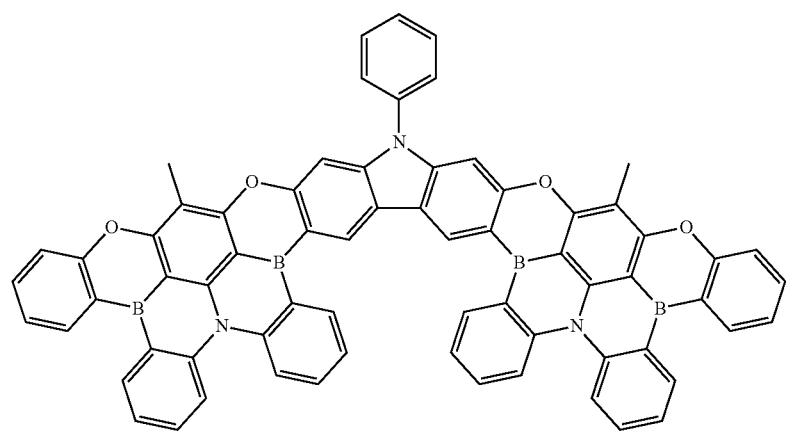
2-9
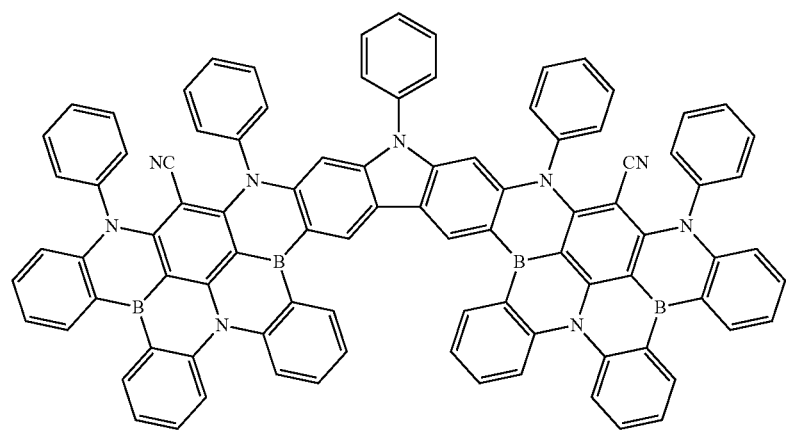

2-10
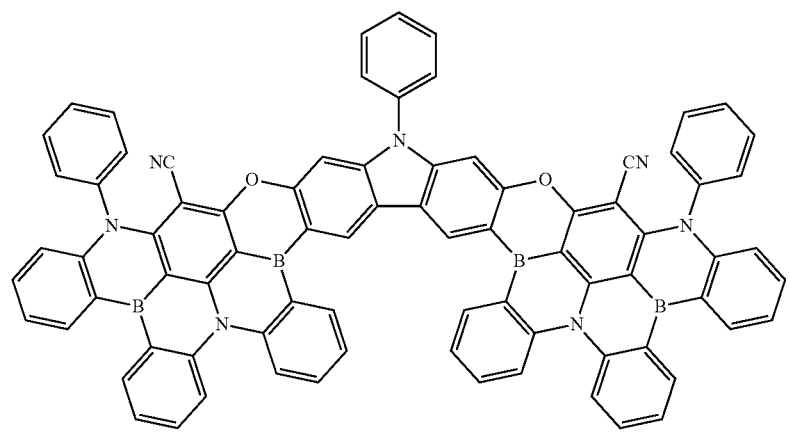
2-11
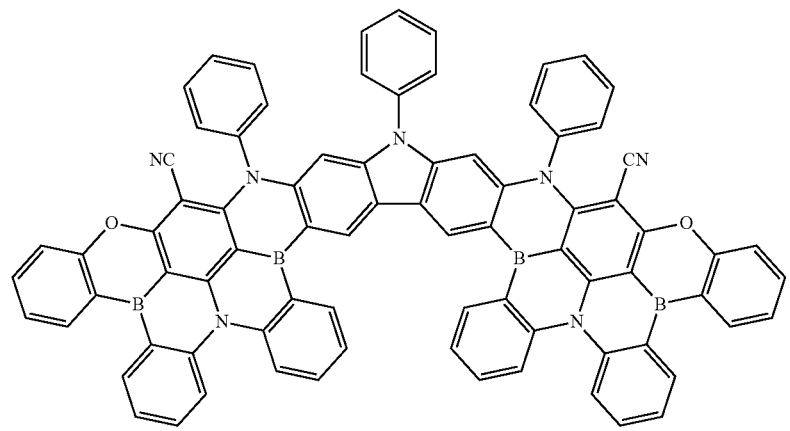
2-12
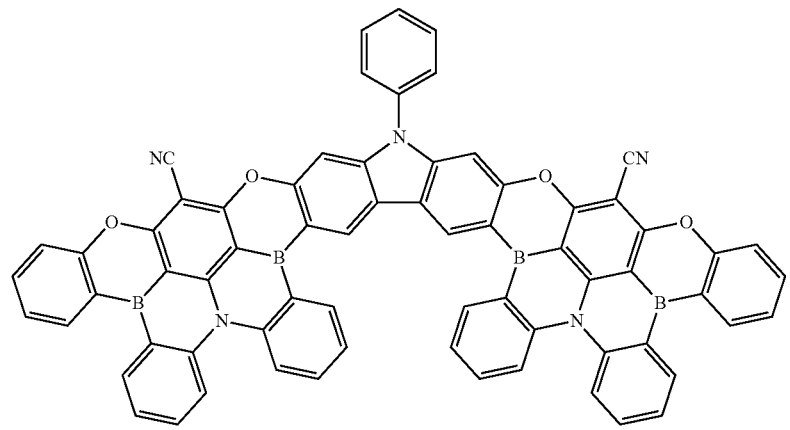

-continued
2-13
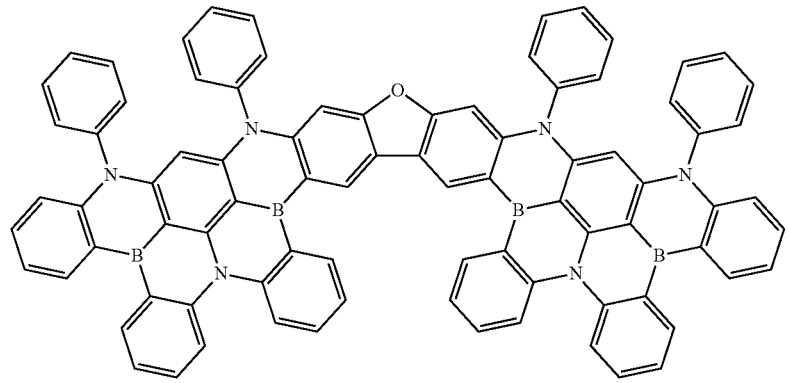
2-14
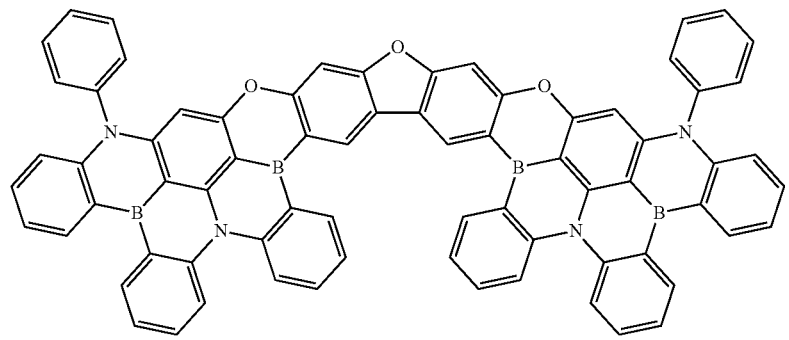
2-15
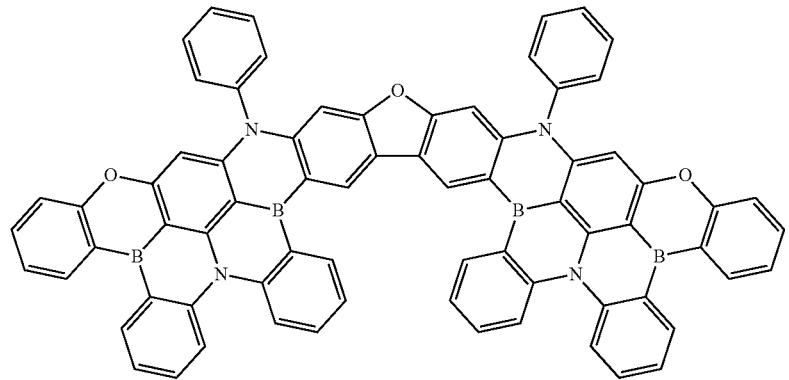
2-16
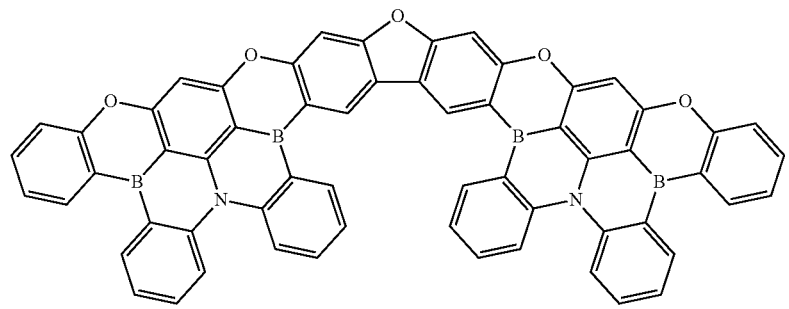

2-17
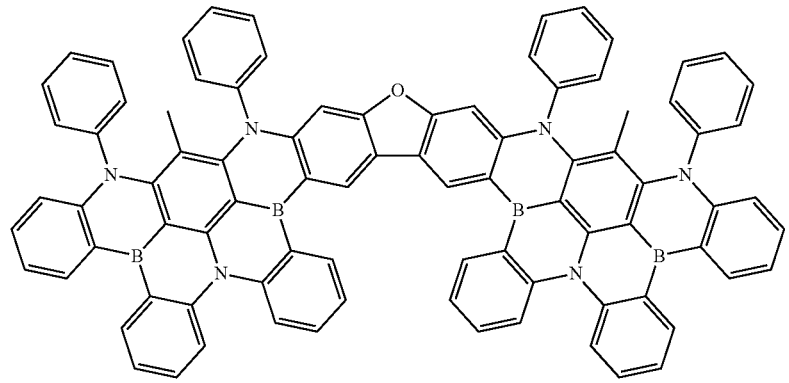
2-18
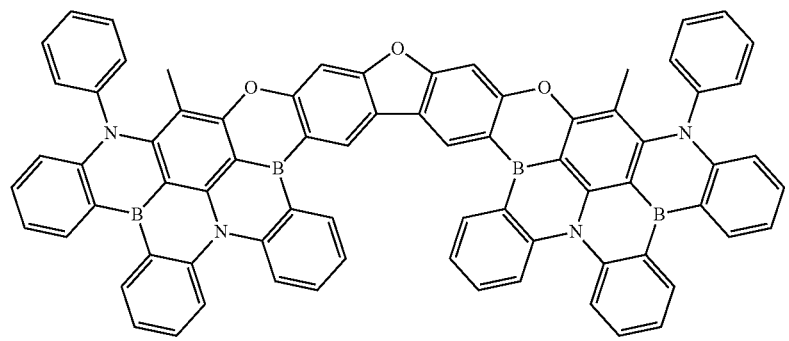
2-19
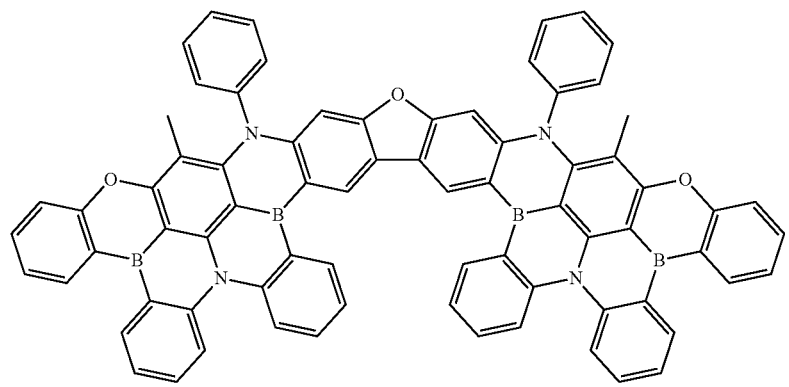
2-20
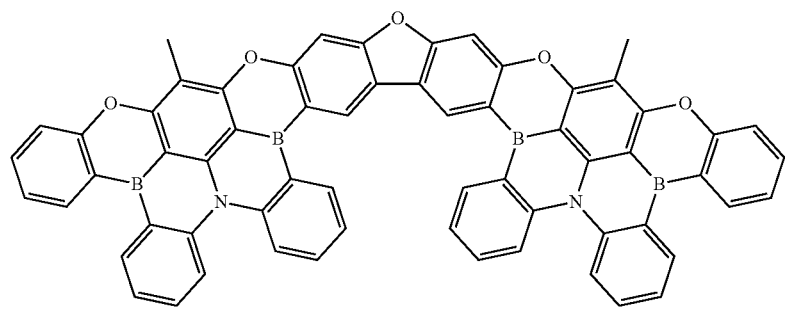

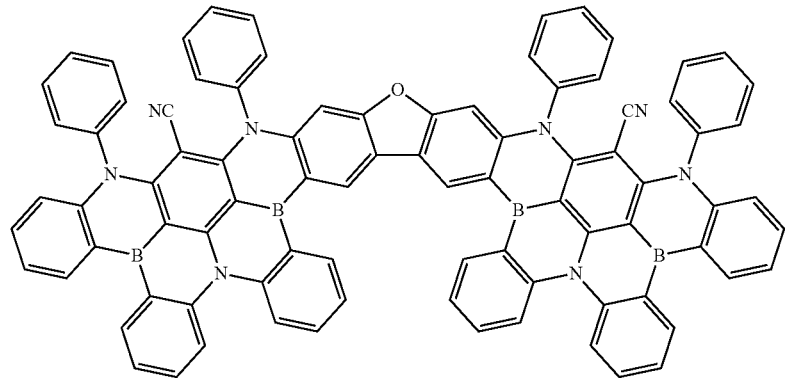
2-21
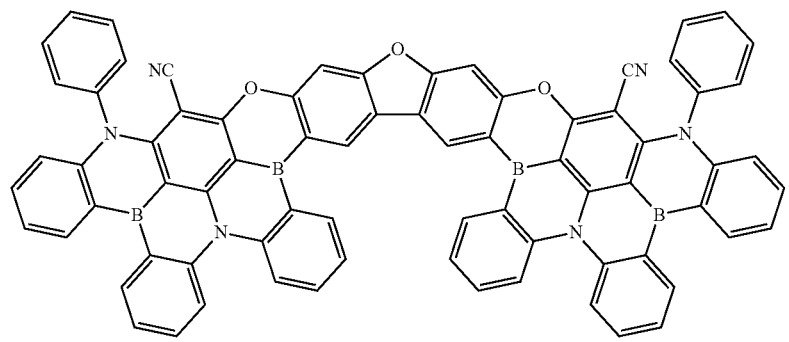
2-22
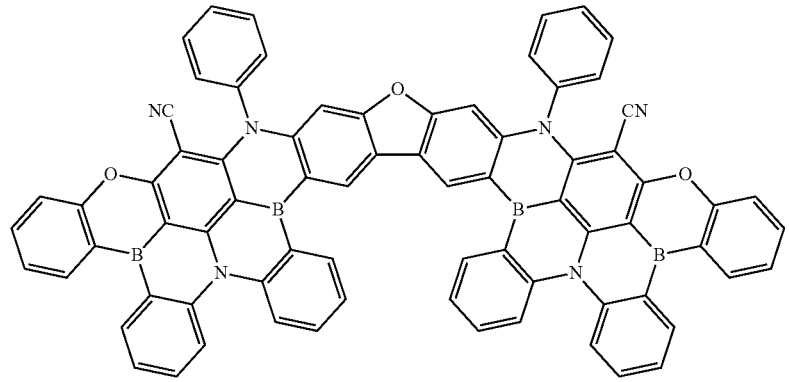
2-23
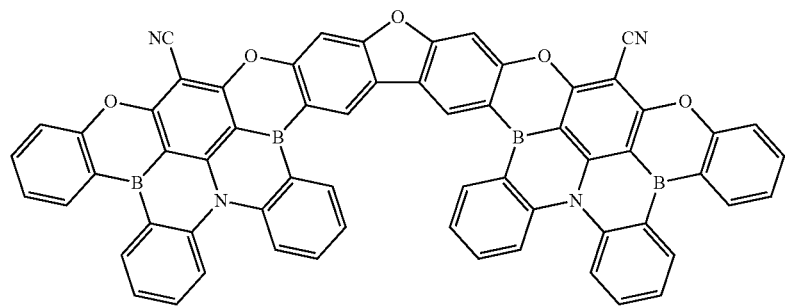
2-24

2-25
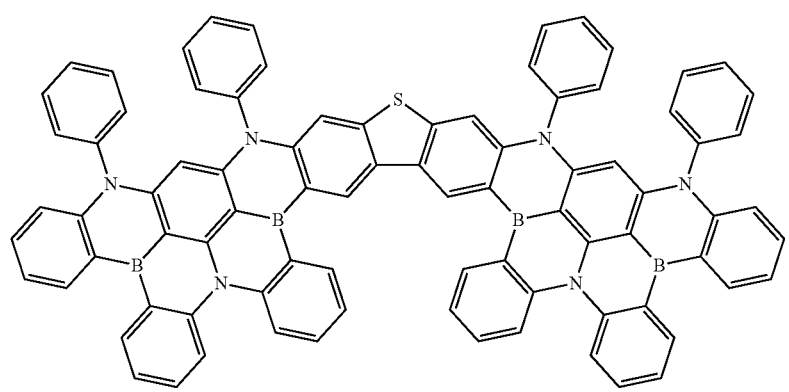
2-26
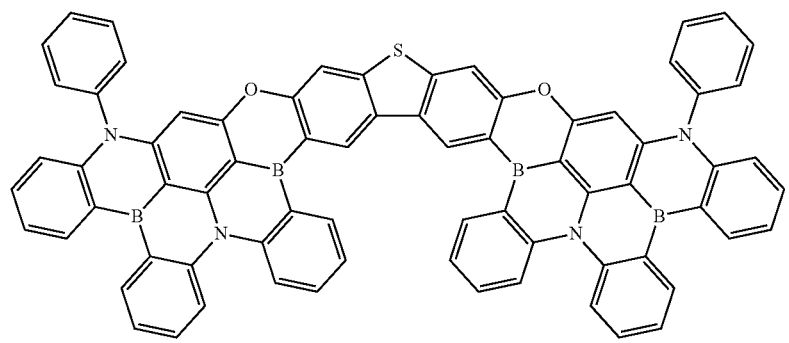
2-27
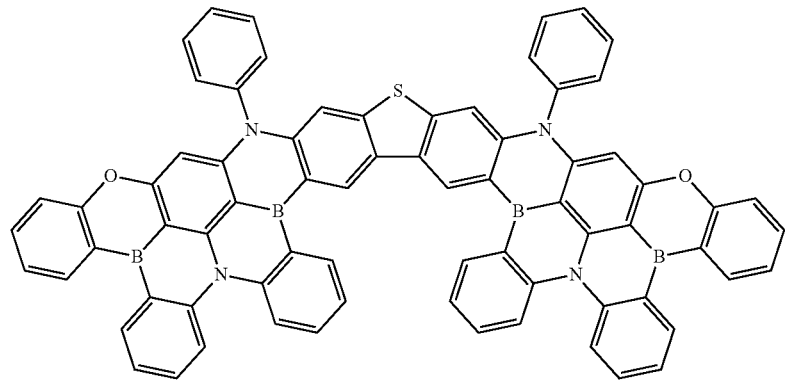
2-28
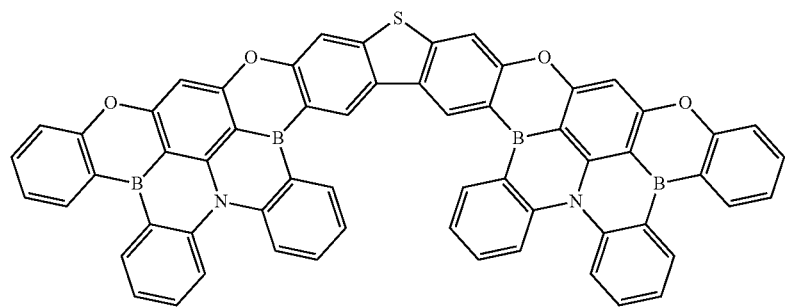

-continued
2-29
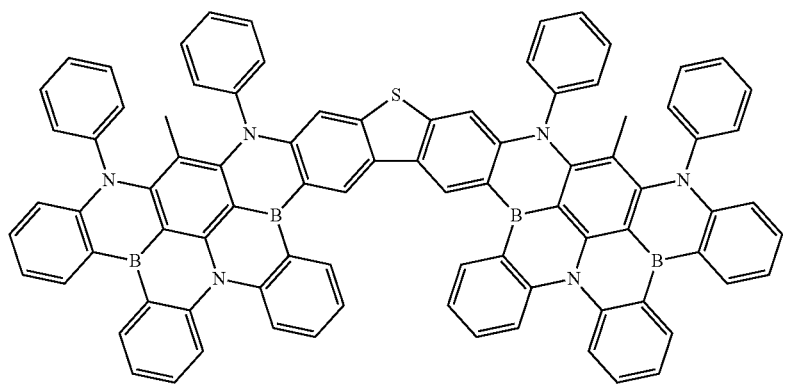
2-30
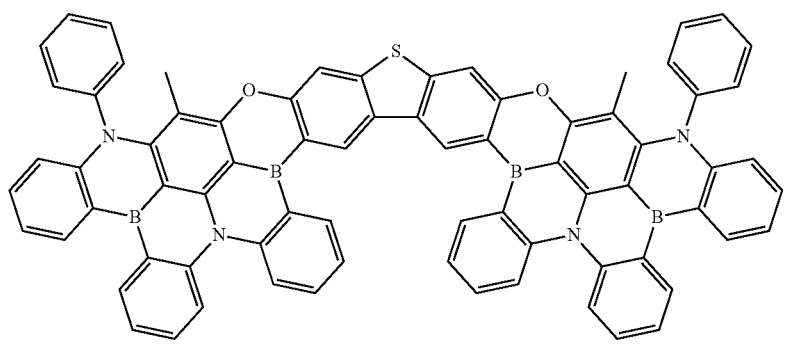
2-31
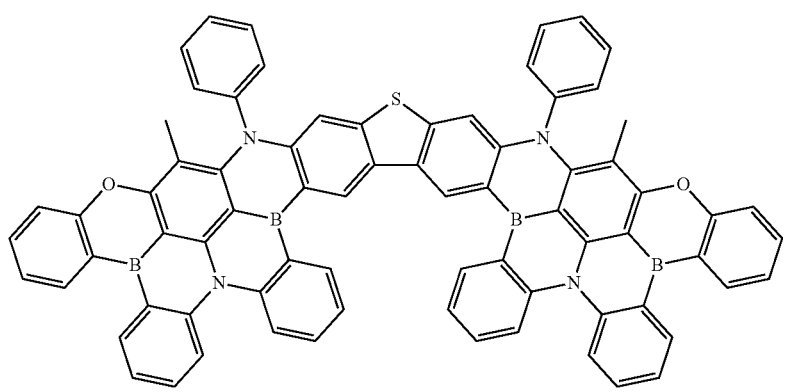
2-32
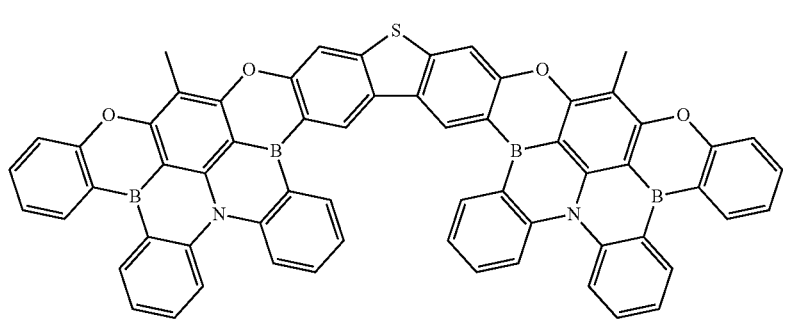

-continued
2-33
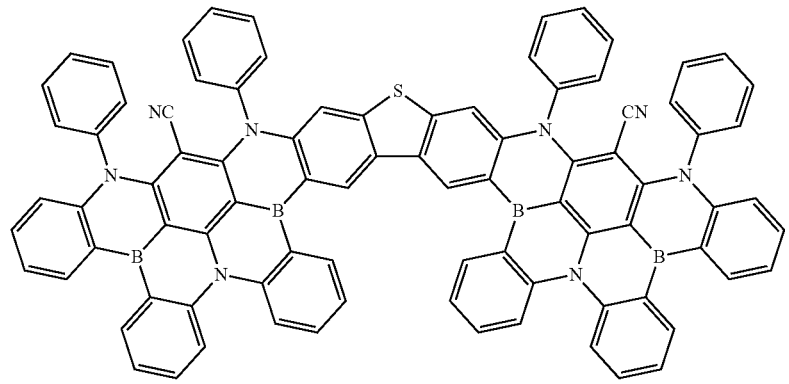
2-34
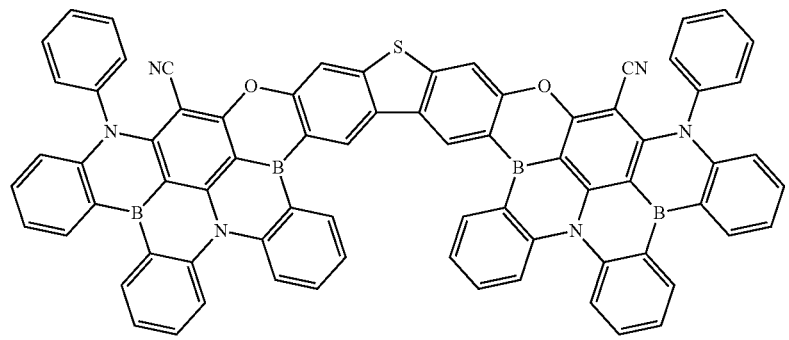
2-35
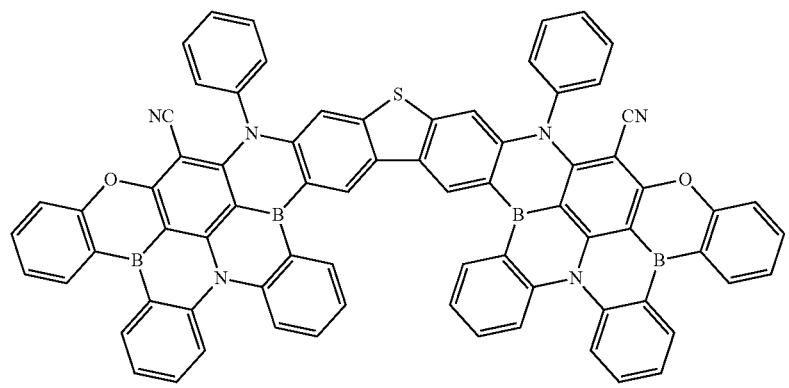
2-36
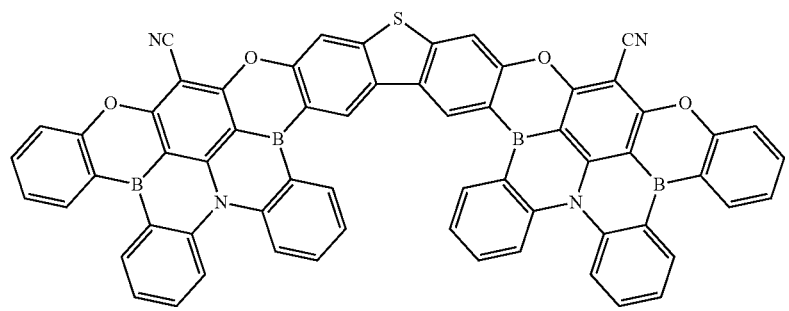

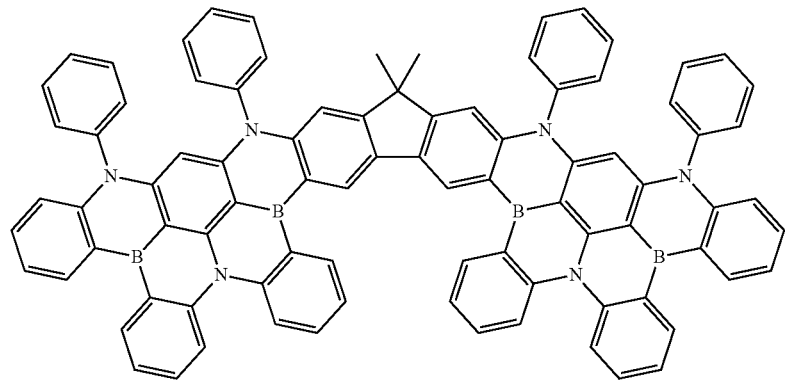
2-37
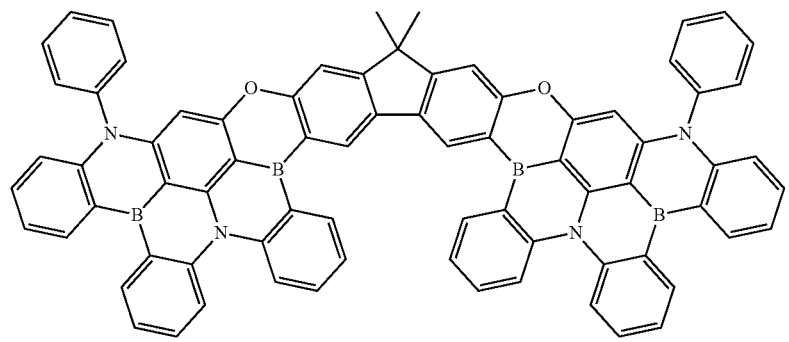
2-38
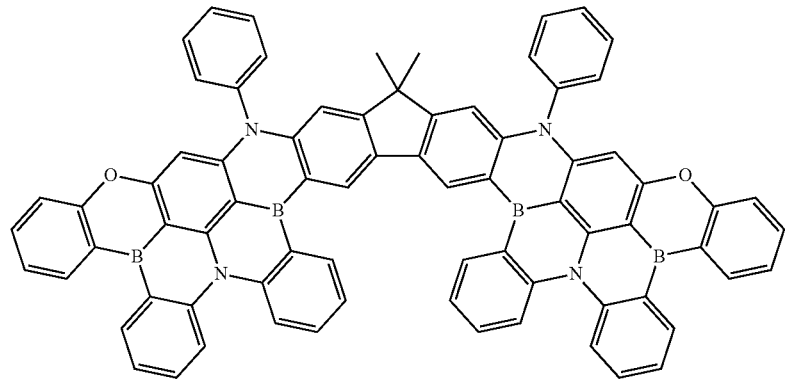
2-39
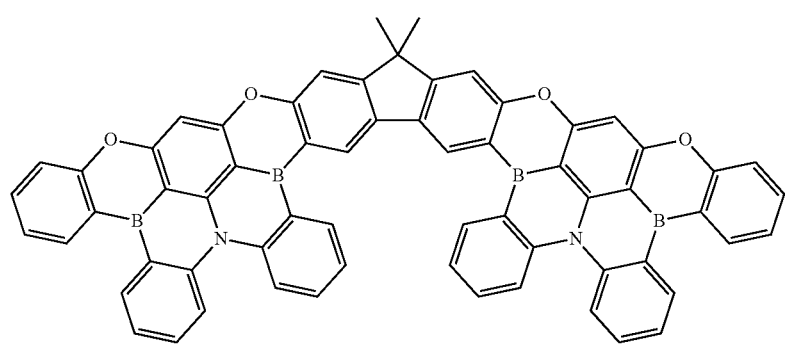
2-40

2-41
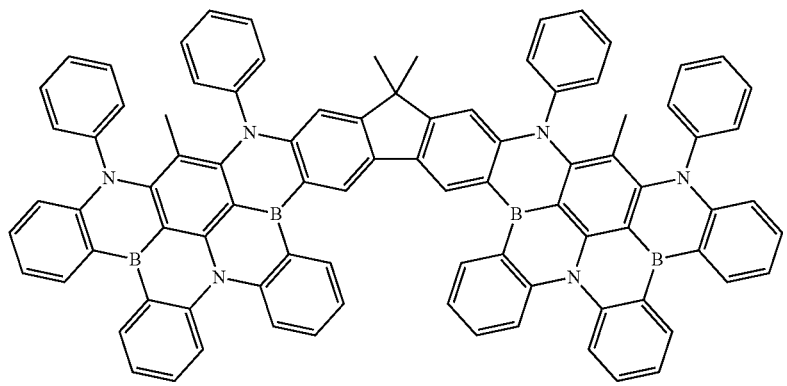
2-42
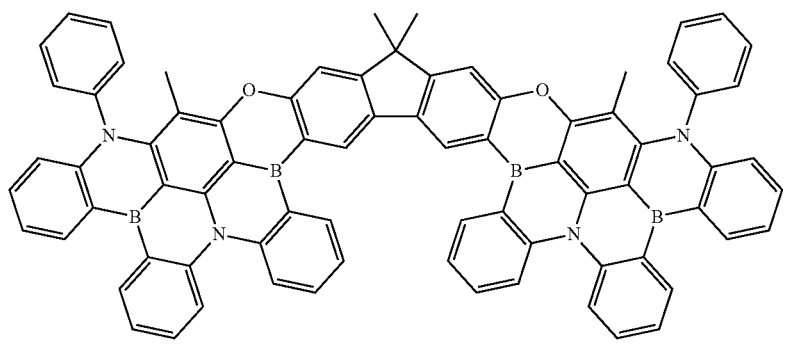
2-43
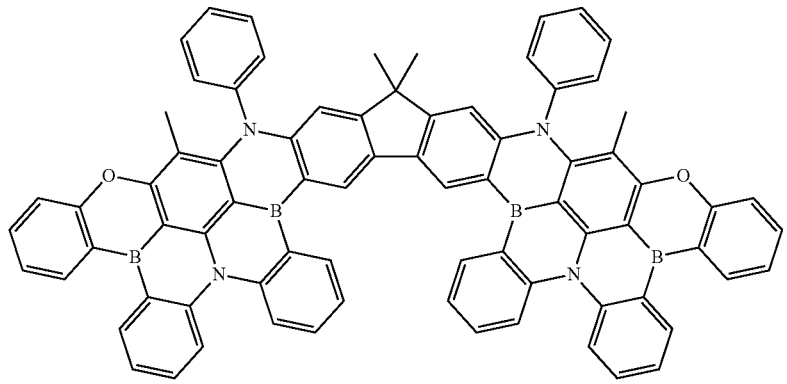
2-44
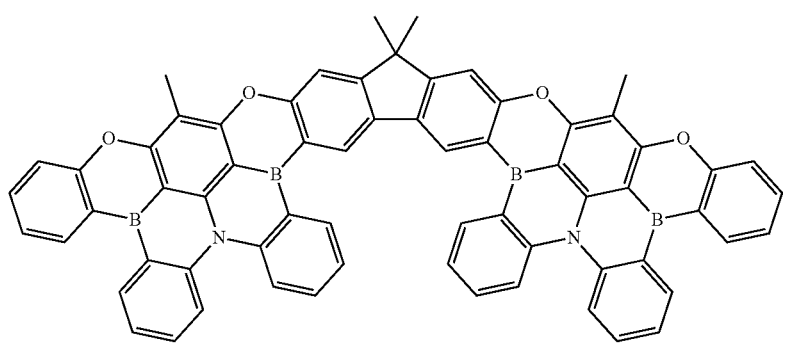

2-45
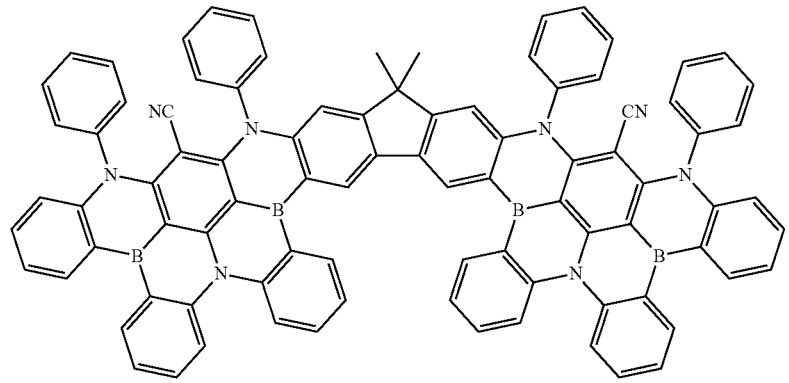
2-46
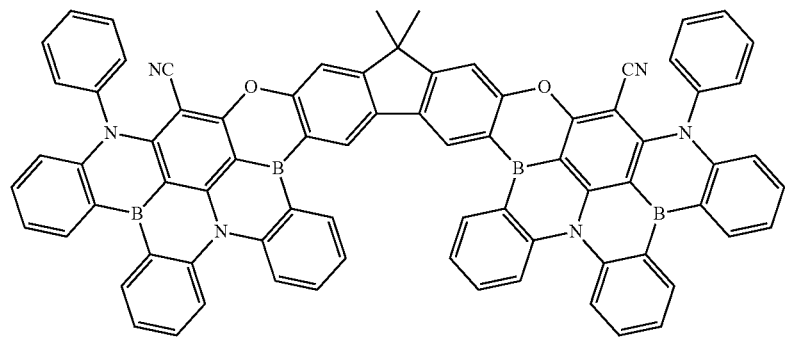
2-47
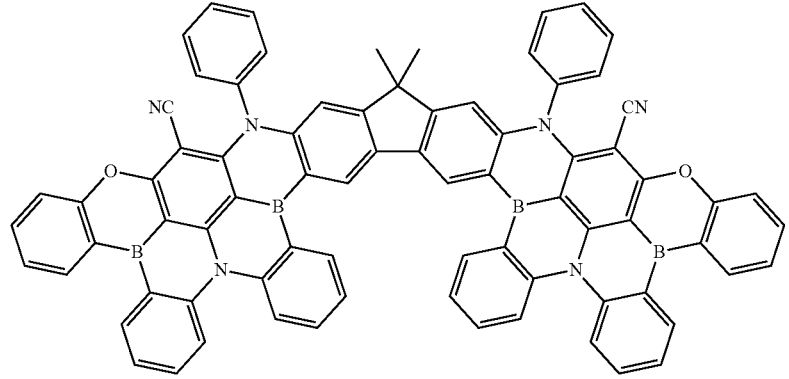
2-48
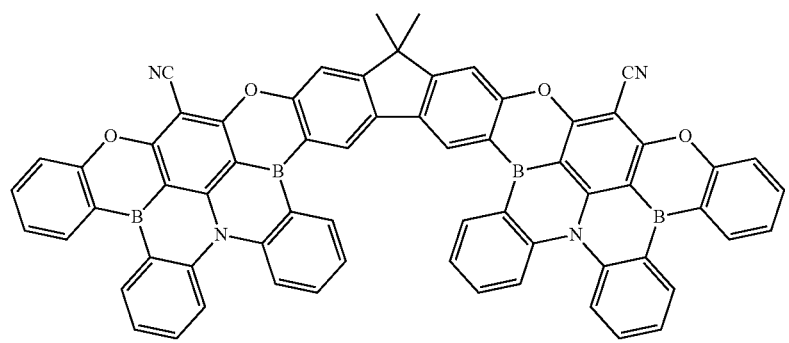

In an embodiment, the polycyclic compound represented by Formula 1 may be any one selected from the compounds represented in the following Compound Group 3, but embodiments of the present disclosure are not limited thereto:
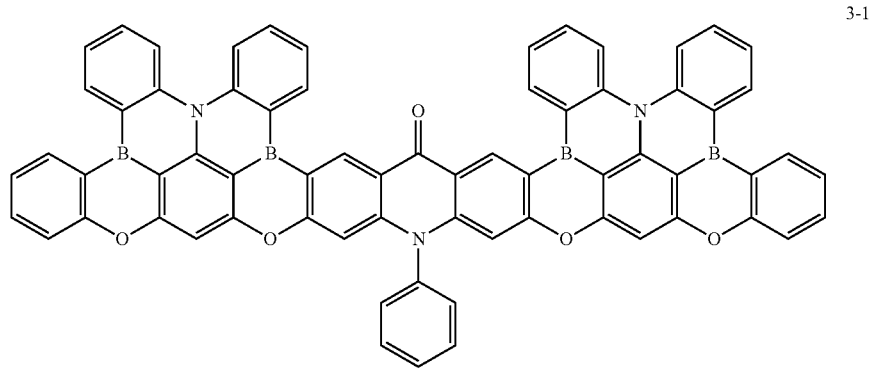
3-1
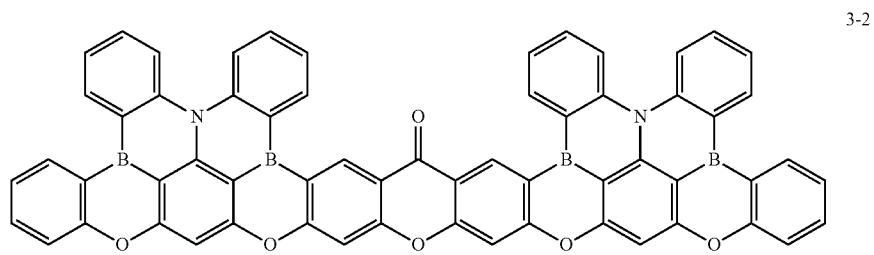
3-2
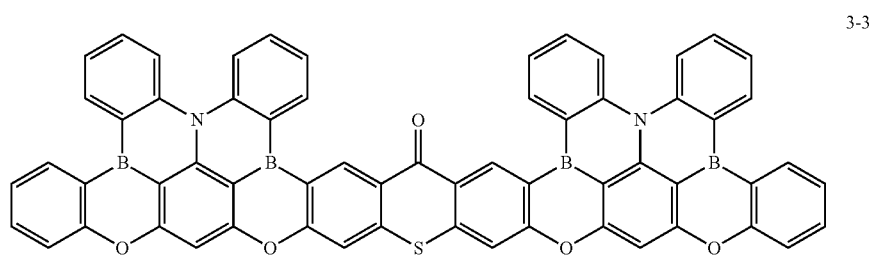
3-3
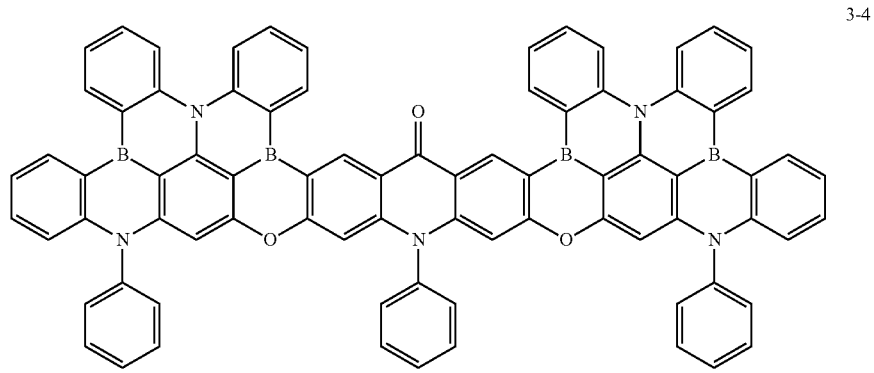
3-4

3-5
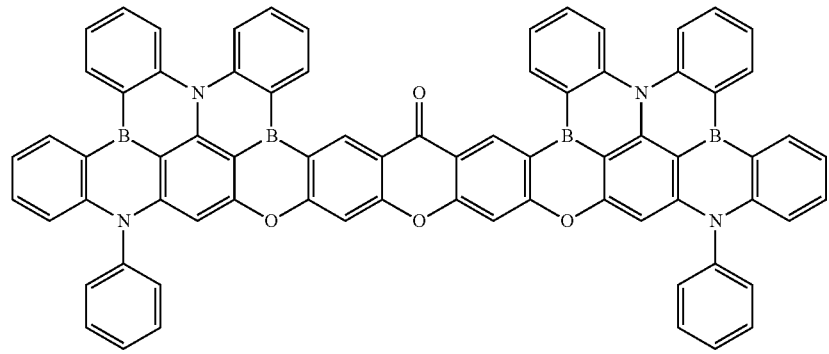
3-6
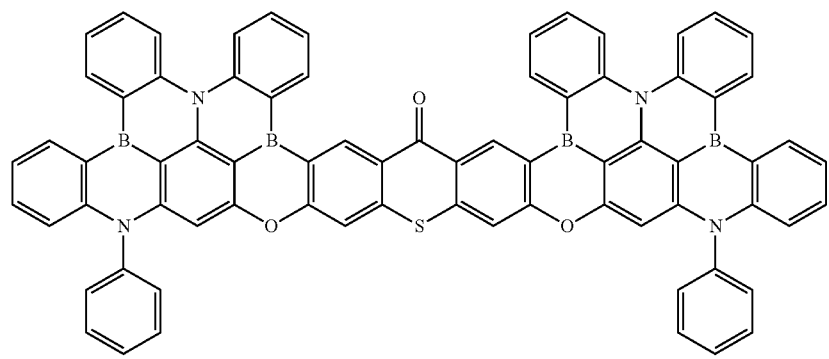
3-7
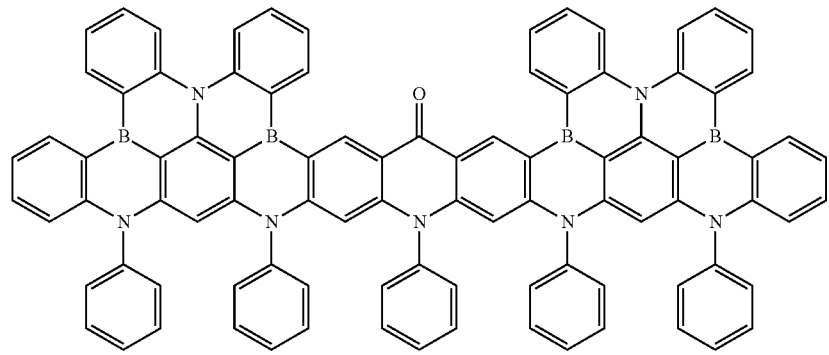
3-8
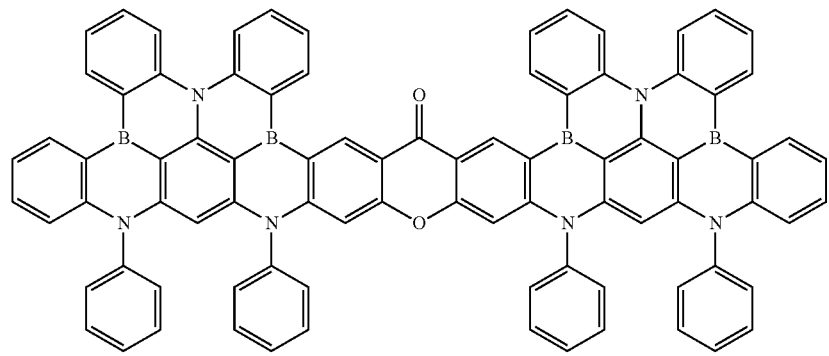

-continued
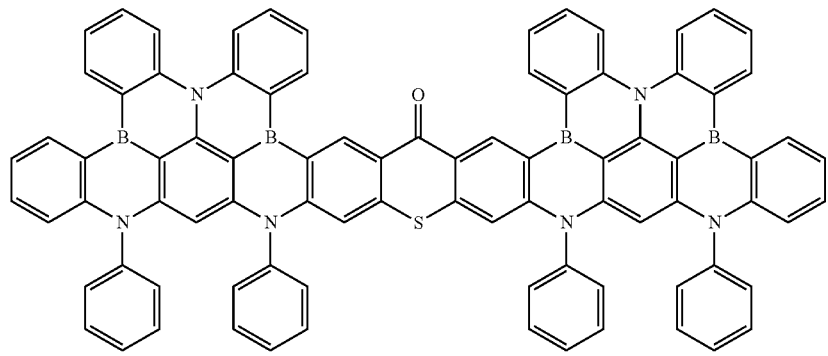
3-9
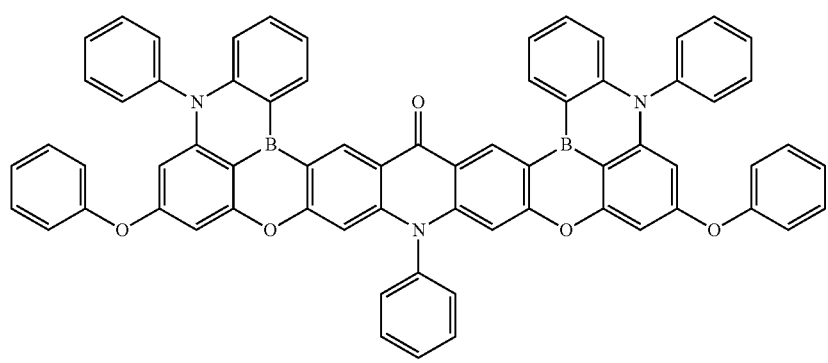
3-10
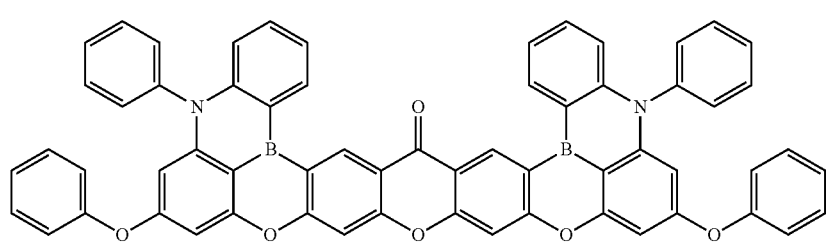
3-11
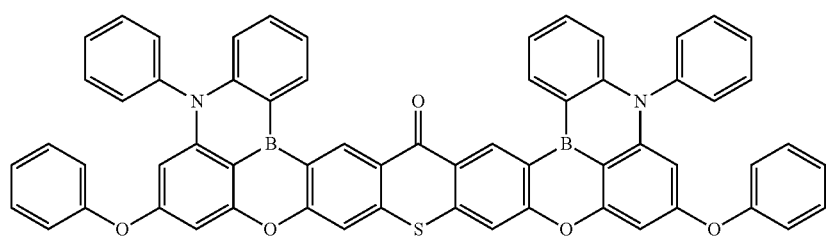
3-12
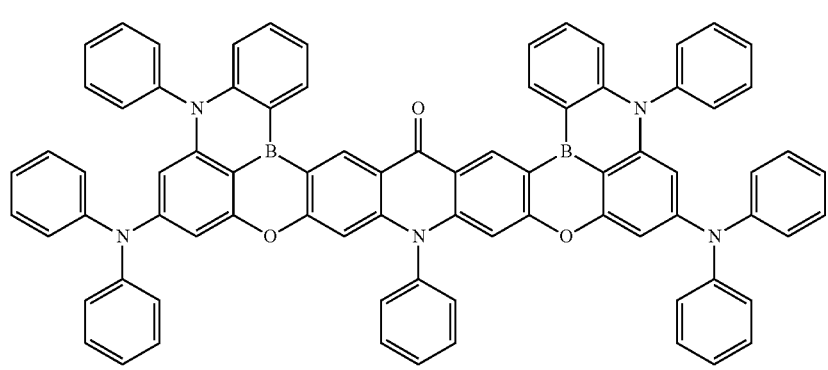
3-13

3-14
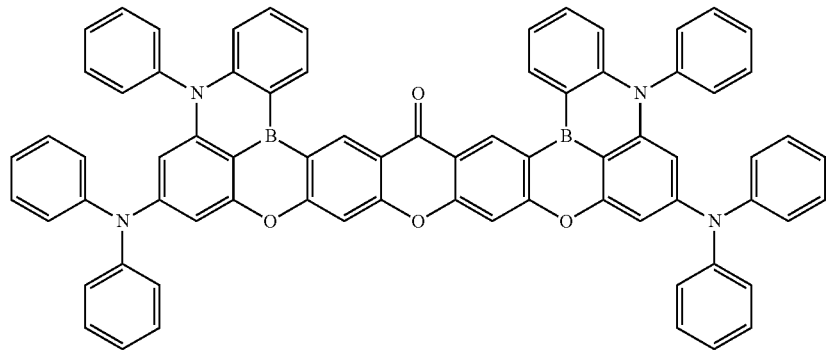
3-15
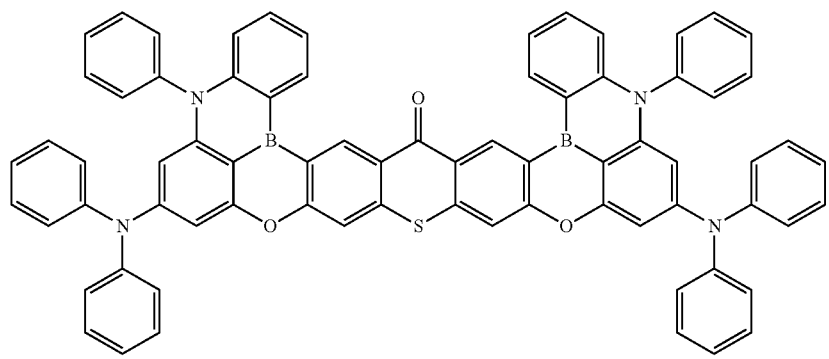
3-16
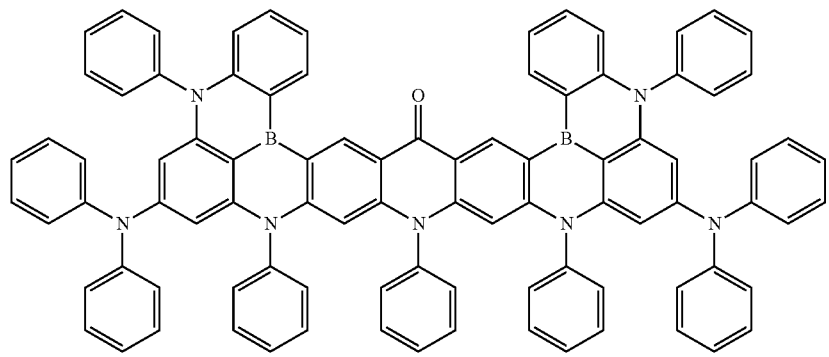
3-17
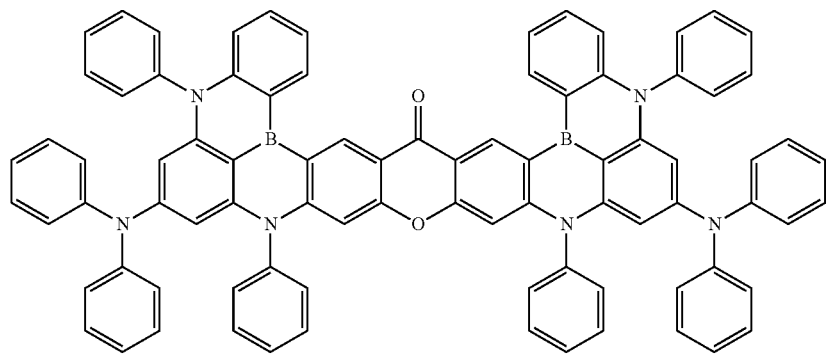

-continued
3-18
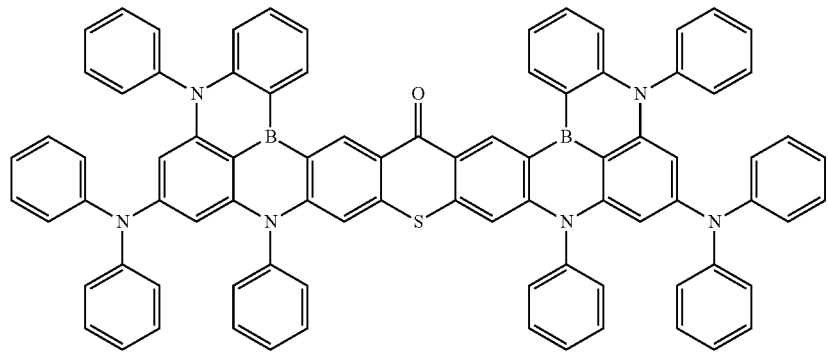
3-19
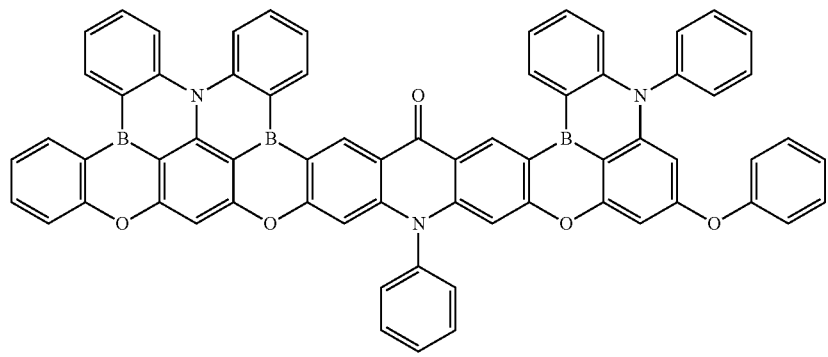
3-20
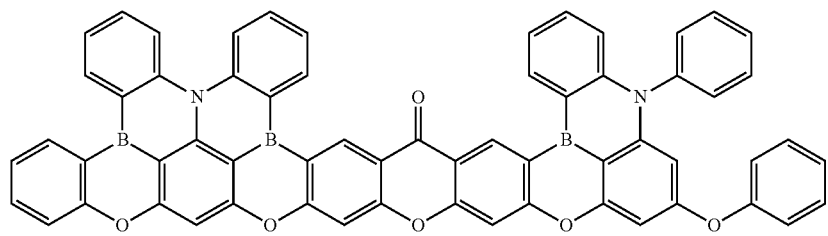
3-21
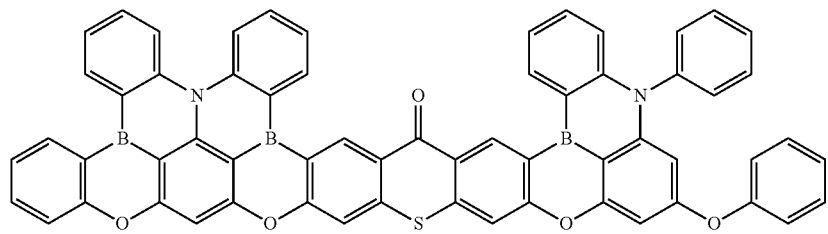
3-22
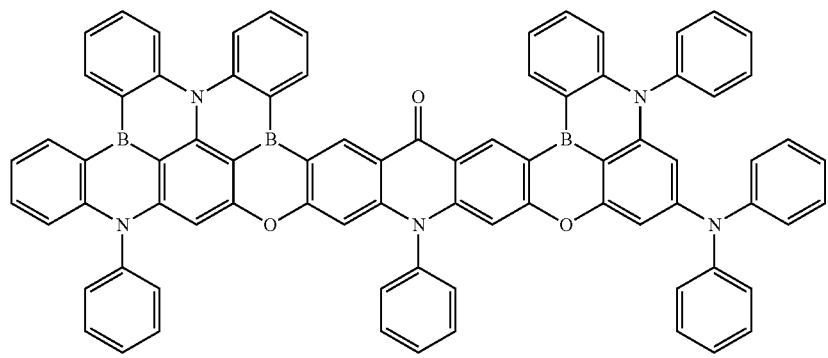

3-23
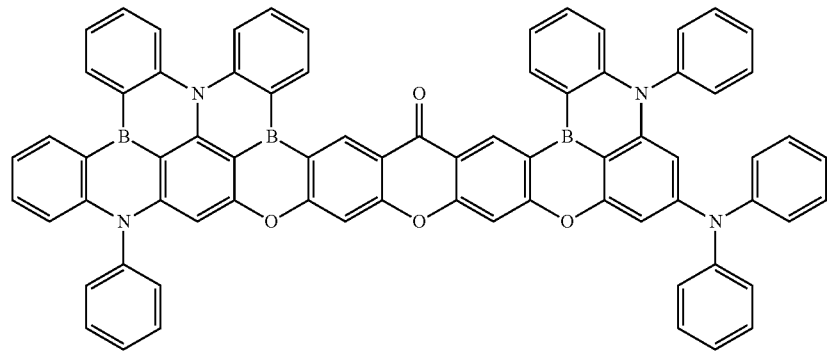
3-24
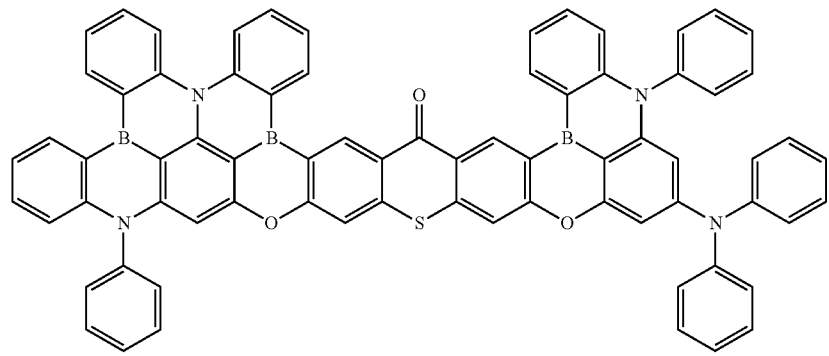
3-25
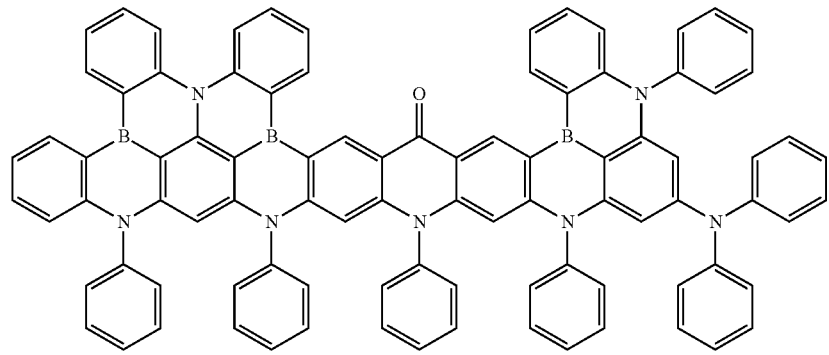
3-26
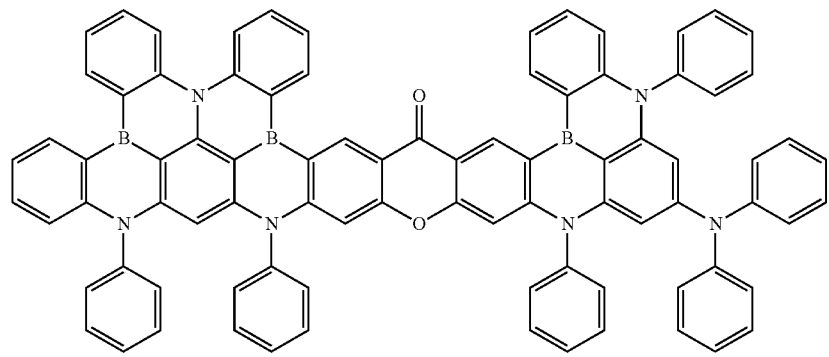

3-27
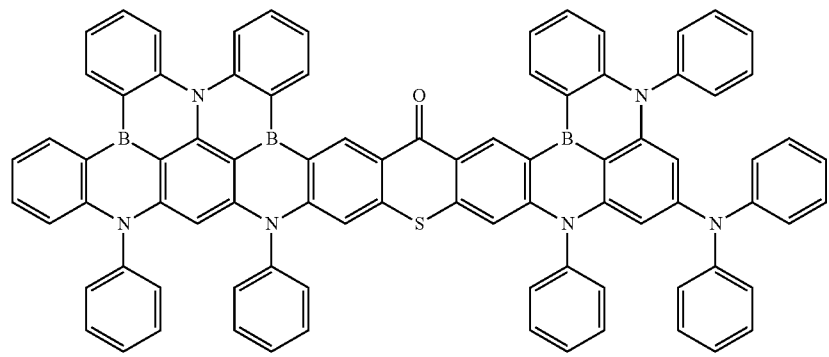
3-28
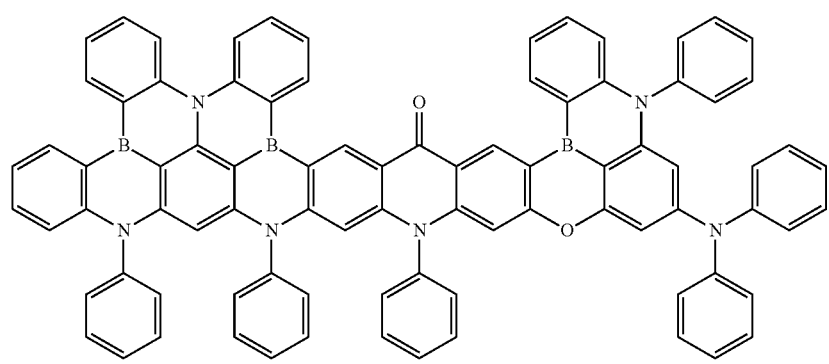
3-29
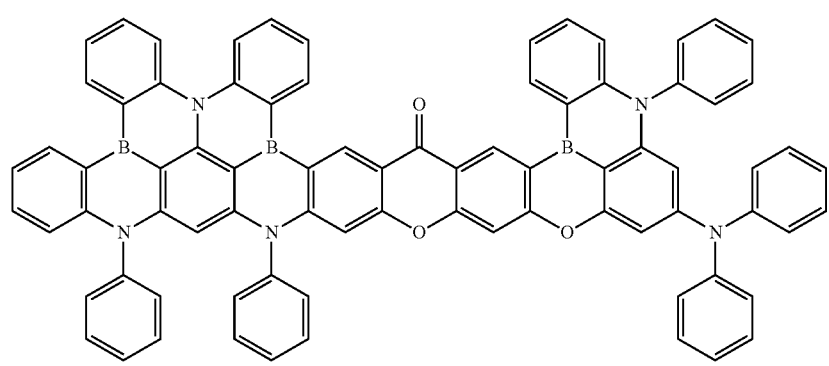
3-30
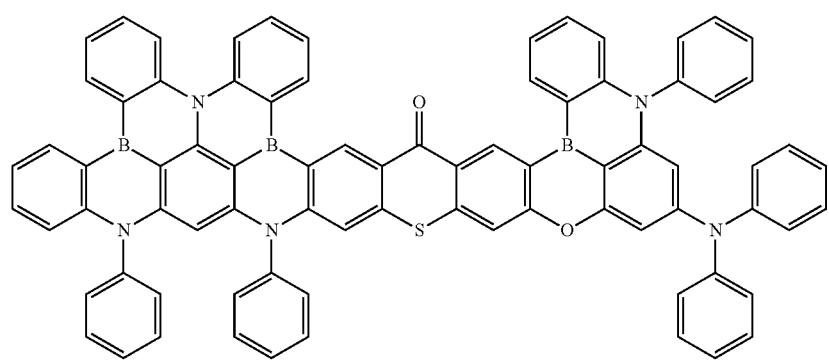

The aforementioned polycyclic compound may be utilized in an organic electroluminescence device 10 of an embodiment and may improve the efficiency and lifespan of the organic electroluminescence device. In one embodiment, the polycyclic compound may be utilized in the organic layer OL of the organic electroluminescence device 10 of an embodiment and may improve the emission efficiency, electron transport properties and lifespan of the organic electroluminescence device 10.

The organic layer OL may include one selected from two or more kinds of the polycyclic compound represented by Formula 1. For example, the organic layer OL may include at least one selected from the compounds represented in the aforementioned Compound Groups 1 to 3. In one embodiment, the organic layer OL may include one or more different polycyclic compounds, each represented by Formula 1.

Referring to FIG. 2 to FIG. 5 again, the organic layer OL may include a hole transport region HTR, an emission layer EML and an electron transport region ETR.

The hole transport region HTR is provided on the first electrode EL1. The hole transport region HTR may include a hole injection layer HIL, a hole transport layer HTL, a hole buffer layer, and/or an electron blocking layer EBL.

The hole transport region HTR may have a single layer formed utilizing a single material, a single layer formed utilizing a plurality of different materials, or a multilayer structure including a plurality of layers formed utilizing a plurality of different materials.

For example, the hole transport region HTR may have the structure of a single layer of a hole injection layer HIL or a hole transport layer HTL, and may have a structure of a single layer formed utilizing a hole injection material and a hole transport material. In one embodiment, the hole transport region HTR may have a structure of a single layer formed utilizing a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL. However, embodiments of the present disclosure are not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino] triphenylamine (m-MTDATA), 4,4',4''-tris(N,N-diphenylamino)triphenylamine (TDATA), 4,4',4''-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPD), triphenylamine-containing polyetherketone (TPAPEK), 4-isopropyl-4'-methyldiphenyliodonium [tetrakis(pentafluorophenyl)borate], and/or dipyrazino[2,3-f:2',3'-h]quinoxaline-2,3,6,7,10,11-hexacarbonitrile (HAT-CN).

The hole transport layer HTL may include common materials (e.g., well-known in the art). For example, carbazole derivatives (such as N-phenyl carbazole and/or polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4',4''-tris(N-carbazolyl)triphenylamine (TCTA)), N,N'-di(naphthalene-1-yl)-N,N'-diphenyl-benzidine (NPD), 4,4'-cyclohexylidene bis[N,N-bis(4-methylphenyl)benzenamine (TAPC), 4,4'-bis[N,N'-(3-tolyl)amino]-3,3'-dimethylbiphenyl (HMTPD), 1,3-bis(N-carbazolyl)benzene (mCP), etc., may be further included.

The electron blocking layer EBL may include, for example, carbazole derivatives (such as N-phenyl carbazole and/or polyvinyl carbazole), fluorine-based derivatives, N,N'-bis(3-methylphenyl)-N,N'-diphenyl-[1,1-biphenyl]-4, 4'-diamine (TPD), triphenylamine-based derivatives (such as 4,4',4''-tris(N-carbazolyl)triphenylamine (TCTA)), N,N'-di(1-naphthalene-1-yl)-N,N'-diphenyl-benzidine (NPD), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), and/or mCP.

The thickness of the hole transport region HTR may be from about 50 Å to about 15,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. When the thicknesses of the hole transport region HTR, the hole injection layer HIL, the hole transport layer HTL and the electron blocking layer EBL each satisfy the above-described ranges, satisfactory hole transport properties may be achieved without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, etc. For example, non-limiting examples of the p-dopant may include quinone derivatives (such as tetracyanoquinodimethane (TCNQ) and/or 2,3,5,6-tetrafluoro-7,7',8,8'-tetracyanoquinodimethane (F4-TCNQ)), metal oxides (such as tungsten oxide and/or molybdenum oxide), etc.

As described above, the hole transport region HTR may further include at least one of a hole buffer layer or an electron blocking layer EBL in addition to the hole injection layer HIL and the hole transport layer HTL. The hole buffer layer may compensate a resonance distance according to the wavelength of light emitted from an emission layer EML and may increase light emission efficiency. Materials which may be included in the hole transport region HTR may be utilized as materials included in the hole buffer layer. The electron blocking layer EBL is a layer playing the role of preventing or substantially preventing the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed utilizing a single material, a single layer formed utilizing a plurality of different materials, or a multilayer structure having a plurality of layers formed utilizing a plurality of different materials.

The emission layer EML may emit one selected from red light, green light, blue light, white light, yellow light and cyan light. The emission layer EML may include a fluorescence emission material or a phosphorescence emission material.

In an embodiment, the emission layer EML may be a fluorescence emission layer. For example, light emitted from the emission layer EML may be partially due to thermally activated delayed fluorescence (TADF). That is, a portion of the light emitted from the emission layer EML may be emitted as a result of thermally activated delayed fluorescence (TADF). In one embodiment, the emission layer EML may include a light-emitting component emitting thermally activated delayed fluorescence. In an embodiment, the emission layer EML may be a blue light emission layer emitting thermally activated delayed fluorescence.

The emission layer EML of the organic electroluminescence device 10 of an embodiment may include the polycyclic compound according to an embodiment of the present disclosure. In one embodiment, the polycyclic compound may be utilized in the emission layer EML of the organic electroluminescence device 10 of an embodiment and may improve the emission efficiency and lifespan of the organic electroluminescence device 10.

The emission layer EML may include one kind or two or more kinds of the polycyclic compounds represented by Formula 1. For example, the emission layer EML may include at least one selected from the compounds represented in the above-described Compound Groups 1 to 3. In one embodiment, the emission layer EML may include one or more different polycyclic compounds, each represented by Formula 1.

In an embodiment, the emission layer EML may include a host and a dopant, the host may be a host for emitting delayed fluorescence, and the dopant may be a dopant for emitting delayed fluorescence. Meanwhile, the polycyclic compound of an embodiment, represented by Formula 1, may be included as the dopant material of the emission layer EML. For example, the polycyclic compound of an embodiment, represented by Formula 1, may be utilized as a TADF dopant.

In one embodiment, the organic electroluminescence device 10 of an embodiment may include a plurality of emission layers. The plurality of emission layers may be stacked in order and to provide, for example, an organic electroluminescence device 10 that may emit white light. The organic electroluminescence device including a plurality of emission layers may be an organic electroluminescence device with a tandem structure. When the organic electroluminescence device 10 includes a plurality of emission layers, at least one emission layer EML may include the polycyclic compound according to the present disclosure.

The emission layer EML may further include a dopant, and the dopant may use a suitable (e.g., well-known) material. For example, the dopant may be selected from styryl derivatives (for example, 1,4-bis[2-(3-N-ethylcarbazoryl)vinyl]benzene (BCzVB), 4-(di-p-tolylamino)-4''-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBPe), and/or perylene and the derivatives thereof (for example, 2,5,8,11-tetra-t-butylperylene (TBP)), and pyrene and the derivatives thereof (for example, 1,1-dipyrene, 1,4-dipyrenylbenzene, 1,4-bis(N,N-diphenylamino)pyrene, and/or 1,6-bis(N,N-diphenylamino)pyrene), and 1,3,5-tris(1-phenyl-1H-benzo[d]imidazole-2-yl)benzene (TPBi)). However, embodiments of the present disclosure are not limited thereto.

The emission layer EML may further include a common material (e.g., well-known in the art). For example, the emission layer EML may include as a host material at least one selected from tris(8-hydroxyquinolino)aluminum (Alq3), bis[2-(diphenylphosphino)phenyl]ether oxide (DPEPO), 4,4'-bis(N-carbazol-9-yl)biphenyl (CBP), 1,3-bis(N-carbazol-9-yl)benzene (mCP), 2,8-bis(diphenylphosphoryl)dibenzo[b,d]furan (PPF), 4,4',4''-tris(carbazol-9-yl)-triphenylamine (TCTA), poly(N-vinylcarbazole) (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2''-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH-2), hexaphenylcyclotrisiloxane (DPSiO$_3$), octaphenylcyclotetrasiloxane (DPSiO$_4$), 2,8-bis(diphenylphosphoryl)dibenzofuran (PPF), and 1,3,5-tris(1-phenyl-1H-benzo[d]imidazol-2-yl)benzene (TPBi). However, embodiments of the present disclosure are not limited thereto.

In case where the emission layer EML emits red light, the emission layer EML may further include, for example, a fluorescence material including tris(dibenzoylmethanato)phenanthoroline europium (PBD:Eu(DBM)$_3$(Phen)) or perylene. In case where the emission layer EML emits red light, the dopant included in the emission layer EML may be selected from, for example, a metal complex or an organometallic complex (such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr) and/or octaethylporphyrin platinum (PtOEP)), rubrene and the derivatives thereof, and 4-dicyanomethylene-2-(p-dimethylaminostyryl)-6-methyl-4H-pyrane (DCM) and the derivatives thereof.

In case where the emission layer EML emits green light, the emission layer EML may further include, for example, a fluorescence material including tris(8-hydroxyquinolino)aluminum (Alq3). In case where the emission layer EML emits green light, the dopant included in the emission layer EML may be selected from, for example, a metal complex or an organometallic complex (such as fac-tris(2-phenylpyridine)iridium (Ir(ppy)$_3$)), and coumarin and the derivatives thereof.

In case where the emission layer EML emits blue light, the emission layer EML may further include a fluorescence material including any one selected from the group consisting of spiro-DPVBi, spiro-6P, distyryl-benzene (DSB), distyryl-arylene (DSA), a polyfluorene (PFO)-based polymer and a poly(p-phenylene vinylene (PPV)-based polymer. In case where the emission layer EML emits blue light, the dopant included in the emission layer EML may be selected from, for example, a metal complex or an organometallic complex (such as (4,6-F2ppy)$_2$Irpic), and perylene and the derivatives thereof.

The electron transport region ETR is disposed on the emission layer EML. The electron transport region ETR may include at least one of a hole blocking layer HBL, an electron transport layer ETL or an electron injection layer EIL, but embodiments of the present disclosure are not limited thereto.

The electron transport region ETR may have a single layer formed utilizing a single material, a single layer formed utilizing a plurality of different materials, or a multilayer structure having a plurality of layers formed utilizing a plurality of different materials.

For example, the electron transport region ETR may have a single layer structure of an electron injection layer EIL or an electron transport layer ETL, or a single layer structure formed utilizing an electron injection material and an electron transport material. Further, the electron transport region ETR may have a single layer structure having a plurality of different materials, or a structure stacked from the emission layer EML of electron transport layer ETL/electron injection layer EIL, or hole blocking layer HBL/electron transport layer ETL/electron injection layer EIL. However, embodiments of the present disclosure are not limited thereto. The thickness of the electron transport region ETR may be, for example, from about 1,000 Å to about 1,500 Å.

The electron transport region ETR of the organic electroluminescence device 10 of an embodiment may include the polycyclic compound according to an embodiment of the present disclosure. For example, the electron transport region ETR may include the polycyclic compound represented by Formula 1.

When the electron transport region ETR has a multilayer structure having a plurality of layers, any one of the plurality of layers may include the polycyclic compound represented by Formula 1. For example, the electron transport region ETR may include an electron transport layer ETL disposed on the emission layer EML and an electron injection layer EIL disposed on the electron transport layer ETL, and the electron transport layer ETL or the electron injection layer EIL may include the polycyclic compound according to an embodiment of the present disclosure.

The electron transport region ETR may include one kind or two or more kinds of the polycyclic compounds represented by Formula 1. For example, the electron transport region ETR may include at least one selected from the compounds represented in the aforementioned Compound Groups 1 to 3. In one embodiment, the electron transport region ETR may include one or more different polycyclic compounds, each represented by Formula 1.

The electron transport region ETR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may further include a suitable (e.g., well-known) material in addition to the polycyclic compound. When the electron transport region ETR includes an electron transport layer ETL, the electron transport region ETR may include an anthracene-based compound. The electron transport region may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq2), 9,10-di(naphthalene-2-yl)anthracene (ADN), or a mixture thereof. However, embodiments of the present disclosure are not limited thereto. The thickness of the electron transport layer ETL may be from about 100 Å to about 1,000 Å and may be, for example, from about 150 Å to about 500 Å. When the thickness of the electron transport layer ETL satisfies the above-described ranges, satisfactory electron transport properties may be obtained without substantial increase of a driving voltage.

When the electron transport region ETR includes the electron injection layer EIL, the electron transport region ETR may include, a metal halide (such as LiF, NaCl, CsF, RbCl and/or RbI), a metal in lanthanoides (such as Yb), a metal oxide (such as $Li_2O$ and/or BaO), and/or lithium quinolate (LiQ). However, embodiments of the present disclosure are not limited thereto. The electron injection layer EIL also may be formed utilizing a mixture material of an electron transport material and an insulating organo metal salt. The organo metal salt may be a material having an energy band gap of about 4 eV or more. The organo metal salt may include, for example, metal acetates, metal benzoates, metal acetoacetates, metal acetylacetonates, and/or metal stearates. The thickness of the electron injection layer EIL may be from about 1 Å to about 100 Å, or from about 3 Å to about 90 Å. When the thickness of the electron injection layer EIL satisfies the above described ranges, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, embodiments of the present disclosure are not limited thereto.

The second electrode EL2 is provided on the electron transport region ETR. The second electrode EL2 may be a common electrode or a cathode. The second electrode EL2 may be a transmissive electrode, a transflective electrode or a reflective electrode. When the second electrode EL2 is the transmissive electrode, the second electrode EL2 may include a transparent metal oxide, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed utilizing the above-described materials and a transparent conductive layer formed utilizing ITO, IZO, ZnO, ITZO, etc.

In one embodiment, the second electrode EL2 may be connected with an auxiliary electrode. When the second electrode EL2 is connected with the auxiliary electrode, the resistance of the second electrode EL2 may decrease.

Meanwhile, referring to FIG. 4, on the second electrode EL2 of the organic electroluminescence device 10 of an embodiment, a capping layer (CPL) may be further disposed. The capping layer (CPL) may include, for example, α-NPD, NPB, TPD, m-MTDATA, Alq3, CuPc, N4,N4,N4', N4'-tetra(biphenyl-4-yl) biphenyl-4,4'-diamine (TPD15), 4,4',4''-tris(carbazol sol-9-yl) triphenylamine (TCTA), N,N'-bis(naphthalene-1-yl), etc.

The organic electroluminescence device 10 according to an embodiment of the present disclosure includes the polycyclic compound represented by Formula 1 and may show suitable (e.g., excellent) emission efficiency and long lifespan. In addition, the organic electroluminescence device 10 of an embodiment may show high efficiency and long-lifespan characteristics in a blue wavelength region.

Hereinafter, the polycyclic compound according to an embodiment and the organic electroluminescence device of an embodiment of the present disclosure will be particularly explained referring to embodiments and comparative embodiments. The following embodiments are only illustrations to assist the understanding of the present disclosure, and the scope of the present disclosure is not limited thereto.

EXAMPLES

Synthesis of Polycyclic Compound

The synthetic methods of the polycyclic compounds explained below are only example embodiments, and the synthetic method of the polycyclic compound according to an embodiment of the present disclosure is not limited thereto.

1. Synthesis of Compound 1-9

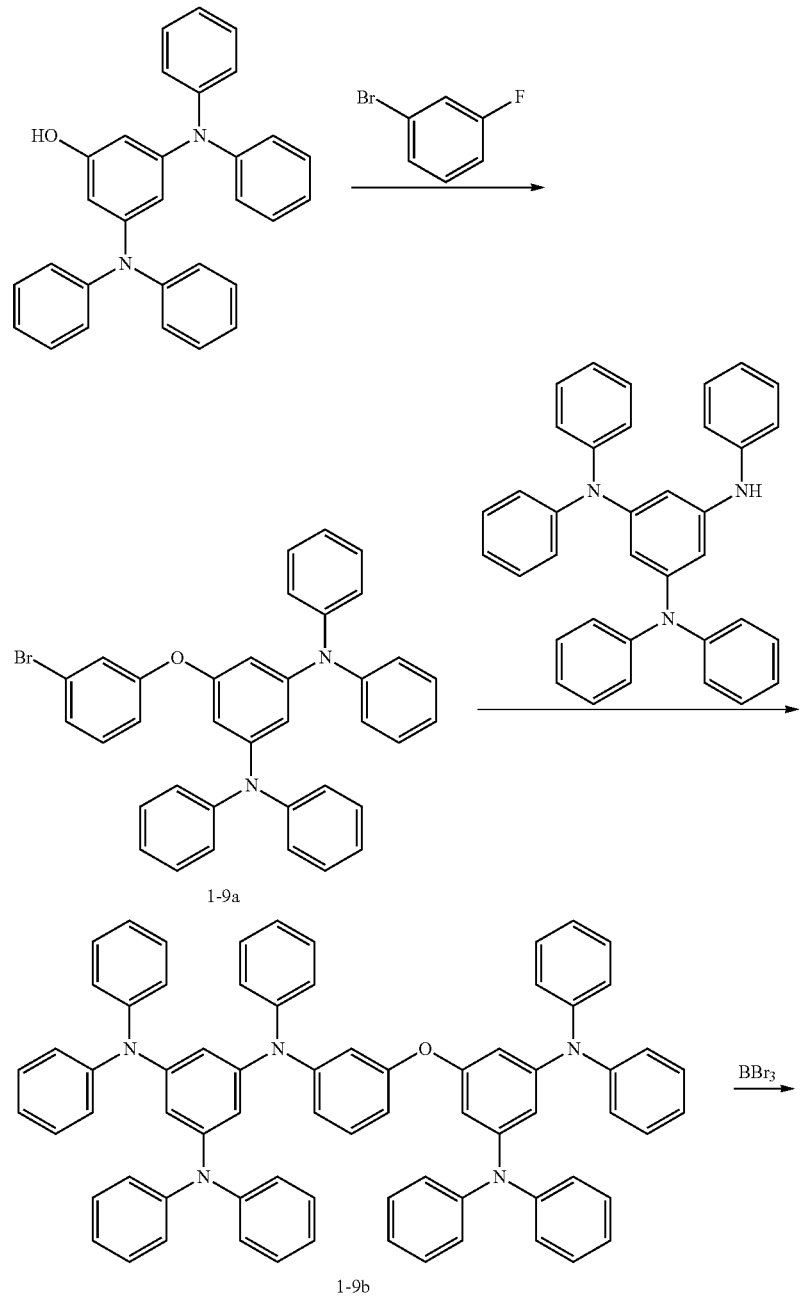

-continued

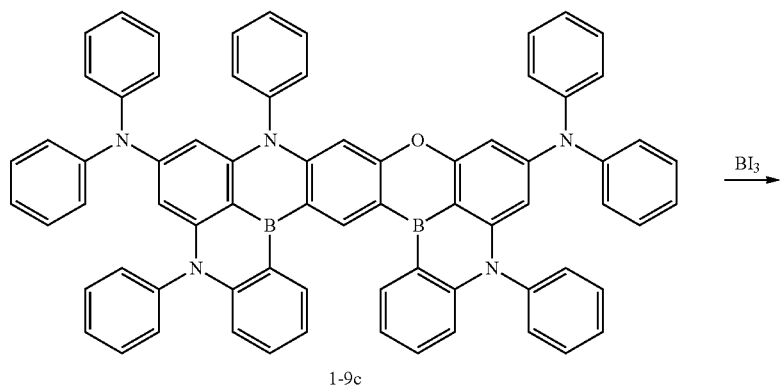

1-9c

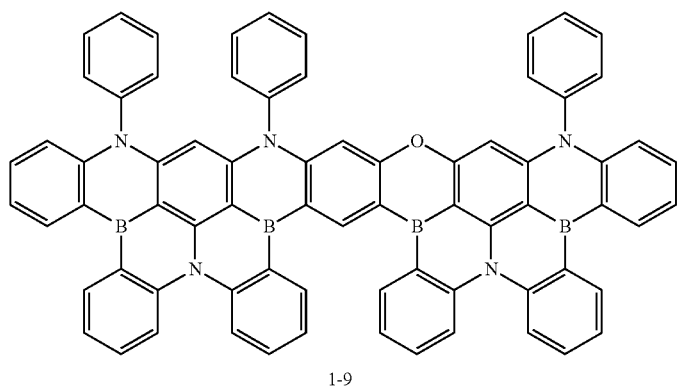 [SMILES: c1ccc(N2c3ccccc3B3c4ccccc4N4c5ccccc5B5c6cc7c(cc6Oc6cc2c3c4c65)N(c2ccccc2)c2cc3c4c5c2B7c2ccccc2N5c2ccccc2B4c2ccccc2N3c2ccccc2)cc1]

1-9

(1) Synthesis of Intermediate 1-9a 3,5-bis(diphenylamino)phenol (1 eq.), 1-bromo-3-fluorobenzene (1.1 eq.), and potassium carbonate (2 eq.) were added to DMF and then, stirred under a nitrogen atmosphere at about 160° C. for about 24 hours. After cooling, the reaction solution was washed with ethyl acetate and water three times, and an organic layer thus obtained was dried with $MgSO_4$ and dried under a reduced pressure. Through column chromatography, Intermediate 1-9a was obtained (yield: 80%).

(2) Synthesis of Intermediate 1-9b

Intermediate 1-9a (1 eq.), N1,N1,N3,N3,N5-pentaphenylbenzene-1,3,5-triamine (1.1 eq.), tris(dibenzylideneacetone)dipalladium(O) (0.05 eq.), tri-tert-butylphosphine (0.1 eq.), and sodium tert-butoxide (3 eq.) were dissolved in toluene and then, stirred under a nitrogen atmosphere at about 100° C. for about 12 hours. After cooling, the reaction solution was washed with ethyl acetate and water three times, and an organic layer thus obtained was dried with $MgSO_4$ and dried under a reduced pressure. Through column chromatography, Intermediate 1-9b was obtained (yield: 75%).

(3) Synthesis of Intermediate 1-9c

Intermediate 1-9c (1 eq.) was dissolved in ortho dichlorobenzene, a flask was cooled under a nitrogen atmosphere to about 0° C., and $BBr_3$ (4 eq.) was slowly injected thereto. After finishing the dropwise addition, the temperature was elevated to about 160° C. and stirring was performed for about 24 hours. After cooling, triethylamine was slowly added dropwise to the flask until heating stopped to finish the reaction, and hexane was added thereto for precipitation. Solid contents were filtered and obtained. The solid content thus obtained was separated by column chromatography and separated further by recrystallization with MC/Hex to obtain Intermediate 1-9c (yield: 15%).

(4) Synthesis of Compound 1-9

Intermediate 1-9c (1 eq.) was dissolved in ortho dichlorobenzene, a flask was cooled under a nitrogen atmosphere to about 0° C., and $BI_3$ (2.5 eq.) was slowly injected thereto. After finishing the dropwise addition, the temperature was elevated to about 160° C. and stirring was performed for about 6 hours. After cooling, triethylamine was slowly added dropwise to the flask until heating stopped to finish the reaction, and hexane was added thereto for precipitation. Solid contents were filtered and obtained. The solid content thus obtained was separated by silica filtration and separated further by recrystallization with MC/Hex to obtain Compound 1-9 (yield: 10%).

2. Synthesis of Compound 1-10
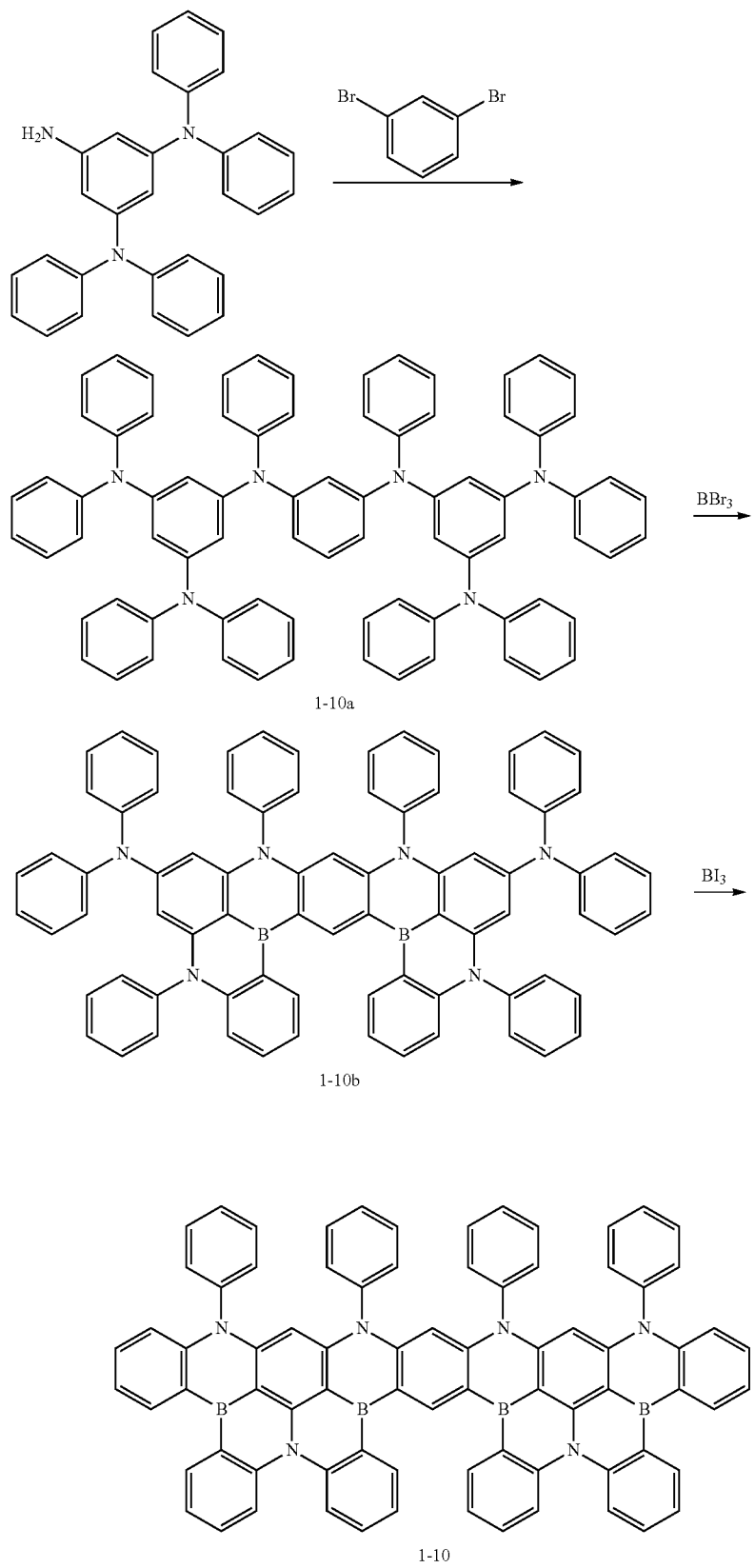

(1) Synthesis of Intermediate 1-10a

N1,N1,N3,N3,N5-pentaphenylbenzene-1,3,5-triamine (2.2 eq.), 1,3-dibromobenzene (1 eq.), tris(dibenzylideneacetone)dipalladium(O) (0.05 eq.), tri-tert-butylphosphine (0.1 eq.), and sodium tert-butoxide (3 eq.) were dissolved in toluene and then, stirred under a nitrogen atmosphere at about 100° C. for about 12 hours. After cooling, the reaction solution was washed with ethyl acetate and water three times, and an organic layer thus obtained was dried with $MgSO_4$ and dried under a reduced pressure. Through column chromatography, Intermediate 1-10a was obtained (yield: 65%).

(2) Synthesis of Intermediate 1-10b

Intermediate 1-10a (1 eq.) was dissolved in ortho dichlorobenzene, a flask was cooled under a nitrogen atmosphere to about 0° C., and $BBr_3$ (4 eq.) was slowly injected thereto. After finishing the dropwise addition, the temperature was elevated to about 160° C. and stirring was performed for about 24 hours. After cooling, triethylamine was slowly added dropwise to the flask until heating stopped to finish the reaction, and hexane was added thereto for precipitation. Solid contents were filtered and obtained. The solid content thus obtained was separated by column chromatography and separated further by recrystallization with MC/Hex to obtain Intermediate 1-10b (yield: 15%).

(3) Synthesis of Compound 1-10

Intermediate 1-10b (1 eq.) was dissolved in ortho dichlorobenzene, a flask was cooled under a nitrogen atmosphere to about 0° C., and $BI_3$ (2.5 eq.) was slowly injected thereto. After finishing the dropwise addition, the temperature was elevated to about 160° C. and stirring was performed for about 6 hours. After cooling, triethylamine was slowly added dropwise to the flask until heating stopped to finish the reaction, and hexane was added thereto for precipitation. Solid contents were filtered and obtained. The solid content thus obtained was separated by silica filtration and separated further by recrystallization with MC/Hex to obtain Compound 1-10 (yield: 10%).

3. Synthesis of Compound 2-2

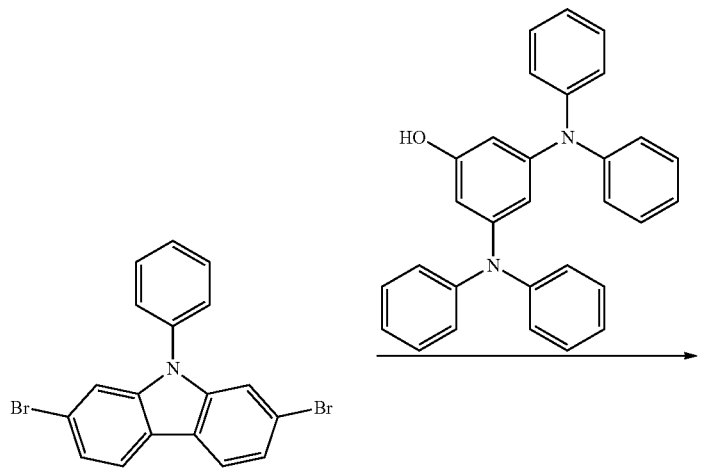

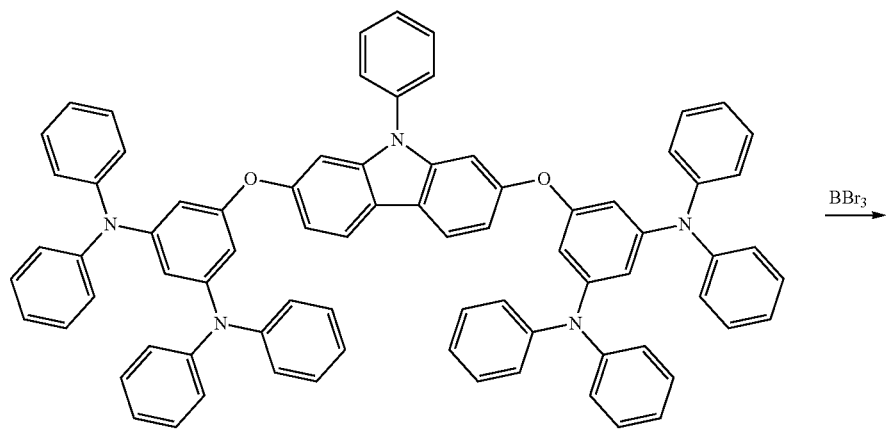

2-2a

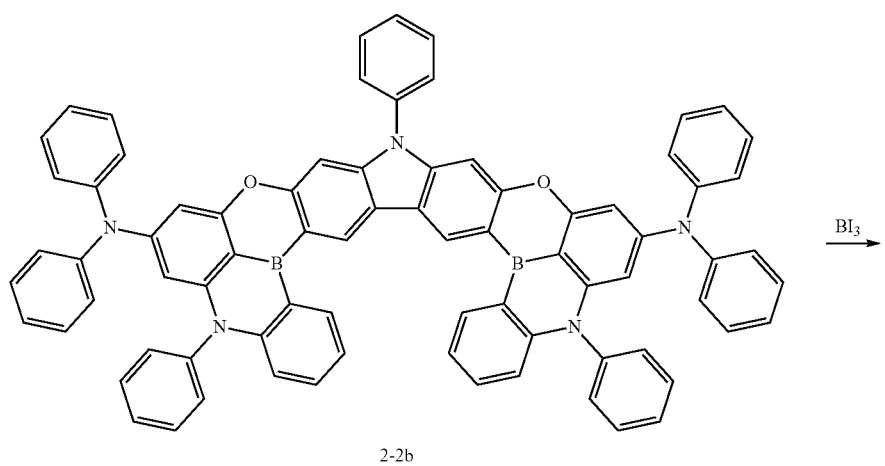

2-2b

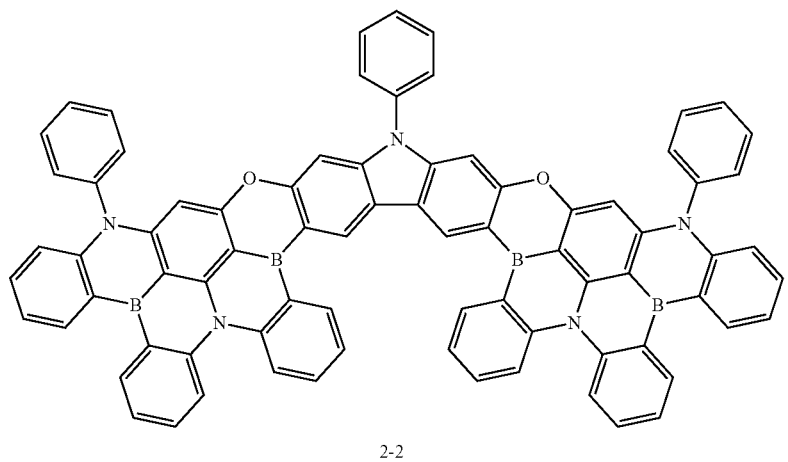

2-2

(1) Synthesis of Intermediate 2-2a 2,7-dibromo-9-phenyl-9H-carbazole (1 eq.), 3,5-bis(diphenylamino)phenol (2.5 eq.), and potassium carbonate (5 eq.) were added to DMSO and then, stirred under a nitrogen atmosphere at about 180° C. for about 24 hours. After cooling, the reaction solution was washed with ethyl acetate and water five times, and an organic layer thus obtained was dried with $MgSO_4$ and dried under a reduced pressure. Through column chromatography, Intermediate 2-2a was obtained (yield: 50%).

(2) Synthesis of Intermediate 2-2b

Intermediate 2-2a (1 eq.) was dissolved in ortho dichlorobenzene, a flask was cooled under a nitrogen atmosphere to about 0° C., and $BBr_3$ (4 eq.) was slowly injected thereto. After finishing the dropwise addition, the temperature was elevated to about 160° C. and stirring was performed for about 24 hours. After cooling, triethylamine was slowly added dropwise to the flask until heating stopped to finish the reaction, and hexane was added thereto for precipitation. Solid contents were filtered and obtained. The solid content thus obtained was separated by column chromatography and separated further by recrystallization with MC/Hex to obtain Intermediate 2-2b (yield: 15%).

(3) Synthesis of Compound 2-2

Intermediate 2-2b (1 eq.) was dissolved in ortho dichlorobenzene, a flask was cooled under a nitrogen atmosphere to about 0° C., and $BI_3$ (2.5 eq.) was slowly injected thereto. After finishing the dropwise addition, the temperature was elevated to about 160° C. and stirring was performed for about 6 hours. After cooling, triethylamine was slowly added dropwise to the flask until heating stopped to finish the reaction, and hexane was added thereto for precipitation. Solid contents were filtered and obtained. The solid content thus obtained was separated by silica filtration and separated further by recrystallization with MC/Hex to obtain Compound 2-2 (yield: 10%).

4. Synthesis of Compound 2-3
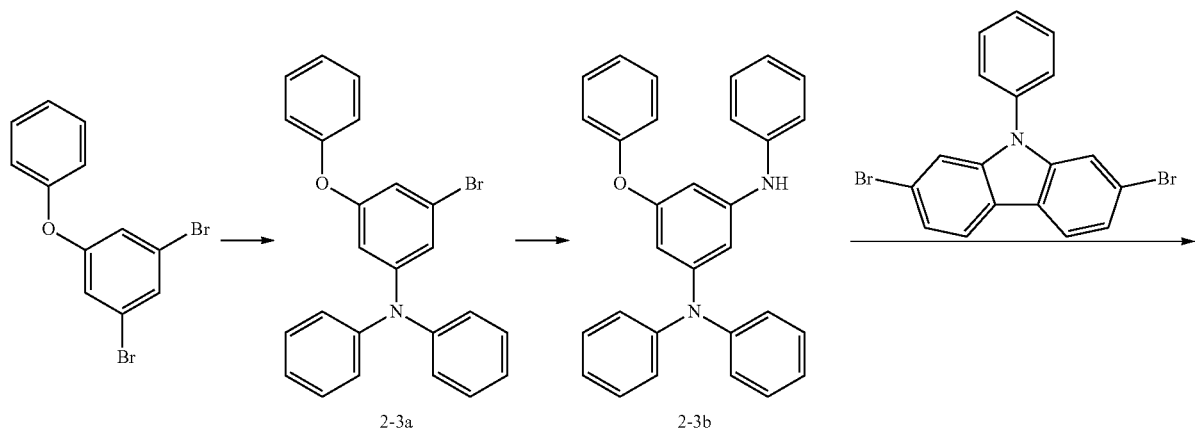
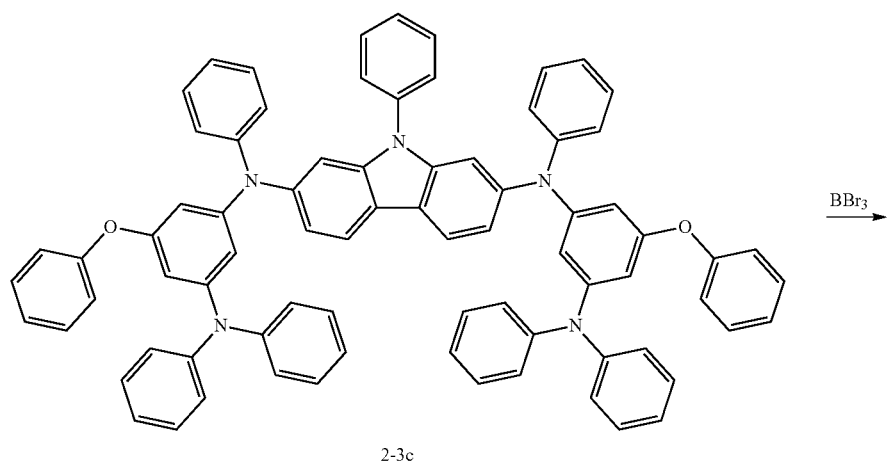
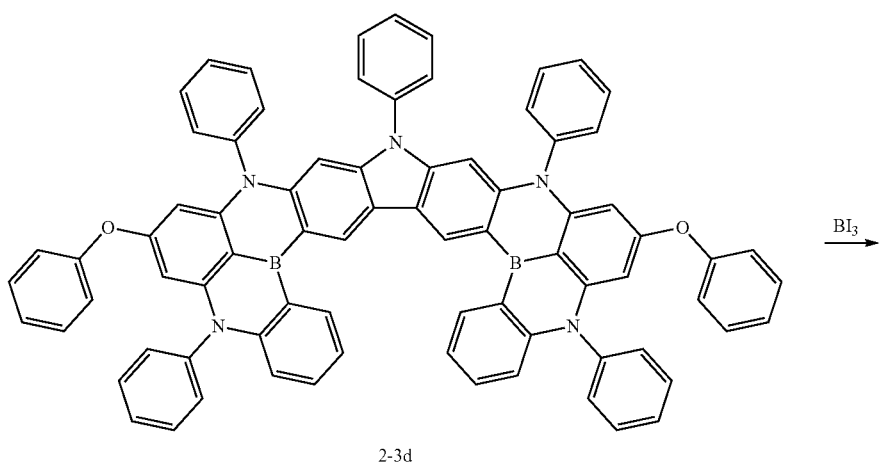

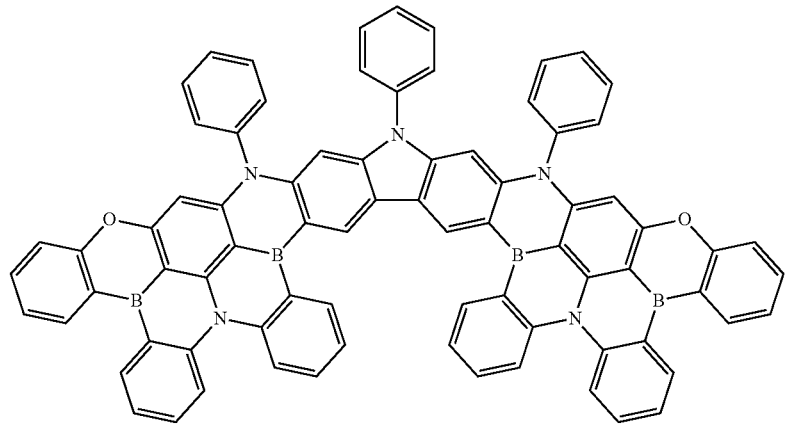

2-3

(1) Synthesis of Intermediate 2-3a 1,3-dibromo-5-phenoxybenzene (1 eq.), diphenylamine (1 eq.), tris(dibenzylideneacetone)dipalladium(O) (0.01 eq.), tri-tert-butylphosphine (0.05 eq.), and sodium tert-butoxide (3 eq.) were dissolved in toluene and stirred under a nitrogen atmosphere at about 90° C. for about 2 hours. After cooling, the reaction solution was washed with ethyl acetate and water three times, and an organic layer thus obtained was dried with $MgSO_4$ and dried under a reduced pressure. Through column chromatography, Intermediate 2-3a was obtained (yield: 65%).

(2) Synthesis of Intermediate 2-3b

Intermediate 2-3a (1 eq.), aniline (1.1 eq.), tris(dibenzylideneacetone)dipalladium(O) (0.01 eq.), tri-tert-butylphosphine (0.05 eq.), and sodium tert-butoxide (3 eq.) were dissolved in toluene and stirred under a nitrogen atmosphere at about 90° C. for about 2 hours. After cooling, the reaction solution was washed with ethyl acetate and water three times, and an organic layer thus obtained was dried with $MgSO_4$ and dried under a reduced pressure. Through column chromatography, Intermediate 2-3b was obtained (yield: 75%).

(3) Synthesis of Intermediate 2-3c

Intermediate 2-3b (2.1 eq.), 2,7-dibromo-9-phenyl-9H-carbazole (1 eq.), tris(dibenzylideneacetone)dipalladium(O) (0.05 eq.), tri-tert-butylphosphine (0.1 eq.), and sodium tert-butoxide (3 eq.) were dissolved in toluene and stirred under a nitrogen atmosphere at about 100° C. for about 24 hours. After cooling, the reaction solution was washed with ethyl acetate and water three times, and an organic layer thus obtained was dried with $MgSO_4$ and dried under a reduced pressure. Through column chromatography, Intermediate 2-3c was obtained (yield: 65%).

(4) Synthesis of Intermediate 2-3d

Intermediate 2-3c (1 eq.) was dissolved in ortho dichlorobenzene, a flask was cooled under a nitrogen atmosphere to about 0° C., and $BBr_3$ (4 eq.) was slowly injected thereto. After finishing the dropwise addition, the temperature was elevated to about 160° C. and stirring was performed for about 24 hours. After cooling, triethylamine was slowly added dropwise to the flask until heating stopped to finish the reaction, and hexane was added thereto for precipitation. Solid contents were filtered and obtained. The solid content thus obtained was separated by column chromatography and separated further by recrystallization with MC/Hex to obtain Intermediate 2-3d (yield: 15%).

(5) Synthesis of Compound 2-3

Intermediate 2-3d (1 eq.) was dissolved in ortho dichlorobenzene, a flask was cooled under a nitrogen atmosphere to about 0° C., and $BI_3$ (2.5 eq.) was slowly injected thereto. After finishing the dropwise addition, the temperature was elevated to about 160° C. and stirring was performed for about 6 hours. After cooling, triethylamine was slowly added dropwise to the flask until heating stopped to finish the reaction, and hexane was added thereto for precipitation. Solid contents were filtered and obtained. The solid content thus obtained was separated by silica filtration and separated further by recrystallization with MC/Hex to obtain Compound 2-3 (yield: 10%).

5. Synthesis of Compound 2-13
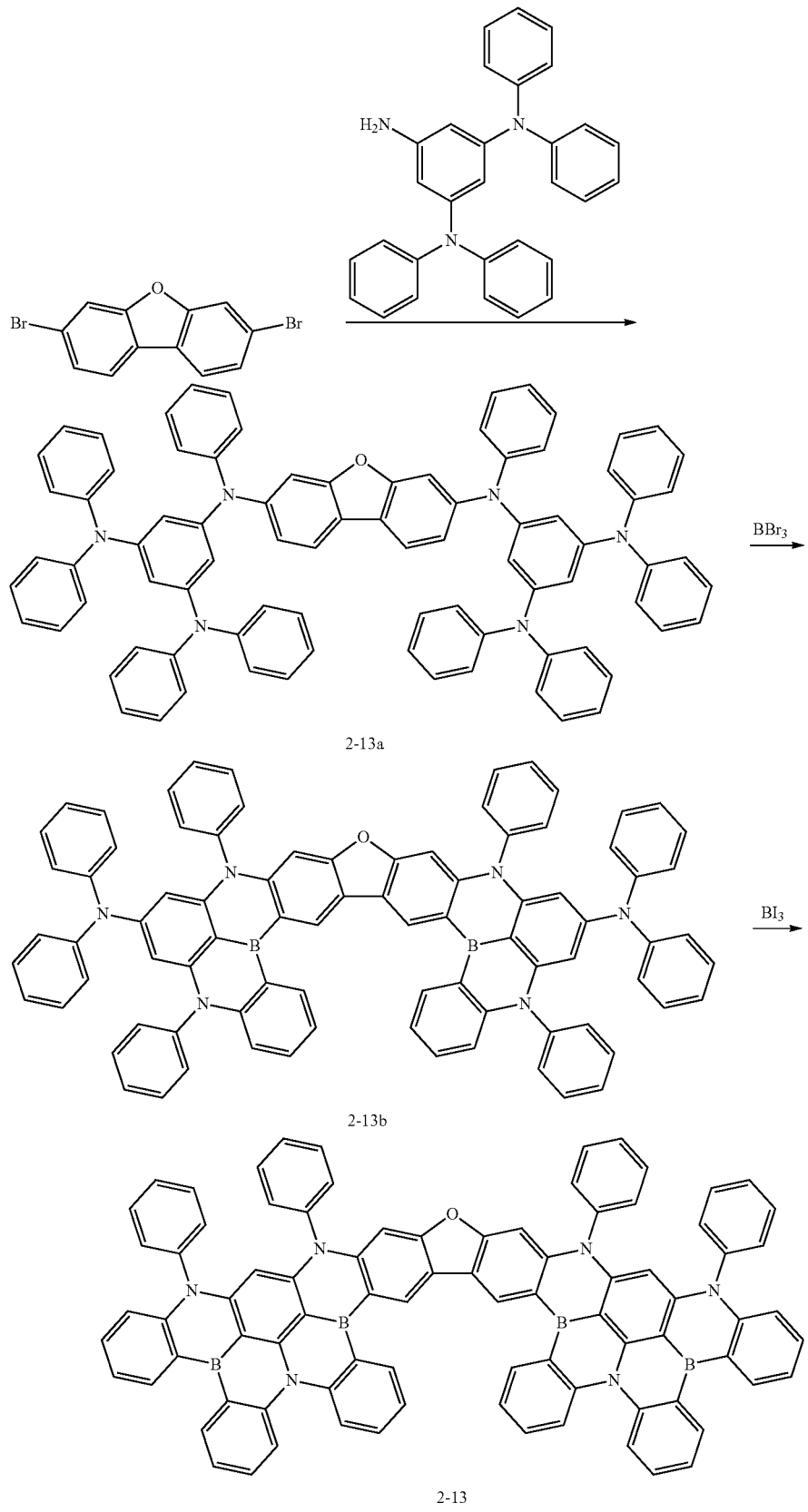

(1) Synthesis of Intermediate 2-13a

N1,N1,N3,N3,N5-pentaphenylbenzene-1,3,5-triamine (2.2 eq.), 3,7-dibromodibenzo[b,d]furan (1 eq.), tris(dibenzylideneacetone)dipalladium(O) (0.05 eq.), tri-tert-butylphosphine (0.1 eq.) and sodium tert-butoxide (3 eq.) were dissolved in toluene and then, stirred under a nitrogen atmosphere at about 100° C. for about 12 hours. After cooling, the reaction solution was washed with ethyl acetate and water three times, and an organic layer thus obtained was dried with MgSO$_4$ and dried under a reduced pressure. Through column chromatography, Intermediate 2-13a was obtained (yield: 65%).

(2) Synthesis of Intermediate 2-13b

Intermediate 2-13a (1 eq.) was dissolved in ortho dichlorobenzene, a flask was cooled under a nitrogen atmosphere to about 0° C., and BBr$_3$ (4 eq.) was slowly injected thereto. After finishing the dropwise addition, the temperature was elevated to about 160° C. and stirring was performed for about 24 hours. After cooling, triethylamine was slowly added dropwise to the flask until heating stopped to finish the reaction, and hexane was added thereto for precipitation. Solid contents were filtered and obtained. The solid content thus obtained was separated by column chromatography and separated further by recrystallization with MC/Hex to obtain Intermediate 2-13b (yield: 15%).

(3) Synthesis of Compound 2-13

Intermediate 2-13b (1 eq.) was dissolved in ortho dichlorobenzene, a flask was cooled under a nitrogen atmosphere to about 0° C., and BI$_3$ (2.5 eq.) was slowly injected thereto. After finishing the dropwise addition, the temperature was elevated to about 160° C. and stirring was performed for about 6 hours. After cooling, triethylamine was slowly added dropwise to the flask until heating stopped to finish the reaction, and hexane was added thereto for precipitation. Solid contents were filtered and obtained. The solid content thus obtained was separated by silica filtration and separated further by recrystallization with MC/Hex to obtain Compound 2-13 (yield: 10%).

6. Synthesis of Compound 3-1

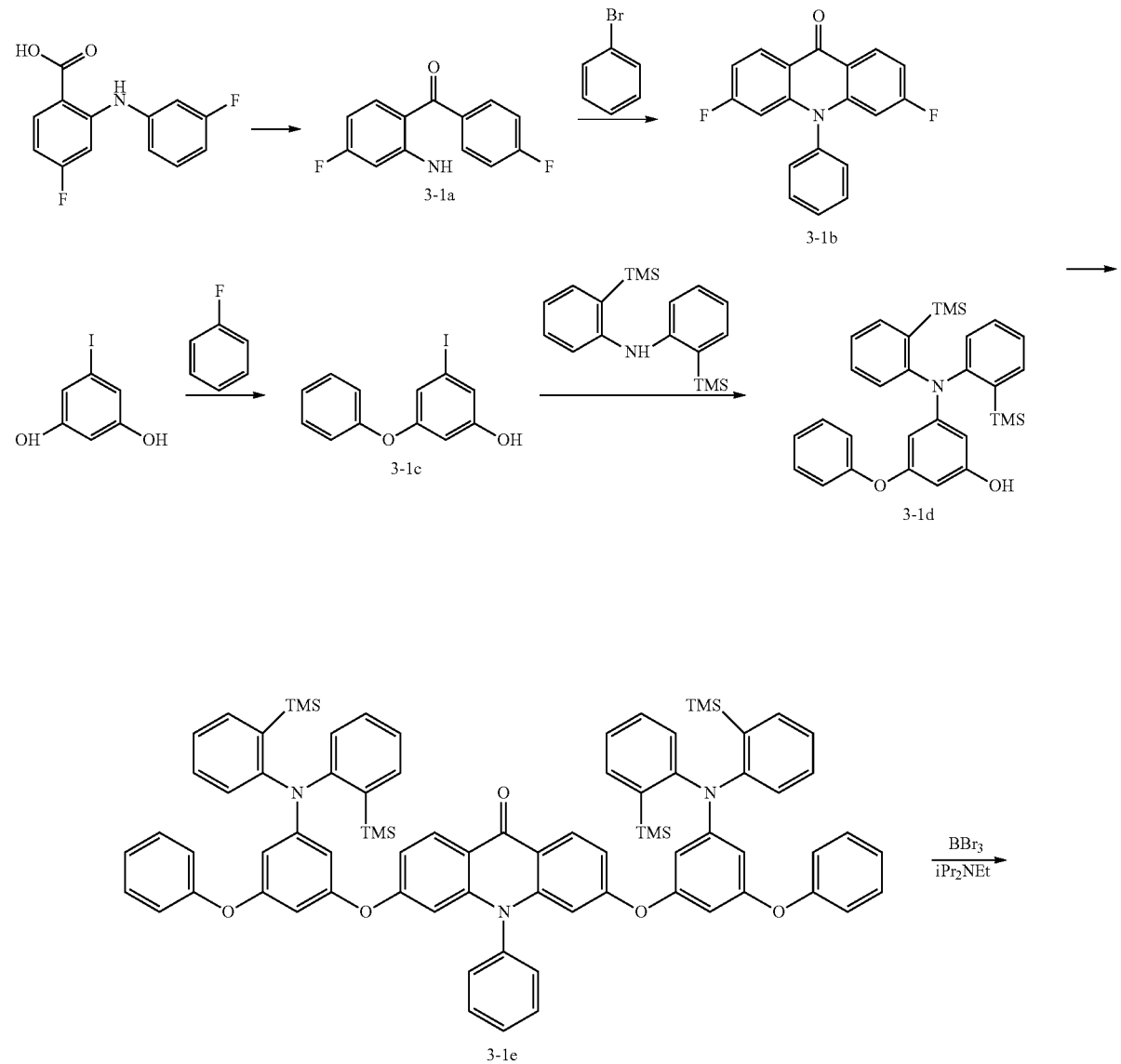

-continued

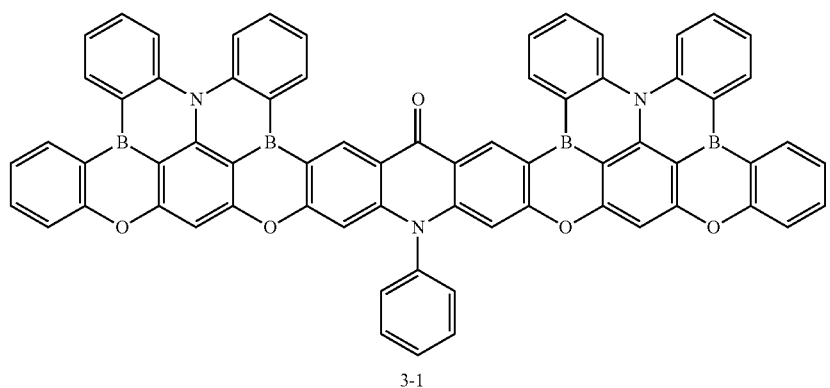

3-1

(1) Synthesis of Intermediate 3-1a 4-fluoro-2-((3-fluorophenyl)amino)benzoic acid (1 eq.) was added to CH₃CN in a concentration of about 0.44 M. After heating to about 90° C., phosphorus(V) oxychloride (2.2 eq.) was slowly added over about 1 hour. After finishing the addition, the reaction solution was stirred at about 90° C. for about 2 hours. After cooling, H₂O (70 eq.) was added thereto, followed by stirring at about 100° C. for about 3 hours. After cooling, the reaction solution was washed with ethyl acetate and water three times, and an organic layer thus obtained was dried with MgSO₄ and dried under a reduced pressure. Through column chromatography, Intermediate 3-1a was obtained (yield: 30%).

(2) Synthesis of Intermediate 3-1b

Intermediate 3-1a (1 eq.), bromobenzene (1.1 eq.), tris(dibenzylideneacetone)dipalladium(O) (0.01 eq.), tri-tert-butylphosphine (0.05 eq.) and sodium tert-butoxide (3 eq.) were dissolved in toluene and stirred under a nitrogen atmosphere at about 90° C. for about 2 hours. After cooling, the reaction solution was washed with ethyl acetate and water three times, and an organic layer thus obtained was dried with MgSO₄ and dried under a reduced pressure. Through column chromatography, Intermediate 3-1 b was obtained (yield: 65%).

(3) Synthesis of Intermediate 3-1c 5-iodobenzene-1,3-diol (1 eq.), fluorobenzene (1.1 eq.), and potassium carbonate (2 eq.) were added to DMSO and then, stirred under a nitrogen atmosphere at about 160° C. for about 12 hours. After cooling, the reaction solution was washed with ethyl acetate and water five times, and an organic layer thus obtained was dried with MgSO₄ and dried under a reduced pressure. Through column chromatography, Intermediate 3-1c was obtained (yield: 50%).

(4) Synthesis of Intermediate 3-1d

Intermediate 3-1c (1 eq.), bis(2-trimethylsilyl)phenyl)amine (2.2 eq.), copper iodide (0.05 eq.), potassium hydroxide (5 eq.), and 1,10-phenanthroline (0.05 eq.) were added to xylene and then, stirred under a nitrogen atmosphere at about 110° C. for about 24 hours. After cooling, the reaction solution was washed with ethyl acetate and water five times, and an organic layer thus obtained was dried with MgSO₄ and dried under a reduced pressure. Through column chromatography, Intermediate 3-1d was obtained (yield: 50%).

(5) Synthesis of Intermediate 3-1e

Intermediate 3-1b (1 eq.), Intermediate 3-1d (2.2 eq.), and cesium carbonate (5 eq.) were dissolved in DMSO and then, stirred under a nitrogen atmosphere at about 160° C. for about 24 hours. After cooling, the reaction solution was washed with ethyl acetate and water five times, and an organic layer thus obtained was dried with MgSO₄ and dried under a reduced pressure. Through column chromatography, Intermediate 3-1e was obtained (yield: 35%).

(6) Synthesis of Compound 3-1

BBr₃ (5 eq.) was dissolved in ortho dichlorobenzene, a flask was cooled under a nitrogen atmosphere to about 0° C., and Intermediate 3-1e (1 eq.) dissolved in ortho dichlorobenzene was slowly added over about one hour. After the addition, stirring was performed at room temperature for about 2 hours, and the reaction solution was cooled to about 0° C. Then, diisopropylethylamine (15 eq.) was added thereto. After the addition, the temperature was elevated to about 160° C., and stirring was performed for about 24 hours. After finishing the reaction, hexane was added thereto for precipitation. Solid contents were filtered and obtained. The solid content thus obtained was separated by column chromatography and separated further by recrystallization with MC/Hex to obtain Compound 3-1 (yield: 15%).

7. Synthesis of Compound 3-2

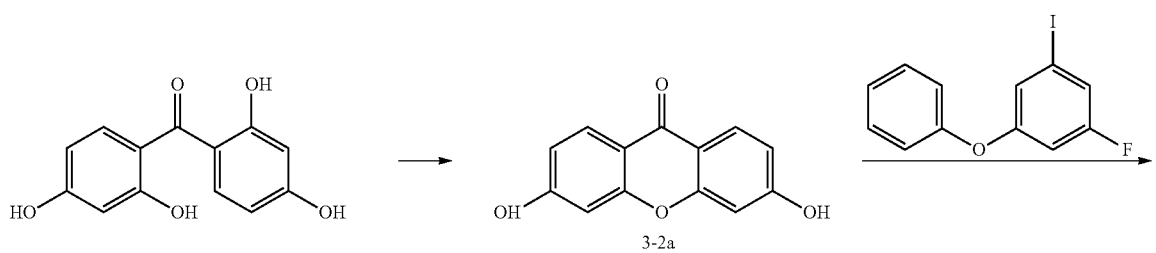

3-2a

-continued

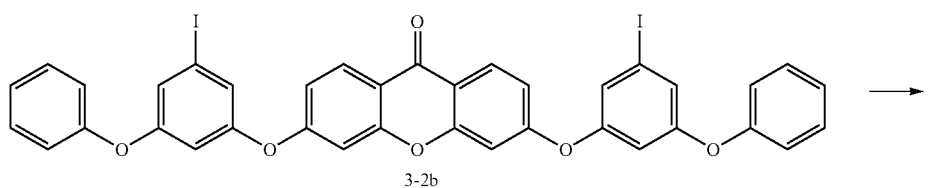
3-2b

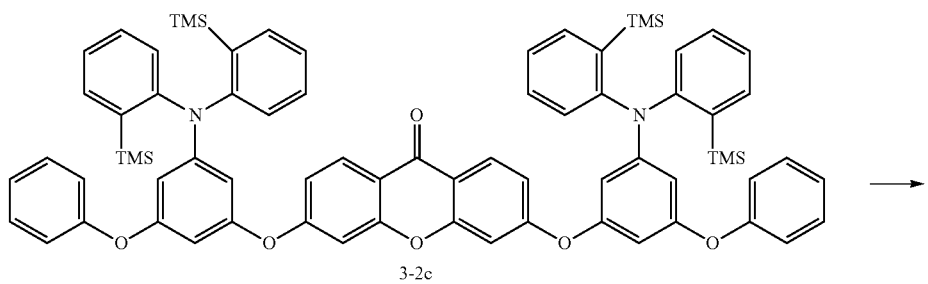
3-2c

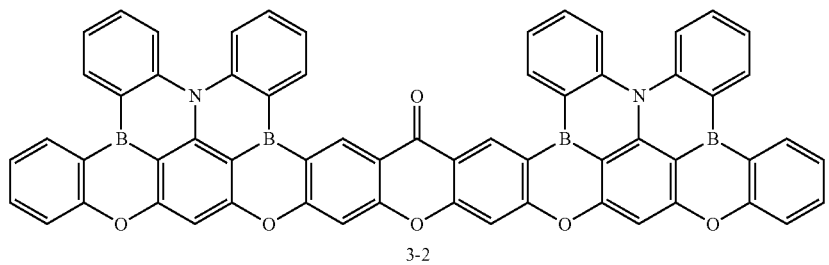
3-2

(1) Synthesis of Intermediate 3-2a 2,2',4,4'-tetrahydroxybenzophenone was heated at about 220° C. for about 6 hours utilizing a sand bath, and through column chromatography, Intermediate 3-2a was obtained (yield: 85%).

(2) Synthesis of Intermediate 3-2b

Intermediate 3-2a (1 eq.), 1-fluoro-3-iodo-5-phenoxybenzene (2.2 eq.), and cesium carbonate (5 eq.) were dissolved in DMSO and then, stirred under a nitrogen atmosphere at about 160° C. for about 24 hours. After cooling, the reaction solution was washed with ethyl acetate and water five times, and an organic layer thus obtained was dried with MgSO$_4$ and dried under a reduced pressure. Through column chromatography, Intermediate 3-2b was obtained (yield: 35%).

(3) Synthesis of Intermediate 3-2c

Intermediate 3-2b (1 eq.), bis(2-trimethylsilyl)phenyl)amine (2.2 eq.), copper iodide (0.05 eq.), potassium hydroxide (5 eq.), and 1,10-phenanthroline (0.05 eq.) were added to xylene and then, stirred under a nitrogen atmosphere at about 110° C. for about 24 hours. After cooling, the reaction solution was washed with ethyl acetate and water five times, and an organic layer thus obtained was dried with MgSO$_4$ and dried under a reduced pressure. Through column chromatography, Intermediate 3-2c was obtained (yield: 55%).

(4) Synthesis of Compound 3-2

BBr$_3$ (5 eq.) was dissolved in ortho dichlorobenzene, a flask was cooled under a nitrogen atmosphere to about 0° C., and Intermediate 3-2c (1 eq.) dissolved in ortho dichlorobenzene was slowly added over about one hour. After the addition, stirring was performed at room temperature for about 2 hours, and the reaction solution was cooled to about 0° C. Then, diisopropylethylamine (15 eq.) was added thereto. After the addition, the temperature was elevated to about 160° C. and stirring was performed for about 24 hours. After finishing the reaction, hexane was added thereto for precipitation. Solid contents were filtered and obtained. The solid content thus obtained was separated by column chromatography and separated further by recrystallization with MC/Hex to obtain Compound 3-2 (yield: 15%).

8. Synthesis of Compound 3-4

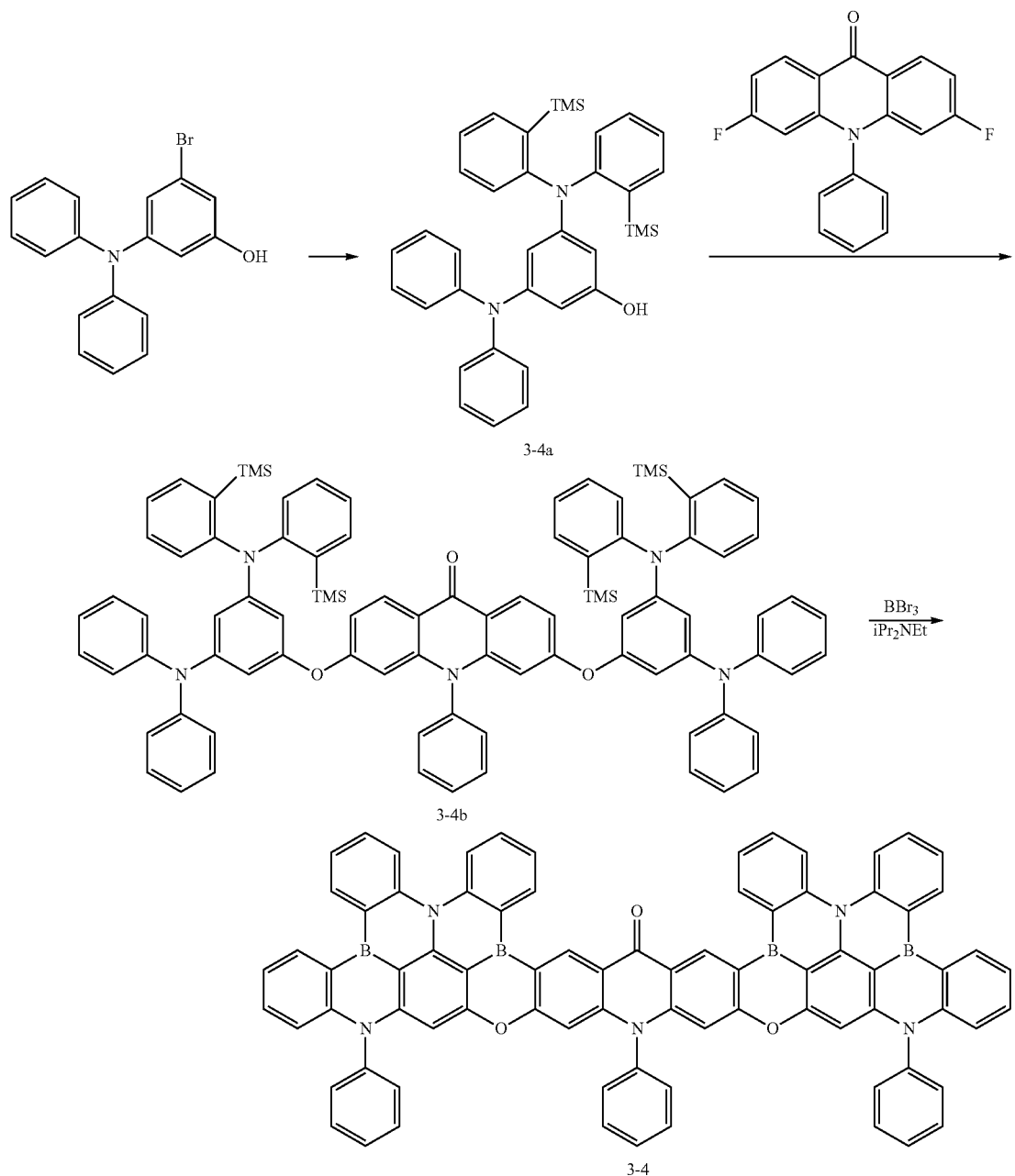

(1) Synthesis of Intermediate 3-4a 3-bromo-5-(diphenylamino)phenol (1 eq.), bis(2-(trimethylsilyl)phenyl)amine (1.1 eq.), copper iodide (0.05 eq.), potassium hydroxide (5 eq.), and 1,10-phenanthroline (0.05 eq.) were added to xylene and then, stirred under a nitrogen atmosphere at about 110° C. for about 24 hours. After cooling, the reaction solution was washed with ethyl acetate and water five times, and an organic layer thus obtained was dried with MgSO$_4$ and dried under a reduced pressure. Through column chromatography, Intermediate 3-4a was obtained (yield: 55%).

(2) Synthesis of Intermediate 3-4b

Intermediate 3-4a (2.2 eq.), 3,6-difluoro-10-phenylacridin-9(10H)-one (1 eq.), and cesium carbonate (5 eq.) were dissolved in DMSO and then, stirred under a nitrogen atmosphere at about 160° C. for about 24 hours. After cooling, the reaction solution was washed with ethyl acetate and water five times, and an organic layer thus obtained was dried with MgSO$_4$ and dried under a reduced pressure. Through column chromatography, Intermediate 3-4b was obtained (yield: 35%).

(3) Synthesis of Compound 3-4

BBr$_3$ (5 eq.) was dissolved in ortho dichlorobenzene, a flask was cooled under a nitrogen atmosphere to about 0° C., and Intermediate 3-4b (1 eq.) dissolved in ortho dichlorobenzene was slowly added over about one hour. After the addition, stirring was performed at room temperature for about 2 hours, and the reaction solution was cooled to about 0° C. Then, diisopropylethylamine (15 eq.) was added thereto. After the addition, the temperature was elevated to about 160° C. and stirring was performed for about 24 hours. After finishing the reaction, hexane was added thereto for precipitation. Solid contents were filtered and obtained. The solid content thus obtained was separated by column chromatography and separated further by recrystallization with MC/Hex to obtain Compound 3-4 (yield: 15%).

Example Compounds 1-9

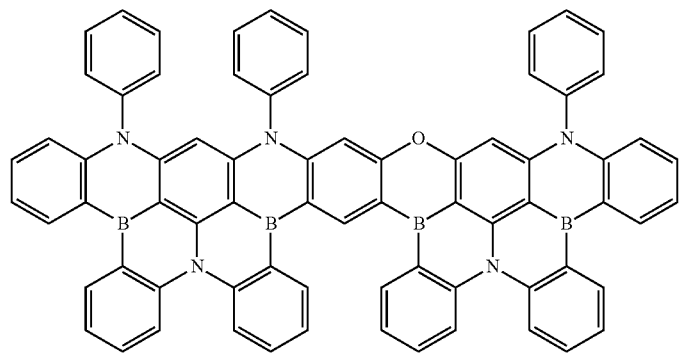

1-10

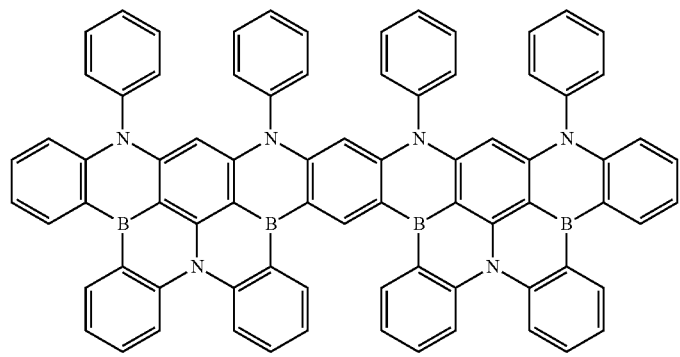

2-2

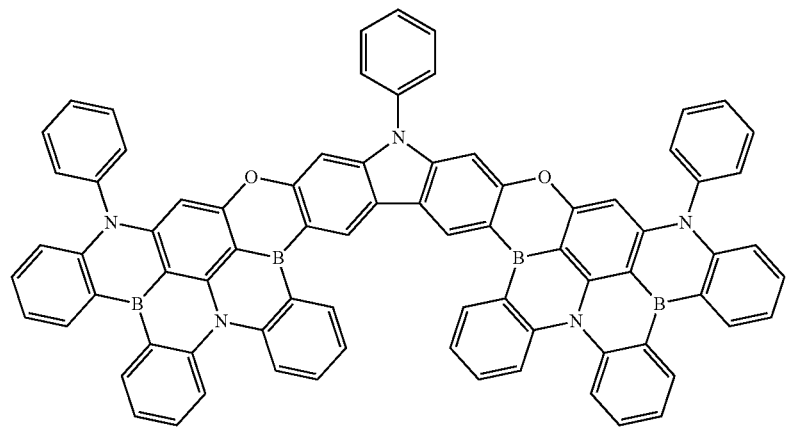

2-3
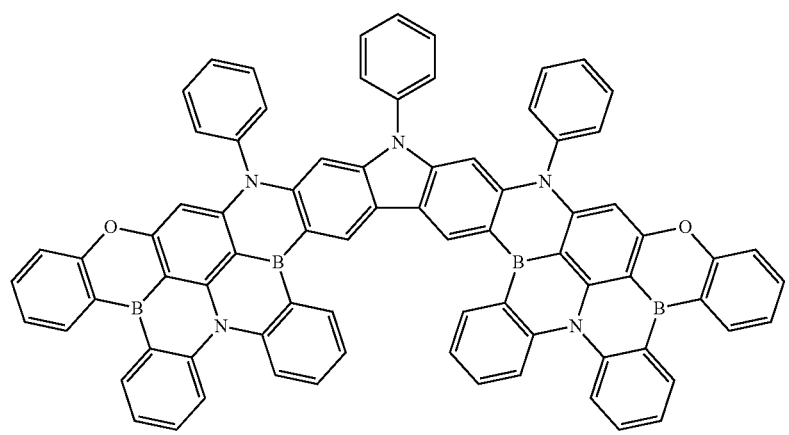
2-13
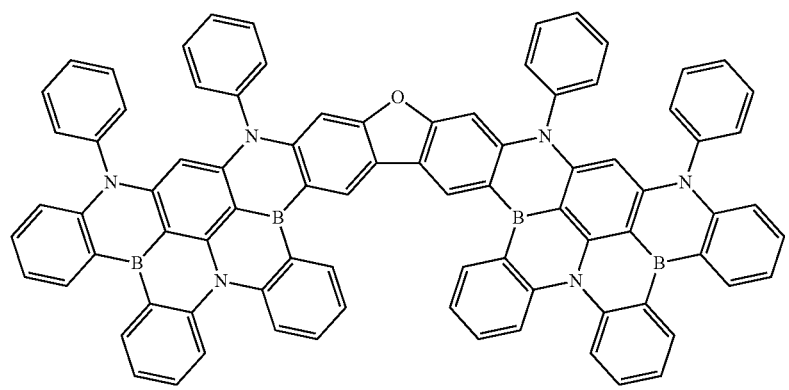
3-1
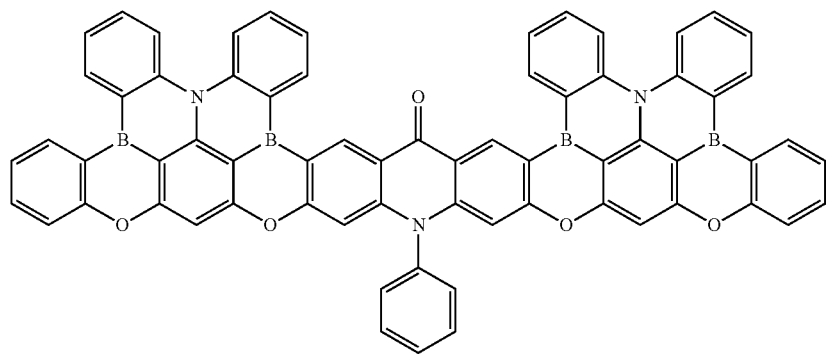
3-2
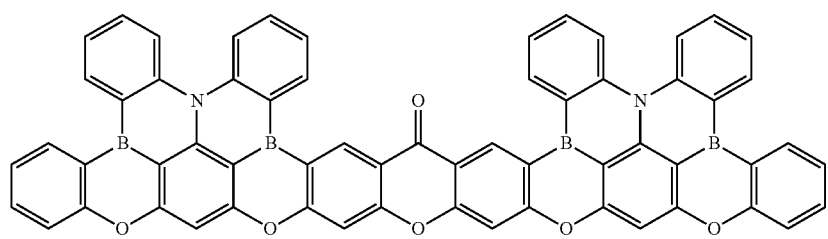

-continued 3-4

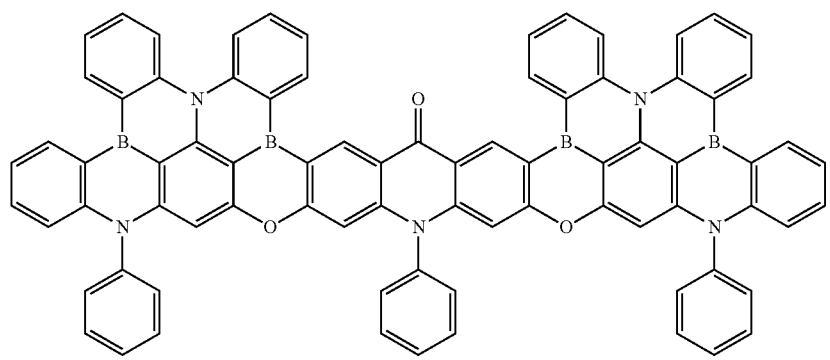

By utilizing the Comparative Compounds as materials for an emission layer, organic electroluminescence devices of Comparative Examples were manufactured.

Comparative Compounds

C1

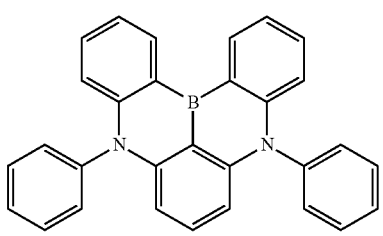

C2

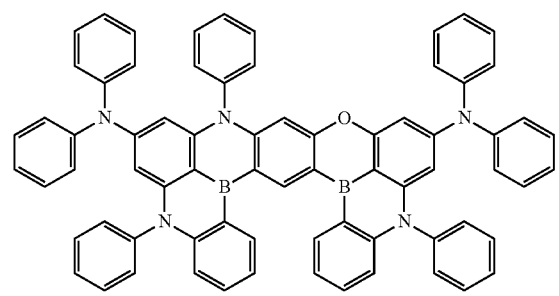

C3

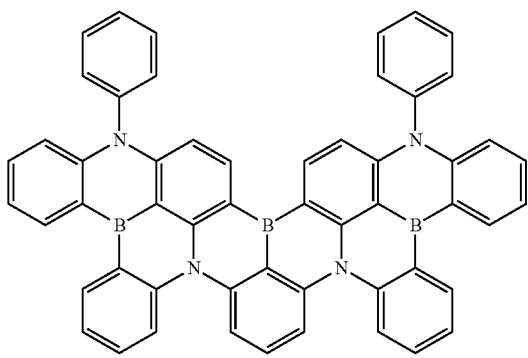

-continued

C4

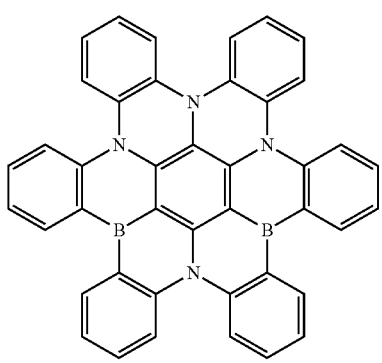

C5

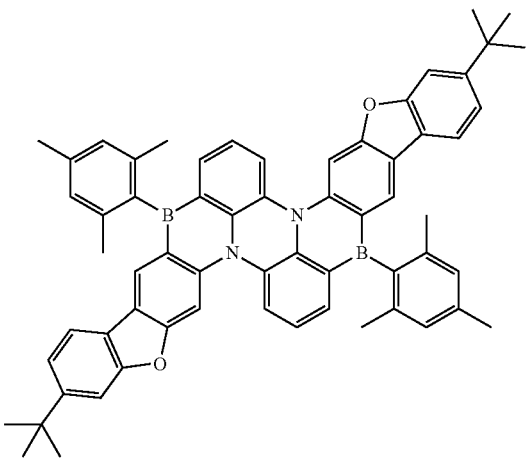

C6

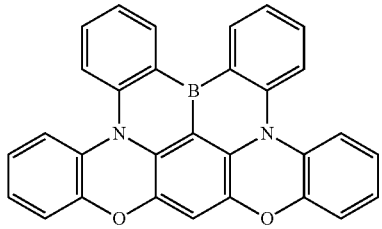

Organic electroluminescence devices of Examples and Comparative Examples were each manufactured by a method described below.

On a glass substrate, ITO with a thickness of about 1,200 Å was patterned, washed with ultra-pure water and treated with UV-ozone for about 30 minutes. Then, NPD was vacuum deposited to a thickness of about 300 Å to form a hole injection layer, and TATA was vacuum deposited to a thickness of about 200 Å to form a hole transport layer. A compound of CzSi was vacuum deposited to a thickness of about 100 Å on the hole transport layer.

Then, the polycyclic compound of an embodiment or the Comparative Compound was co-deposited with mCP in a ratio of 1:99 to form an emission layer with a thickness of about 200 Å.

On the emission layer, a layer with a thickness of about 200 Å was formed utilizing TSPO1, and a layer with a thickness of about 300 Å was formed utilizing TPBi as an electron injection layer compound. On the electron transport layer, a halogenated alkali metal, LiF, was deposited to a thickness of about 10 Å as an electron injection layer, and Al was vacuum deposited to a thickness of about 3,000 Å to form a LiF/Al electrode to manufacture an organic electroluminescence device.

(Evaluation of Properties of Organic Electroluminescence Device)

In order to evaluate the properties of the organic electroluminescence devices of Examples and Comparative Examples, maximum light-emitting wavelength (nm), and external quantum efficiency (e.g., emission efficiency) (%) at a luminance of about 1,000 cd/m² were measured.

TABLE 1

| | Dopant of emission layer | Maximum light-emitting wavelength (nm) | External quantum efficiency (%) |
|---|---|---|---|
| Example 1 | Example Compound 1-9 | 460 | 24.7 |
| Example 2 | Example Compound 1-10 | 470 | 24.3 |
| Example 3 | Example Compound 2-2 | 458 | 23.9 |
| Example 4 | Example Compound 2-3 | 462 | 24.1 |
| Example 5 | Example Compound 2-13 | 467 | 24.4 |
| Example 6 | Example Compound 3-1 | 450 | 20.2 |
| Example 7 | Example Compound 3-2 | 453 | 22.4 |
| Example 8 | Example Compound 3-4 | 455 | 22.2 |
| Comparative Example 1 | Comparative Compound C1 | 465 | 19.1 |
| Comparative Example 2 | Comparative Compound C2 | 462 | 15.1 |
| Comparative Example 3 | Comparative Compound C3 | 475 | 18.2 |
| Comparative Example 4 | Comparative Compound C4 | 445 | 21.0 |
| Comparative Example 5 | Comparative Compound C5 | 440 | 10.1 |
| Comparative Example 6 | Comparative Compound C6 | 460 | 18.1 |

Referring to the results of Table 1, it could be confirmed that when the polycyclic compound according to an embodiment is included in an emission layer, the external quantum efficiency was improved when compared with the Comparative Examples.

Because the polycyclic compound according to an embodiment has a wide plate-shaped skeleton, multiple resonance effect may be further activated, and high horizontal orientation ratio of the transition dipole moment of a dopant in the host matrix of an emission layer may be achieved. Accordingly, $\Delta E_{ST}$ (e.g., representing the difference between the lowest singlet excitation energy level (S1 level) and the lowest triplet excitation energy level (T1 level)) may be reduced even further, and emission efficiency may be improved.

The organic electroluminescence device according to an embodiment of the present disclosure may achieve high efficiency and long lifespan.

The polycyclic compound according to an embodiment of the present disclosure may improve the lifespan and efficiency of an organic electroluminescence device.

The use of "may" when describing embodiments of the present invention refers to "one or more embodiments of the present invention." Also, the term "exemplary" is intended to refer to an example or illustration.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a), and 35 U.S.C. § 132(a).

Although the exemplary embodiments of the present invention have been described, it is understood that the present invention should not be limited to these exemplary embodiments but various suitable changes and modifications can be made by one ordinary skilled in the art within the spirit and scope of the present invention as hereinafter claimed, and equivalents thereof.

What is claimed is:

1. An organic electroluminescence device, comprising:
   a first electrode;
   an organic layer on the first electrode; and
   a second electrode on the organic layer;
   wherein the organic layer comprises a polycyclic compound represented by the following Formula 1:

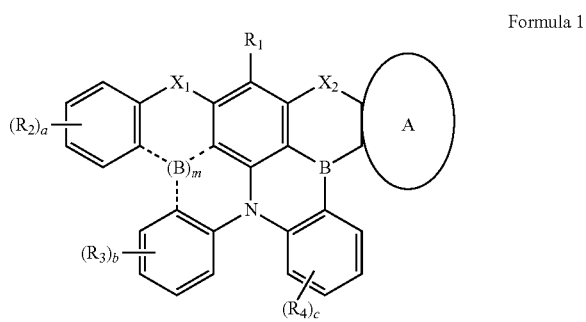

Formula 1

107

-continued

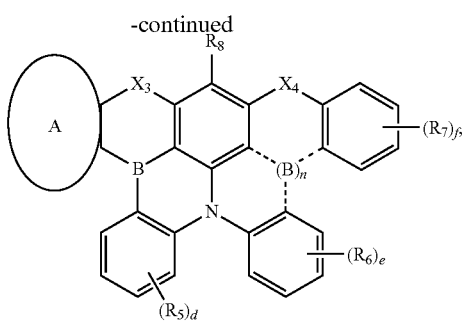

wherein in Formula 1,
$X_1$ to $X_4$ are each independently $NR_9$, O or S,
$R_1$ to $R_8$ are each independently a hydrogen atom, a deuterium atom, a halogen atom, a cyano group, a substituted or unsubstituted boron group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring,
$R_9$ is a hydrogen atom, a deuterium atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring,
a to f are each independently an integer of 0 to 4,
m and n are each independently 0 or 1,
a dotted line represents a bond or a non-bond, and
ring A is represented by any one selected from the following Formula 2-1 to Formula 2-1

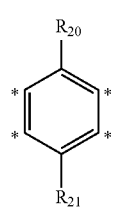

Formula 2-2

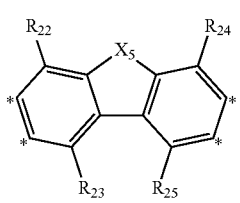

Formula 2-3

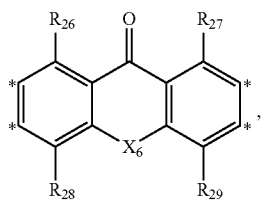

wherein in Formula 2-1 to Formula 2-3,
* represents a bonding site with a neighboring atom,
$X_5$ and $X_6$ are each independently $CR_{30}R_{31}$, $NR_{32}$, O or S,

108

$R_{30}$ to $R_{32}$ are each independently a hydrogen atom, a deuterium atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and
$R_{20}$ to $R_{29}$ are each independently a hydrogen atom, a deuterium atom, a halogen atom, a cyano group, a substituted or unsubstituted boron group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and
wherein when ring A is represented by Formula 2-1 or 2-2, at least one selected from m and n is 1.

2. The organic electroluminescence device of claim 1, wherein the organic layer comprises:
a hole transport region on the first electrode;
an emission layer on the hole transport region; and
an electron transport region on the emission layer.

3. The organic electroluminescence device of claim 2, wherein the emission layer comprises the polycyclic compound and is to emit delayed fluorescence.

4. The organic electroluminescence device of claim 3, wherein
the emission layer is a delayed fluorescence emission layer comprising a host and a dopant, and
the dopant is the polycyclic compound.

5. The organic electroluminescence device of claim 3, wherein the emission layer is a thermally activated delayed fluorescence emission layer to emit blue light.

6. The organic electroluminescence device of claim 2, wherein the electron transport region comprises:
an electron transport layer on the emission layer; and
an electron injection layer on the electron transport layer, and
wherein the electron transport layer or the electron injection layer comprises the polycyclic compound.

7. The organic electroluminescence device of claim 1, wherein Formula 2-2 is represented by any one selected from the following Formula 3-1 to Formula 3-4:

Formula 3-1

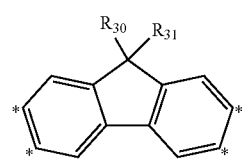

Formula 3-2

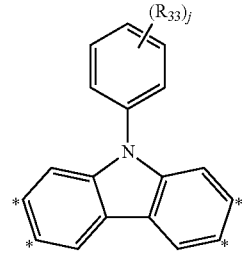

Formula 3-3

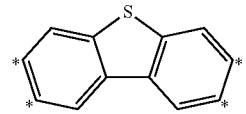

-continued

Formula 3-4

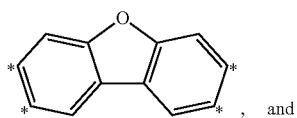, and wherein in Formula 3-1 to Formula 3-4,

* represents a bonding site with a neighboring atom, $R_{30}$, $R_{31}$, and $R_{33}$ are each independently a hydrogen atom, a deuterium atom, or a substituted or unsubstituted alkyl group of 1 to 20 carbon atoms, and j is an integer of 0 to 5.

8. The organic electroluminescence device of claim 1, wherein Formula 2-3 is represented by any one selected from the following Formula 4-1 to Formula 4-3:

Formula 4-1

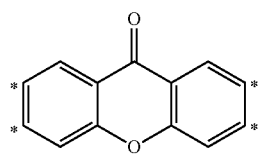

Formula 4-2

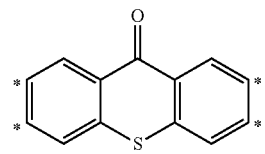

Formula 4-3

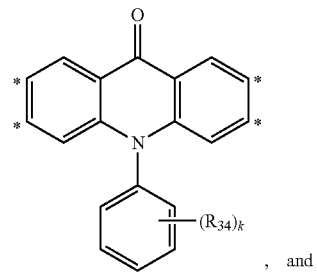, and wherein in Formula 4-1 to Formula 4-3,

* represents a bonding site with a neighboring atom, $R_{34}$ is a hydrogen atom, a deuterium atom, or a substituted or unsubstituted alkyl group of 1 to 20 carbon atoms, and k is an integer of 0 to 5.

9. The organic electroluminescence device of claim 1, wherein the polycyclic compound represented by Formula 1 is represented by the following Formula 5-1 or Formula 5-2:

Formula 5-1

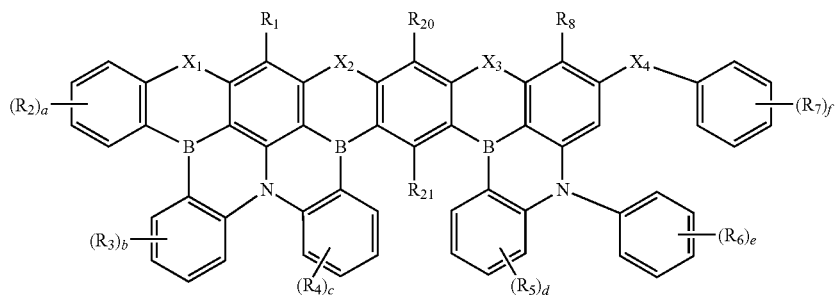

Formula 5-2

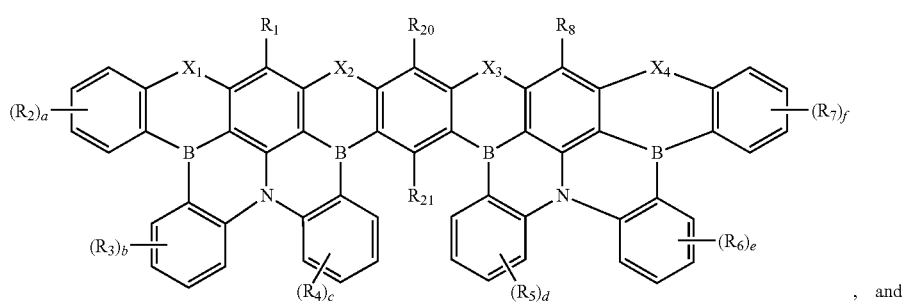, and wherein in Formula 5-1 and Formula 5-2, $X_1$ to $X_4$, $R_1$ to $R_8$, $R_{20}$, $R_{21}$, and a to f are the same as respectively defined in connection with Formula 1 and Formula 2-1.

10. The organic electroluminescence device of claim 1, wherein the polycyclic compound represented by Formula 1 is represented by the following Formula 6-1 or Formula 6-2:

Formula 6-1

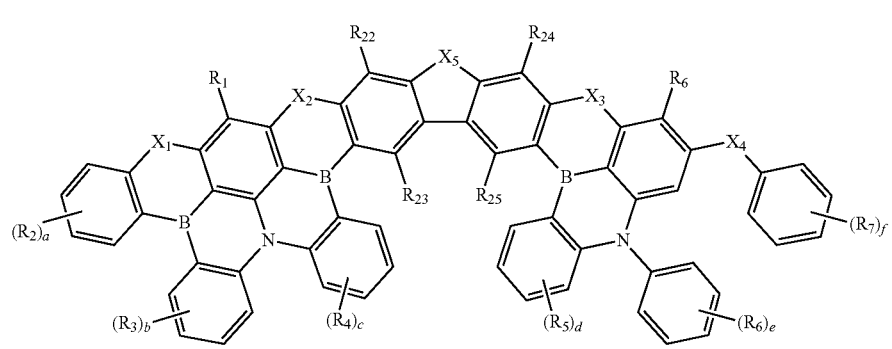

Formula 6-2

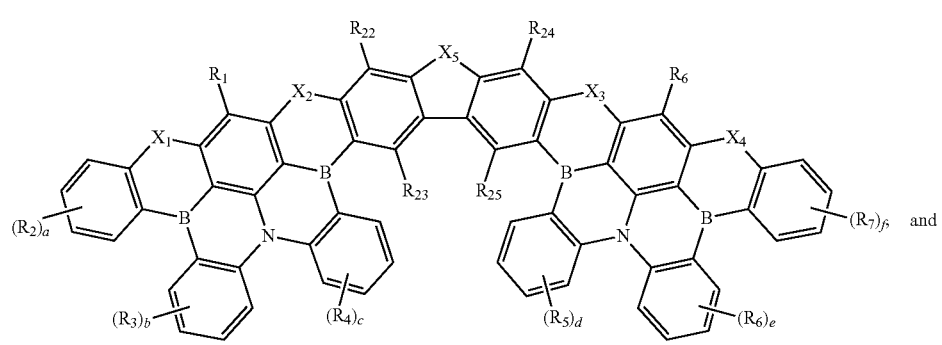

and wherein in in Formula 6-1 and Formula 6-2,
$X_1$ to $X_5$, $R_1$ to $R_8$, $R_{22}$ to $R_{25}$, and a to f are the same as respectively defined in connection with Formula 1 and Formula 2-2.

11. The organic electroluminescence device of claim 1, wherein the polycyclic compound represented by Formula 1 is represented by any one selected from the following Formula 7-1 to Formula 7-3:

Formula 7-1

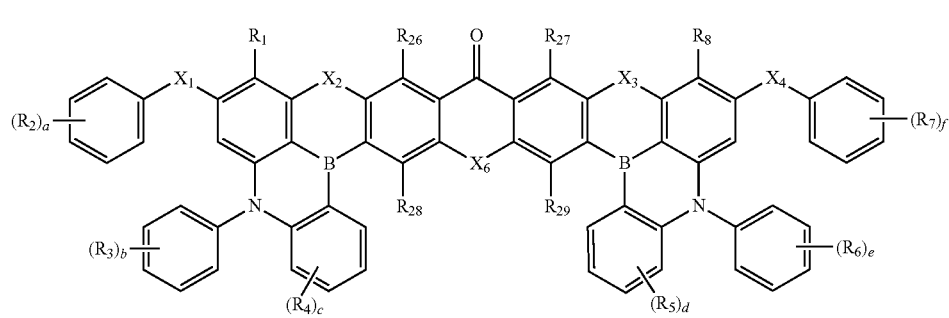

Formula 7-2

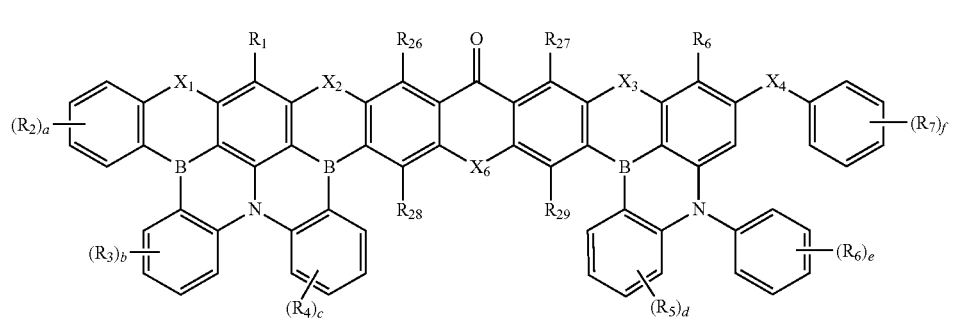

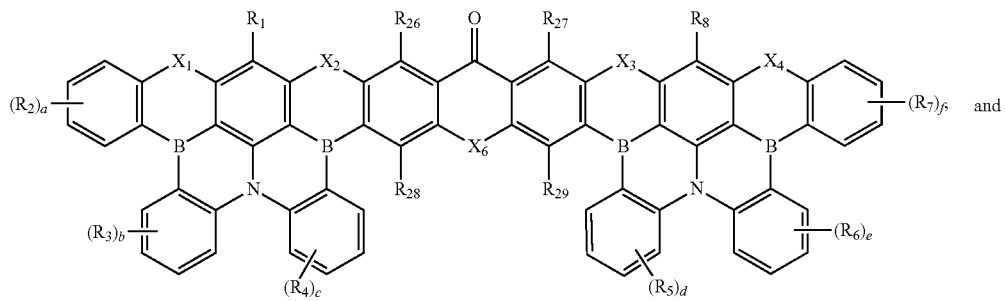

Formula 7-3 wherein in Formula 7-1 to Formula 7-3, $X_1$ to $X_4$, $X_6$, $R_1$ to Ra, $R_{26}$ to $R_{29}$, and a to f are the same as respectively defined in Formula 1 and Formula 2-3.

12. The organic electroluminescence device of claim 1, wherein:

$X_1$ to $X_4$ are each independently $NR_{11}$ or O; and $R_{11}$ is a substituted or unsubstituted aryl group of 6 to 30 carbon atoms for forming a ring.

13. The organic electroluminescence device of claim 1, wherein:

$X_1$ and $X_4$ are the same; and $X_2$ and $X_3$ are the same.

14. The organic electroluminescence device of claim 1, wherein the polycyclic compound represented by Formula 1 is any one selected from compounds represented in the following Compound Group 1 to Compound Group 3:

1-1

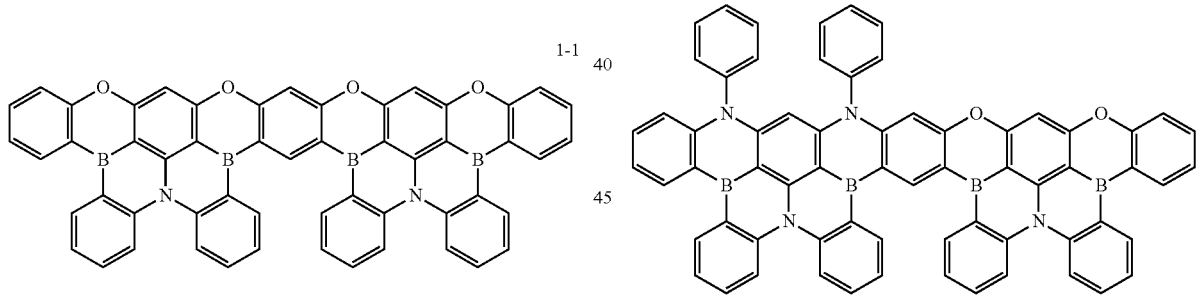

1-2

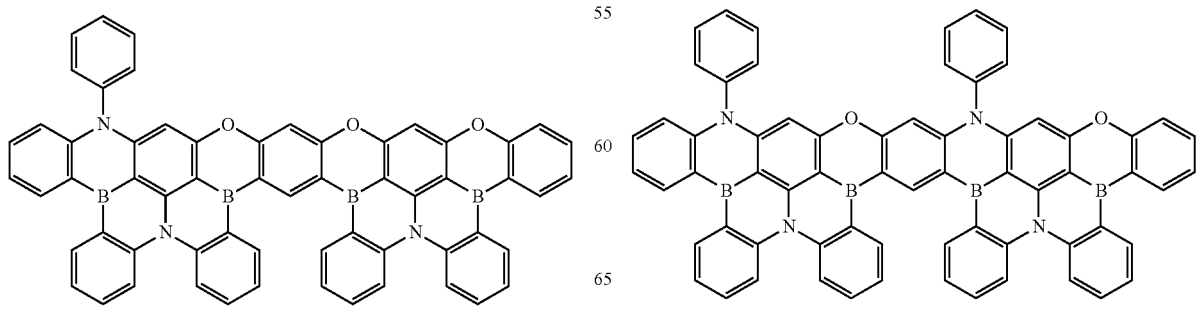

1-3

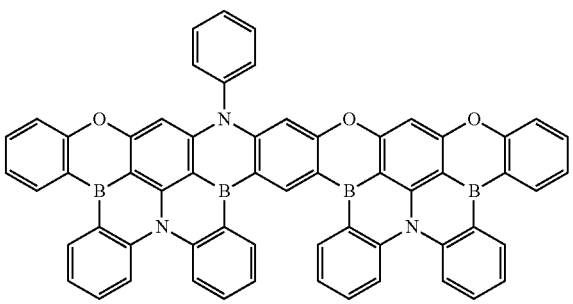

1-4

1-5

1-6
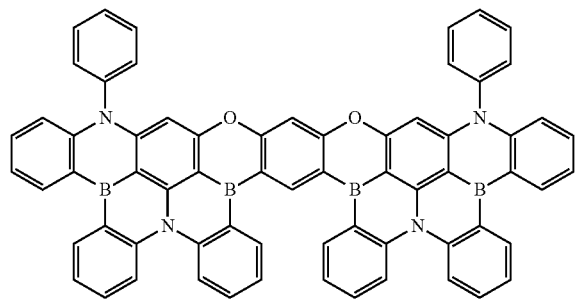
1-7
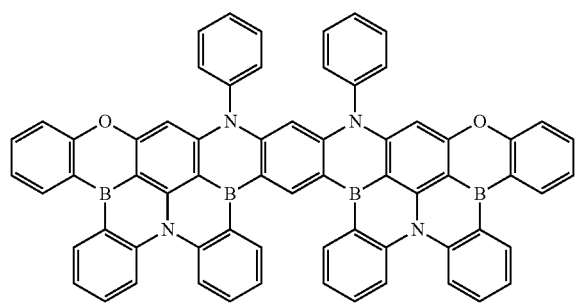
1-8
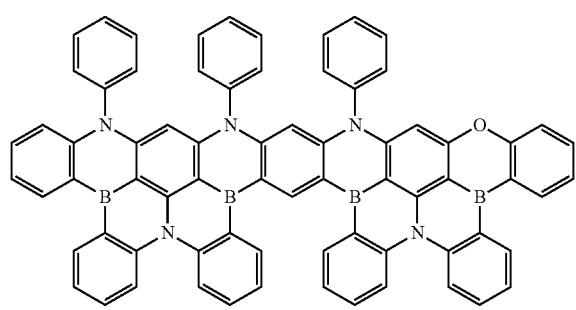
1-9
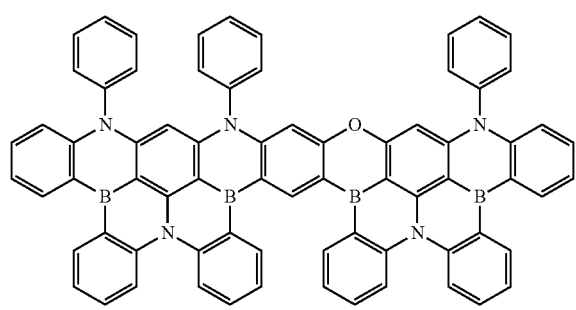
1-10
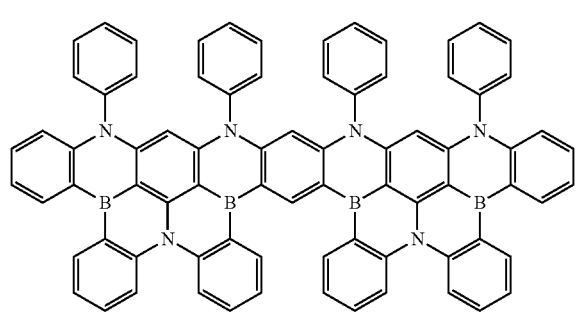
1-11
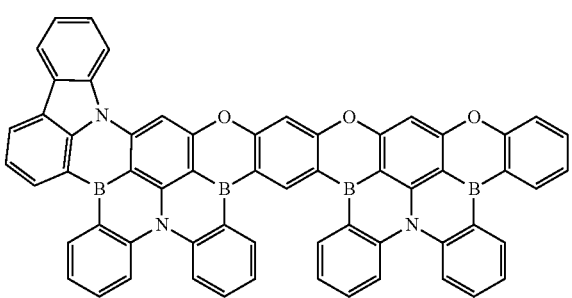
1-12
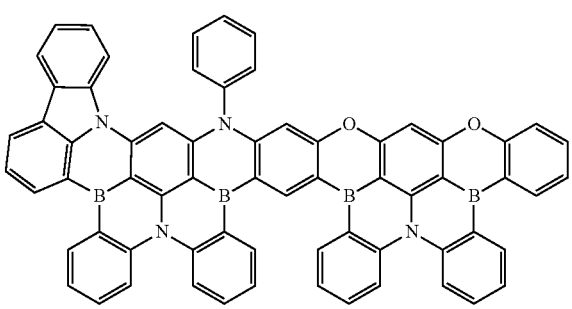
1-13
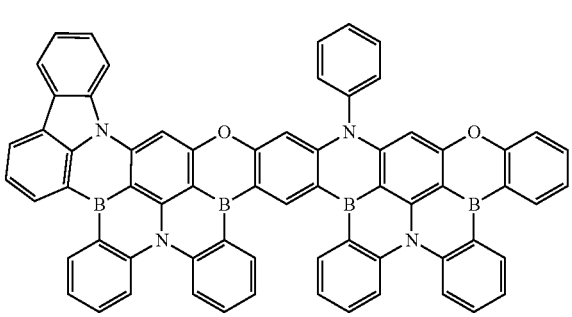
1-14
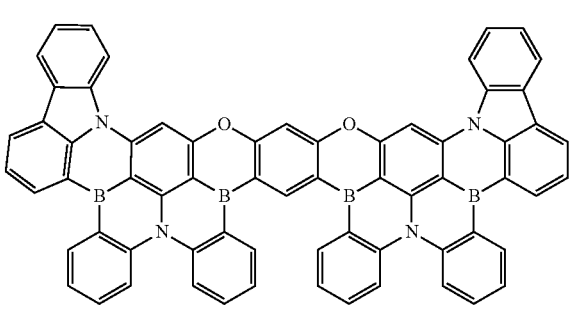
1-15
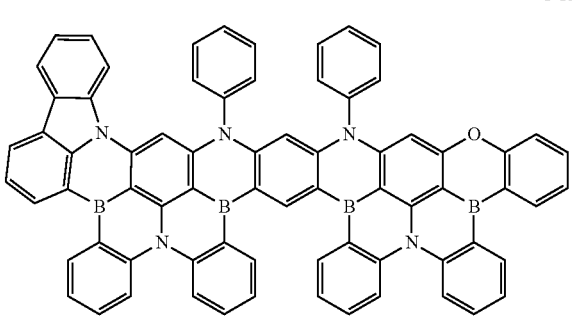

1-16
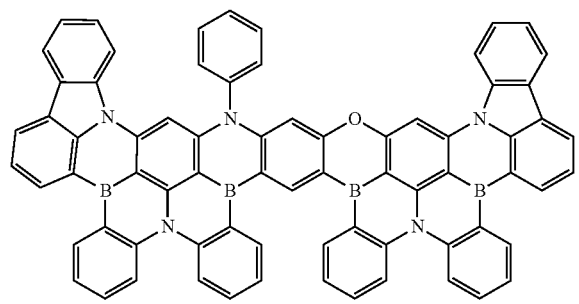
1-17
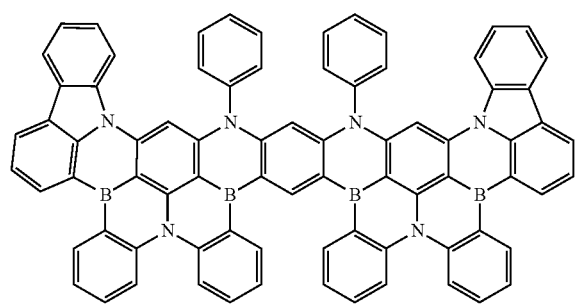
1-18
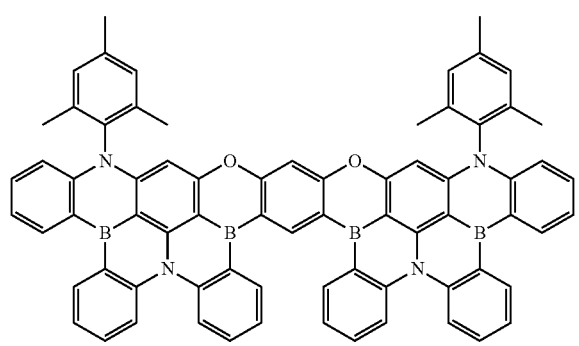
1-19
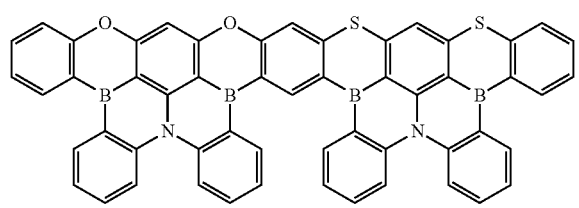
1-20
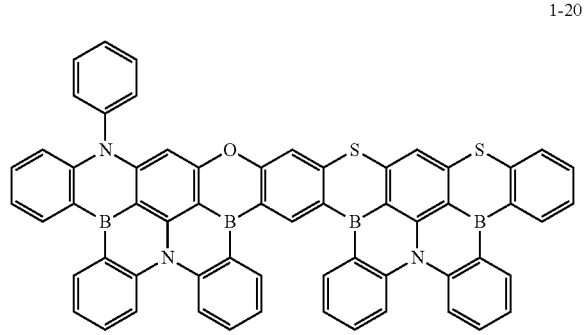
1-21
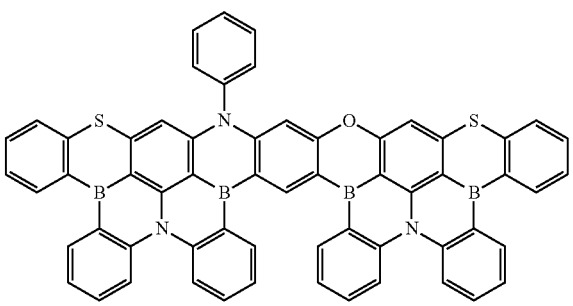
1-22
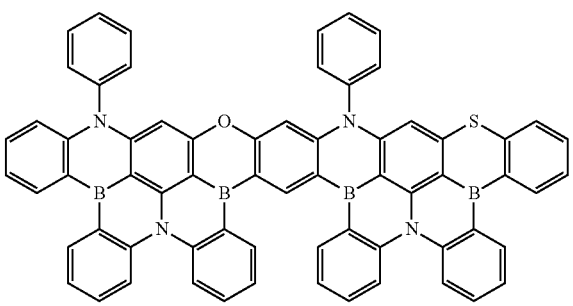
1-23
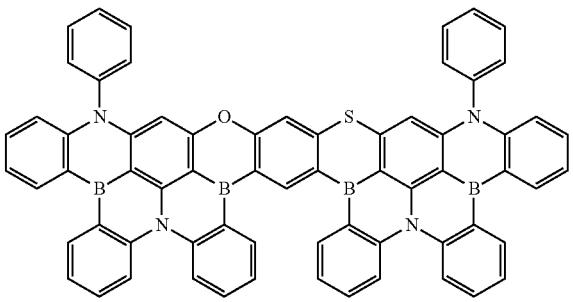
1-24
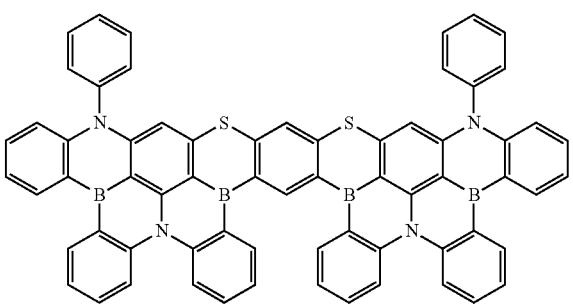

1-25
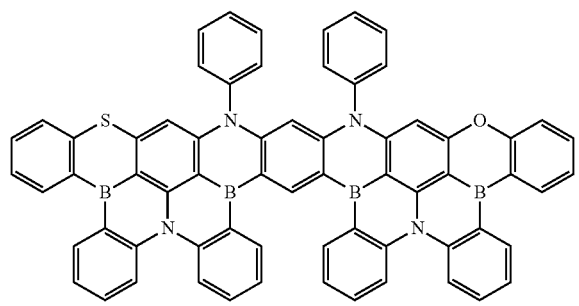
1-27
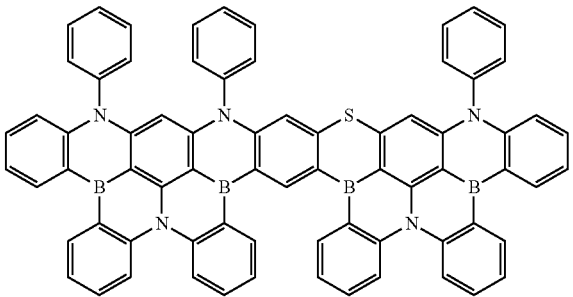
1-26
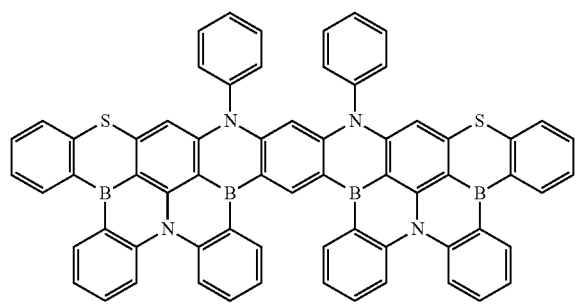
1-28
2-1
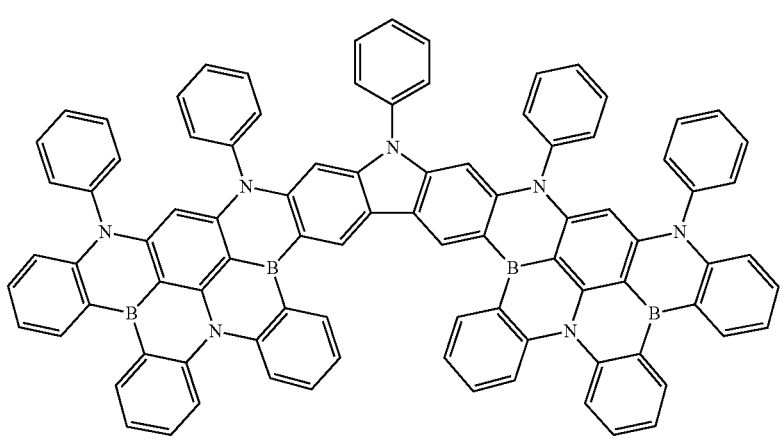
2-2
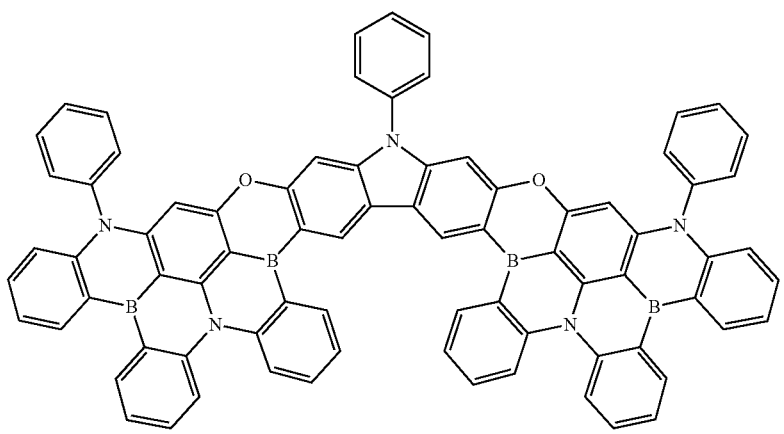

-continued
2-3
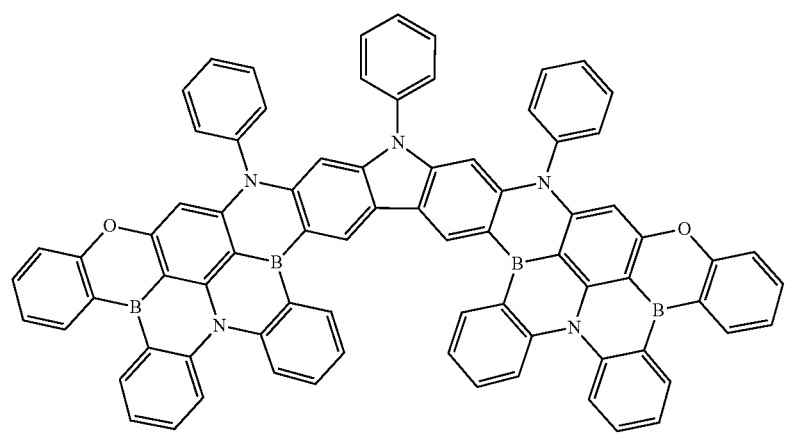
2-4
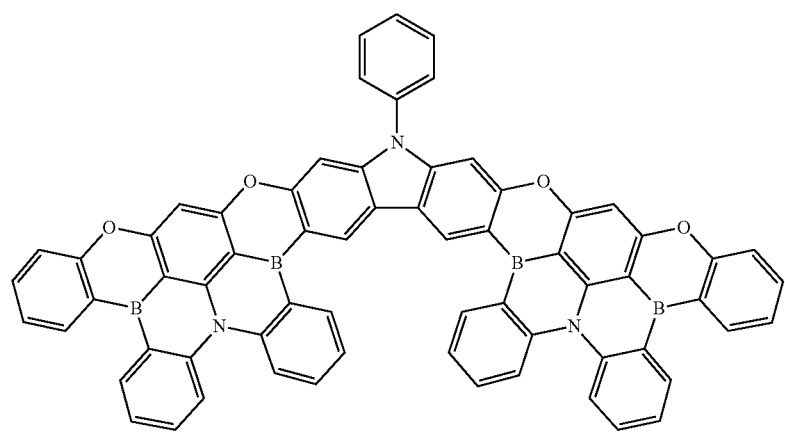
2-5
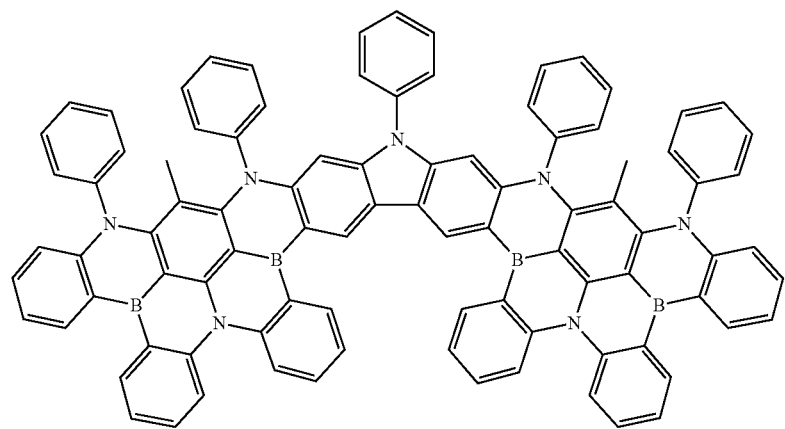

2-6
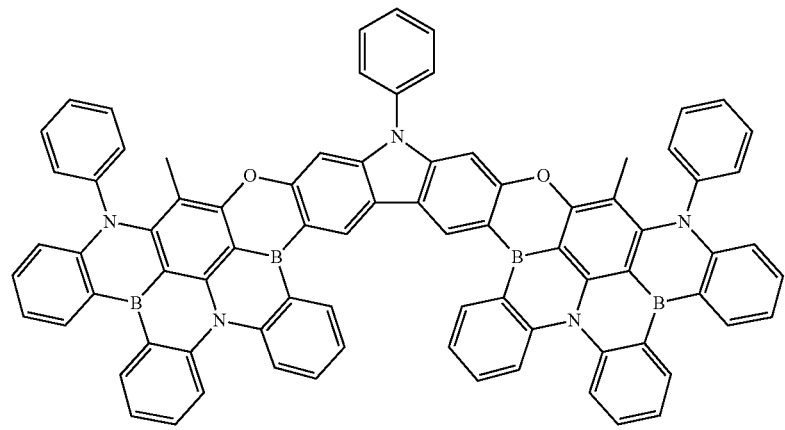
2-7
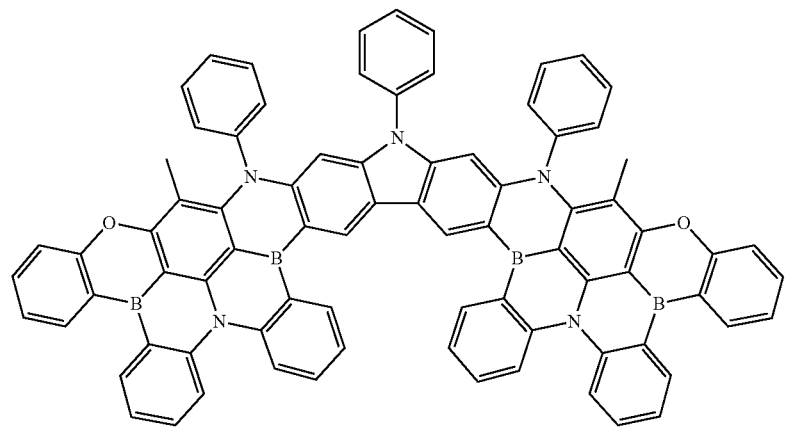
2-8
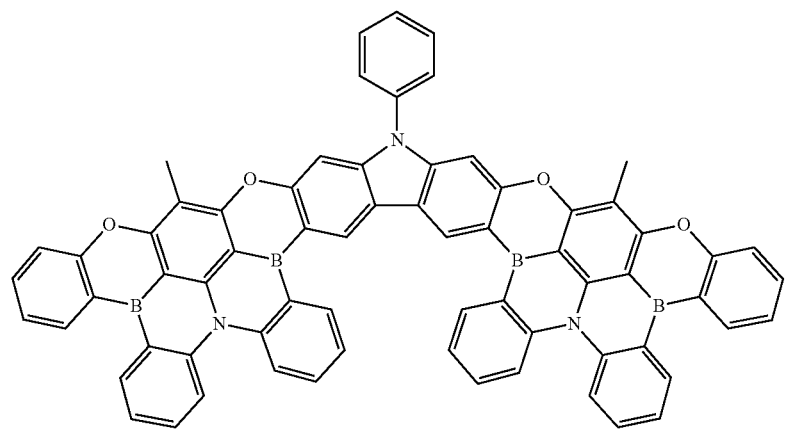

2-9
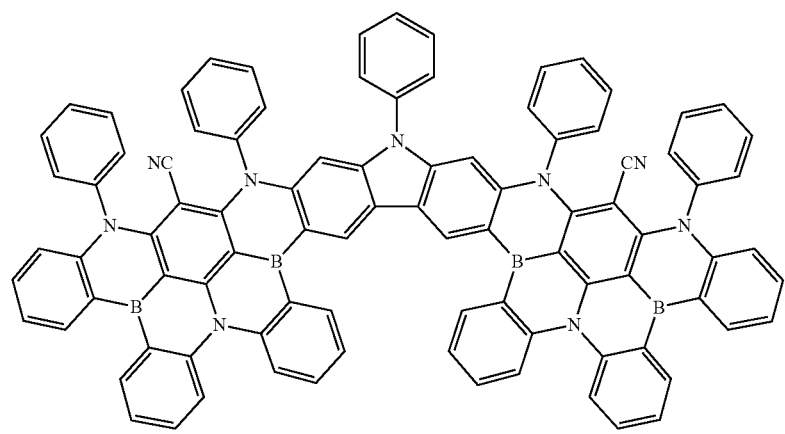
2-10
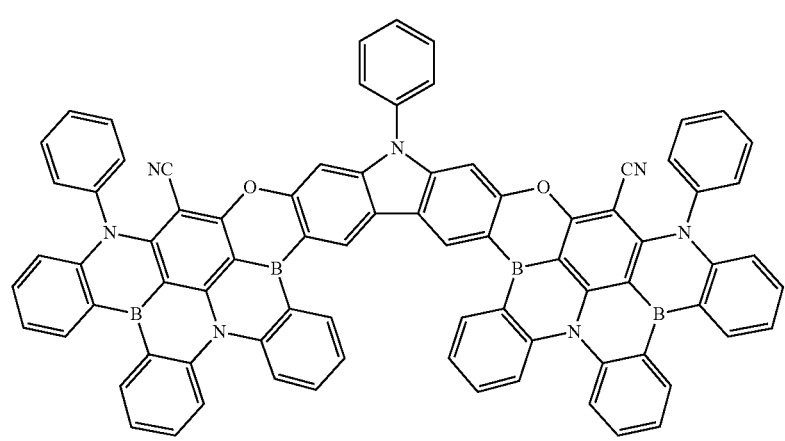
2-11
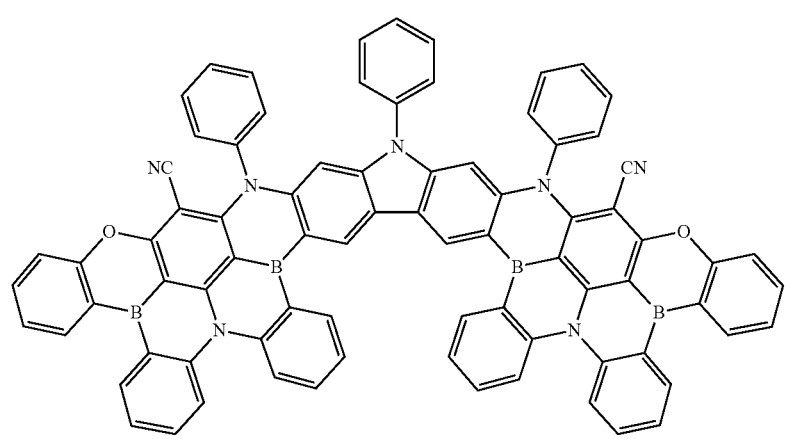

2-12
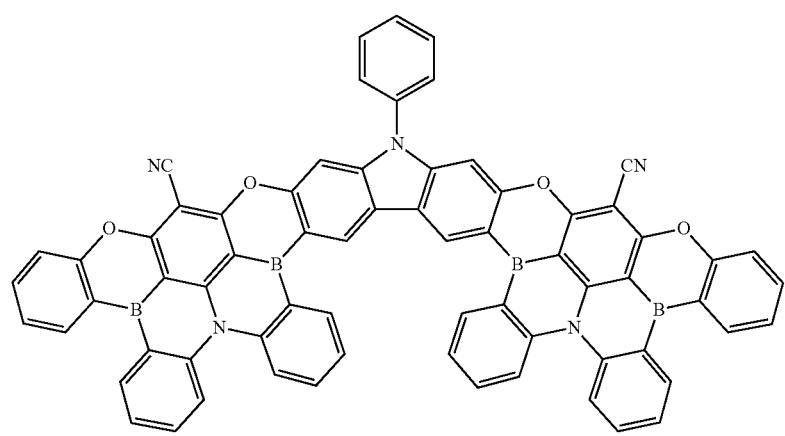
2-13
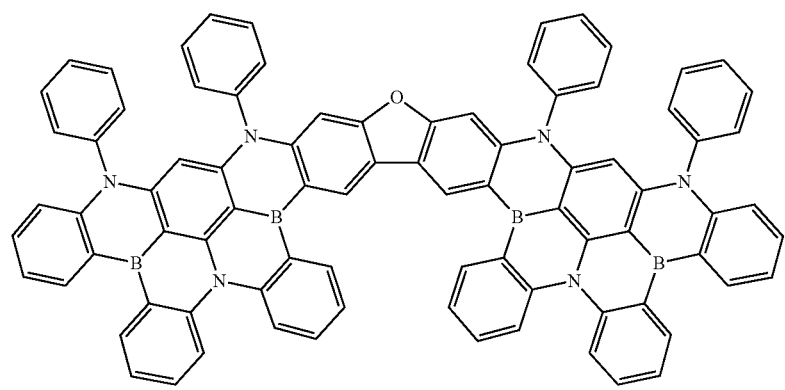
2-14
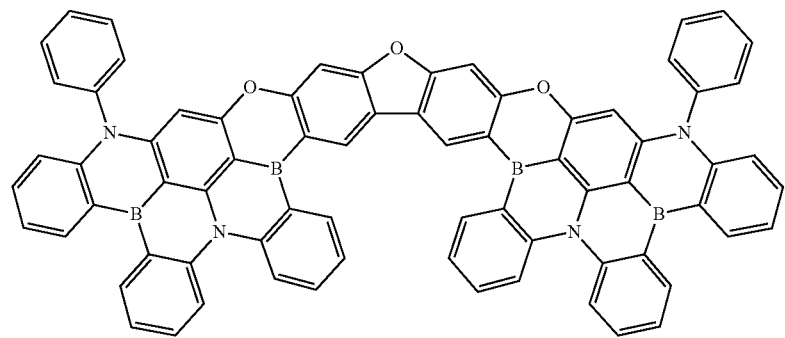
2-15
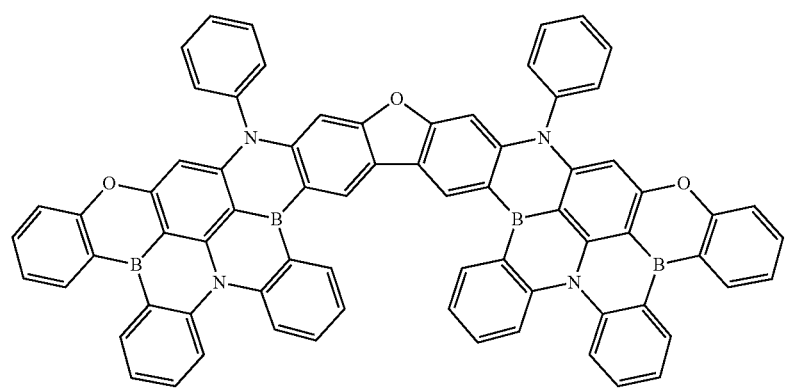

2-16
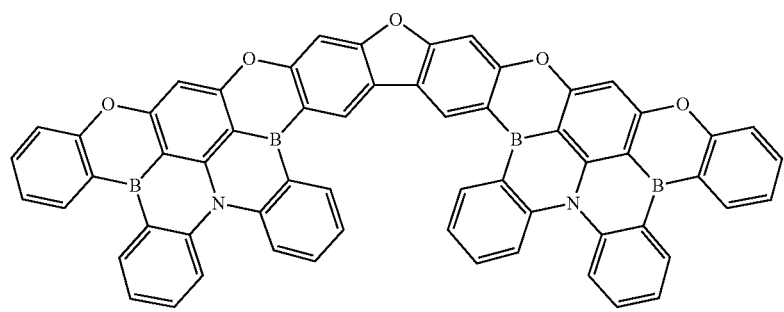
2-17
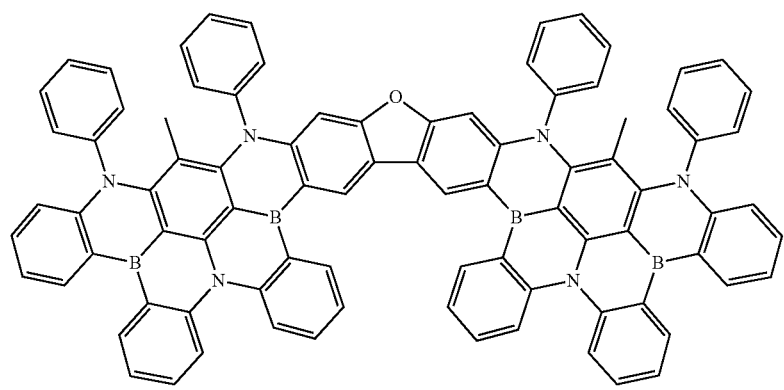
2-18
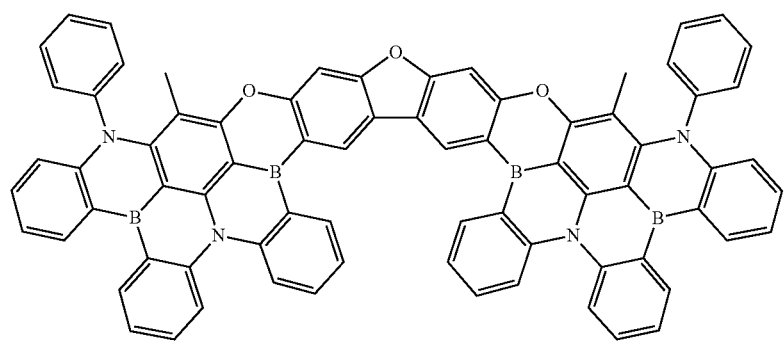
2-19
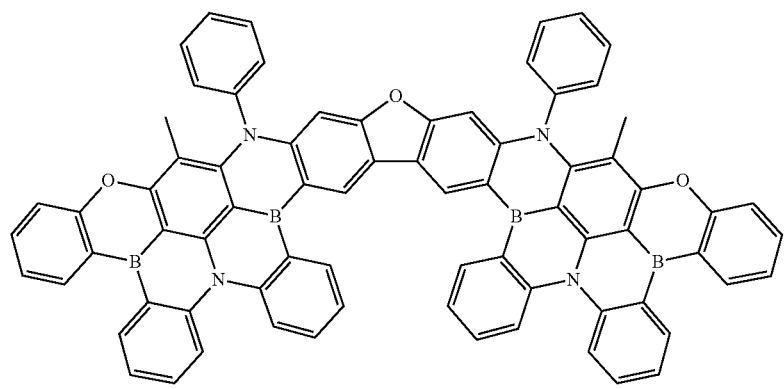

2-20
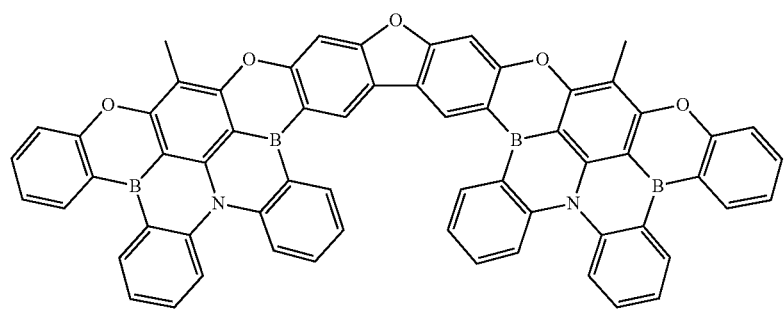
2-21
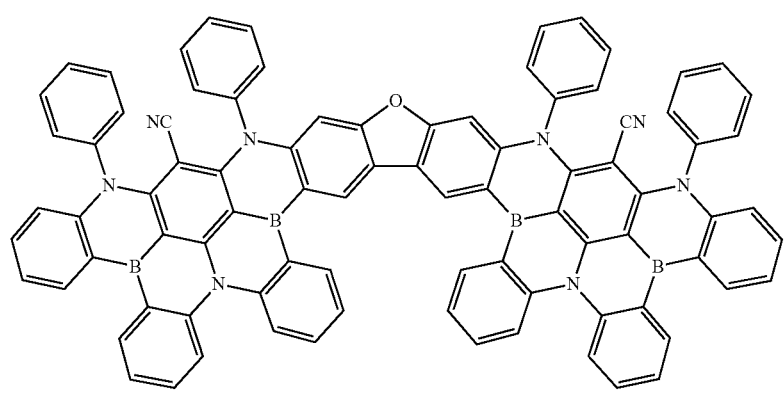
2-22
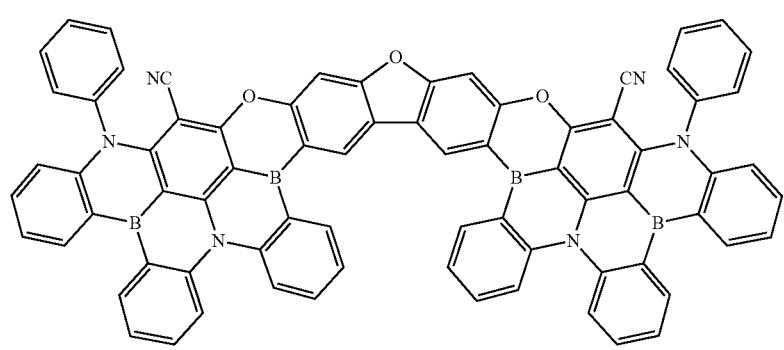
2-23
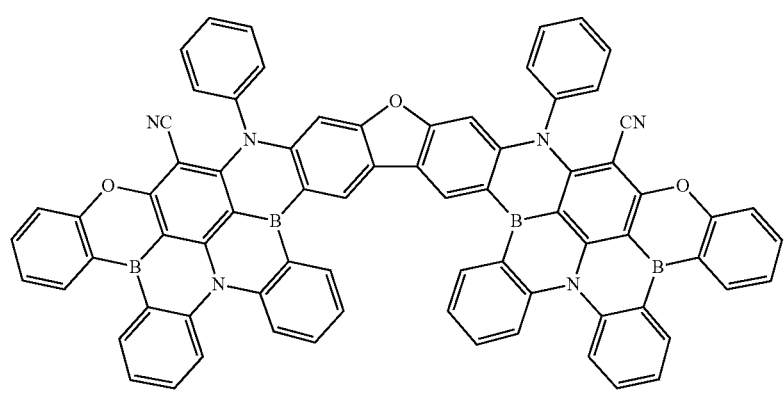

2-24
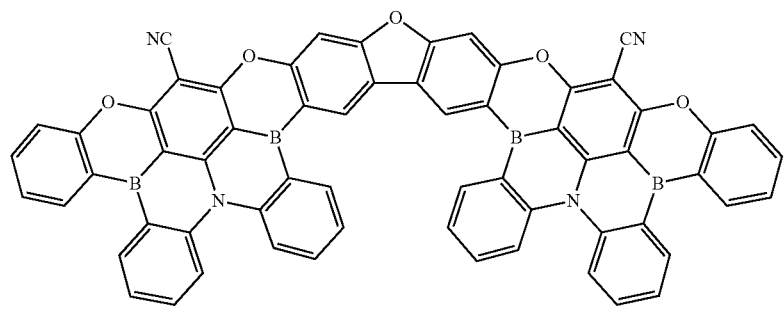
2-25
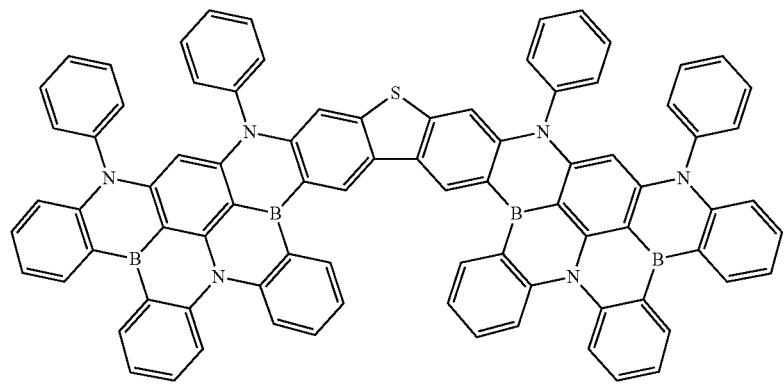
2-26
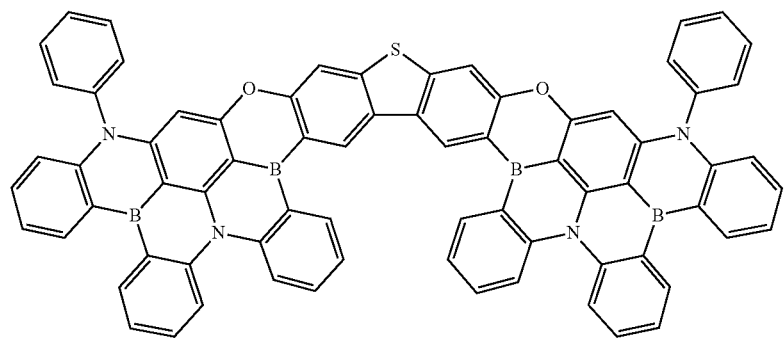
2-27
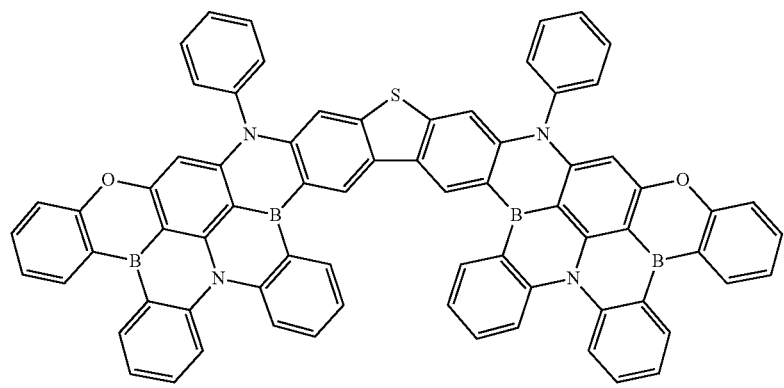

2-28
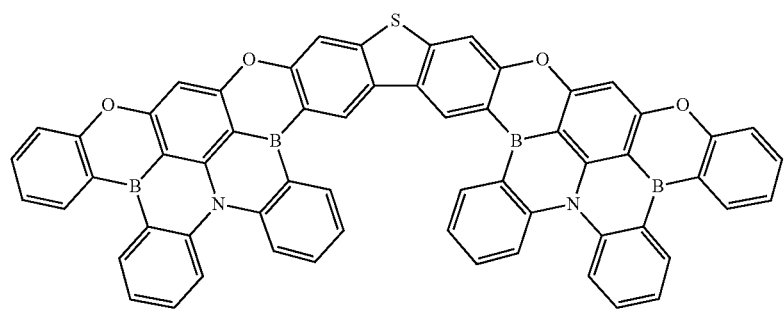
2-29
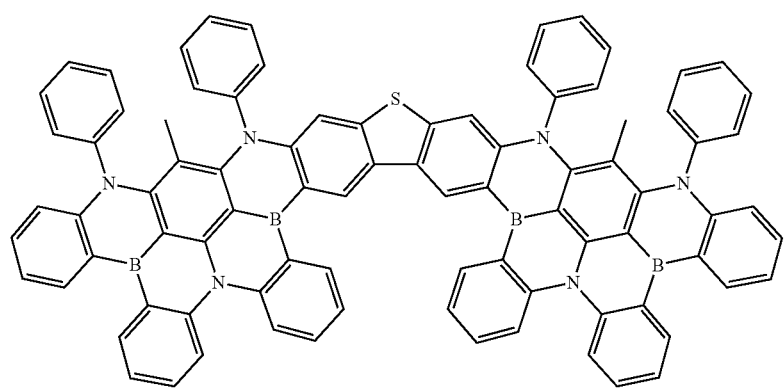
2-30
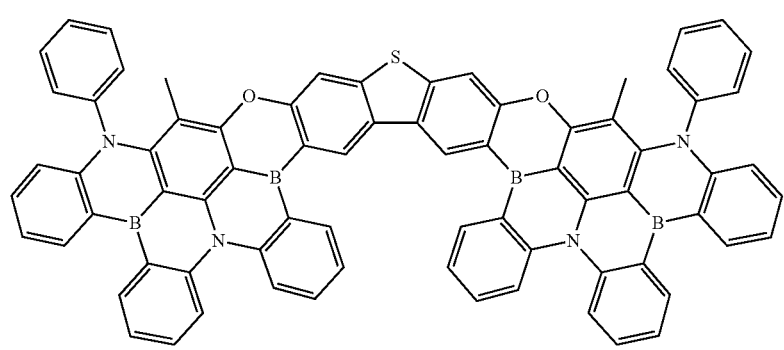
2-31
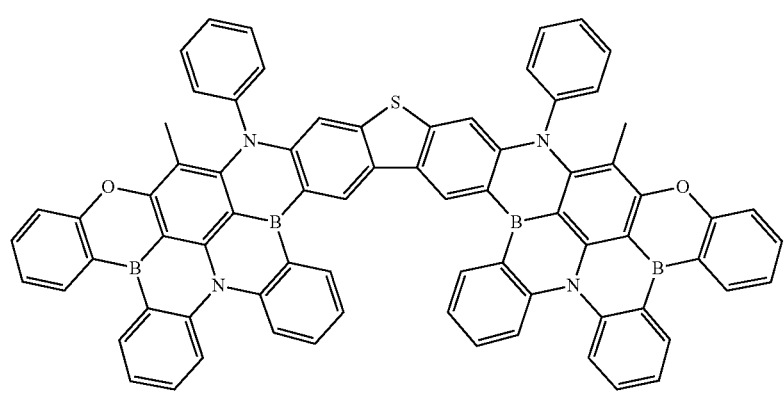

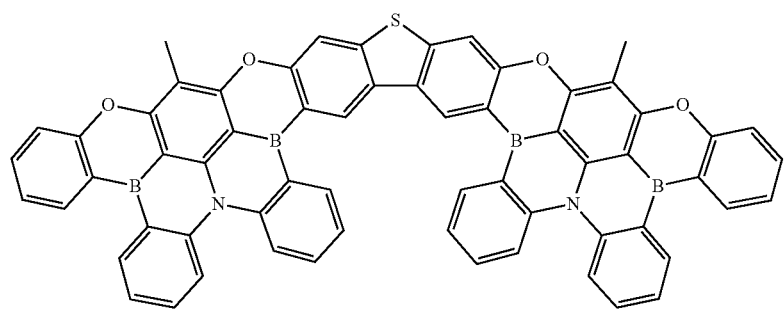
2-32
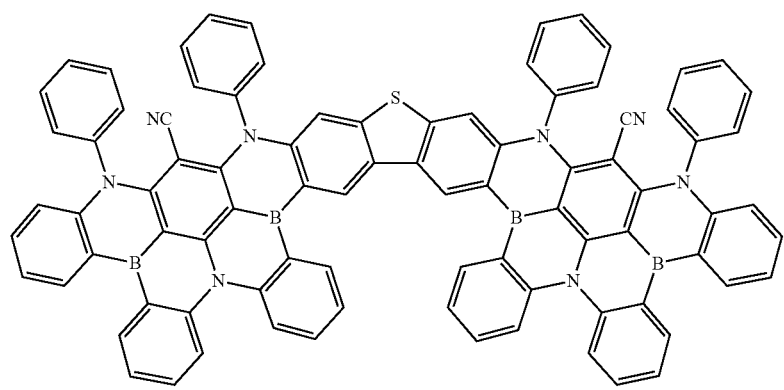
2-33
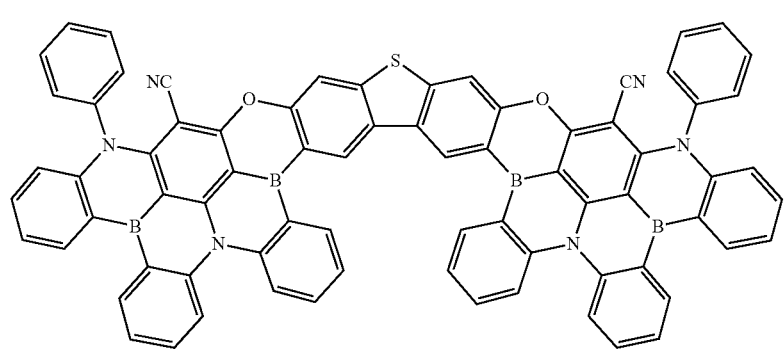
2-34
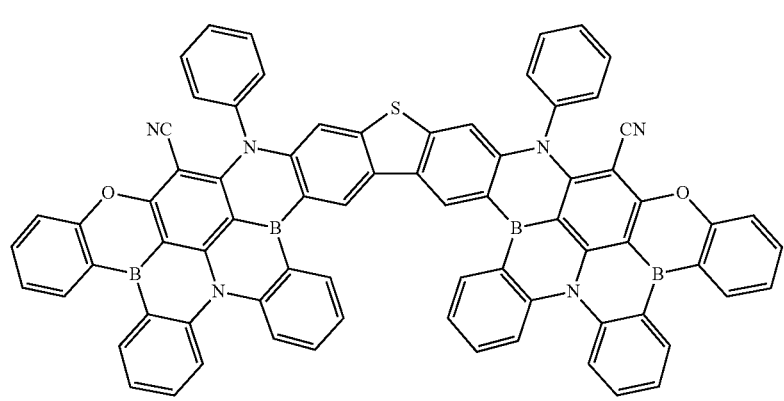
2-35

2-36
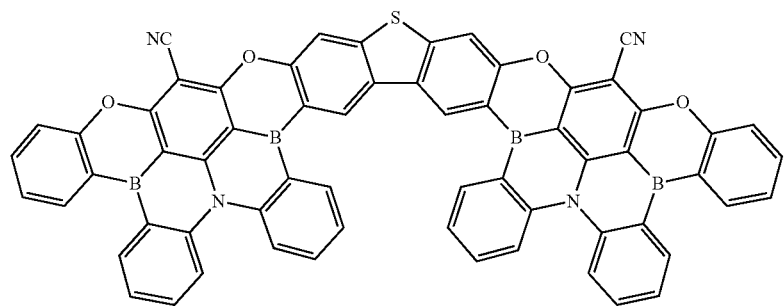
2-37
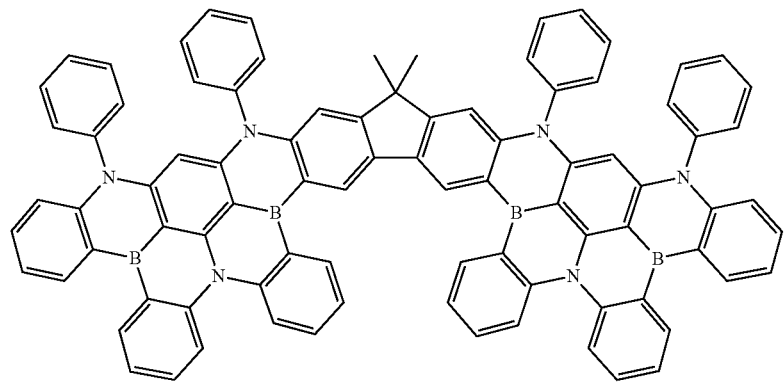
2-38
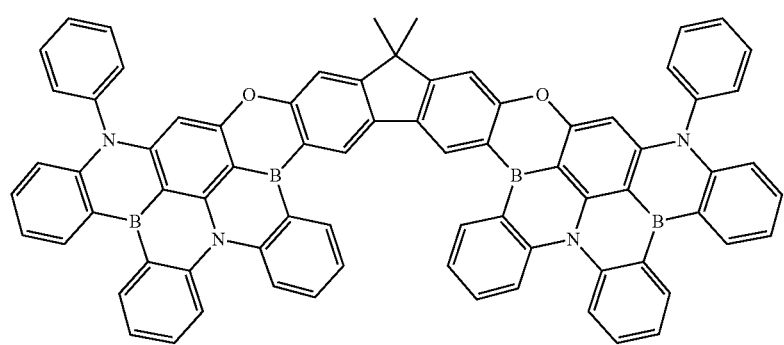
2-39
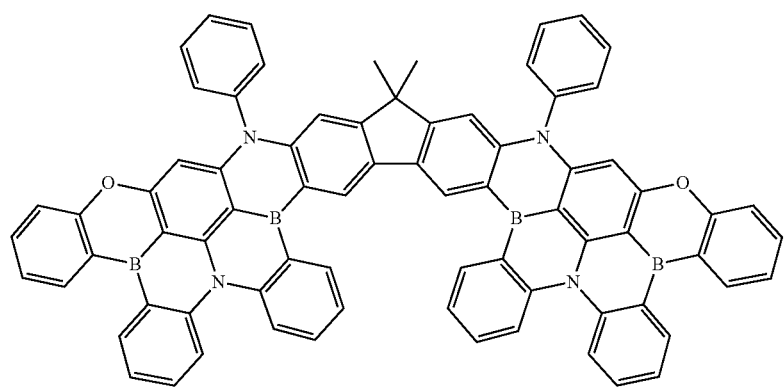

-continued
2-40
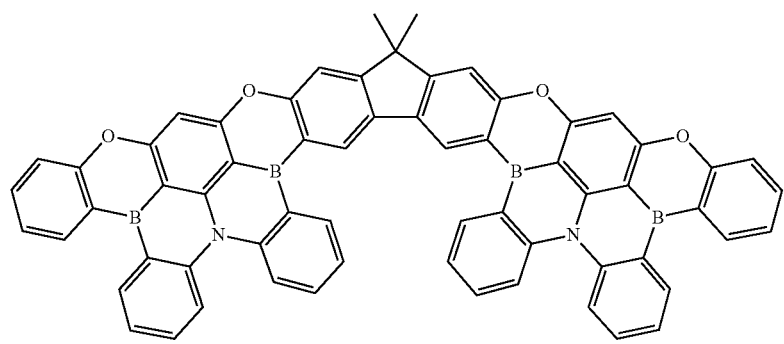
2-41
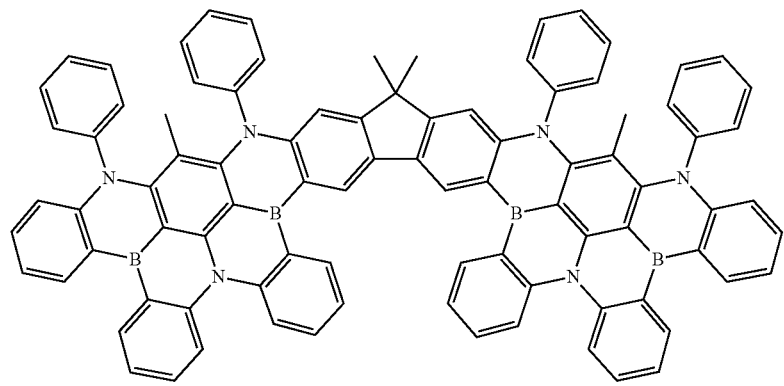
2-42
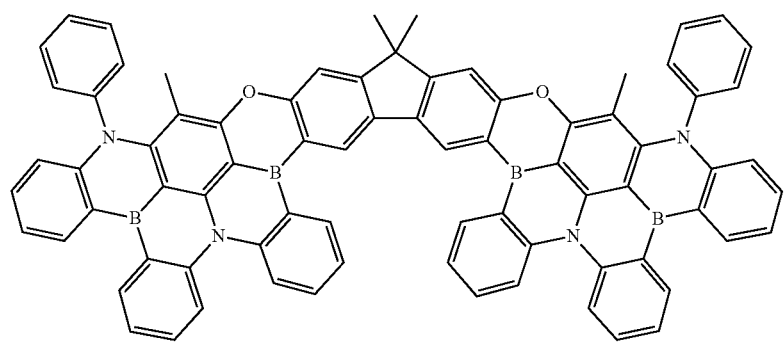
2-43
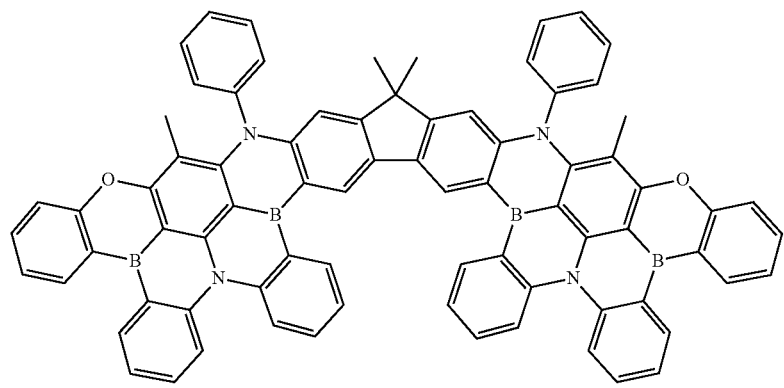

-continued
2-44
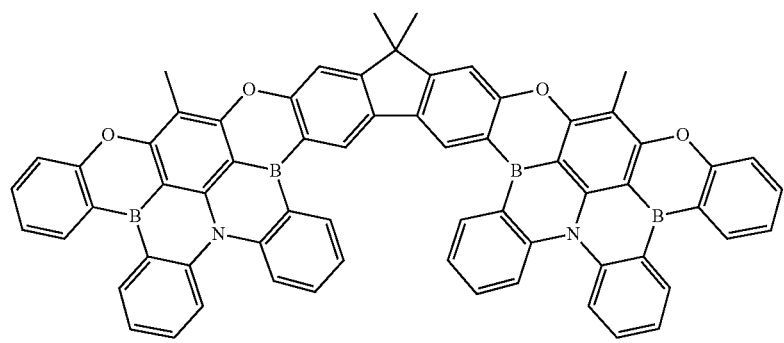
2-45
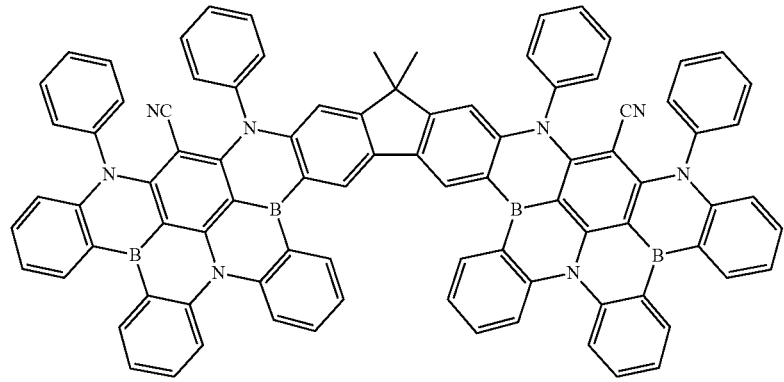
2-46
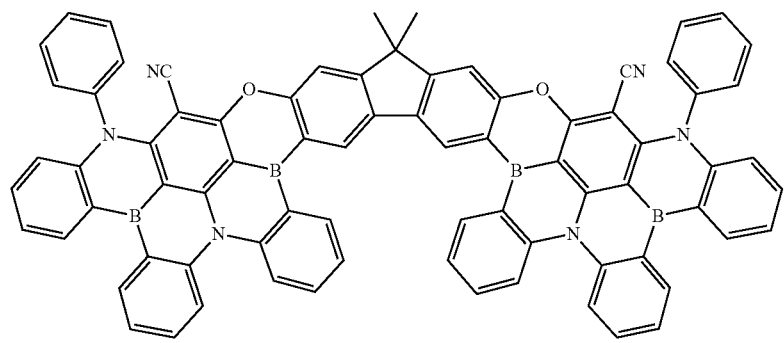
2-47
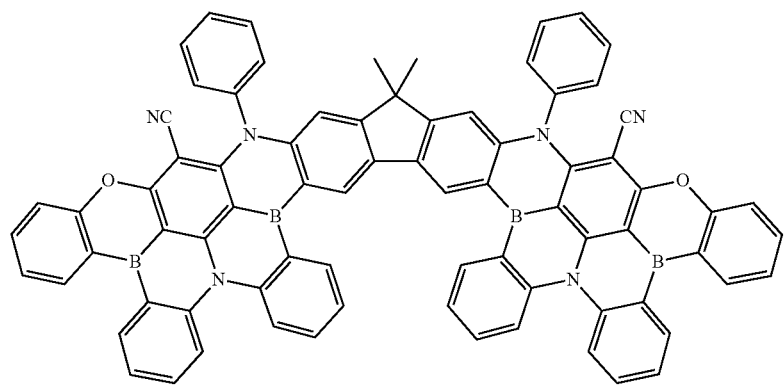

2-48
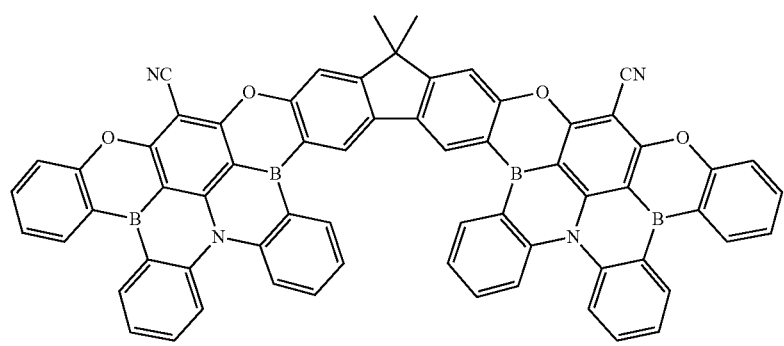
3-1
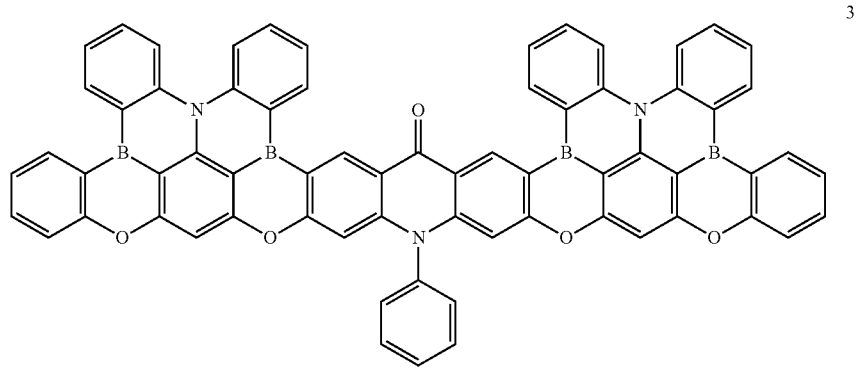
3-2
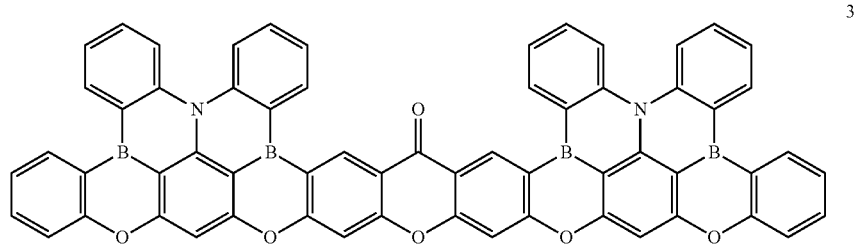
3-3
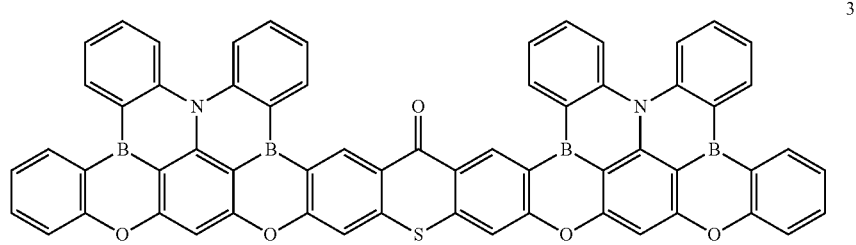

3-4
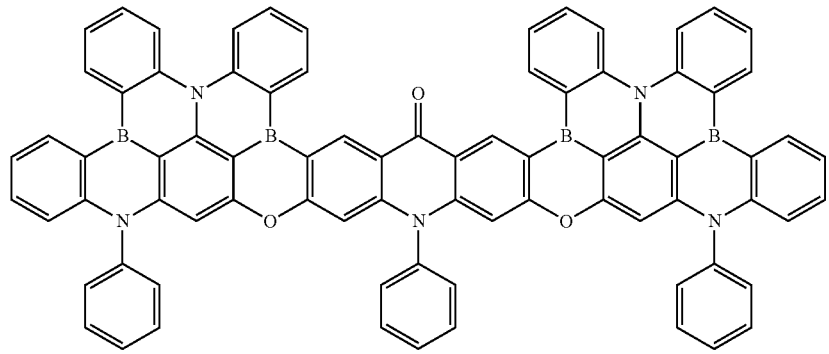
3-5
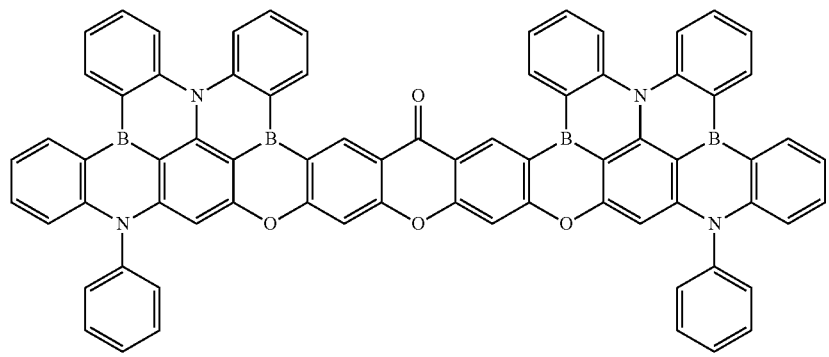
3-6
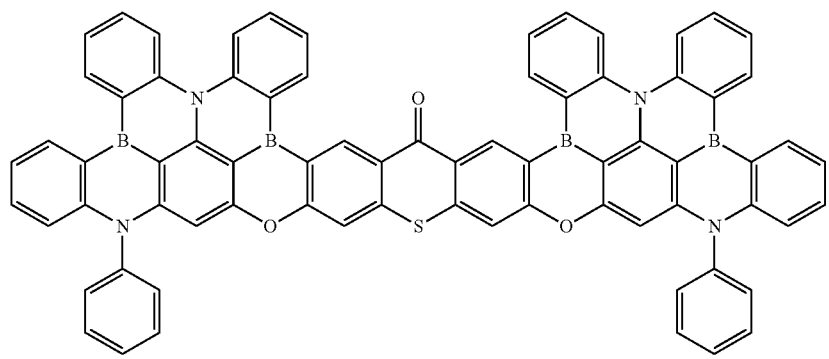
3-7
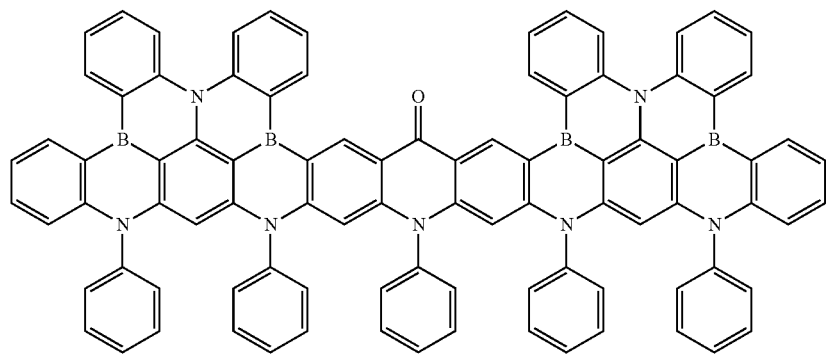

3-8
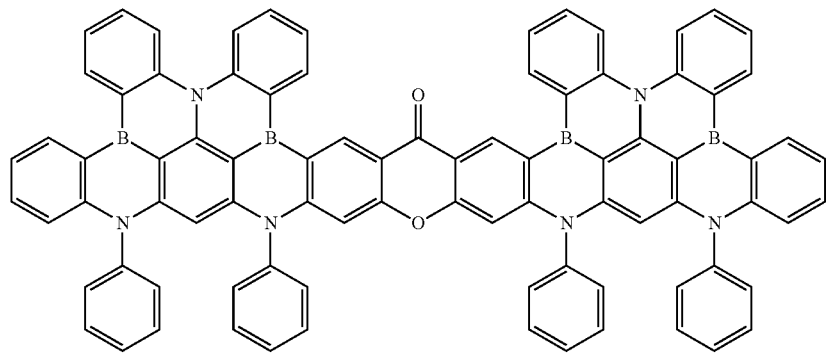
3-9
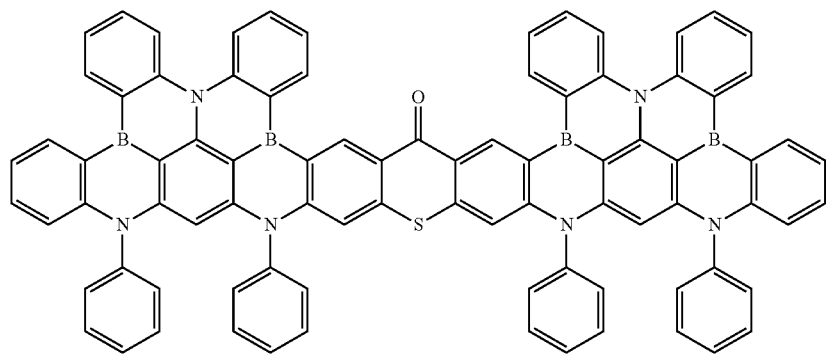
3-10
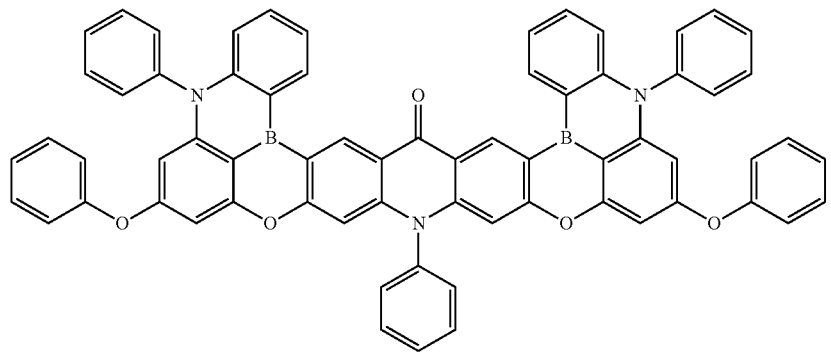
3-11
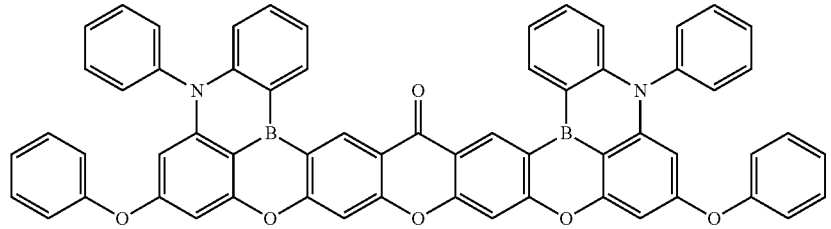
3-12
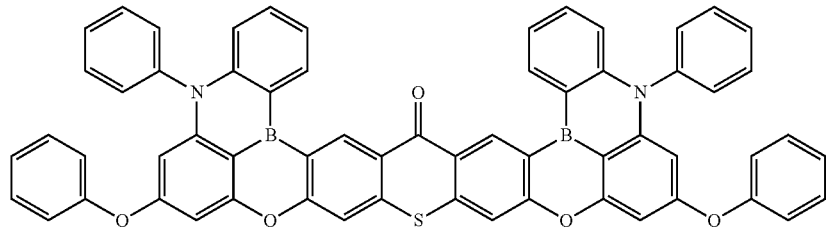

-continued
3-13
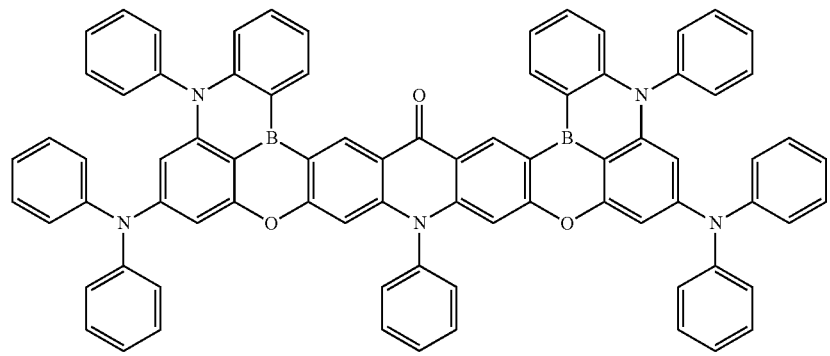
3-14
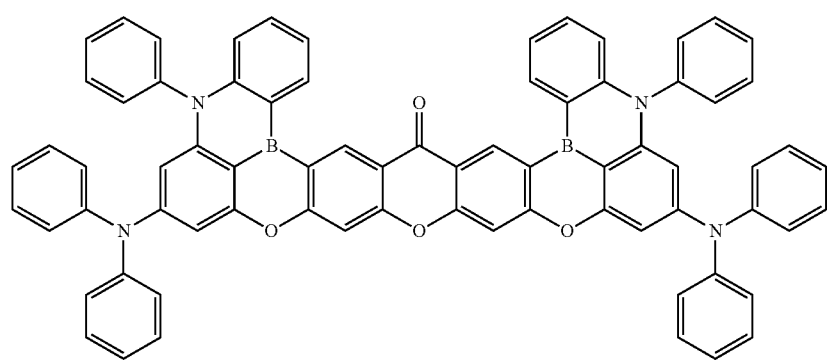
3-15
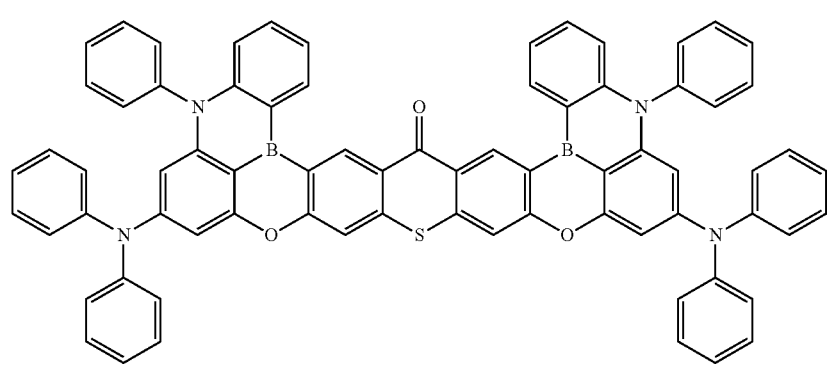
3-16
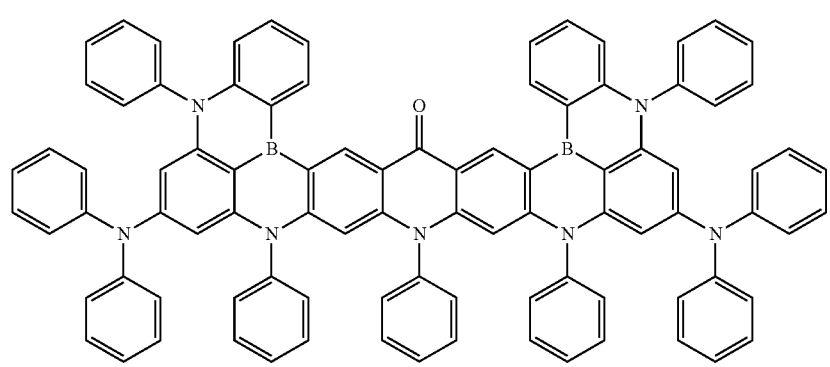

3-17
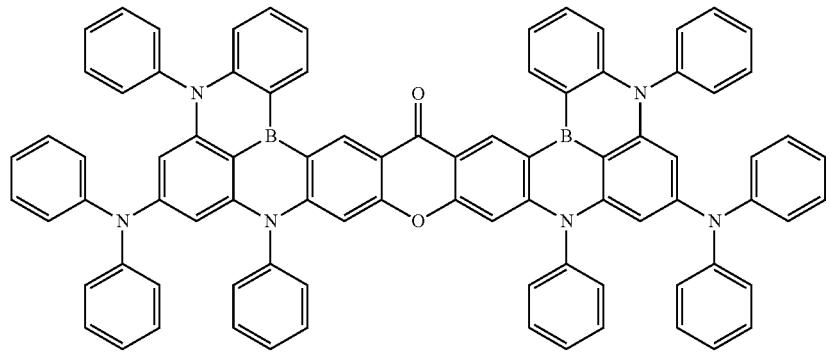
3-18
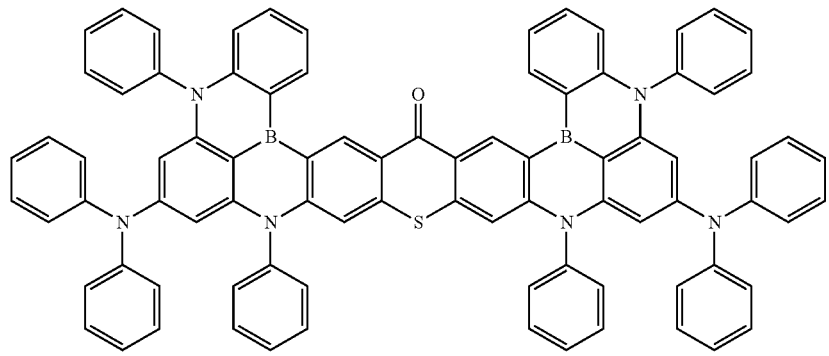
3-19
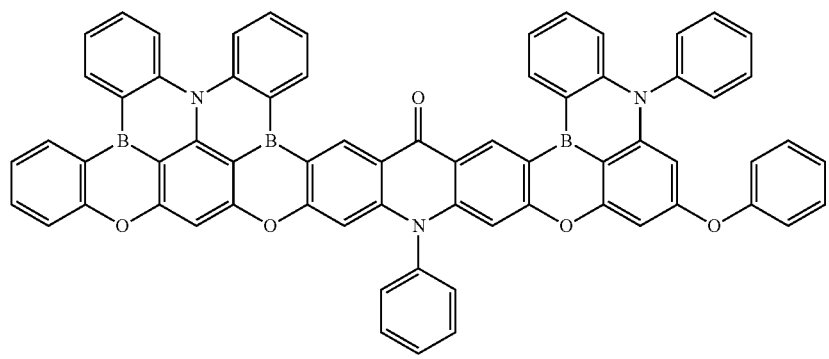
3-20
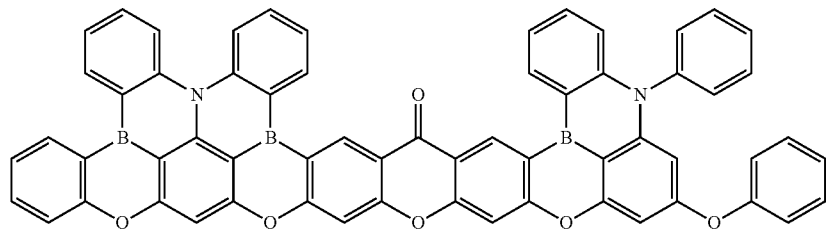
3-21
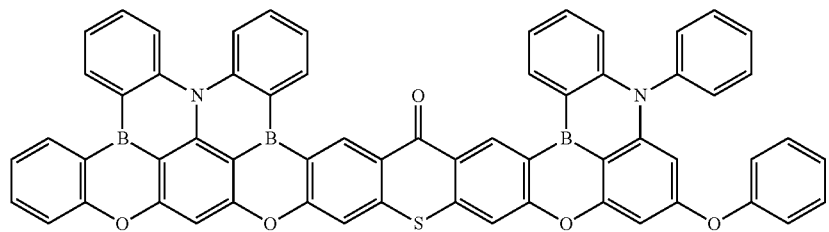

3-22
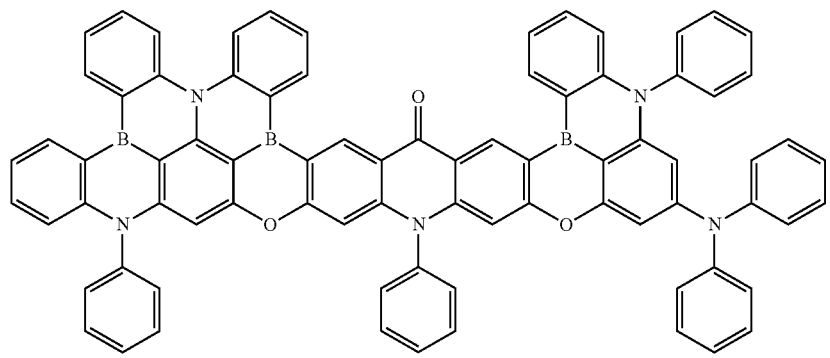
3-23
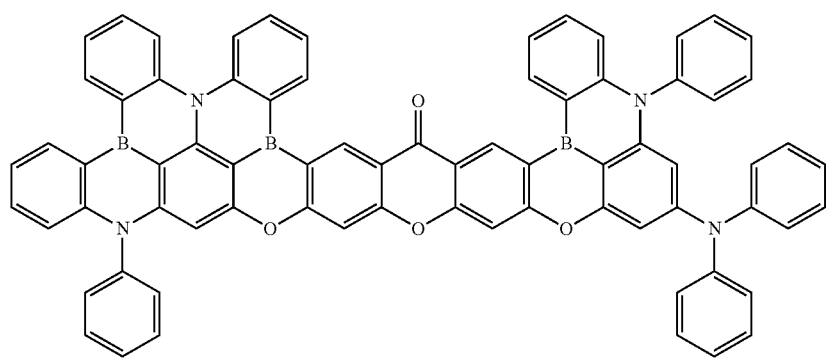
3-24
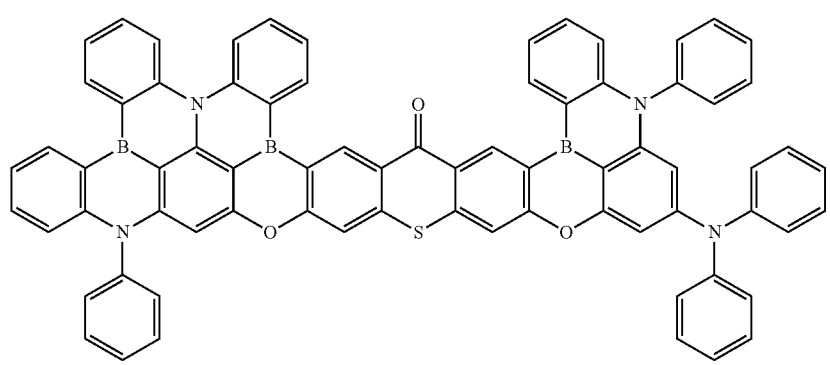
3-25
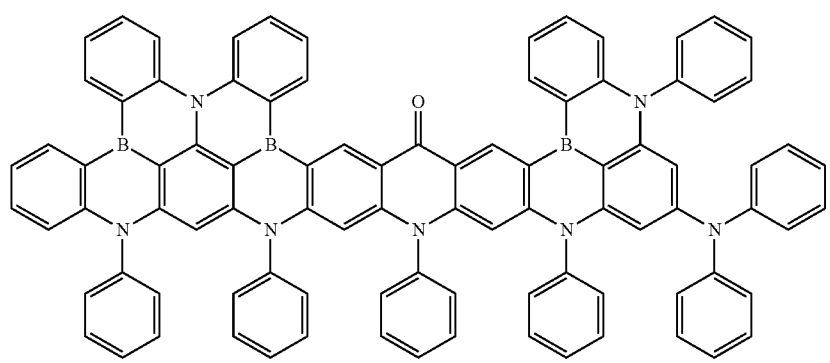

3-26
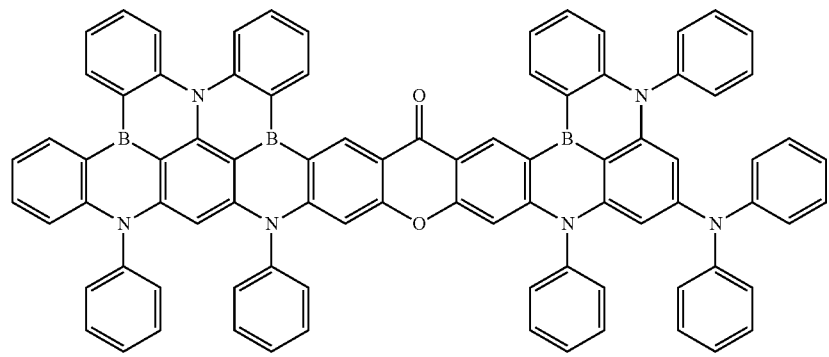
3-27
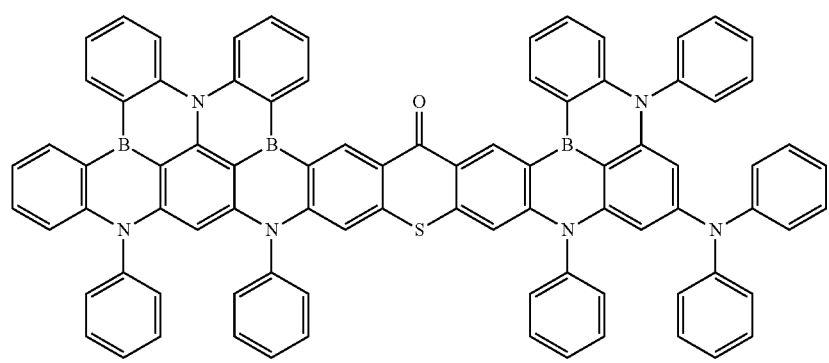
3-28
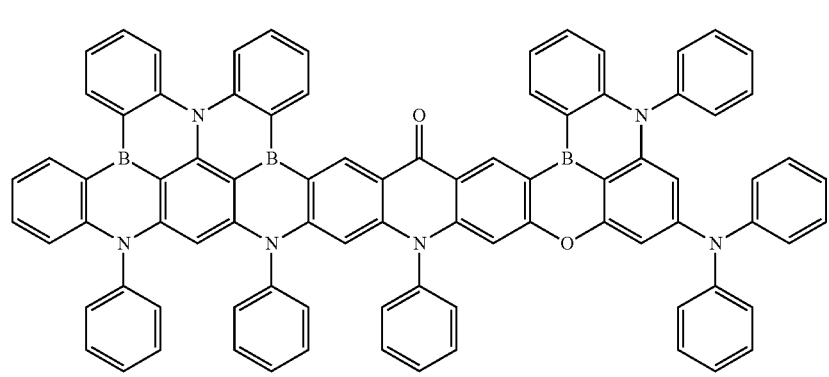
3-29
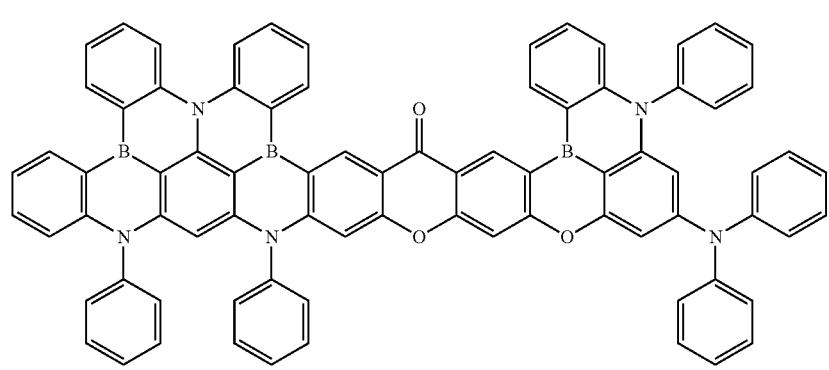

-continued 3-30

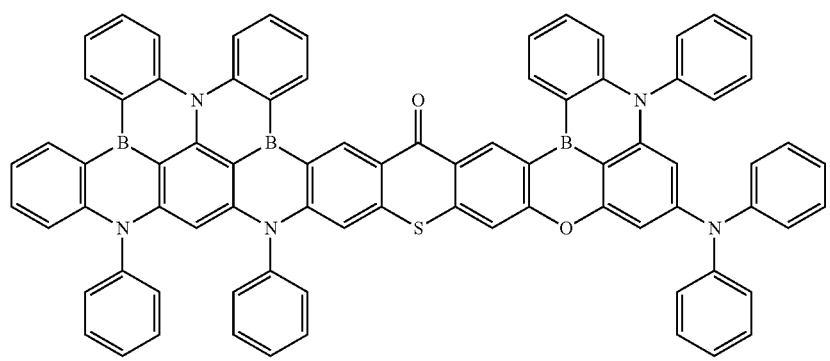

15. A polycyclic compound represented by the following Formula 1:

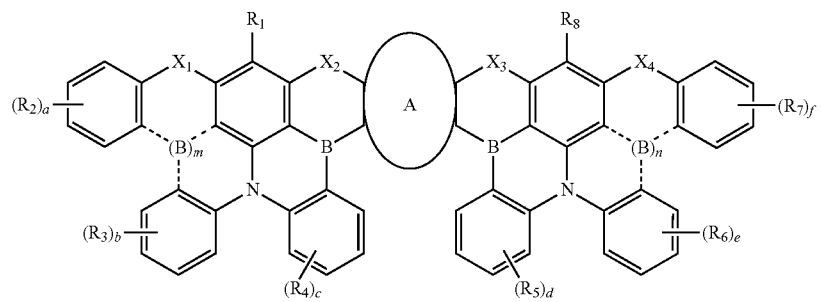

wherein in Formula 1, $X_1$ to $X_4$ are each independently $NR_9$, O or S, $R_1$ to $R_8$ are each independently a hydrogen atom, a deuterium atom, a halogen atom, a cyano group, a substituted or unsubstituted boron group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_9$ is a hydrogen atom, a deuterium atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring, a to f are each independently an integer of 0 to 4, m and n are each independently 0 or 1, a dotted line represents a bond or a non-bond, and ring A is represented by any one selected from the following Formula 2-1 to Formula 2-3:

Formula 2-1

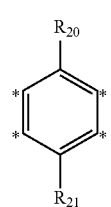

Formula 2-2

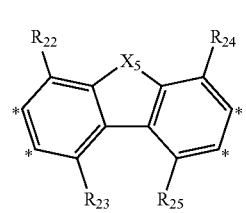

Formula 2-3

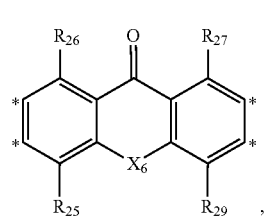

wherein in Formula 2-1 to Formula 2-3,

* represents a bonding site with a neighboring atom, $X_5$ and $X_6$ are each independently $CR_{30}R_{31}$, $NR_{32}$, O or S, R₃₀ to R₃₂ are each independently a hydrogen atom, a deuterium atom, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and R₂₀ to R₂₉ are each independently a hydrogen atom, a deuterium atom, a halogen atom, a cyano group, a substituted or unsubstituted boron group, a substituted or unsubstituted silyl group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and wherein when ring A is represented by Formula 2-1 or 2-2, at least one selected from m and n is 1.

16. The polycyclic compound of claim 15, wherein Formula 2-2 is represented by any one selected from the following Formula 3-1 to Formula 3-4:

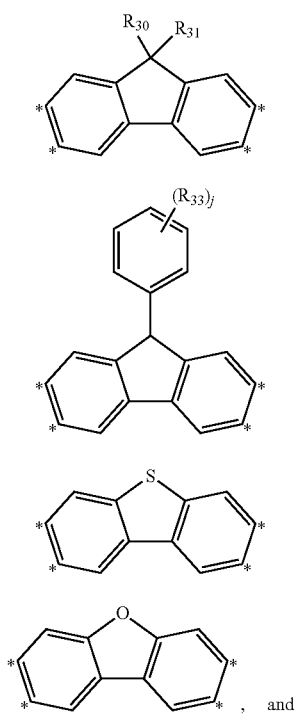

Formula 3-1

Formula 3-2

Formula 3-3

Formula 3-4

, and wherein in Formula 3-1 to Formula 3-4,

* represents a bonding site with a neighboring atom,

R₃₀, R₃₁, and R₃₃ are each independently a hydrogen atom, a deuterium atom, or a substituted or unsubstituted alkyl group of 1 to 20 carbon atoms, and j is an integer of 0 to 5.

17. The polycyclic compound of claim 15, wherein Formula 2-3 is represented by any one selected from the following Formula 4-1 to Formula 4-3:

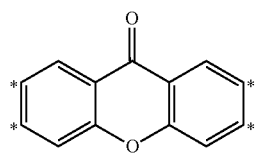

Formula 4-1

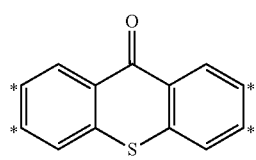

Formula 4-2

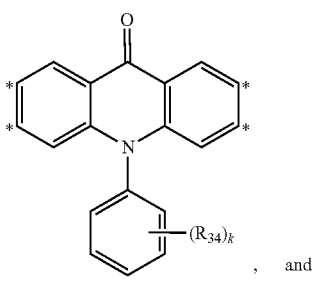

Formula 4-3]

, and wherein in Formula 4-1 to Formula 4-3,

* represents a bonding site with a neighboring atom,

R₃₄ is a hydrogen atom, a deuterium atom, or a substituted or unsubstituted alkyl group of 1 to 20 carbon atoms, and k is an integer of 0 to 5.

18. The polycyclic compound of claim 15, wherein the polycyclic compound represented by Formula 1 is represented by the following Formula 5-1 or Formula 5-2:

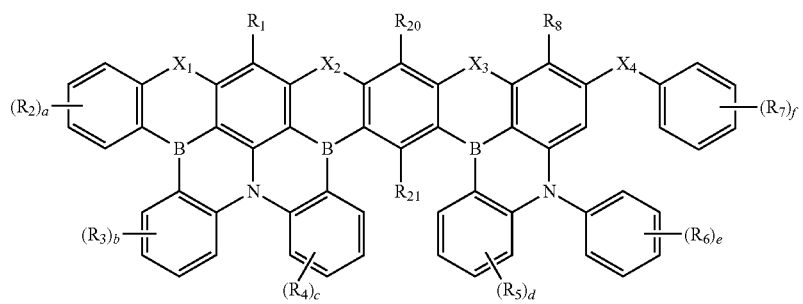

Formula 5-1

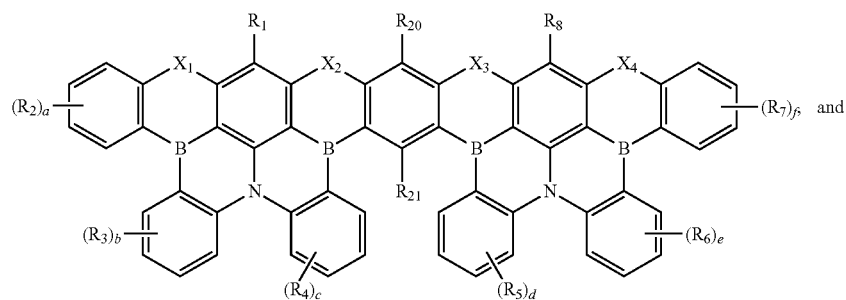

Formula 5-2 wherein in Formula 5-1 and Formula 5-2, $X_1$ to $X_4$, $R_1$ to $R_8$, $R_{20}$, $R_{21}$, and a to f are the same as respectively defined in connection with Formula 1 and Formula 2-1.

19. The polycyclic compound of claim 15, wherein the polycyclic compound represented by Formula 1 is represented by the following Formula 6-1 or Formula 6-2:

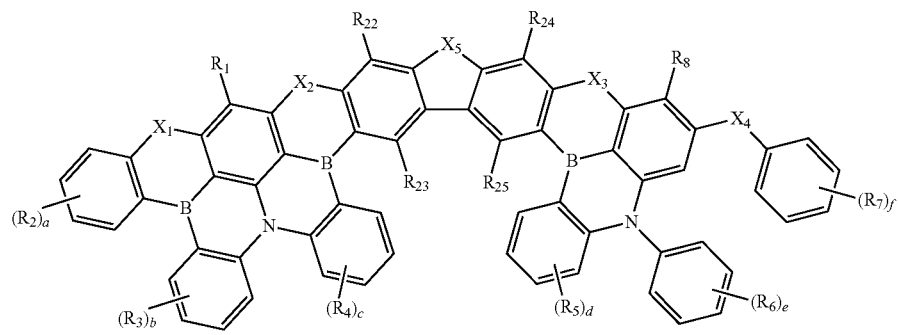

Formula 6-1

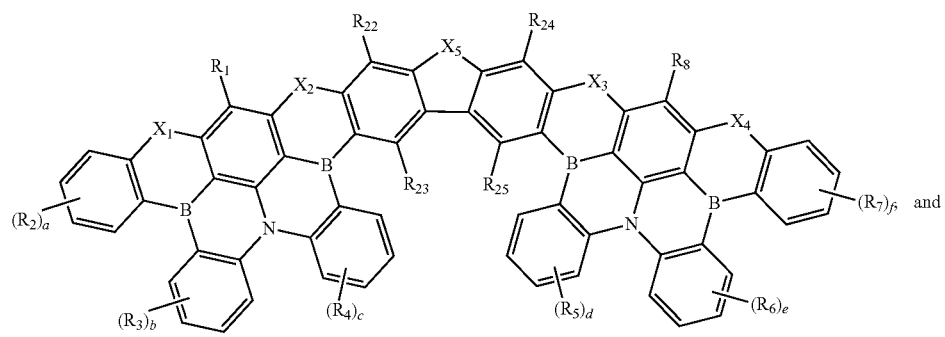

Formula 6-2 wherein in Formula 6-1 and Formula 6-2, $X_1$ to $X_5$, $R_1$ to $R_8$, $R_{22}$ to $R_{25}$, and a to f are the same as respectively defined in connection with Formula 1 and Formula 2-2.

20. The polycyclic compound of claim 15, wherein the polycyclic compound represented by Formula 1 is represented by any one selected from the following Formula 7-1 to Formula 7-3:

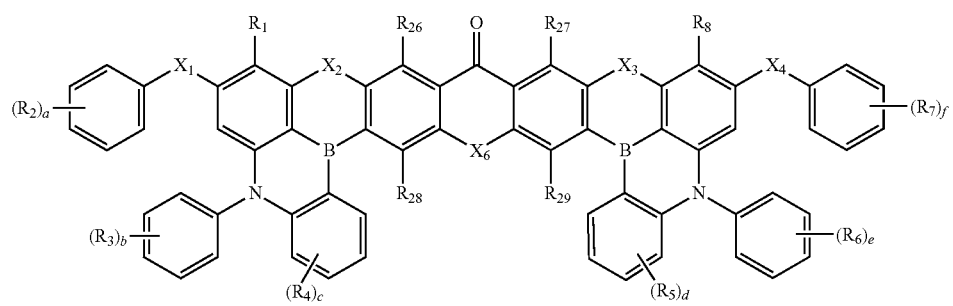

Formula 7-1

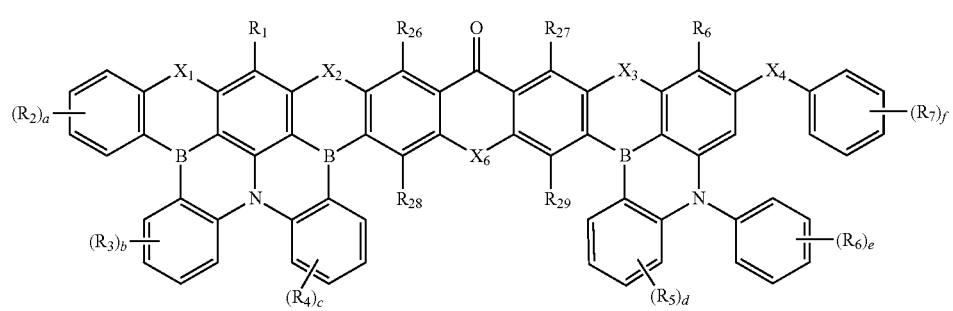

Formula 7-2

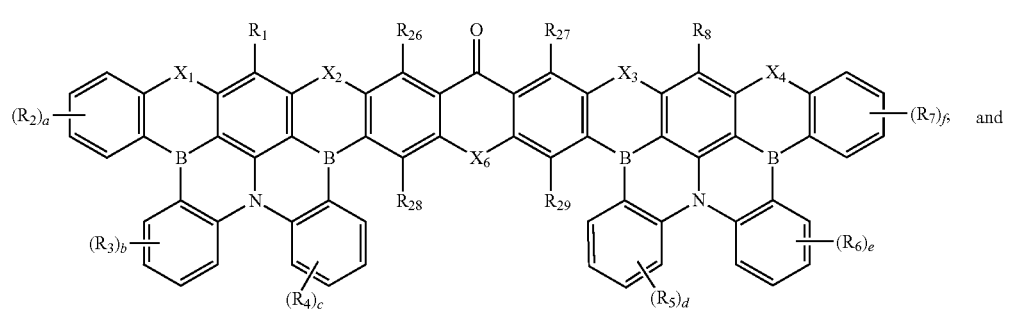

Formula 7-3 wherein in Formula 7-1 to Formula 7-3, $X_1$ to $X_4$, $X_6$, $R_1$ to $R_8$, $R_{26}$ to $R_{29}$, and a to f are the same as respectively defined in connection with Formula 1 and Formula 2-3.

21. The polycyclic compound of claim 15, wherein the polycyclic compound represented by Formula 1 is any one selected from compounds represented in the following Compound Group 1 to Compound Group 3:

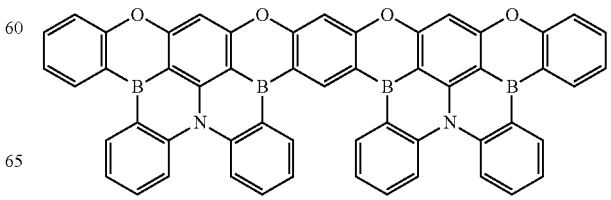

1-1

1-2
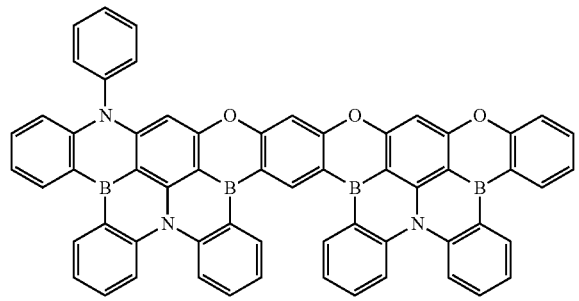
1-3
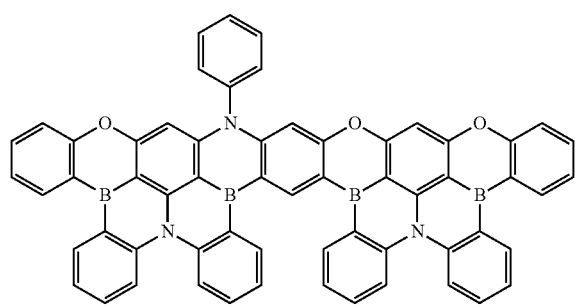
1-4
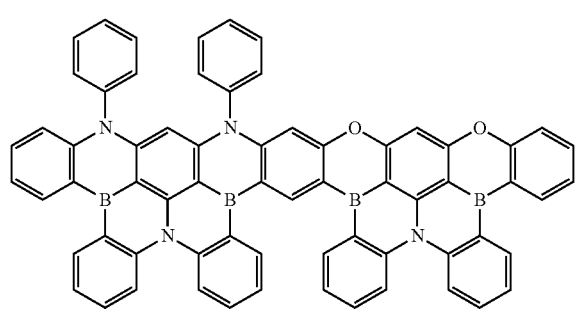
1-5
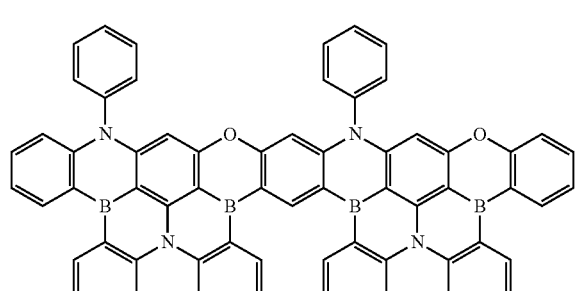
1-6
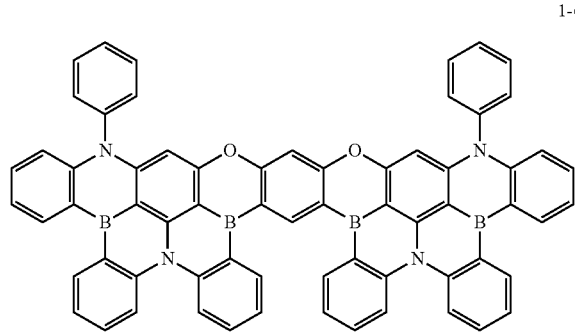
1-7
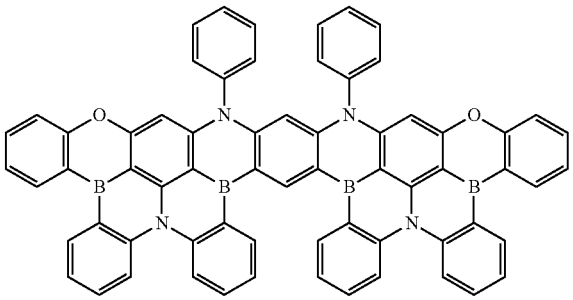
1-8
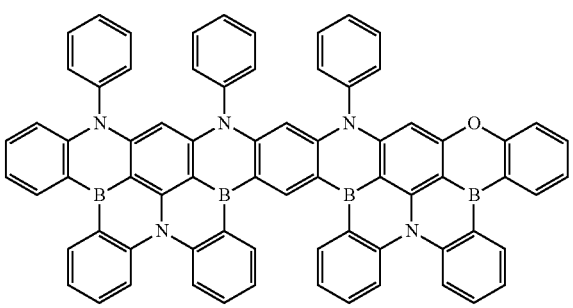
1-9
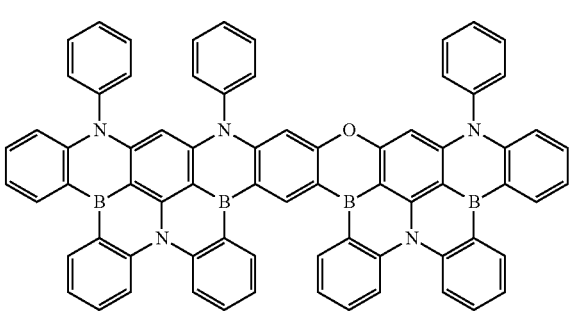
1-10
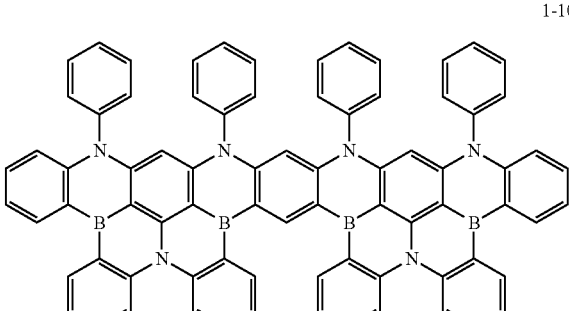
1-11
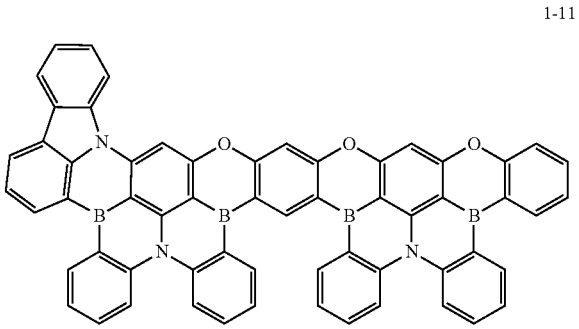

-continued
1-12
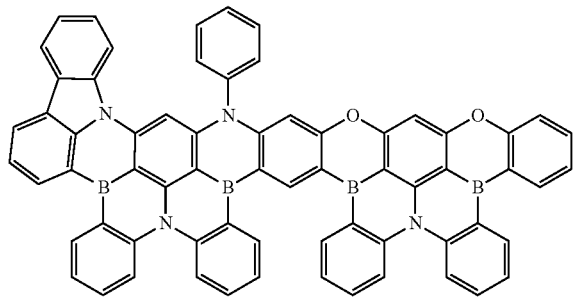
1-13
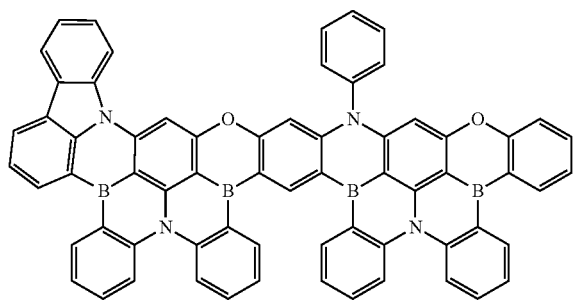
1-14
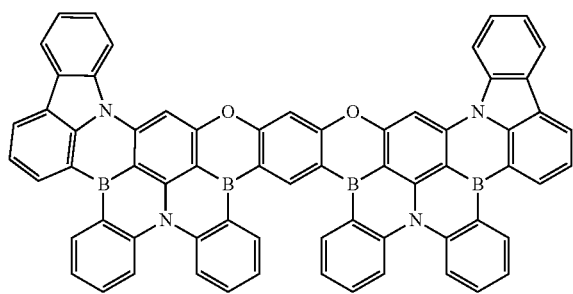
1-15
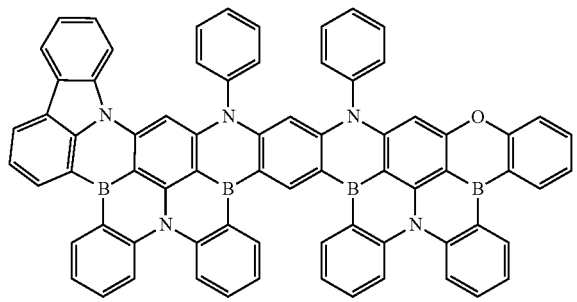
1-16
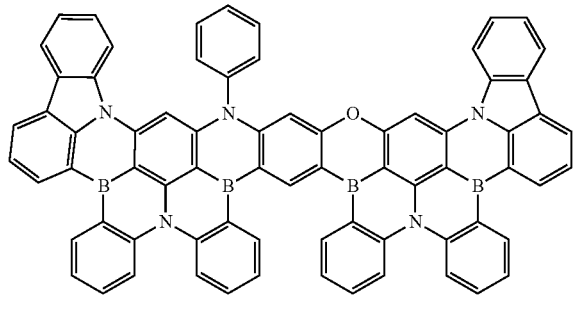
-continued
1-17
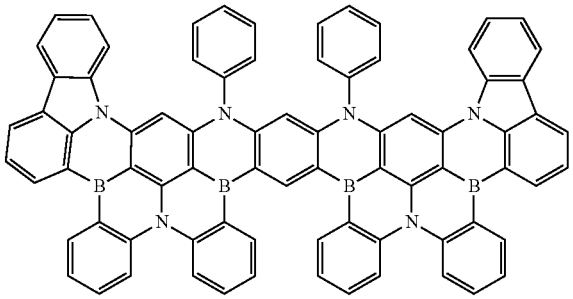
1-18
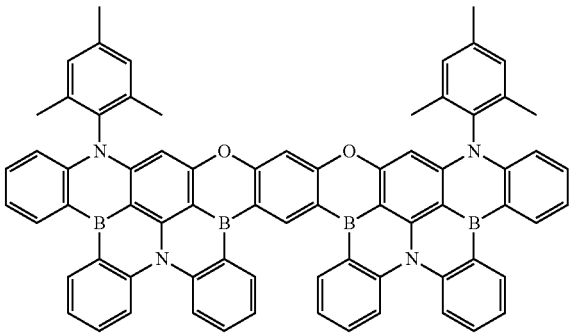
1-19
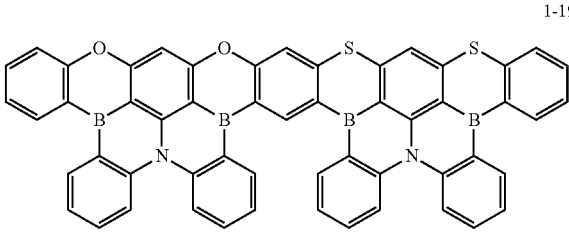
1-20
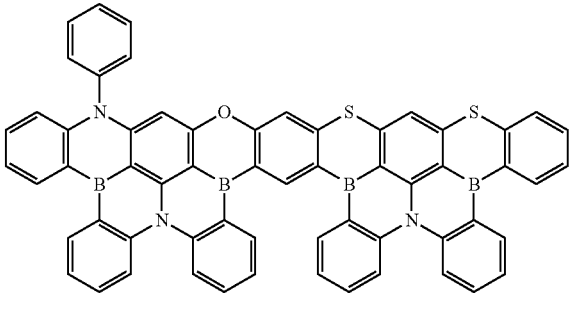

-continued
1-21
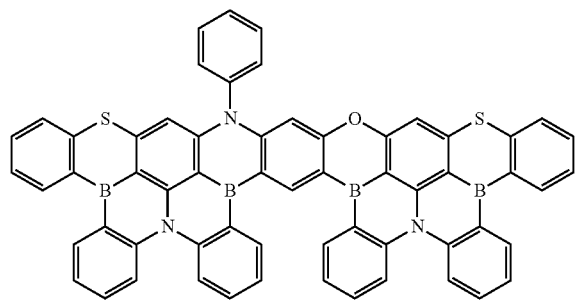
1-22
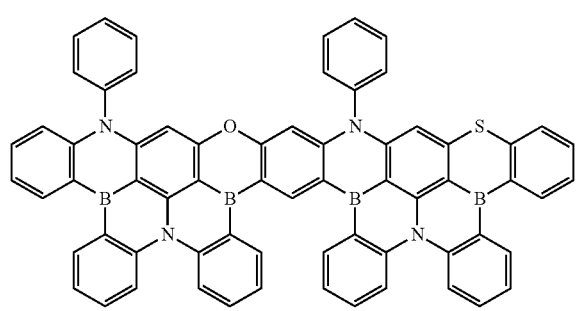
1-23
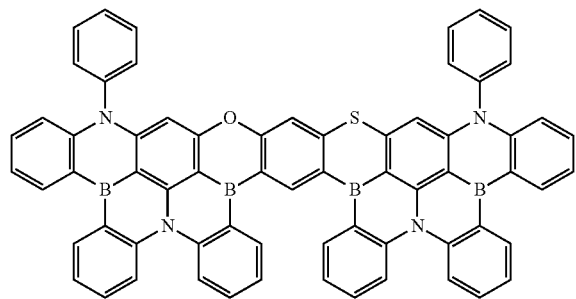
1-24
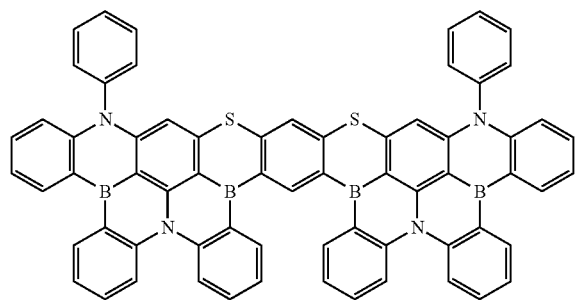
-continued
1-25
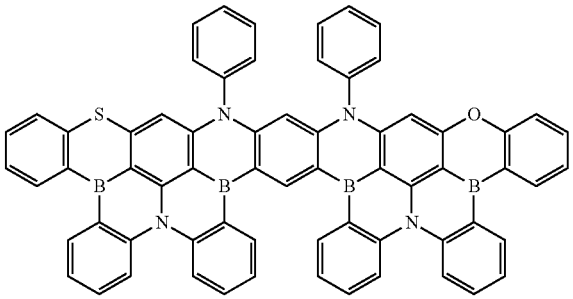
1-26
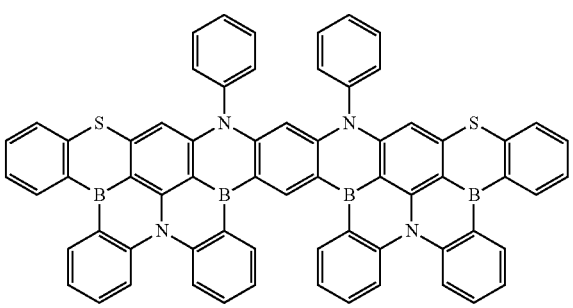
1-27
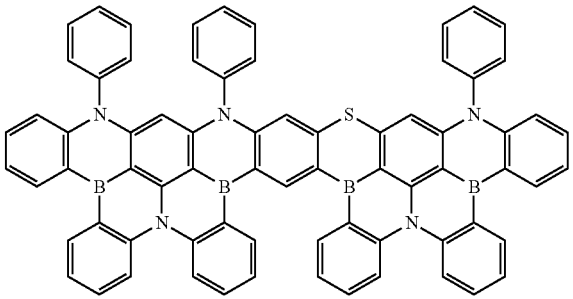
1-28
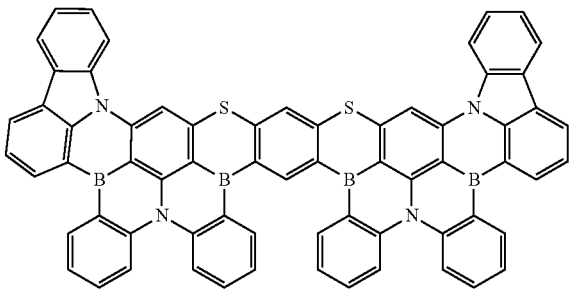

2-1
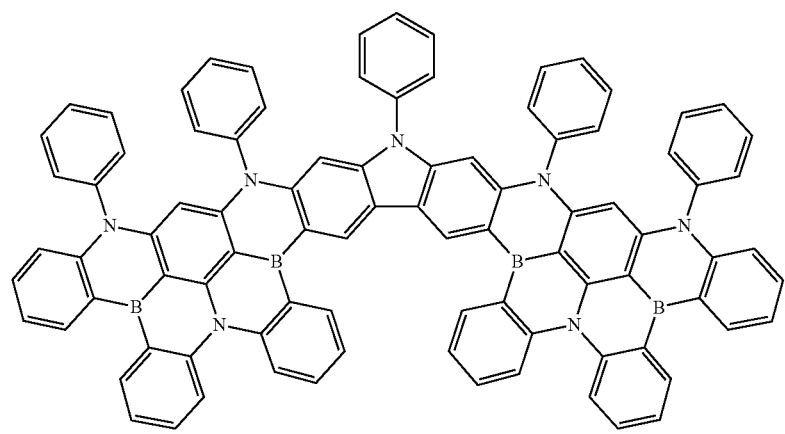
2-2
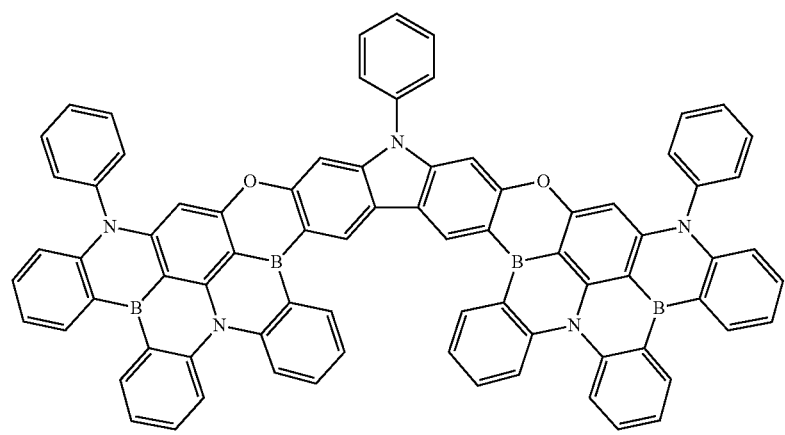
2-3
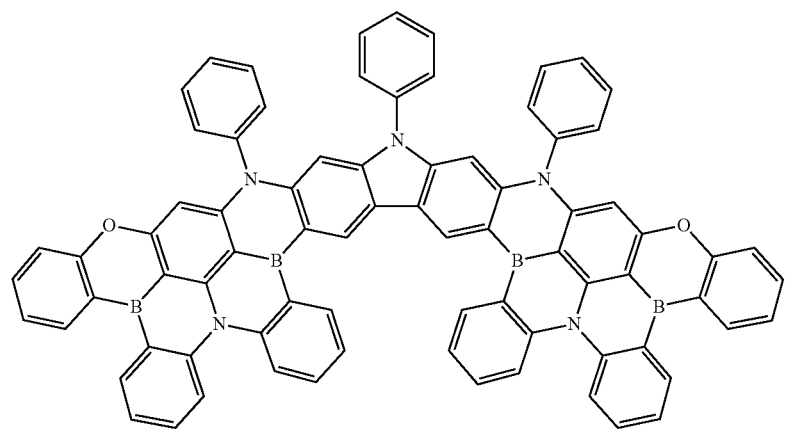

-continued
2-4
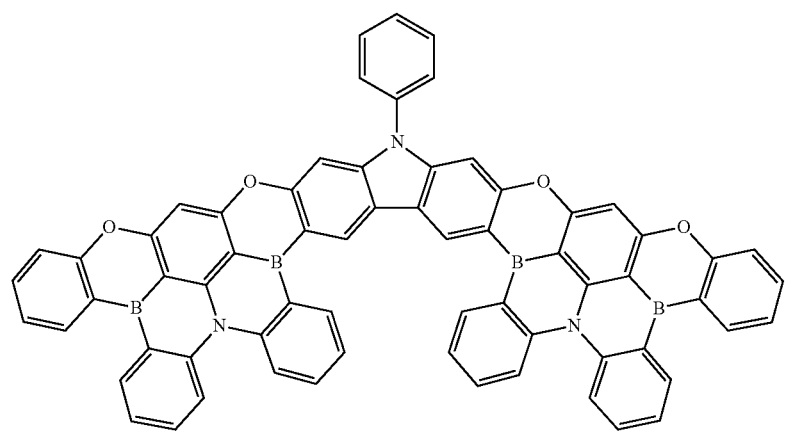
2-5
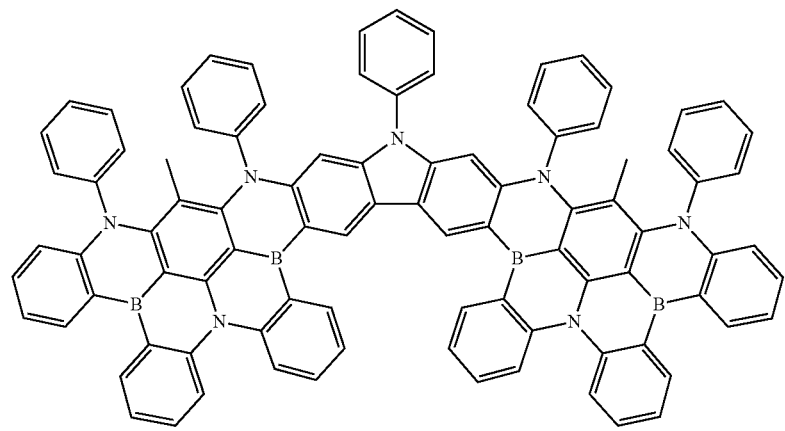
2-6
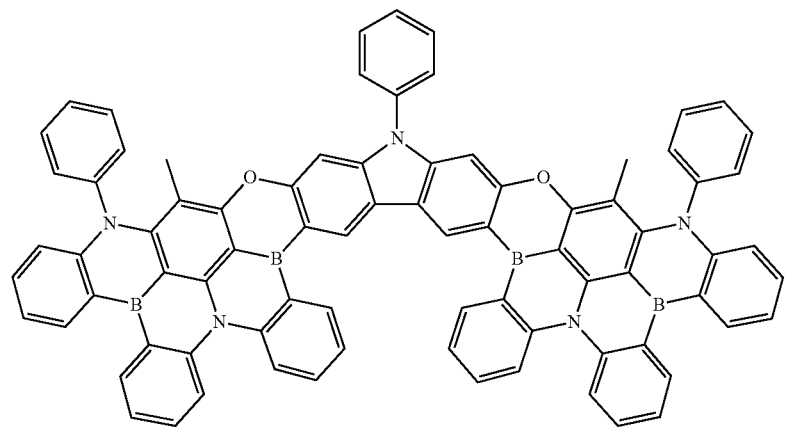

2-7
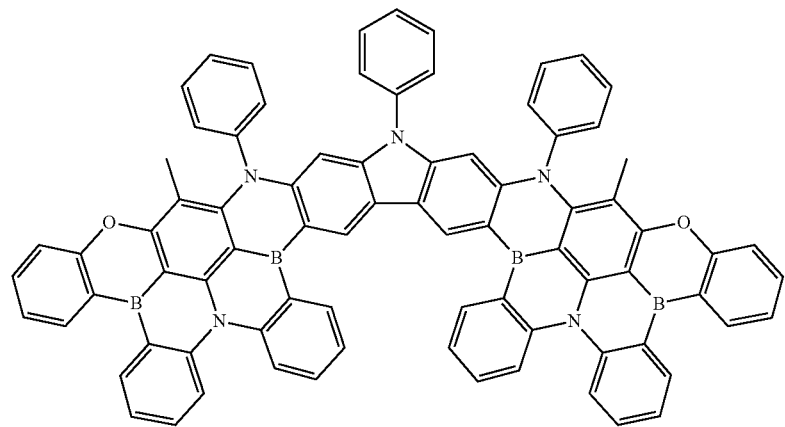
2-8
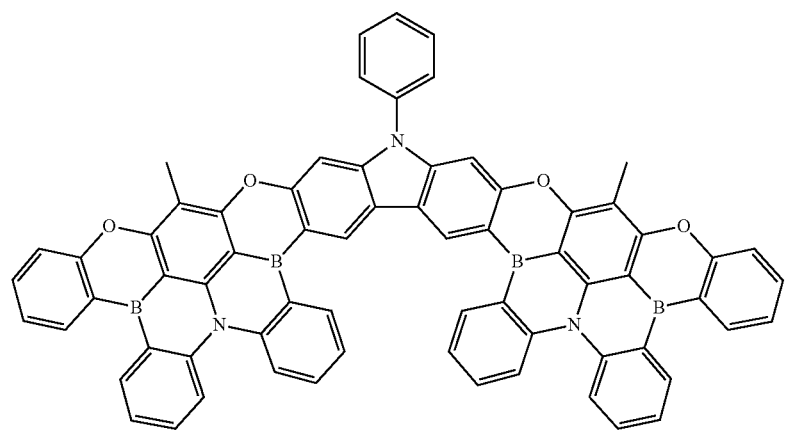
2-9
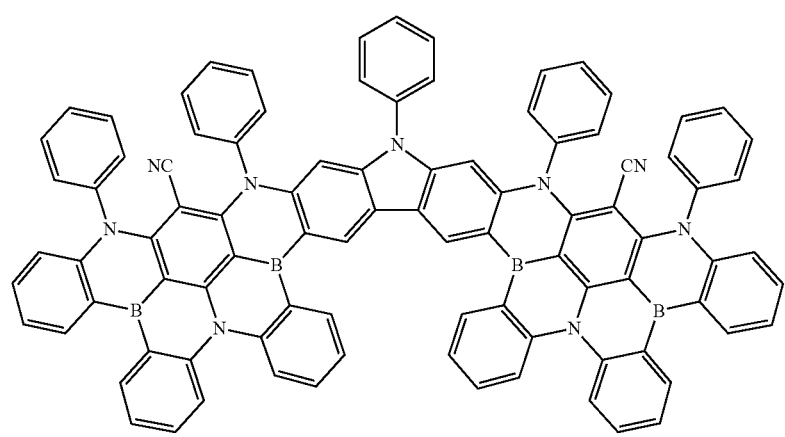

-continued
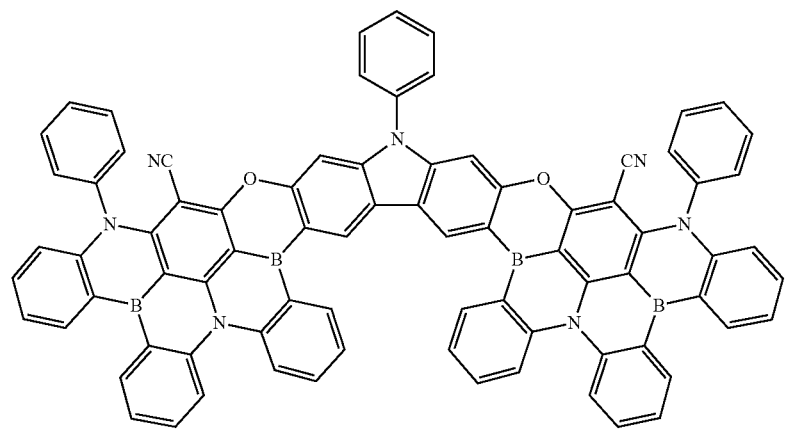
2-10
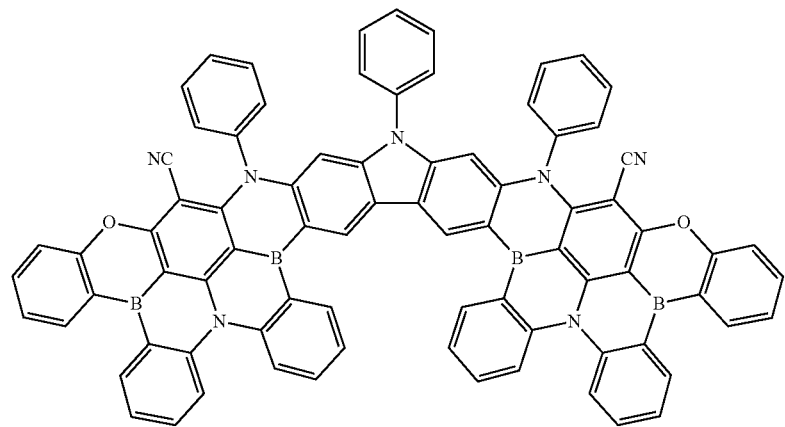
2-11
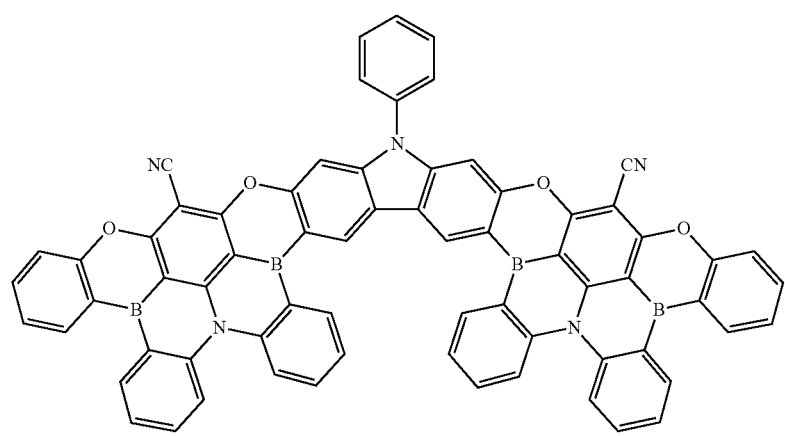
2-12

2-13
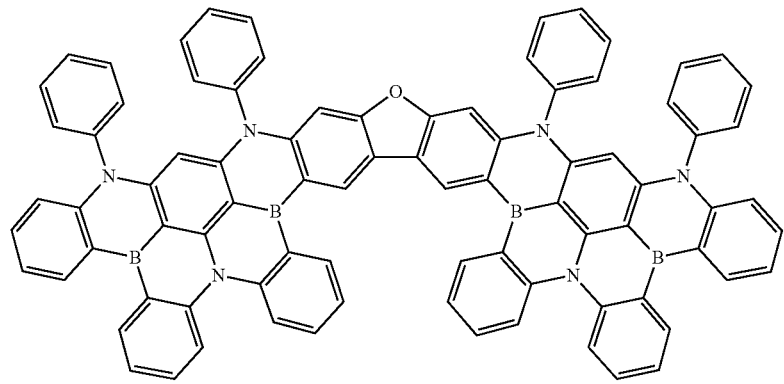
2-14
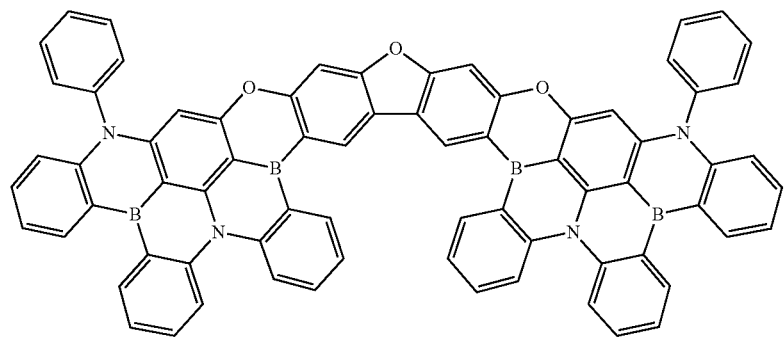
2-15
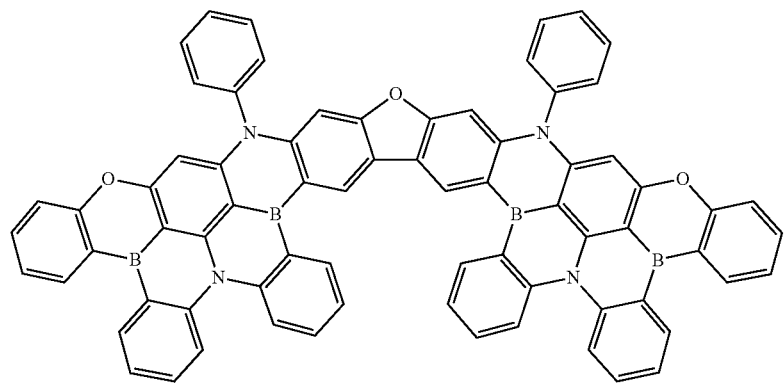
2-16
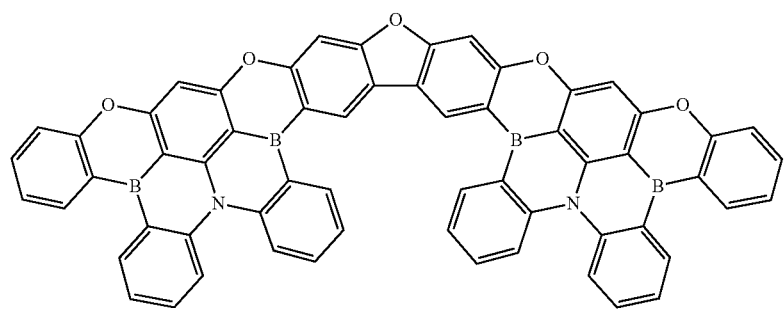

2-17
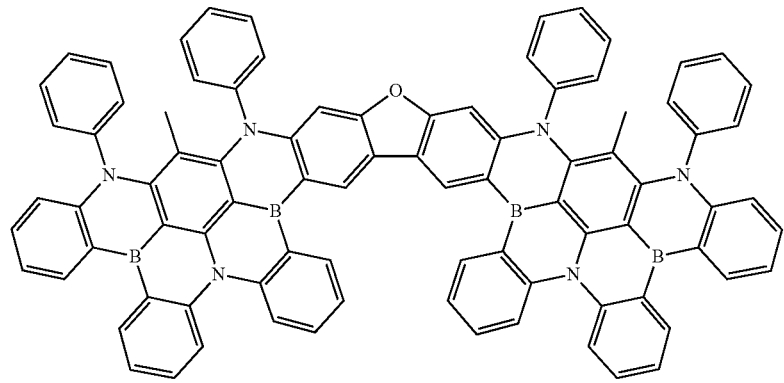
2-18
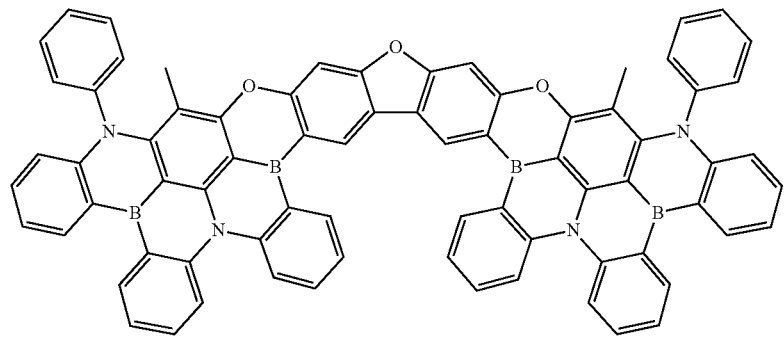
2-19
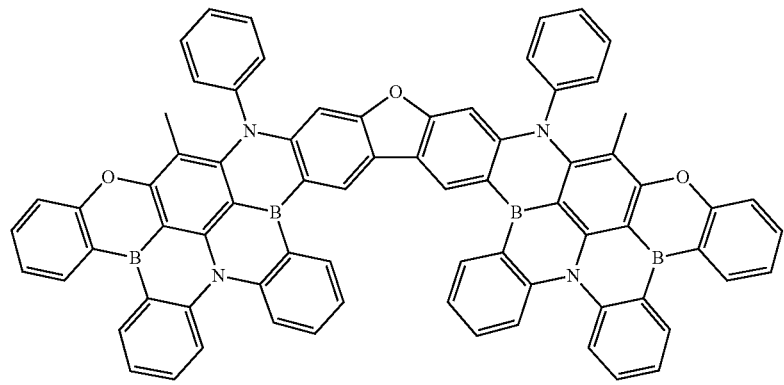
2-20
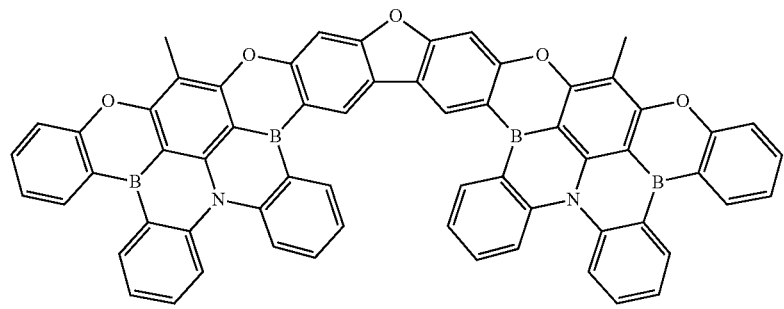

-continued
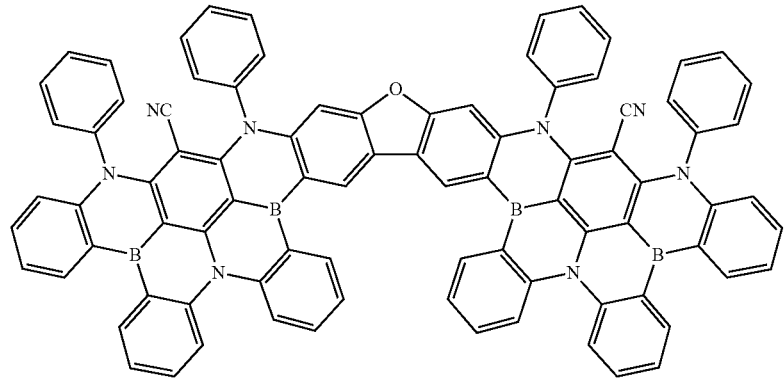
2-21
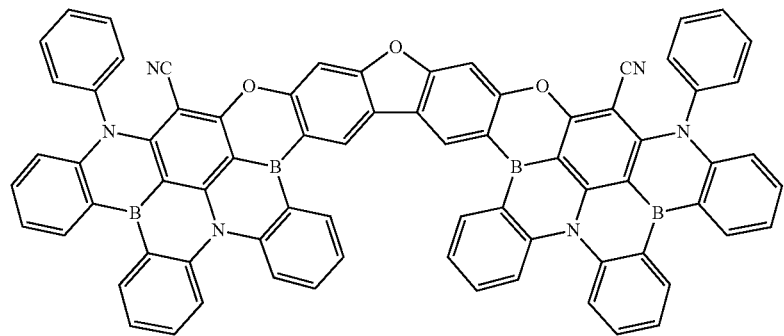
2-22
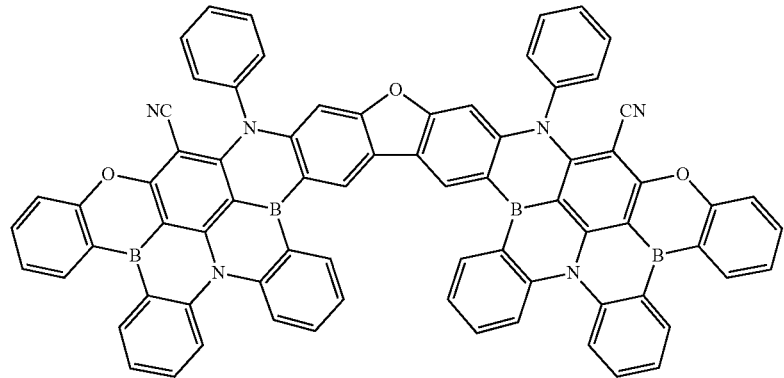
2-23
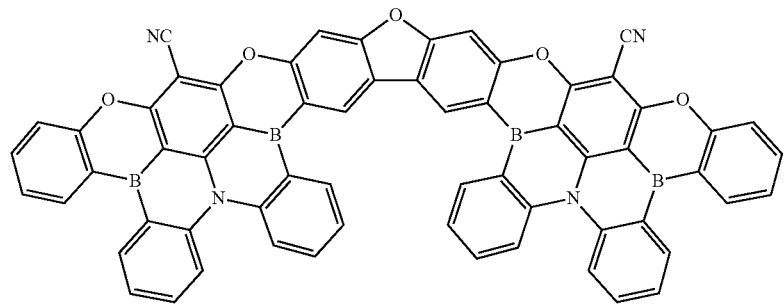
2-24

2-25
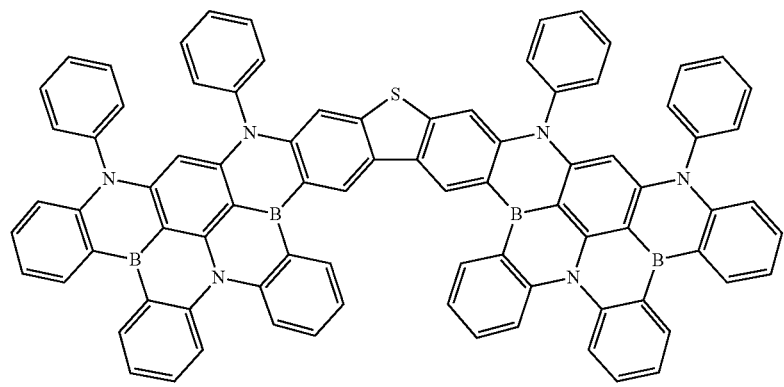
2-26
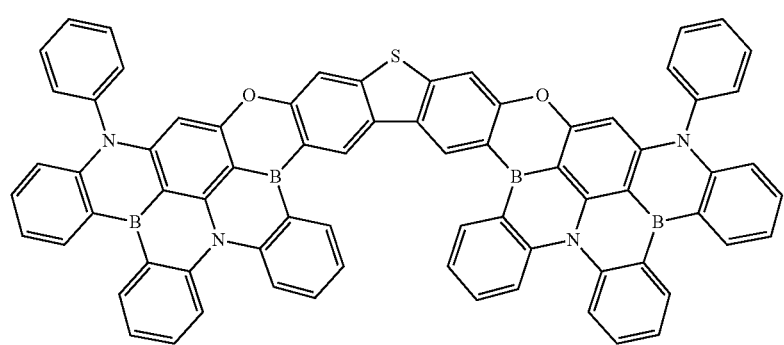
2-27
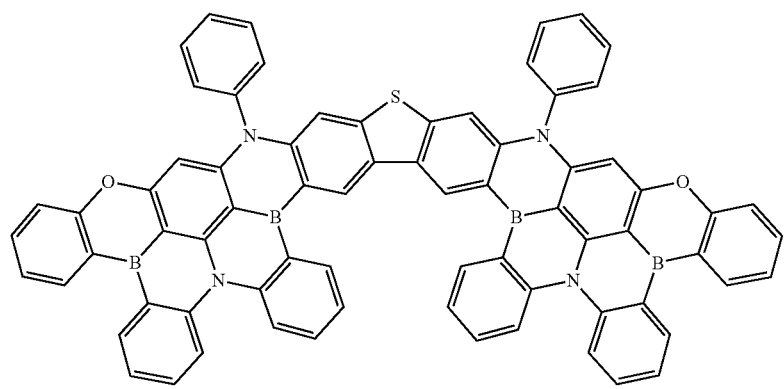
2-28
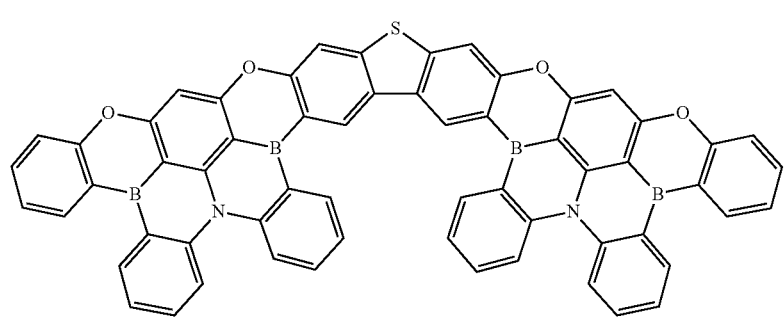

-continued
2-29
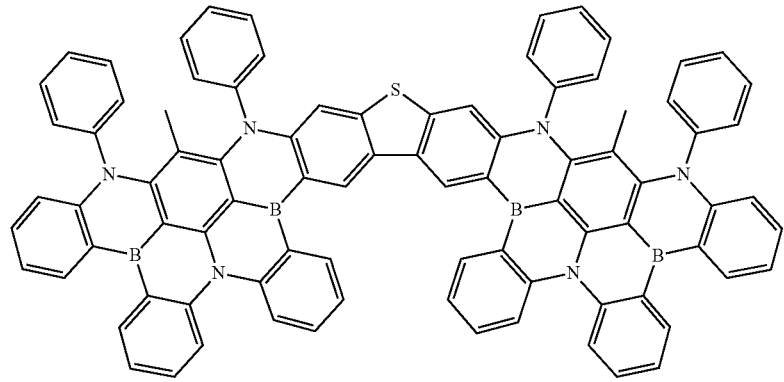
2-30
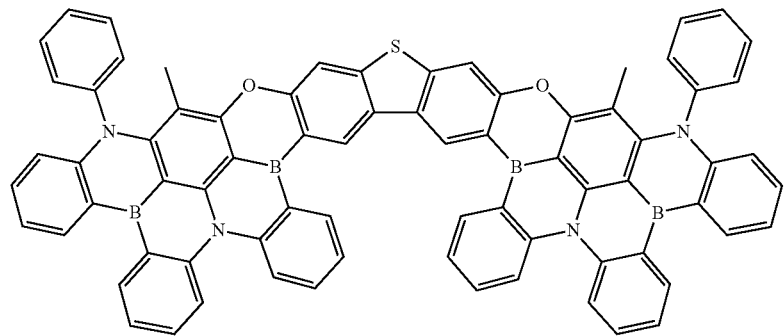
2-31
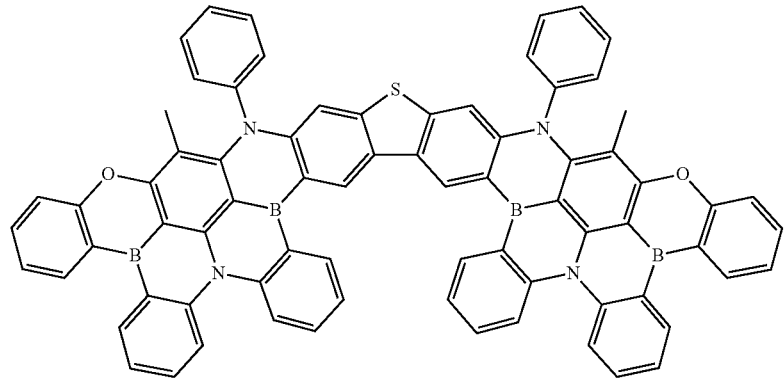
2-32
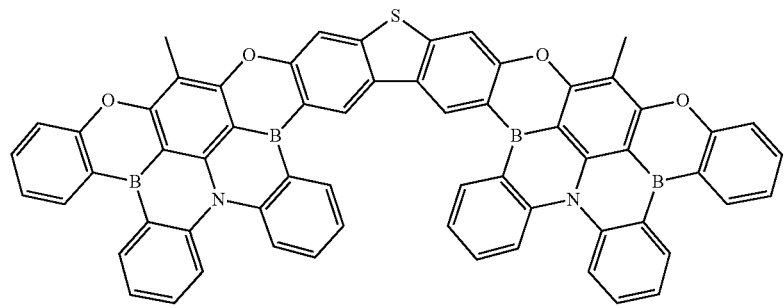

2-33
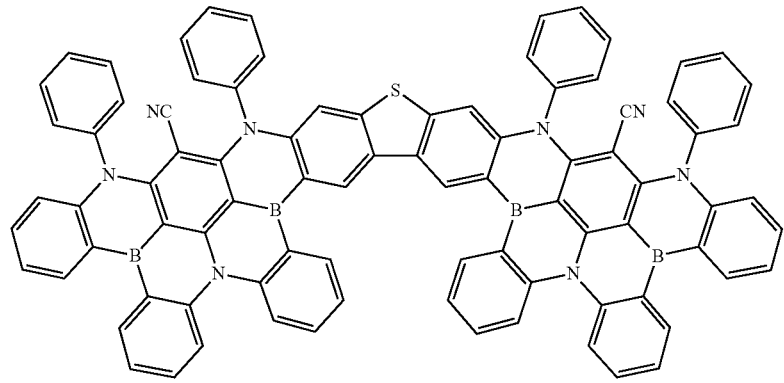
2-34
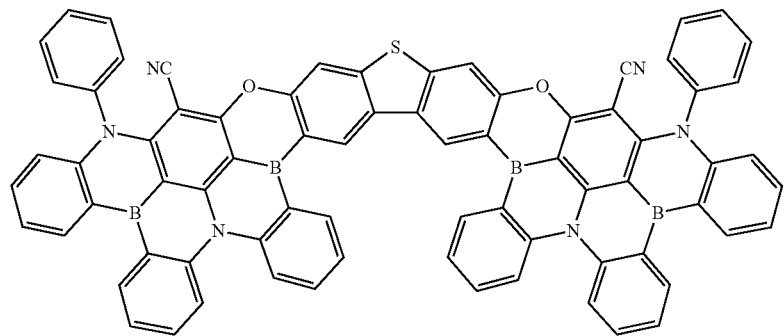
2-35
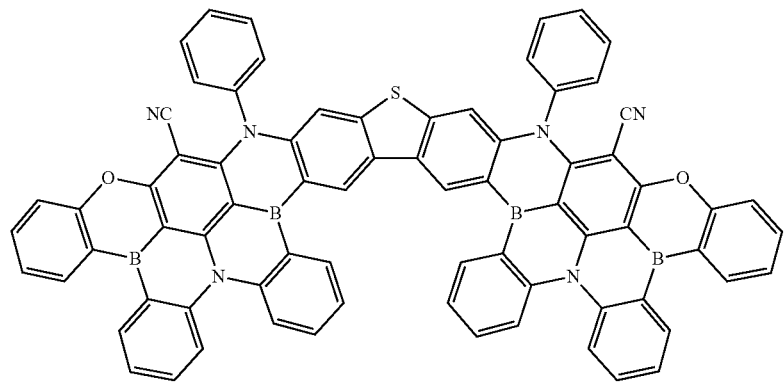
2-36
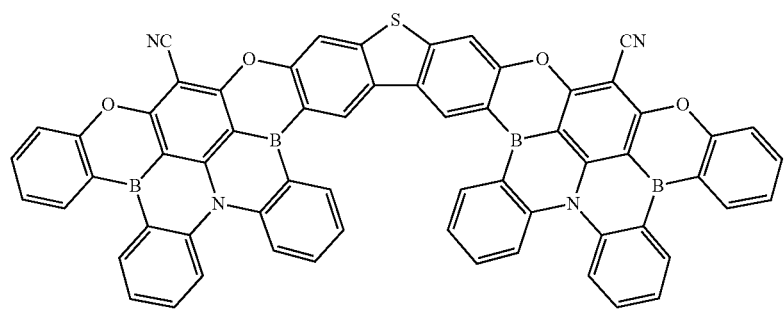

-continued
2-37
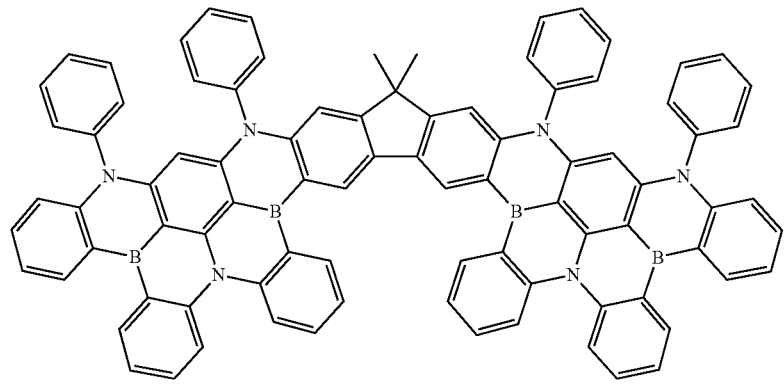
2-38
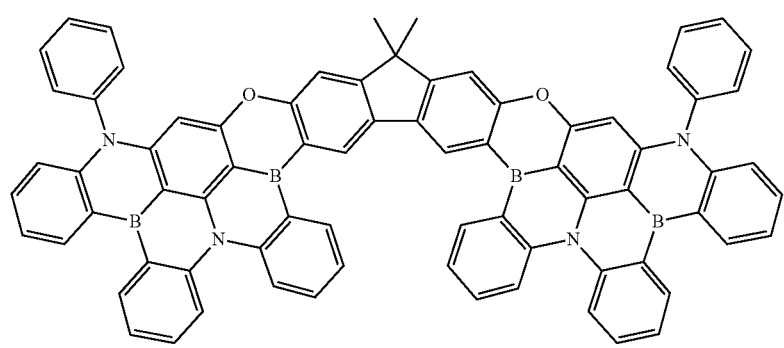
2-39
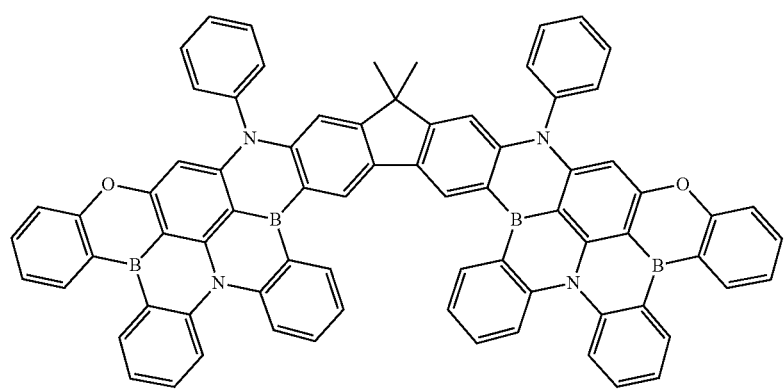
2-40
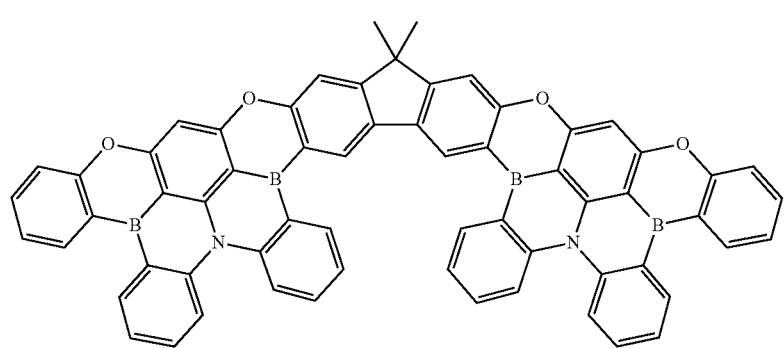

-continued
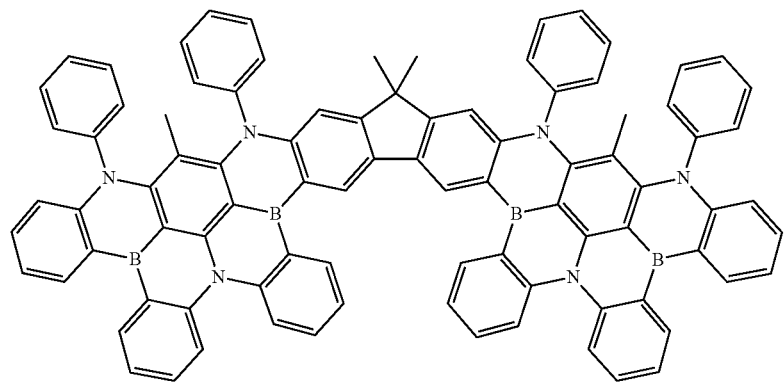
2-41
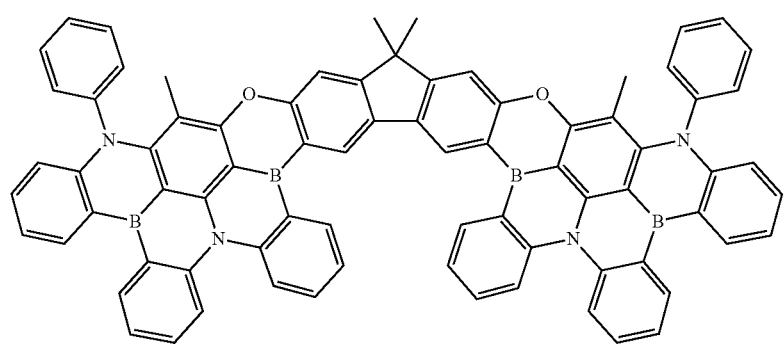
2-42
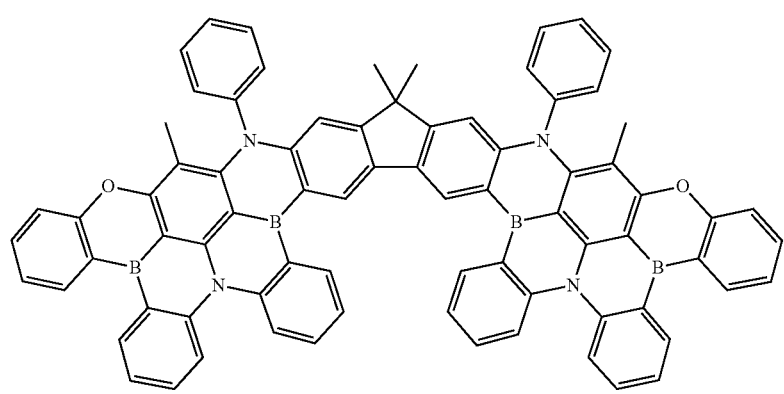
2-43
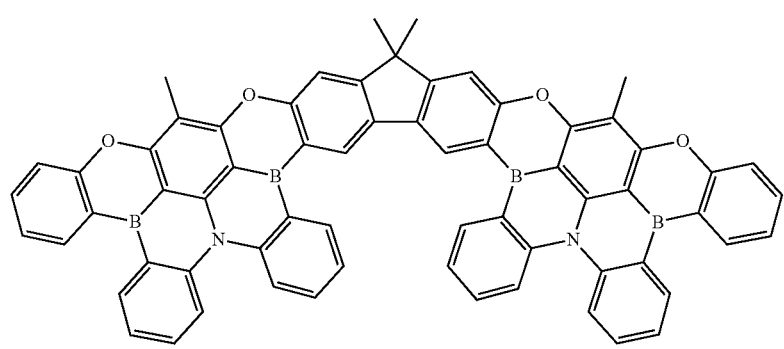
2-44

-continued
2-45
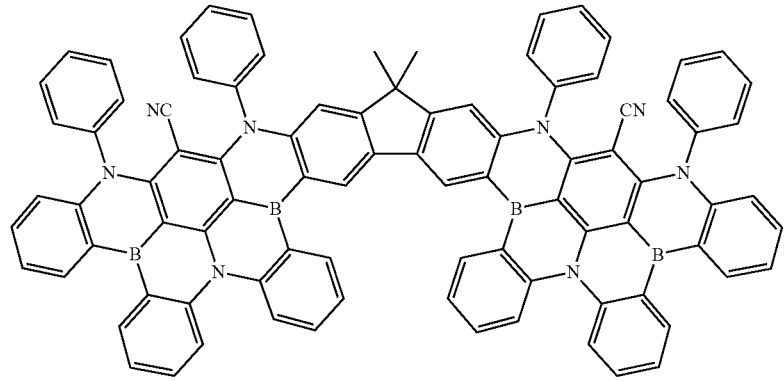
2-46
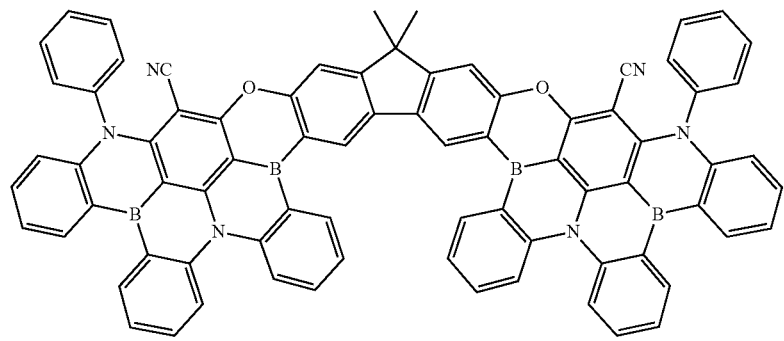
2-47
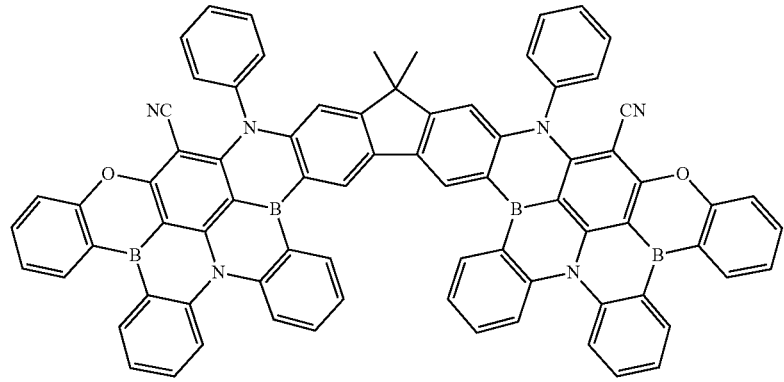
2-48
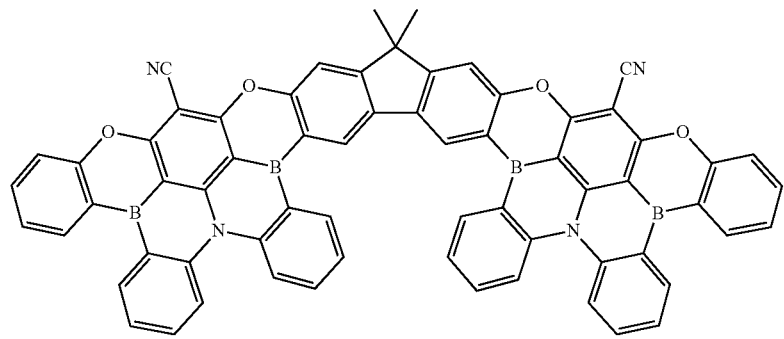

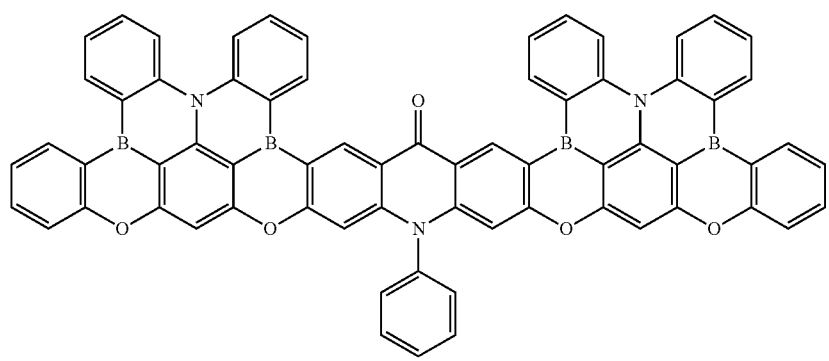
3-1
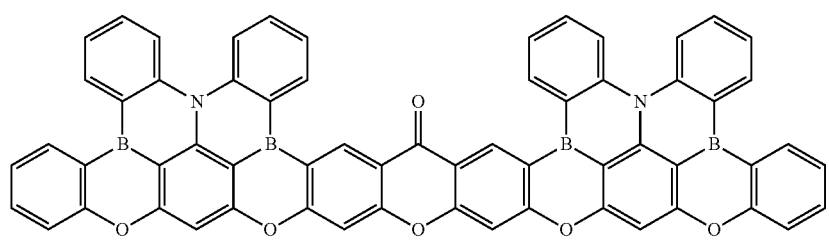
3-2
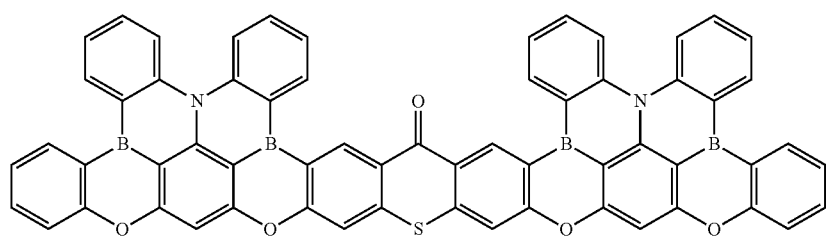
3-3
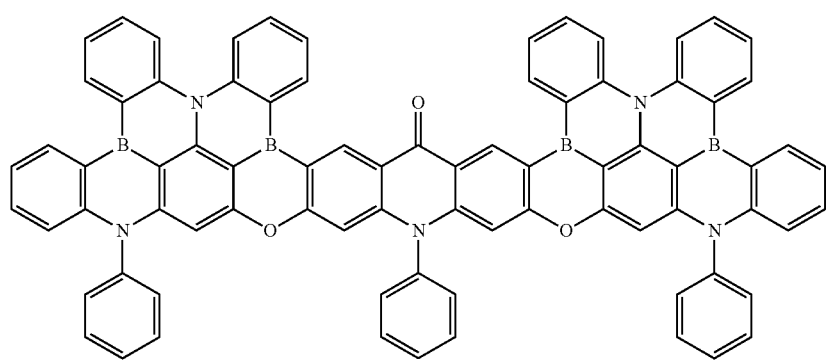
3-4
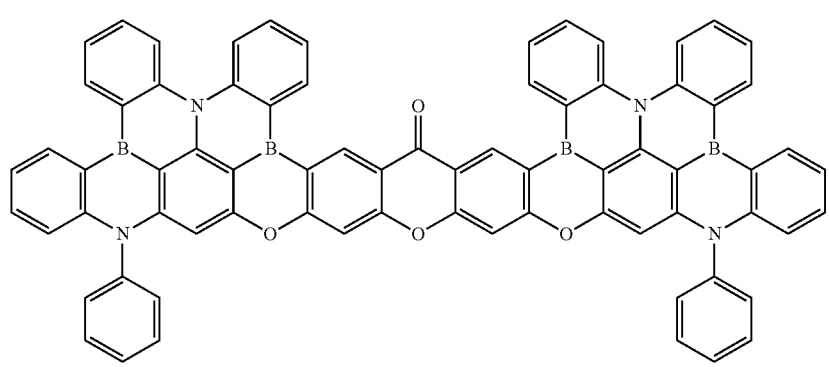
3-5

3-6
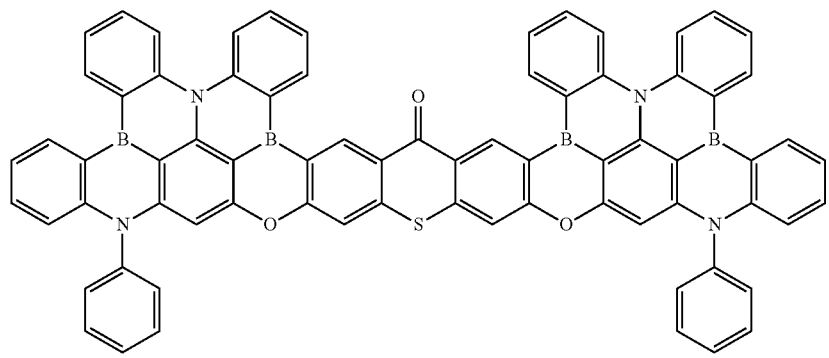
3-7
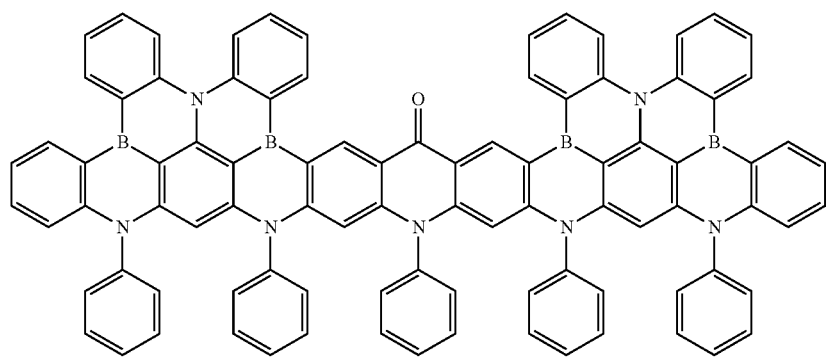
3-8
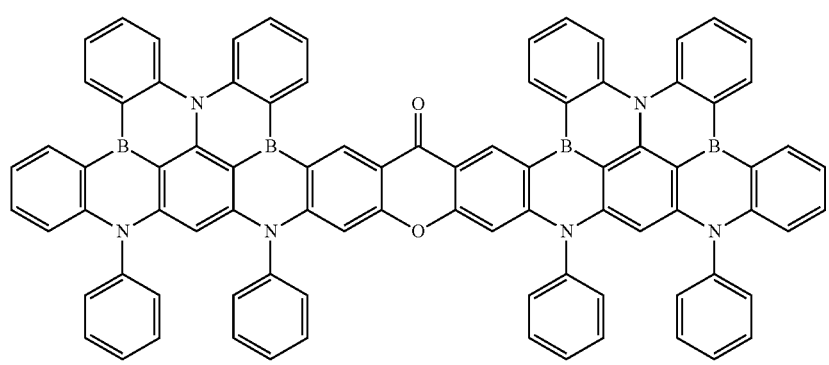
3-9
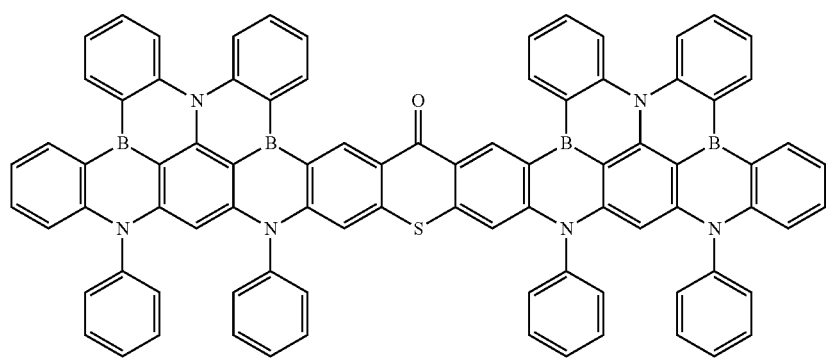

-continued
3-10
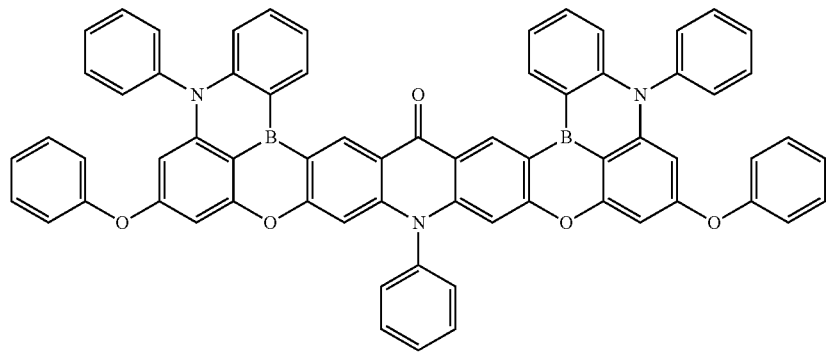
3-11
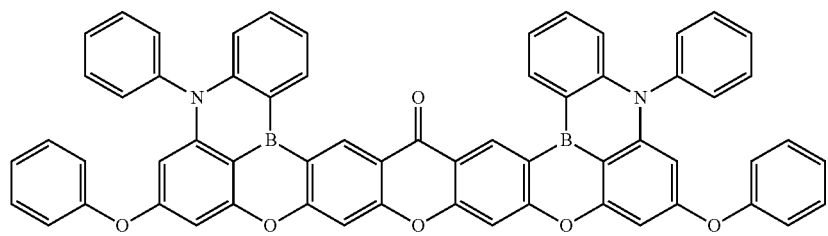
3-12
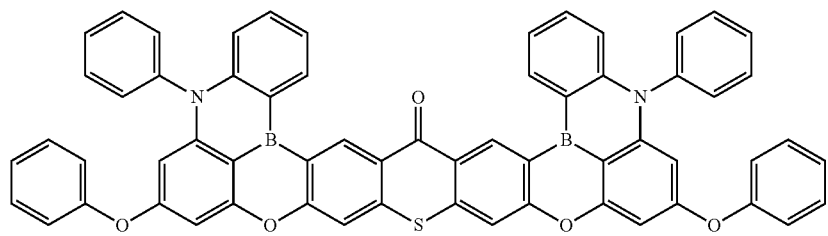
3-13
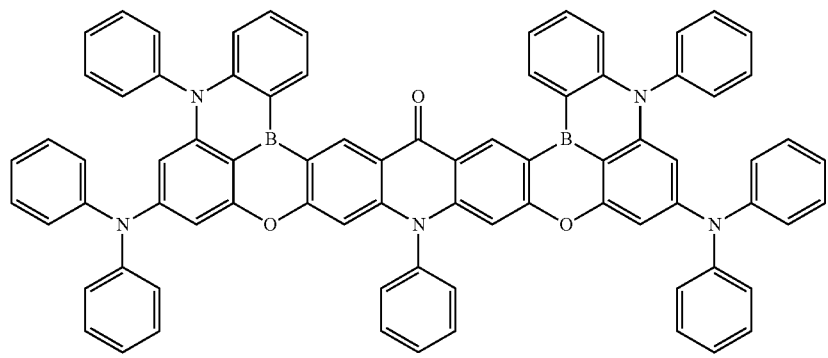
3-14
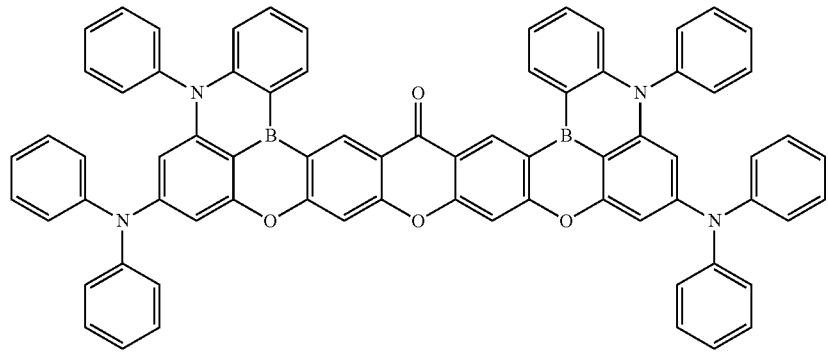

3-15
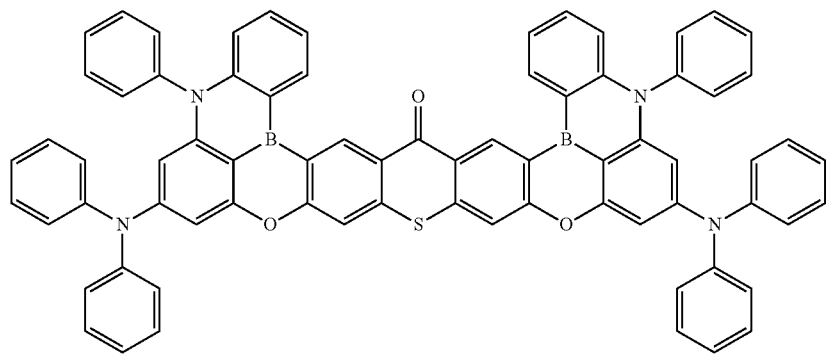
3-16
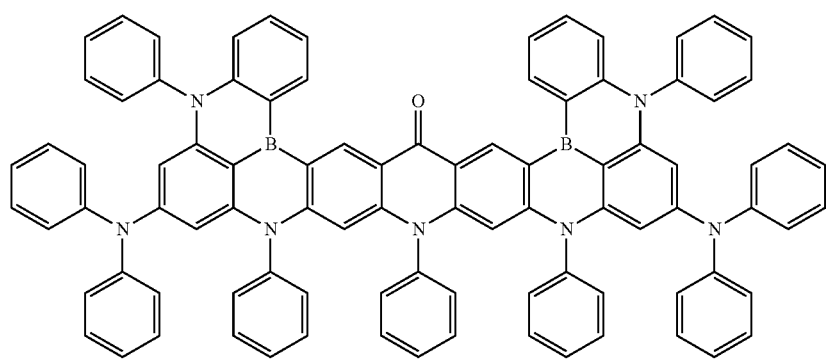
3-17
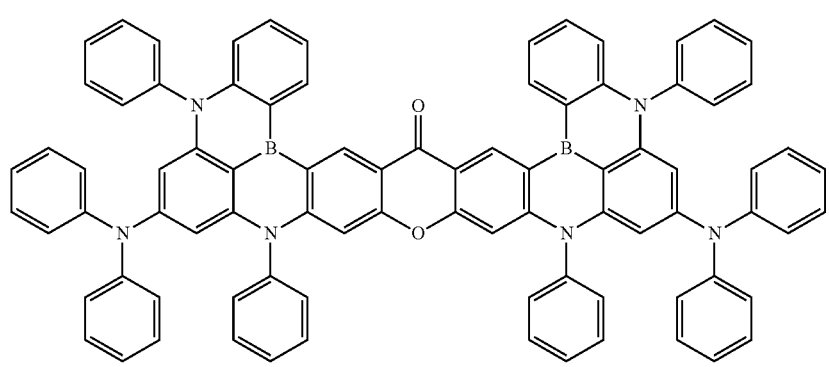
3-18
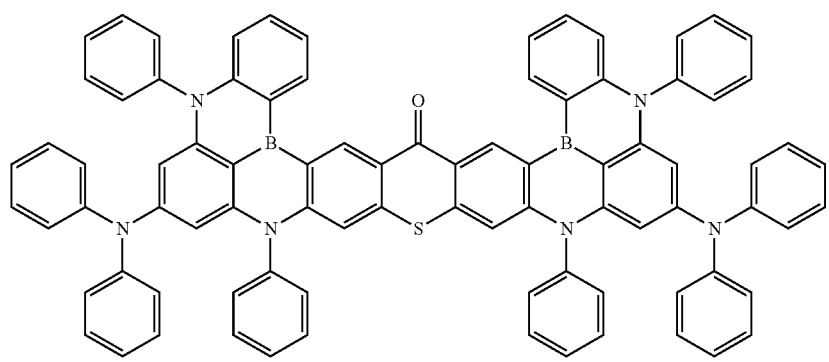

3-19
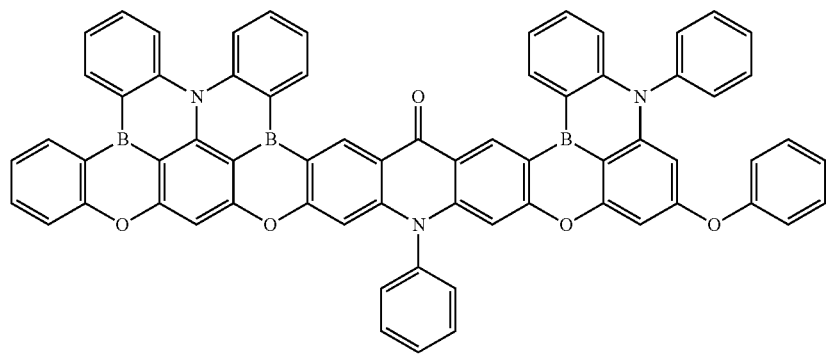
3-20
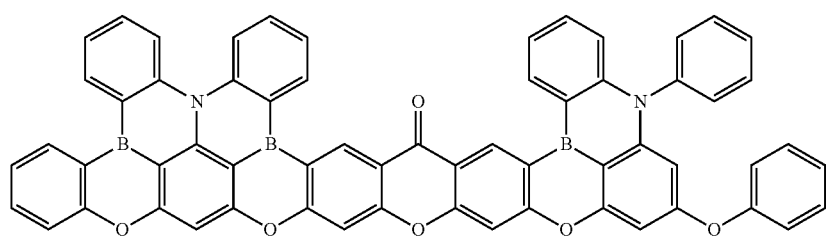
3-21
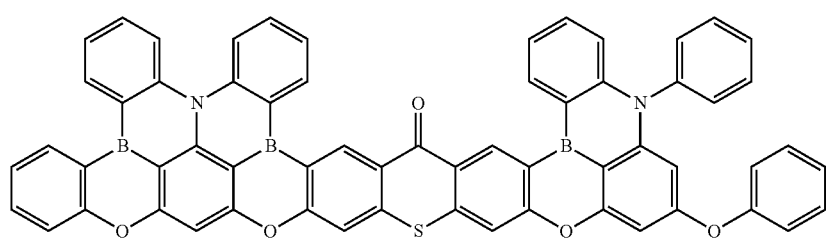
3-22
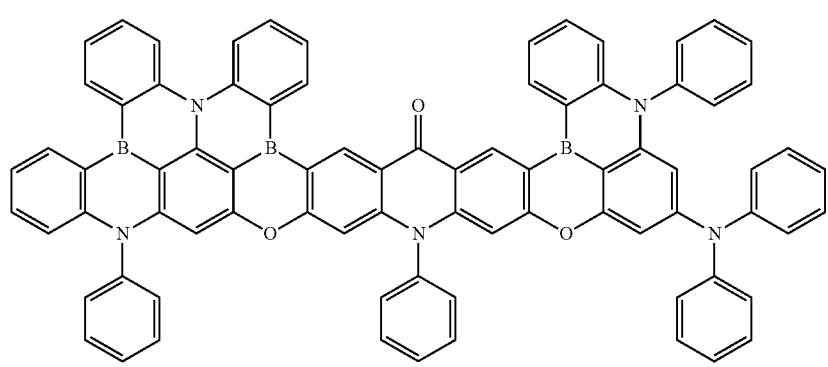
3-23
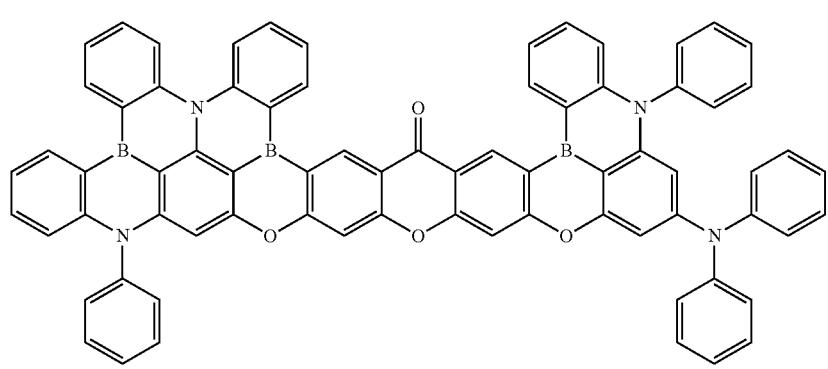

3-24
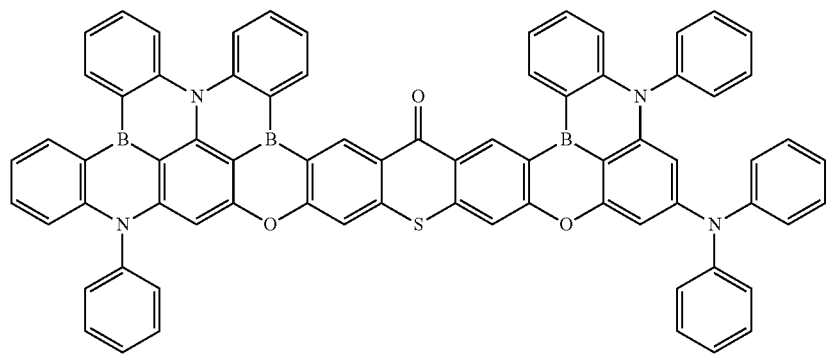
3-25
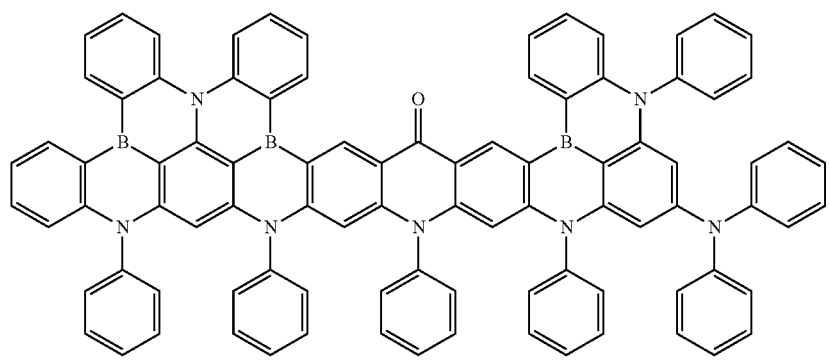
3-26
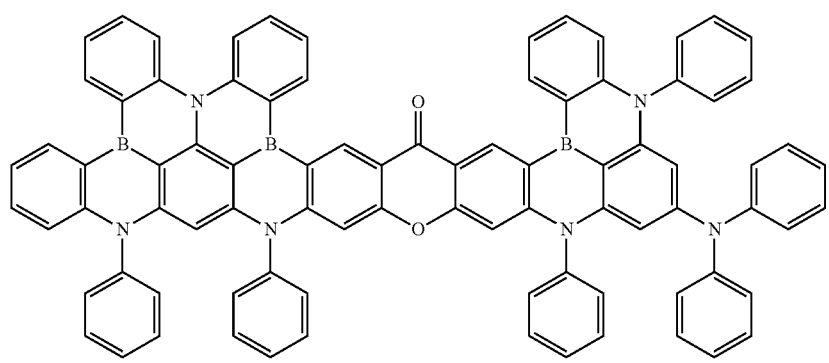
3-27
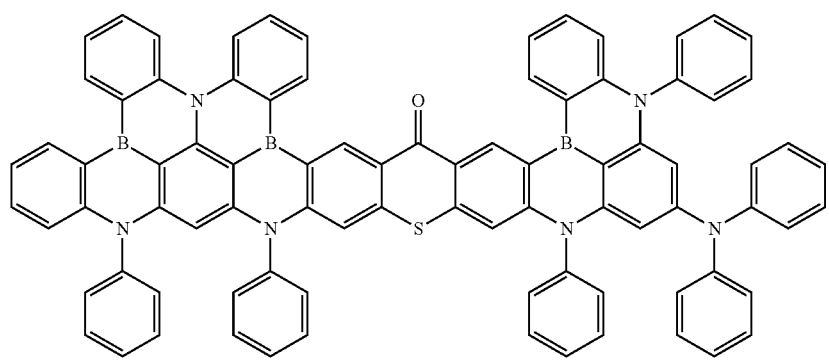

-continued
3-28
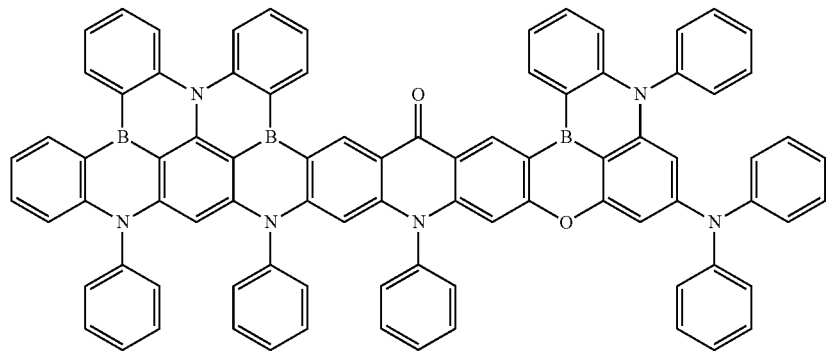
3-29
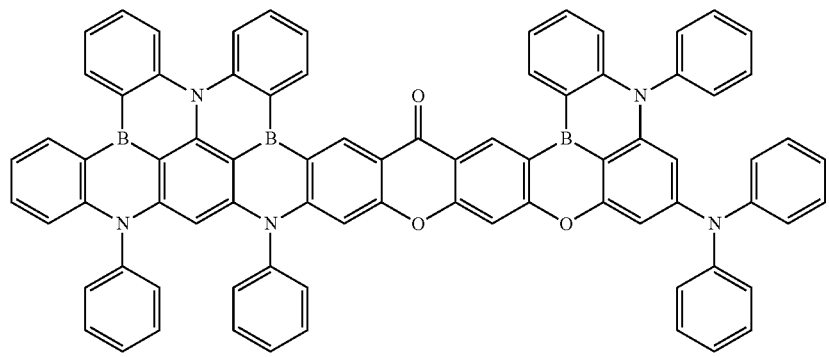
3-30
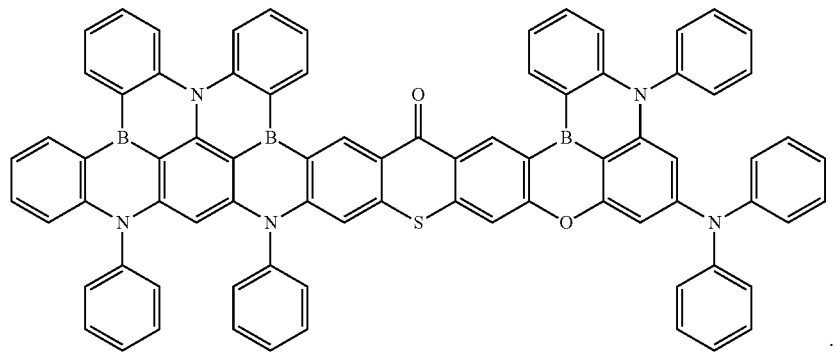
* * * * *

UNITED STATES PATENT AND TRADEMARK OFFICE
CERTIFICATE OF CORRECTION

PATENT NO. : 11,800,793 B2
APPLICATION NO. : 17/091619
DATED : October 24, 2023
INVENTOR(S) : Hankyu Pak et al.

It is certified that error appears in the above-identified patent and that said Letters Patent is hereby corrected as shown below:

In the Claims

In Column 107, Line 36, in Claim 1, after "to" insert -- Formula 2-3: --.

In Column 113, Line 19, in Claim 11, delete "Ra," and insert -- $R_8$, --.

In Column 113, Line 37, in Claim 14, below "3:" insert -- Compound Group 1 --.

In Columns 119-120, Line 27, in Claim 14, below "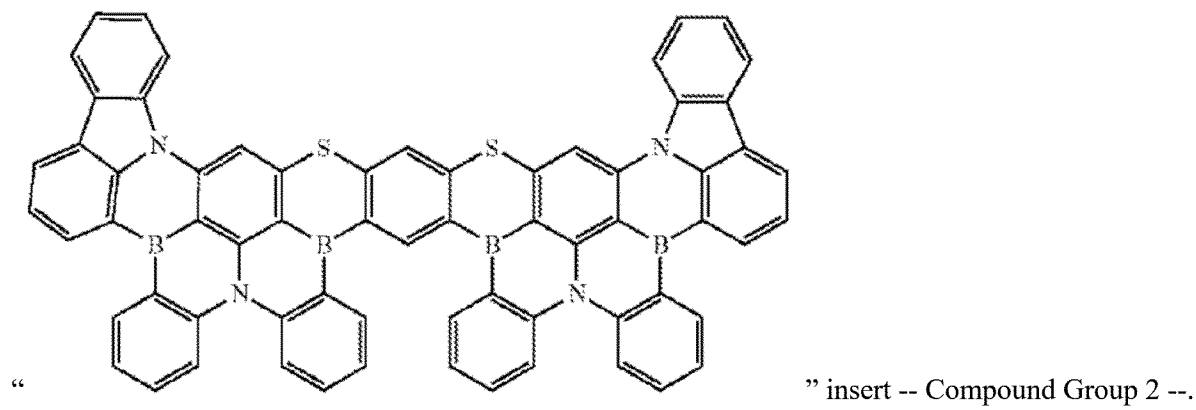" insert -- Compound Group 2 --.

In Columns 145-146, Line 2, in Claim 14, below

Signed and Sealed this
Twenty-fourth Day of December, 2024

Derrick Brent
*Acting Director of the United States Patent and Trademark Office*

CERTIFICATE OF CORRECTION (continued)
U.S. Pat. No. 11,800,793 B2

Page 2 of 4

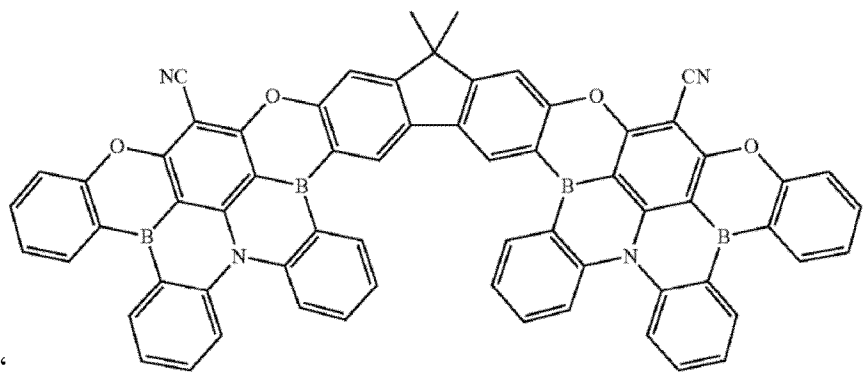

2-48

" 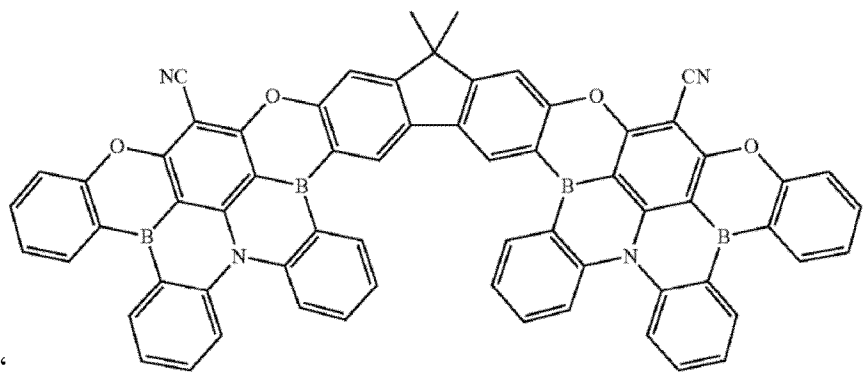 " insert -- Compound Group 3 --.

In Columns 159-160, Line 15, in Claim 15, below "1:" insert -- Formula 1 --.

In Column 160, Lines 55-61, in Claim 15, in Formula 2-3, delete " 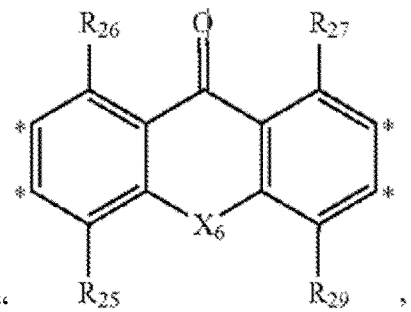 ,"

and insert -- 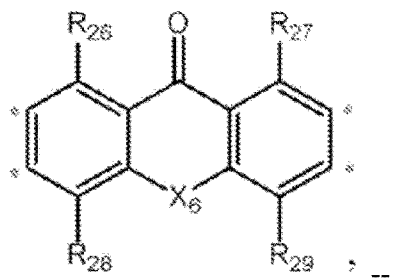 ; --.

CERTIFICATE OF CORRECTION (continued)
U.S. Pat. No. 11,800,793 B2

Page 3 of 4

In Column 161, Lines 29-38, in Claim 16, in Formula 3-2, delete " 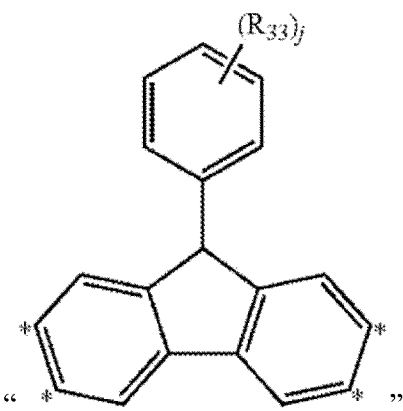 "

and insert -- 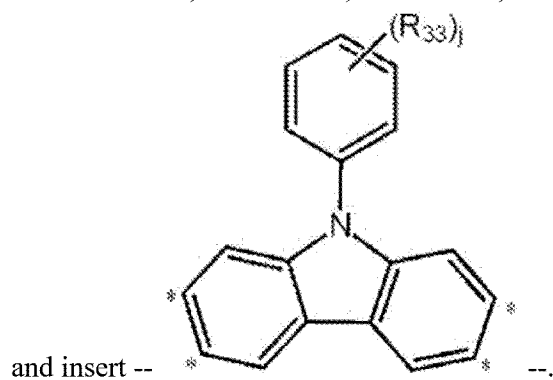 --.

In Column 165, Line 67, in Claim 21, below "3:" insert -- Compound Group 1 --.

In Columns 173-174, Line 1, in Claim 21, above

" 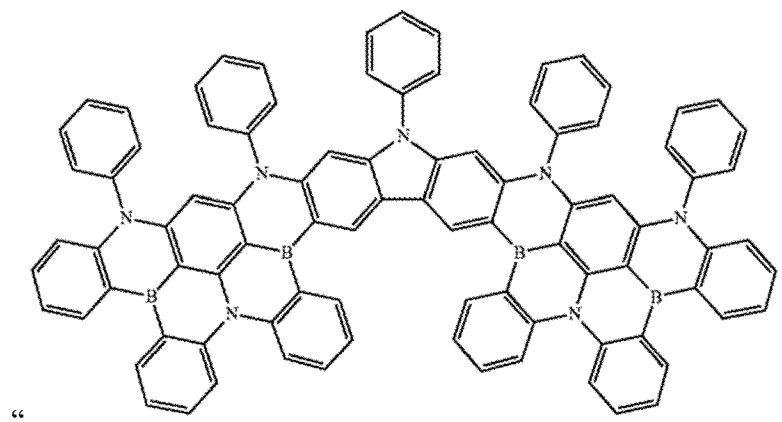 " insert -- Compound Group 2 --.

In Columns 199-200, Line 1, in Claim 21, above

CERTIFICATE OF CORRECTION (continued)
U.S. Pat. No. 11,800,793 B2

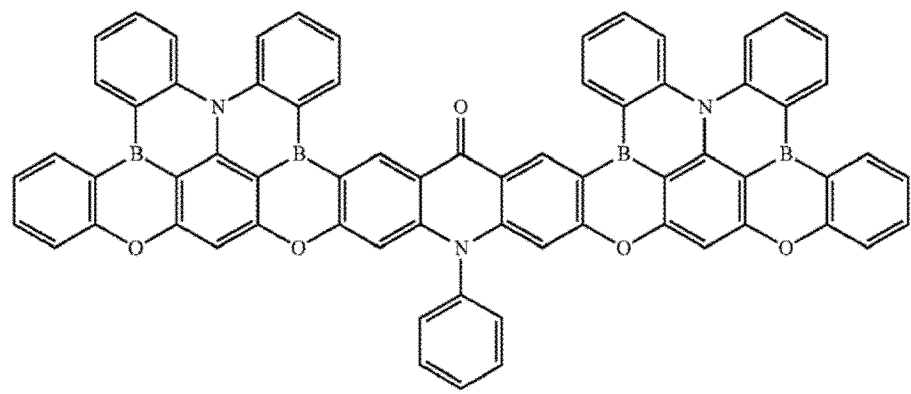

3-1

" " insert
-- Compound Group 3 --.